US008420234B2

(12) United States Patent
Kinoshita et al.

(10) Patent No.: US 8,420,234 B2
(45) Date of Patent: Apr. 16, 2013

(54) ORGANIC ELECTROLUMINESCENT DEVICE

(75) Inventors: Ikuo Kinoshita, Ashigarakami-gun (JP); Akira Takeda, Ashigarakami-gun (JP); Toshihiro Ise, Ashigarakami-gun (JP); Hiroo Takizawa, Ashigarakami-gun (JP); Masaaki Inoue, Ashigarakami-gun (JP); Takashi Kato, Ashigarakami-gun (JP)

(73) Assignee: UDC Ireland Limited, Dublin (IE)

( * ) Notice: Subject to any disclaimer, the term of this patent is extended or adjusted under 35 U.S.C. 154(b) by 581 days.

(21) Appl. No.: 12/683,098

(22) Filed: Jan. 6, 2010

(65) Prior Publication Data

US 2010/0171418 A1 Jul. 8, 2010

(30) Foreign Application Priority Data

Jan. 6, 2009 (JP) ................................ 2009-001162
Aug. 31, 2009 (JP) ................................ 2009-201149

(51) Int. Cl.
*H01L 51/54* (2006.01)
*C09K 11/00* (2006.01)

(52) U.S. Cl.
USPC ........... 428/690; 428/917; 313/504; 313/506; 252/301.16; 257/40; 257/103; 257/E51.051; 548/440

(58) Field of Classification Search ........................ None
See application file for complete search history.

(56) References Cited

U.S. PATENT DOCUMENTS

2007/0009759 A1* 1/2007 Burn et al. .................... 428/690
2007/0190359 A1* 8/2007 Knowles et al. .............. 428/690
2009/0058279 A1* 3/2009 Takeda .......................... 313/504
2010/0187985 A1* 7/2010 Kinoshita et al. ............. 313/504
2010/0231123 A1* 9/2010 Otsu et al. ..................... 313/504

FOREIGN PATENT DOCUMENTS

| | | | |
|---|---|---|---|
| JP | 08-060144 | A | 3/1996 |
| JP | 08-088083 | A | 4/1996 |
| JP | 2003-335753 | A | 11/2003 |
| WO | 2004/101707 | A1 | 11/2004 |
| WO | WO 2007/108459 | A1 * | 9/2007 |

* cited by examiner

*Primary Examiner* — Michael H Wilson
(74) *Attorney, Agent, or Firm* — Morgan, Lewis & Bockius LLP

(57) ABSTRACT

An organic electroluminescent device is provided and includes: a pair of electrodes; an organic layer including a light emitting layer between the electrodes. The organic layer contains a compound represented by formula (I).

(I)

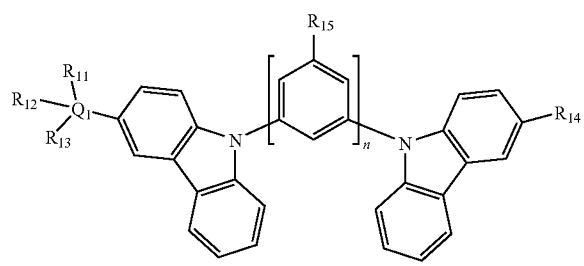

In formula (I), $R_{11}$, $R_{12}$, and $R_{13}$ each independently represents a $C_{1-6}$ alkyl group, $Q_1$ represents a carbon atom or a silicon atom, $R_{14}$ represents a hydrogen atom or $-Q_2(R_{16})(R_{17})R_{18}$ in which $Q_2$ represents a carbon atom or a silicon atom and $R_{16}$, $R_{17}$, and $R_{18}$ each independently represents a $C_{1-6}$ alkyl group, $R_{15}$ represents a hydrogen atom, a substituted or unsubstituted alkyl group, a cyano group, a substituted or unsubstituted aryl group, or a substituted or unsubstituted heteroaryl group, and n stands for 1 or 2.

13 Claims, 1 Drawing Sheet

ORGANIC ELECTROLUMINESCENT DEVICE

This application is based on and claims priority under 35 U.S.C. §119 from Japanese Patent Application Nos. 2009-001162 and 2009-201149, filed Jan. 6, 2009 and Aug. 31, 2009, respectively, the entire disclosures of which are herein incorporated by reference.

BACKGROUND OF THE INVENTION

1. Field of the Invention

The present invention relates to an organic electroluminescent device that emits light by converting an electric energy into light.

2. Background Art

Research and development are being vigorously made on organic electroluminescent devices (which may hereinafter be called "organic EL devices") because they can emit light with a high luminance even by low voltage driving. Organic electroluminescent devices each has one or more organic layers between a pair of electrodes. For light emission, they utilize energy of an exciton generated as a result of recombination, in the organic layers, of electrons injected from a cathode and holes injected from an anode.

In recent years, phosphorescent materials have been used to promote the efficiency of the device. There is disclosed an invention related to an organic electroluminescent device having improved long-term storage stability and less dark spots by using a compound having an N-phenylcarbazole skeleton between an organic light emitting layer and a cathode for improving the adhesion with the cathode (refer to Japanese Patent Laid-Open Nos. 8-88083 and 8-60144).

WO 04/101707 discloses an invention related to an organic electroluminescent device using, as a host material for forming a light emitting layer in cooperation with an iridium complex material, a compound having, for example, an N-phenylcarbazole skeleton represented by the following formula:

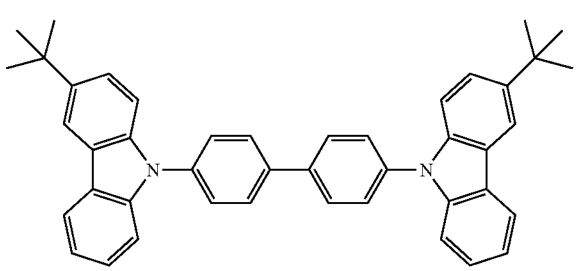 [SMILES: CC(C)(C)c1ccc2c(c1)c1ccccc1n2-c1ccc(-c2ccc(-n3c4ccccc4c4cc(C(C)(C)C)ccc43)cc2)cc1]

The device using the above compound has however insufficient durability and in addition, needs a further improvement in drive voltage.

Japanese Patent Laid-Open No. 2003-335753 discloses an invention related to an organic electroluminescent device using, for the light emitting layer thereof, for example an N-phenylcarbazole compound represented by the following formula:

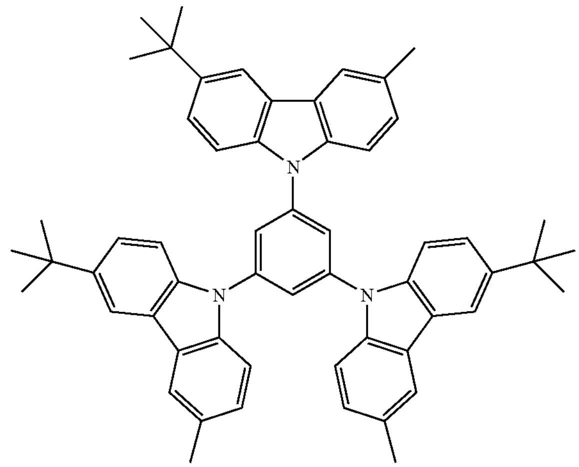 [SMILES: Cc1ccc2c(c1)c1cc(C(C)(C)C)ccc1n2-c1cc(-n2c3ccc(C)cc3c3cc(C(C)(C)C)ccc32)cc(-n2c3ccc(C)cc3c3cc(C(C)(C)C)ccc32)c1]

The device using the compound has however insufficient durability and in addition, needs a further improvement in drive voltage.

SUMMARY OF THE INVENTION

An object of an illustrative, non-limiting embodiment of the invention is to provide an organic electroluminescent device having both a high luminous efficiency and high durability, in particular, an organic electroluminescent device that shows emission in the blue region and has both a high luminous efficiency and high durability.

According to an aspect of the invention, there are provided the following means.

[1] An organic electroluminescent device comprising:

a pair of electrodes;

an organic layer including a light emitting layer between the electrodes, wherein the organic layer contains a compound represented by the following formula (I):

(I)

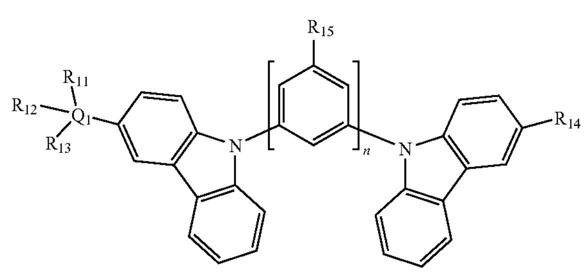

(in the formula (I), $R_{11}$, $R_{12}$, and $R_{13}$ each independently represents a $C_{1-6}$ alkyl group, $Q_1$ represents a carbon atom or a silicon atom, $R_{14}$ represents a hydrogen atom or $-Q_2(R_{16})(R_{17})R_{18}$ in which $Q_2$ represents a carbon atom or a silicon atom and $R_{16}$, $R_{17}$, and $R_{18}$ each independently represents a $C_{1-6}$ alkyl group, $R_{15}$ represents a hydrogen atom, a substituted or unsubstituted alkyl group, a cyano group, a substituted or unsubstituted aryl group, or a substituted or unsubstituted heteroaryl group, and n stands for 1 or 2).

[2] The organic electroluminescent device as described in [1], wherein the compound represented by the formula (I) is a compound represented by the following formula (II):

(II)

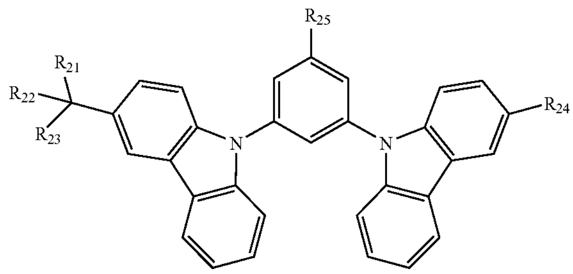

(in the formula (II), $R_{21}$, $R_{22}$, and $R_{23}$ each independently represents a $C_{1-6}$ alkyl group, $R_{24}$ represents a hydrogen atom or —$C(R_{26})(R_{27})R_{28}$ in which $R_{26}$, $R_{27}$, and $R_{28}$ each independently represents a $C_{1-6}$ alkyl group, $R_{25}$ represents a hydrogen atom, a substituted or unsubstituted alkyl group, a cyano group, a substituted or unsubstituted aryl group, or a substituted or unsubstituted heteroaryl group).

[3] The organic electroluminescent device as described in [2], wherein the compound represented by the formula (II) is a compound represented by the following formula (III):

(III)

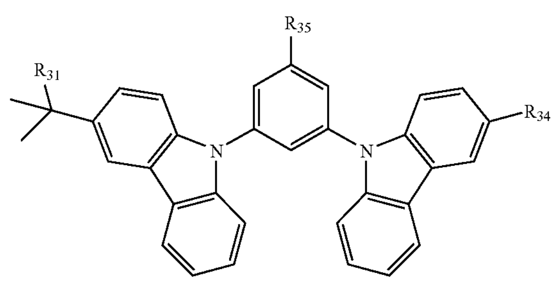

(in the formula (III), $R_{31}$ represents a $C_{1-6}$ alkyl group, $R_{34}$ represents a hydrogen atom or —$C(CH_3)_2R_{36}$ in which $R_{36}$ represents a $C_{1-6}$ alkyl group, $R_{35}$ represents a hydrogen atom, a substituted or unsubstituted alkyl group, a cyano group, a substituted or unsubstituted aryl group, or a substituted or unsubstituted heteroaryl group).

[4] The organic electroluminescent device as described in [3], wherein the compound represented by the formula (III) is a compound represented by the following formula (IV):

(IV)

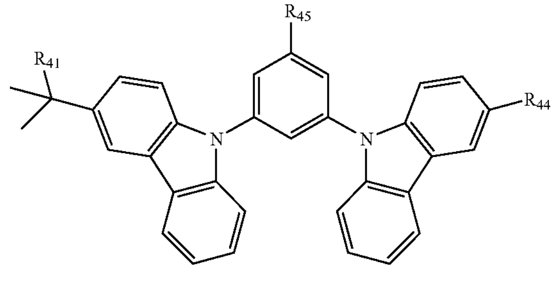

(in the formula (IV), $R_{41}$ represents a methyl or ethyl group, $R_{44}$ represents a hydrogen atom or —$C(CH_3)_2R_{46}$ in which $R_{46}$ represents a methyl or ethyl group, $R_{45}$ represents a hydrogen atom, a substituted or unsubstituted alkyl group, a cyano group, a substituted or unsubstituted aryl group, or a substituted or unsubstituted heteroaryl group).

[5] The organic electroluminescent device as described in [4], wherein the compound represented by the formula (IV) is a compound represented by the following formula (V):

(V)

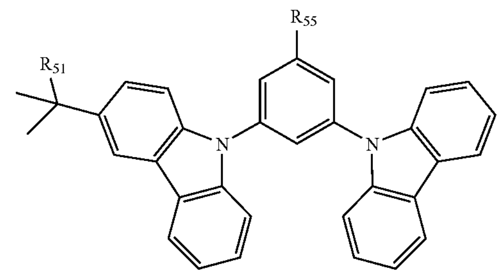

(in the formula (V), $R_{51}$ represents a methyl or ethyl group and $R_{55}$ represents a hydrogen atom, a substituted or unsubstituted alkyl group, a cyano group, a substituted or unsubstituted aryl group, or a substituted or unsubstituted heteroaryl group).

[6] The organic electroluminescent device as described in [5], wherein the compound represented by the formula (V) has, as $R_{55}$, a hydrogen atom.

[7] The organic electroluminescent device as described in [1], wherein the compound represented by the formula (I) is a compound represented by the following formula (VII):

(VII)

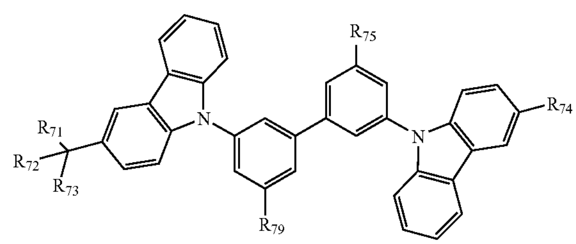

(in the formula (VII), $R_{71}$, $R_{72}$, and $R_{73}$ each independently represents a $C_{1-6}$ alkyl group, $R_{74}$ represents a hydrogen atom or —$C(R_{76})(R_{77})R_{78}$ in which $R_{76}$, $R_{77}$, and $R_{78}$ each independently represents a $C_{1-6}$ alkyl group, and $R_{75}$ and $R_{79}$ each independently represents a hydrogen atom, a substituted or unsubstituted alkyl group, a cyano group, a substituted or unsubstituted aryl group, or a substituted or unsubstituted heteroaryl group).

[8] The organic electroluminescent device as described in [7], wherein the compound represented by the formula (VII) is a compound represented by the following formula (VIII):

(VIII)

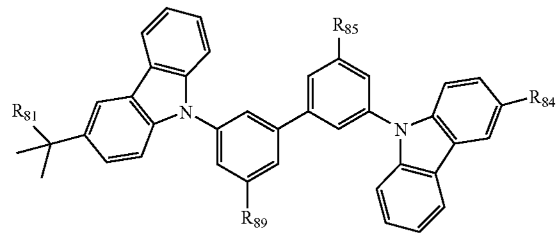

(in the formula (VIII), $R_{81}$ represents a $C_{1-6}$ alkyl group, $R_{84}$ represents a hydrogen atom or —$C(CH_3)_2R_{86}$ in which $R_{86}$ represents a $C_{1-6}$ alkyl group, and $R_{85}$ and $R_{89}$ each independently represents a hydrogen atom, a substituted or unsubstituted alkyl group, a cyano group, a substituted or unsubstituted aryl group, or a substituted or unsubstituted heteroaryl group).

[9] The organic electroluminescent device as described in [8], wherein the compound represented by the formula (VIII) is a compound represented by the following formula (IX):

(IX)

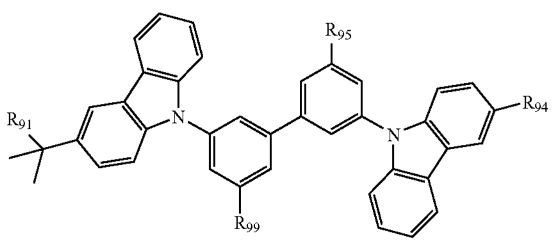

(in the formula (IX), $R_{91}$ represents a methyl or ethyl group, $R_{94}$ represents a hydrogen atom or —$C(CH_3)_2R_{96}$ in which $R_{96}$ represents a methyl or ethyl group, and $R_{95}$ and $R_{99}$ each independently represents a hydrogen atom, a substituted or unsubstituted alkyl group, a cyano group, a substituted or unsubstituted aryl group, or a substituted or unsubstituted heteroaryl group).

[10] The organic electroluminescent device as described in [9], wherein the compound represented by the formula (IX) is a compound represented by the following formula (X):

(X)

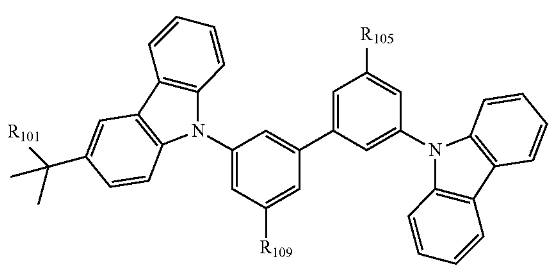

(in the formula (X), $R_{101}$ represents a methyl or ethyl group, $R_{105}$ and $R_{109}$ each independently represents a hydrogen atom, a substituted or unsubstituted alkyl group, a cyano group, a substituted or unsubstituted aryl group, or a substituted or unsubstituted heteroaryl group).

[11] The organic electroluminescent device as described in [10], wherein the compound represented by the formula (X) has, as $R_{105}$ and $R_{109}$, a hydrogen atom.

[12] The organic electroluminescent device as described in any one of [1] to [11], wherein the compounds represented by the formulae (I) to (X) each has $T_1$ of 61 kcal/mol or greater.

[13] The organic electroluminescent device as described in any one of [1] to [12], wherein the compounds represented by the formulae (I) to (X) each has a molecular weight of from 450 to 1200.

[14] The organic electroluminescent device as described in any one of [1] to [13], wherein the light emitting layer contains at least one of the compounds represented by the formulae (I) to (X) and at least one of phosphorescent metal complexes containing a metal having an atomic weight of 40 or greater and a monoanionic bidentate ligand represented by the following formulae (A1) to (A4):

A1

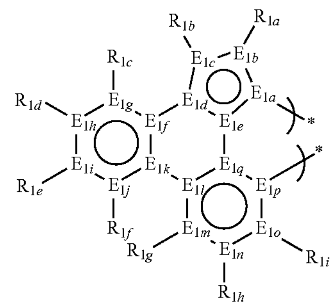

A2

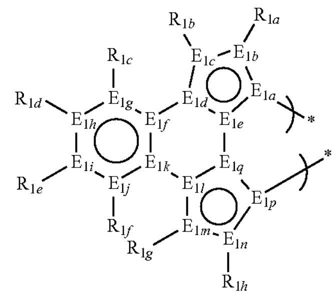

A3

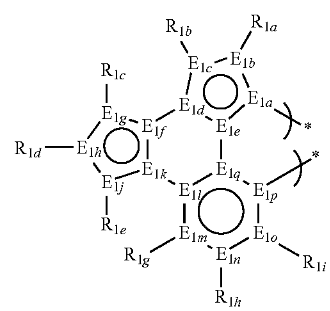

A4

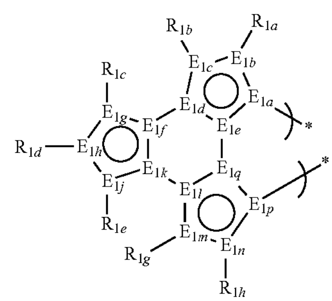

(in the formulae (A1) to (A4), $E_{1a}$ to $E_{1q}$ each independently represents a carbon atom or a hetero atom, $R_{1a}$ to $R_{1i}$ each independently represents a hydrogen atom or a substituent, and the skeletons represented by the formulae (A1) to (A4) each has a 18π electronic structure in total).

[15] The organic electroluminescent device as described in any one of [1] to [13], wherein the light emitting layer contains at least one of the compounds represented by the formulae (I) to (X) and at least one of tetradentate platinum complexes represented by the following formula (1):

(1)

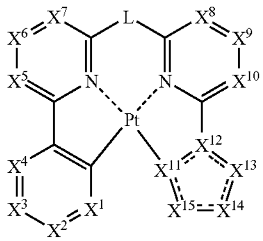

(in the formula (1), $X^1$, $X^2$, $X^3$, and $X^4$ each independently represents a carbon atom or a nitrogen atom, with the proviso that at least one of $X^1$, $X^2$, $X^3$, and $X^4$ represents a nitrogen atom, $X^5$, $X^6$, $X^2$, $X^8$, $X^9$, and $X^{10}$ each independently represents a carbon atom or a nitrogen atom, $X^{11}$ and $X^{12}$ each independently represents a carbon atom or a nitrogen atom, $X^{13}$, $X^{14}$, and $X^{15}$ each independently represents a carbon atom, a nitrogen atom, an oxygen atom, or a sulfur atom, with the proviso that the number of nitrogen atoms contained in a 5-membered ring skeleton represented by $X^{11}$, $X^{12}$, $X^{13}$, $X^{14}$, and $X^{15}$ is 2 or less, and L represents a single bond or a divalent linking group).

[16] The organic electroluminescent device as described in any one of [10] to [15], wherein the light emitting layer contains a compound represented by the following formula (a):

(a)

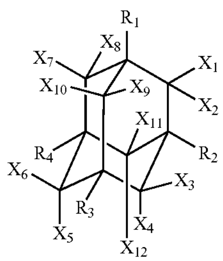

(in the formula (a), $R_1$ to $R_4$ each independently represents a hydrogen atom, an alkyl group, an alkenyl group, an alkynyl group, an aryl group, a heteroaryl group, an alkoxy group, an acyl group, an acyloxy group, an amino group, a nitro group, a cyano group, an ester group, an amide group, a halogen group, a perfluoroalkyl group, or a silyl group, with the proviso that at least one of $R_1$ to $R_4$ is a group having a double bond or a triple bond, and $X_1$ to $X_{12}$ each independently represents a hydrogen atom, an alkyl group, an alkynyl group, an aryl group, a heteroaryl group, an alkoxy group, an acyl group, an acyloxy group, an amino group, a nitro group, a cyano group, an ester group, an amide group, a halogen group, a perfluoroalkyl group, or a silyl group).

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE EXEMPLARY EMBODIMENTS

Figure 1:
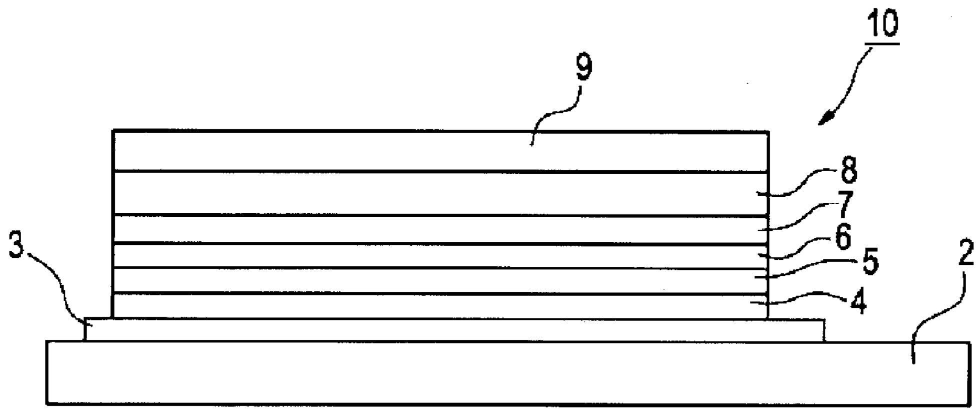
FIG. 1 is a schematic view illustrating an exemplary embodiment of an organic electroluminescent device according to the invention.

A light emitting device (luminescent device) according to an exemplary embodiment of the invention is excellent in durability and can be driven at a reduced drive voltage. It emits light at a low drive voltage even in the blue region and at the same time, has excellent durability. In addition, it is excellent in initial degradation (time for the luminance to drop to 10% of its initial value).

Exemplary embodiments of the invention will be described. In the present invention, "$C_{k-1}$ group" means that the number of carbon atoms in the group is from k to 1.

An organic electroluminescent device according to an exemplary embodiment of the invention is characterized in that it has, between a pair of electrodes, one or more organic layers including a light emitting layer and it contains, in the organic layers, a compound represented by the following formula (I):

(I)

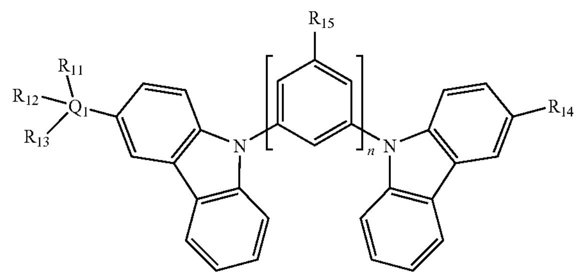

(in the formula (I), $R_{11}$, $R_{12}$, and $R_{13}$ each independently represents a $C_{1-6}$ alkyl group, $Q_1$ represents a carbon atom or a silicon atom, $R_{14}$ represents a hydrogen atom or $-Q_2(R_{16})(R_{17})R_{18}$ in which $Q_2$ represents a carbon atom or a silicon atom and $R_{16}$, $R_{17}$, and $R_{18}$ each independently represents a $C_{1-6}$ alkyl group, $R_{15}$ represents a hydrogen atom, a substituted or unsubstituted alkyl group, a cyano group, a substituted or unsubstituted aryl group, or a substituted or unsubstituted heteroaryl group, and n stands for 1 or 2).

The organic electroluminescent device of the invention has at least one light emitting layer as the organic layer. Further, as the organic layers other than the light emitting layer, a hole injection layer, a hole transport layer, an electron blocking layer, an exciton blocking layer, a hole blocking layer, an electron transport layer, an electron injection layer, and a protective layer may be arranged as needed. They may have a function of another layer simultaneously. Further, each layer may be composed of a plurality of layers.

The organic electroluminescent device of the invention may utilize emission of light from an excited singlet state (fluorescence) or may utilize emission of light from an excited triplet state (phosphorescence), but the latter is preferred from the viewpoint of luminous efficiency.

The light-emitting layer of the organic electroluminescent device of the invention is preferably composed of at least one light emitting material and at least one host material. The term "host material" as used herein means a material constituting a light emitting layer but other than a light emitting material and having at least one function selected from a function of dispersing a light emitting material in a light emitting layer and retaining it therein, a function of accepting holes from an anode, a hole transport layer, or the like, a function of accepting electrons from a cathode, an electron transport layer, or the like, a function of transporting the holes and/or electrons, a function of offering a place of recombination of the holes and electrons, a function of transporting the exciton energy generated by the recombination to the light emitting material, and a function of transporting the holes and/or electrons to the light emitting material.

The compound of the invention may be contained in any of the organic layers. It is contained preferably in a hole injection layer, a hole transport layer, an electron blocking layer, a light emitting layer, a hole blocking layer, an electron transport layer, or an electron injection layer; more preferably in a light emitting layer, a hole blocking layer, an electron transport layer, or an electron injection layer; still more preferably in a light emitting layer; and most preferably in a light emitting layer as a host material. When the compound of the invention is contained in a light emitting layer as a host material, the content of the compound of the invention in the light emitting layer is preferably from 50 to 99.9 mass %, more preferably from 60 to 98 mass %. Further, when the compound of the invention is contained in a hole injection layer, a hole transport layer, an electron blocking layer, a hole blocking layer, an electron transport layer, or an electron injection layer, the content of the compound of the invention in each layer is preferably from 70 to 100%, more preferably from 85 to 100%, most preferably from 99 to 100%.

It is only necessary that the compound of the invention is contained in at least one organic layer. It may also be contained in a plurality of organic layers.

The compound represented by formula (I) will next be described.

(I)

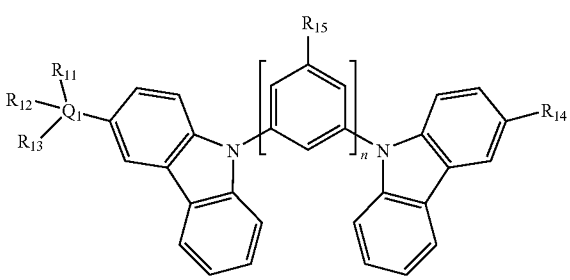

(in the formula (I), $R_{11}$, $R_{12}$, and $R_{13}$ each independently represents a $C_{1-6}$ alkyl group, $Q_1$ represents a carbon atom or a silicon atom, $R_{14}$ represents a hydrogen atom or $-Q_2(R_{16})(R_{17})R_{18}$ in which $Q_2$ represents a carbon atom or a silicon atom and $R_{16}$, $R_{17}$, and $R_{18}$ each independently represents a $C_{1-6}$ alkyl group, $R_{15}$ represents a hydrogen atom, a substituted or unsubstituted alkyl group, a cyano group, a substituted or unsubstituted aryl group, or a substituted or unsubstituted heteroaryl group, and n stands for 1 or 2).

In the inventions so far made, when a carbazole-containing compound is used as a host material of organic electroluminescent devices, the durability of the devices has been improved by protecting all of the 3 and 6 positions, which are active positions of the compound, with a stable substituent such as trialkylmethyl group or trialkylsilyl group, thereby preventing decomposition of it. In the invention, on the other hand, it has been found as a result of various studies and analysis that since the trialkylmethyl group and trialkylsilyl group are bulky substituents, protection of all the active positions of the carbazole group with them increases an intermolecular distance between carbazole main skeletons engaged in transport of charges, disturbs transport of charges, and causes a drastic rise in voltage and deterioration in durability of the devices.

In the invention, it has been found as a result of various studies and analysis that it is possible to prevent decomposition of the compound represented by the formula (I) used as a host material of an organic electroluminescent device by protecting only one (3-position) of the active positions of the carbazole group with a trialkylmethyl group or trialkylsilyl group. In short, it has been found that protection of the active position with a substituent without promoting a voltage rise or durability deterioration leads to a drastic increase in durability.

The compound represented by the formula (1) has a structural characteristic that when n stands for 1, relative to one of the carbazole groups, the other carbazole group is attached to the m-(meta) position and when n stands for 2, the carbazole group is attached to the 3,3'-position of the biphenyl group.

The compound having such a structure can have a higher triplet (T1) energy so that it can provide an organic electroluminescent device having a high efficiency even when a light emitting layer is formed with a blue light emitting material.

In formula (I), $R_{11}$, $R_{12}$, and $R_{13}$ each independently represents a $C_{1-6}$ alkyl group. Examples include methyl, ethyl, n-propyl, isopropyl, n-butyl, isobutyl, sec-butyl, tert-butyl, n-pentyl, isopentyl, sec-pentyl, tert-pentyl, neo-pentyl, n-hexyl, isohexyl, sec-hexyl, neo-hexyl, 4,4-dimethylbutyl, cycloprorpyl, cyclopentyl, and cyclohexyl groups. Of these, methyl, ethyl, n-propyl, isopropyl, n-butyl, and cyclohexyl groups are preferred; methyl, ethyl, and n-propyl groups are more preferred; and methyl and ethyl groups are still more preferred. It is most preferred that $R_{11}$ represents a methyl or ethyl group and $R_{12}$ and $R_{13}$ each represents a methyl group.

$Q_1$ represents a carbon atom or a silicon atom, with a carbon atom being preferred. $Q_2$ represents a hydrogen atom, a carbon atom, or a silicon atom, with a hydrogen atom or a carbon atom being preferred.

When a plurality of $R_{15}$ exist, they each independently represents a hydrogen atom, a substituted or unsubstituted alkyl group, a cyano group, a substituted or unsubstituted aryl group, or a substituted or unsubstituted heteroaryl group.

Examples of the alkyl group represented by $R_{15}$ include substituted or unsubstituted alkyl groups such as methyl, ethyl, isopropyl, tert-butyl, n-octyl, n-decyl, n-hexadecyl, cyclopropyl, cyclopentyl, and cyclohexyl. Of these, methyl, ethyl, isopropyl, tert-butyl, and cyclohexyl groups are preferred, of which methyl and tert-butyl groups are more preferred and a tert-butyl group is still more preferred.

Examples of the aryl group represented by $R_{15}$ include substituted or unsubstituted aryl groups such as phenyl, p-tolyl, m-tolyl, o-tolyl, naphthyl, cyanophenyl, and trifluoromethylphenyl groups, of which phenyl and cyanophenyl groups are preferred, with a phenyl group being more preferred.

Examples of the heteroaryl group represented by $R_{15}$ include substituted or unsubstituted heteroaryl groups such as nitrogen-containing five-membered heterocycles, nitrogen-containing six-membered heterocycles, oxygen-containing five-membered heterocycles, and sulfur-containing five-membered heterocycles. Specific examples include a pyridine ring, a pyrazine ring, a pyrimidine ring, a pyridazine ring, a 1,2,4-triazine ring, a 1,3,5-triazine ring, a pyrrole ring, a pyrazole ring, an imidazole ring, a 1,2,3-triazole ring, a 1,2,4-triazole ring, a furan ring, a thiophene ring, an oxazole ring, an isoxazole ring, a thiazole ring, an isothiazole ring, a 1,2,3-oxadiazole ring, a 1,2,4-oxadiazole ring, a 1,3,4-oxadiazole ring, a 1,2,3-thiadiazole ring, a 1,2,4-thiadiazole ring, a 1,3,4-thiadiazole ring, a selenophene ring, a tellurophene ring, and a carbazole ring. Considering the stability of mother nucleus of an aromatic ring, the ionization potential of a thin film, control of affinity of electrons, and expansion of a $\pi$ electron system from the standpoints of a charge transporting property and driving durability of the device, preferred are a pyridine ring, a pyrazine ring, a pyrimidine ring, a pyridazine ring, a 1,3,5-triazine ring, a pyrrole ring, a pyrazole ring, an imidazole ring, a 1,2,4-triazole ring, a furan ring, a thiophene ring, an oxazole ring, a thiazole ring, a 1,3,4-oxadiazole ring, a 1,3,4-thiadiazole ring, and a carbazole ring. Of these, a pyridine ring, a pyrazine ring, a pyrazole ring, an imidazole ring, an oxazole ring, a thiazole ring, a thiophene ring, and a carbazole ring are more preferred, of which a pyridine ring, a pyrazine ring, an imidazole ring, a pyrazole ring, and a carbazole ring are still more preferred; a pyrazole ring and a carbazole ring are still more preferred, and a carbazole ring is especially preferred.

Considering the bulkiness of the substituent and electronic perturbation from the standpoints of charge transporting property and driving durability of the device, $R_{15}$ represents preferably a hydrogen atom, a phenyl group, a pyrazole ring, or a carbazole ring, more preferably a hydrogen atom, a phenyl group, or a carbazole ring, still more preferably a hydrogen atom or a phenyl group, most preferably a hydrogen atom.

When the aryl or heteroaryl group represented by $R_{15}$ has a substituent, examples of the substituent include those belonging to the substituent group A described later. Of these, a cyano group, substituted or unsubstituted alkyl groups, and substituted or unsubstituted phenyl groups are preferred, with a trifluoromethyl group, a tert-butyl group, and a cyano group being more preferred.

$R_{16}$, $R_{17}$, and $R_{18}$ each independently represents a $C_{1-6}$ alkyl group. Examples include methyl, ethyl, n-propyl, isopropyl, n-butyl, isobutyl, sec-butyl, tert-butyl, n-pentyl, isopentyl, sec-pentyl, tert-pentyl, neo-pentyl, n-hexyl, isohexyl, sec-hexyl, neo-hexyl, 4,4-dimethylbutyl, cyclopropyl, cyclopentyl, and cyclohexyl groups. Of these, methyl, ethyl, n-propyl, isopropyl, n-butyl, and cyclohexyl groups are preferred, of which methyl, ethyl, and n-propyl groups are more preferred and methyl and ethyl groups are still more preferred. It is most preferred that $R_{11}$ represents a methyl or ethyl group, and $R_{12}$ and $R_{13}$ each represents a methyl group.

n stands for 1 or 2.

In the specification, the substituent groups A and B will be defined as described below.

(Substituent Group A)

Substituent group A includes alkyl groups (preferably $C_{1-30}$, more preferably $C_{1-20}$, especially preferably $C_{1-10}$ alkyl groups such as methyl, ethyl, isopropyl, tert-butyl, n-octyl, n-decyl, n-hexadecyl, cyclopropyl, cyclopentyl, and cyclohexyl), alkenyl groups (preferably $C_{2-30}$, more preferably $C_{2-20}$, especially preferably $C_{2-10}$ alkenyl groups such as vinyl, allyl, 2-butenyl, and 3-pentenyl), alkynyl groups (preferably $C_{2-30}$, more preferably $C_{2-20}$, especially preferably $C_{2-10}$ alkynyl groups such as propargyl and 3-pentynyl), aryl groups (preferably $C_{6-30}$, more preferably $C_{6-20}$, especially preferably $C_{6-12}$ aryl groups such as phenyl, p-methylphenyl, naphthyl, and anthranyl), amino groups (preferably $C_{0-30}$, more preferably $C_{0-20}$, especially preferably $C_{0-10}$ amino groups such as amino, methylamino, dimethylamino, diethylamino, dibenzylamino, diphenylamino, and ditolylamino), alkoxy groups (preferably $C_{1-30}$, more preferably $C_{1-20}$, especially preferably $C_{1-10}$ alkoxy groups such as methoxy, ethoxy, butoxy, and 2-ethylhexyloxy), aryloxy groups (preferably $C_{6-30}$, more preferably $C_{6-20}$, especially preferably $C_{6-12}$ aryloxy groups such as phenyloxy, 1-naphthyloxy, and 2-naphthyloxy), heterocyclic oxy groups (preferably $C_{1-30}$, more preferably $C_{1-20}$, especially preferably 7 heterocyclic oxy groups such as pyridyloxy, pyrazyloxy, pyrimidyloxy, and quinolyloxy), acyl groups (preferably $C_{2-30}$, more preferably $C_{2-20}$, especially preferably $C_{2-12}$ acyl groups such as acetyl, benzoyl, formyl, and pivaloyl), alkoxycarbonyl groups (preferably $C_{2-30}$, more preferably $C_{2-20}$, especially preferably $C_{2-12}$ alkoxycarbonyl groups such as methoxycarbonyl and ethoxycarbonyl), aryloxycarbonyl groups (preferably $C_{7-30}$, more preferably $C_{7-20}$, especially preferably $C_{7-12}$ aryloxycarbonyl groups such as phenyloxycarbonyl), acyloxy groups (preferably $C_{2-30}$, more preferably $C_{2-20}$, especially preferably $C_{2-10}$ acyloxy groups such as acetoxy and benzoyloxy), acylamino groups (preferably $C_{2-30}$, more preferably $C_{2-20}$, especially preferably $C_{2-10}$ acylamino groups such as acetylamino and benzoylamino), alkoxycarbonylamino groups (preferably $C_{2-30}$, more preferably $C_{2-20}$, especially preferably $C_{2-12}$ alkoxycarbonylamino groups such as methoxycarbonylamino), aryloxycarbonylamino groups (preferably $C_{7-30}$, more preferably $C_{7-20}$, especially preferably $C_{7-12}$ aryloxycarbonylamino groups such as phenyloxycarbonylamino), sulfonylamino groups (preferably $C_{1-30}$, more preferably $C_{1-20}$, especially preferably $C_{1-12}$ sulfonylamino groups such as methanesulfonylamino and benzenesulfonylamino), sulfamoyl groups (preferably $C_{0-30}$, more preferably $C_{0-20}$, especially preferably $C_{0-12}$ sulfamoyl groups such as sulfamoyl, methylsulfamoyl, dimethylsulfamoyl, and phenylsulfamoyl), carbamoyl groups (preferably $C_{1-30}$, more preferably $C_{1-20}$, especially preferably $C_{1-12}$ carbamoyl groups such as carbamoyl, methylcarbamoyl, diethylcarbamoyl, and phenylcarbamoyl), alkylthio groups (preferably $C_{1-30}$, more preferably $C_{1-20}$, especially preferably $C_{1-12}$ alkylthio groups such as methylthio and ethylthio), arylthio groups (preferably $C_{6-30}$, more preferably $C_{6-20}$, especially preferably $C_{6-12}$ arylthio groups such as phenylthio), heterocyclic thio groups (preferably $C_{1-30}$, more preferably $C_{1-20}$, especially preferably $C_{1-12}$ heterocyclic thio groups such as pyridylthio, 2-benzimidazolylthio, 2-benzoxazolylthio, and 2-benzthiazolylthio), sulfonyl groups (preferably $C_{1-30}$, more preferably $C_{1-20}$, especially preferably $C_{1-12}$ sulfonyl groups such as mesyl and tosyl), sulfinyl groups (preferably $C_{1-30}$, more preferably $C_{1-20}$, especially preferably $C_{1-12}$ sulfinyl groups such as methanesulfinyl and benzenesulfinyl), ureido groups (preferably $C_{1-30}$, more preferably $C_{1-20}$, especially preferably $C_{1-12}$ ureido groups such as ureido, methylureido, and phenylureido), phosphoric acid amide groups (preferably $C_{1-30}$, more preferably $C_{1-20}$, especially preferably $C_{1-12}$ phosphoric acid amide groups such as diethylphosphoric acid amide and phenylphosphoric acid amide), a hydroxy group, a mercapto group, halogen atoms (such as fluorine, chlorine, bromine, and iodine atoms), a cyano group, a sulfo group, a carboxyl group, a nitro group, a hydroxamic acid group, a sulfino group, a hydrazino group, an imino group, heterocyclic groups (that includes aromatic hetero cyclic groups and that are preferably $C_{1-30}$, more preferably $C_{1-12}$ heterocyclic groups having, as a heteroatom, a nitrogen atom, an oxygen atom, a sulfur atom, a phosphorus atom, a silicon atom, a selenium atom, or a tellurium atom and specifically include pyridyl, pyrazinyl, pyrimidyl, pyridazinyl, pyrrolyl, pyrazolyl, triazolyl, imidazolyl, oxazolyl, thiazolyl, isoxazolyl, isothiazolyl, quinolyl, furyl, thienyl, selenophenyl, tellurophenyl, piperidyl, piperidino, morpholino, pyrrolidyl, pyrrolidino, benzoxazolyl, benzimidazolyl, benzothiazolyl, carbazolyl, azepinyl, and silolyl), silyl groups (preferably $C_{3-40}$, more preferably $C_{3-30}$, especially preferably $C_{3-24}$ silyl groups such as trimethylsilyl and triphenylsilyl), silyloxy groups (preferably $C_{3-40}$, more preferably $C_{3-30}$, especially preferably $C_{3-24}$ silyloxy groups such as trimethylsilyloxy and triphenylsilyloxy), and phosphoryl groups (such as diphenylphosphoryl and dimethylphosphoryl). These substituents may be substituted with another substituent and examples of the another substituent include those selected from the substituent group A.

(Substituent Group B)

Substituent group B includes alkyl groups (preferably $C_{1-30}$, more preferably $C_{1-20}$, especially preferably $C_{1-10}$ alkyl groups such as methyl, ethyl, isopropyl, tert-butyl, n-octyl, n-decyl, n-hexadecyl, cyclopropyl, cyclopentyl, and cyclohexyl), alkenyl groups (preferably $C_{2-30}$, more preferably $C_{2-20}$, especially preferably $C_{2-10}$ alkenyl groups such as vinyl, allyl, 2-butenyl, and 3-pentenyl), alkynyl groups (preferably $C_{2-30}$, more preferably $C_{2-20}$, especially preferably $C_{2-10}$ alkynyl groups such as propargyl and 3-pentynyl), aryl groups (preferably $C_{6-30}$, more preferably $C_{6-20}$, especially preferably $C_{6-12}$ aryl groups such as phenyl, p-methylphenyl, naphthyl, and anthranyl), a cyano group, heterocyclic groups (that include aromatic heterocyclic groups, are preferably $C_{1-30}$, more preferably $C_{1-12}$ heterocyclic groups having, as a heteroatom, a nitrogen atom, an oxygen atom, a sulfur atom, a phosphorus atom, a silicon atom, a selenium atom, or a tellurium atom, and specifically include pyridyl, pyrazinyl, pyrimidyl, pyridazinyl, pyrrolyl, pyrazolyl, triazolyl, imidazolyl, oxazolyl, thiazolyl, isoxazolyl, isothiazolyl, quinolyl, furyl, thienyl, selenienyl, tellurienyl, piperidyl, piperidino, morpholino, pyrrolidyl, pyrrolidino, benzoxazolyl, benzimidazolyl, benzothiazolyl, carbazolyl, azepinyl, and silolyl).

In the specification, "the number of carbon atoms" of the substituent such as alkyl group includes the number of carbon atoms of another substituent in the case where the substituent such as alkyl group may be substituted with the another substituent.

The compound represented by the formula (I) is preferably a compound represented by the formula (II). The compound represented by the formula (II) will next be described.

(II)

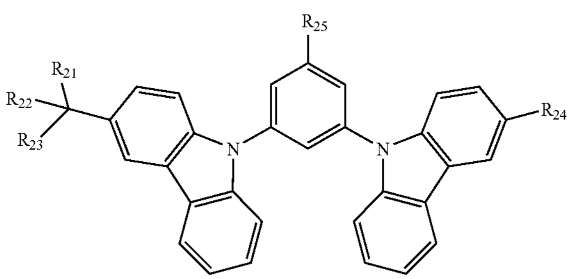

(in the formula (II), $R_{21}$, $R_{22}$, and $R_{23}$ each independently represents a $C_{1-6}$ alkyl group, $R_{24}$ represents a hydrogen atom or —$C(R_{26})(R_{27})R_{28}$ in which $R_{26}$, $R_{27}$, and $R_{28}$ each independently represents a $C_{1-6}$ alkyl group, $R_{25}$ represents a hydrogen atom, a substituted or unsubstituted alkyl group, a cyano group, a substituted or unsubstituted aryl group, or a substituted or unsubstituted heteroaryl group).

$R_{21}$, $R_{22}$, $R_{23}$, $R_{25}$, $R_{26}$, $R_{27}$, and $R_{28}$ have the same meanings as $R_{11}$, $R_{12}$, $R_{13}$, $R_{15}$, $R_{16}$, $R_{17}$, and $R_{18}$ in the formula (I) and the preferred ranges of them are also the same.

The compound represented by the formula (II) is preferably a compound represented by the formula (III). The compound represented by the formula (III) will next be described.

(III)

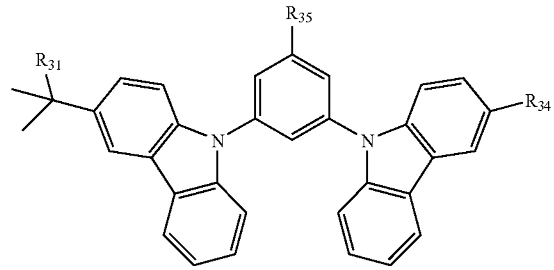

(in the formula (III), $R_{31}$ represents a $C_{1-6}$ alkyl group, $R_{34}$ represents a hydrogen atom or —$C(CH_3)_2R_{36}$ in which $R_{36}$ represents a $C_{1-6}$ alkyl group, $R_{35}$ represents a hydrogen atom, a substituted or unsubstituted alkyl group, a cyano group, a substituted or unsubstituted aryl group, or a substituted or unsubstituted heteroaryl group).

$R_{31}$, $R_{35}$, and $R_{36}$ have the same meanings as $R_{11}$, $R_{15}$, and $R_{16}$ in the formula (I) and the preferred ranges of them are also the same.

The compound represented by the formula (III) is preferably a compound represented by the formula (IV). The compound represented by the formula (IV) will next be described.

(IV)

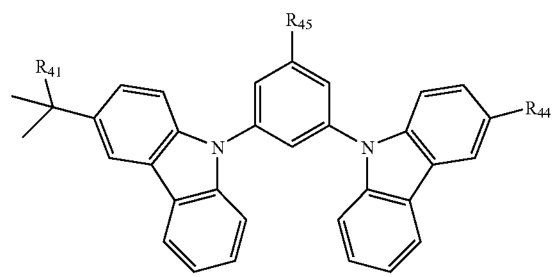

(in the formula (IV), $R_{41}$ represents a methyl or ethyl group, $R_{44}$ represents a hydrogen atom or —$C(CH_3)_2R_{46}$ in which $R_{46}$ represents a methyl or ethyl group, $R_{45}$ represents a hydrogen atom, a substituted or unsubstituted alkyl group, a cyano group, a substituted or unsubstituted aryl group, or a substituted or unsubstituted heteroaryl group).

$R_{45}$ has the same meaning as $R_{15}$ in the formula (I) and the preferred range of it is also the same.

The compound represented by the formula (IV) is preferably a compound represented by the formula (V). The compound represented by the formula (V) will next be described.

(V)

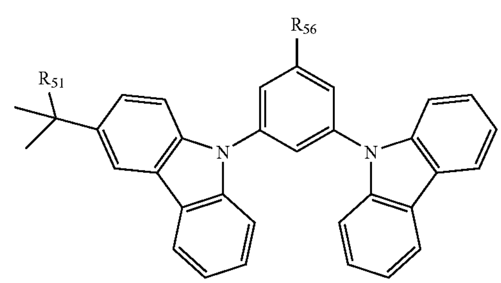

(in the formula (V), $R_{51}$ represents a methyl or ethyl group, $R_{55}$ represents a hydrogen atom, a substituted or unsubstituted alkyl group, a cyano group, a substituted or unsubstituted aryl group, or a substituted or unsubstituted heteroaryl group).

$R_{55}$ has the same meaning as $R_{15}$ in the formula (I) and the preferred range of it is also the same.

In another preferred mode, the compound represented by the formula (I) is a compound represented by the formula (VII). The compound represented by the formula (VII) will next be described.

(VII)

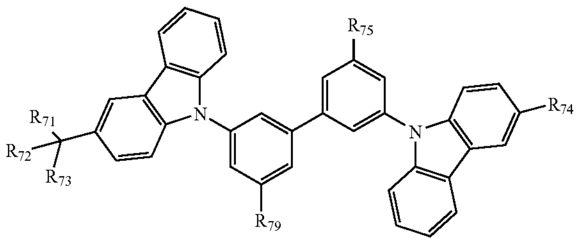

(in the formula (VII), $R_{71}$, $R_{72}$, and $R_{73}$ each independently represents a $C_{1-6}$ alkyl group, $R_{74}$ represents a hydrogen atom or —$C(R_{76})(R_{77})R_{78}$ in which $R_{76}$, $R_{77}$, and $R_{78}$ each independently represents a $C_{1-6}$ alkyl group, $R_{75}$ and $R_{79}$ each independently represents a hydrogen atom, a substituted or unsubstituted alkyl group, a cyano group, a substituted or unsubstituted aryl group, or a substituted or unsubstituted heteroaryl group).

$R_{71}$, $R_{72}$, $R_{73}$, $R_{76}$, $R_{77}$, and $R_{78}$ have the same meanings as $R_{11}$, $R_{12}$, $R_{13}$, $R_{16}$, $R_{17}$, and $R_{18}$ in the formula (I) and the preferred ranges of them are also the same.

$R_{75}$ and $R_{79}$ have the same meanings as $R_{15}$ in the formula (I) and the preferred ranges of them are also the same.

The compound represented by the formula (VII) is preferably a compound represented by the formula (VIII). The compound represented by the formula (VIII) will next be described.

(VIII)

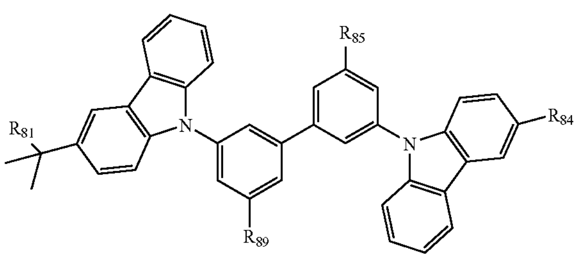

(in the formula (VIII), $R_{81}$ represents a $C_{1-6}$ alkyl group, $R_{84}$ represents a hydrogen atom or —$C(CH_3)_2R_{86}$ in which $R_{86}$ represents a $C_{1-6}$ alkyl group, $R_{85}$ and $R_{89}$ each independently represents a hydrogen atom, a substituted or unsubstituted alkyl group, a cyano group, a substituted or unsubstituted aryl group, or a substituted or unsubstituted heteroaryl group).

$R_{81}$, $R_{86}$, and $R_{88}$ have the same meanings as $R_{11}$, $R_{16}$, and $R_{18}$ in the formula (I) and the preferred ranges of them are also the same.

$R_{85}$ and $R_{89}$ have the same meanings as $R_{15}$ in the formula (I) and the preferred ranges of them are also the same.

The compound represented by the formula (VIII) is preferably a compound represented by the formula (IX). The compound represented by the formula (IX) will next be described.

(IX)

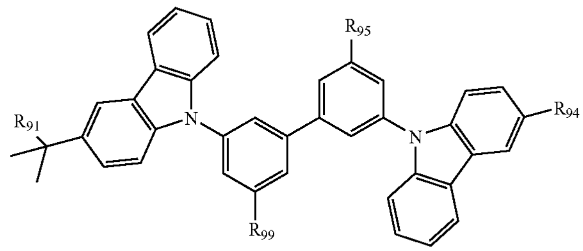

(in the formula (IX), $R_{91}$ represents a methyl or ethyl group, $R_{94}$ represents a hydrogen atom or —$C(CH_3)_2R_{96}$ in which $R_{96}$ represents a methyl or ethyl group, $R_{95}$ and $R_{99}$ each independently represents a hydrogen atom, a substituted or unsubstituted alkyl group, a cyano group, a substituted or unsubstituted aryl group, or a substituted or unsubstituted heteroaryl group).

$R_{95}$ and $R_{99}$ have the same meanings as $R_{15}$ in the formula (I) and the preferred ranges of them are also the same.

The compound represented by the formula (IX) is preferably a compound represented by the formula (X). The compound represented by the formula (X) will next be described.

(X)

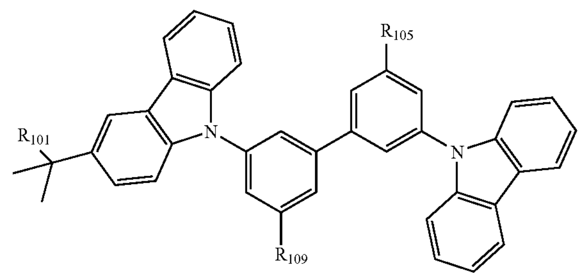

(in the formula (X), $R_{101}$ represents a methyl or ethyl group, $R_{105}$ and $R_{109}$ each independently represents a hydrogen atom, a substituted or unsubstituted alkyl group, a cyano group, a substituted or unsubstituted aryl group, or a substituted or unsubstituted heteroaryl group).

$R_{105}$ and $R_{109}$ have the same meanings as $R_{15}$ in the formula (I) and the preferred ranges of them are also the same.

In the invention, the compound represented by the formula (I) is also preferably a compound represented by the following formula (Ia):

(Ia)

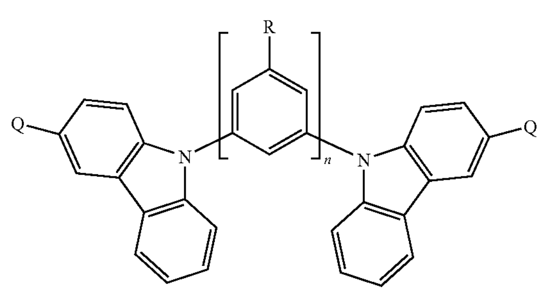

(in the formula (Ia), Qs each independently represents a t-butyl group or a trimethylsilyl group, when a plurality of Rs are present, they each independently represents a hydrogen atom, an alkyl group, a cyano group, an aryl group, or a heteroaryl group, and n stands for 1 or 2).

The compound represented by the formula (Ia) is also preferably a compound represented by the following formula (IIa):

(IIa)

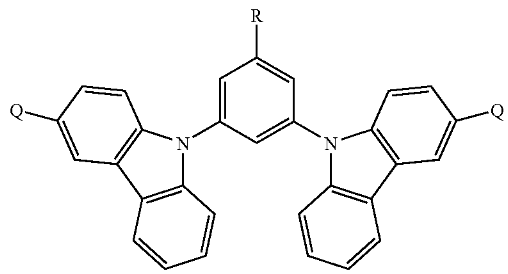

(in the formula (IIa), Qs each independently represents a t-butyl group or a trimethylsilyl group and R represents a hydrogen atom, an alkyl group, a cyano group, an aryl group, or a heteroaryl group).

The compound represented by the formula (IIa) is preferably a compound represented by the following formula (IIIa):

(IIIa)

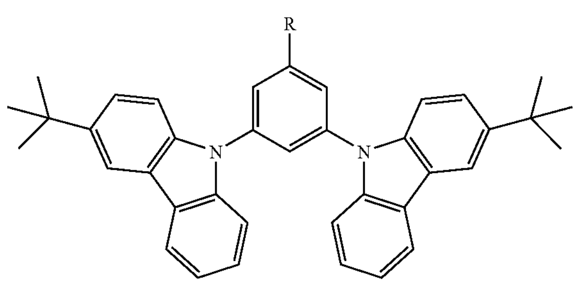

(in the formula (IIIa), R represents a hydrogen atom, an alkyl group, a cyano group, an aryl group, or a heteroaryl group).

The compound represented by the formula (Ia) is preferably a compound represented by the following formula (IVa):

(IVa)

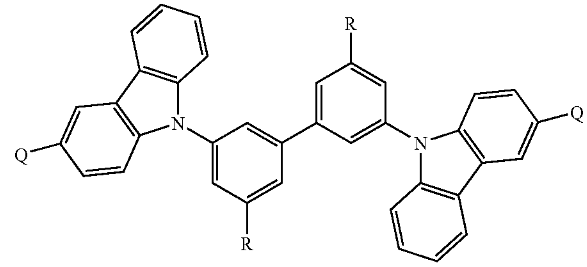

(in the formula (IVa), Qs each independently represents a t-butyl group or a trimethylsilyl group and Rs each independently represents a hydrogen atom, an alkyl group, a cyano group, an aryl group, or a heteroaryl group).

The compound represented by the formula (IVa) is preferably a compound represented by the following formula (Va):

(Va)

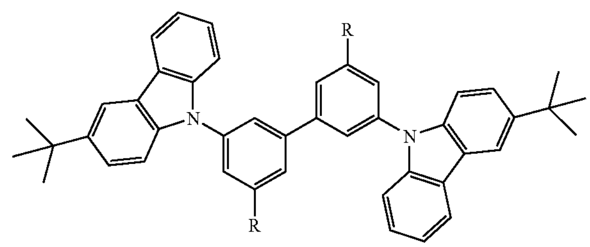

(in the formula (Va), Rs each independently represents a hydrogen atom, an alkyl group, a cyano group, an aryl group, or a heteroaryl group).

Although the compounds represented by the formulae (I) to (X) and (Ia) to (Va) in the invention may be a low molecular weight compound, a high molecular weight compound having a residue connected to the main chain of the polymer, or a high molecular weight compound having in the main chain thereof the compound of the invention represented by the formula (I), they may be preferably a low molecular weight compound. The molecular weight of the compounds represented by the formulae (I) to (X) and (Ia) to (Va) is preferably from 450 to 1200, more preferably from 500 to 1100, still more preferably from 500 to 900.

The following are specific examples of the compounds represented by the formulae (I) to (X) and (Ia) to (Va) in the invention, but the invention is not limited by them.

A-1

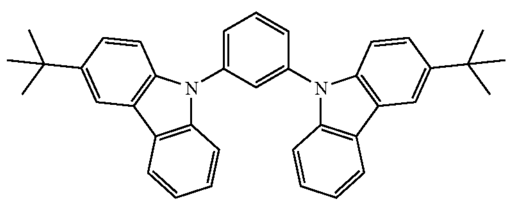

A-2

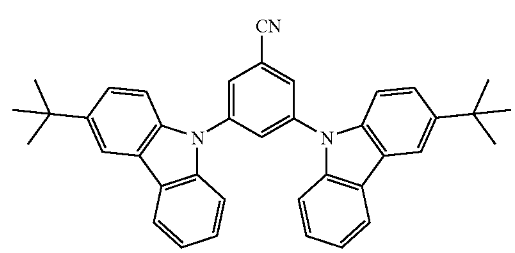

-continued
A-3
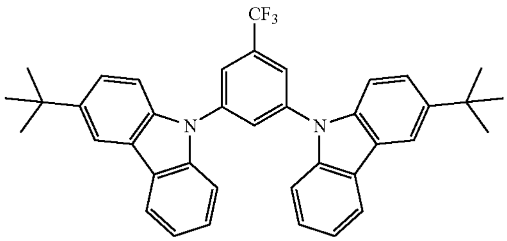
A-4
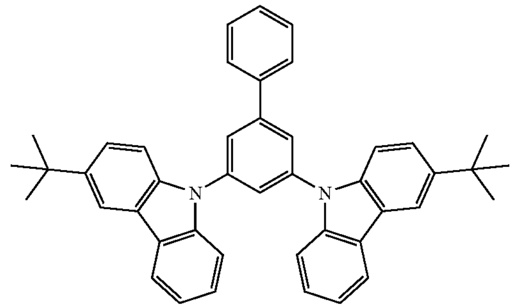
A-5
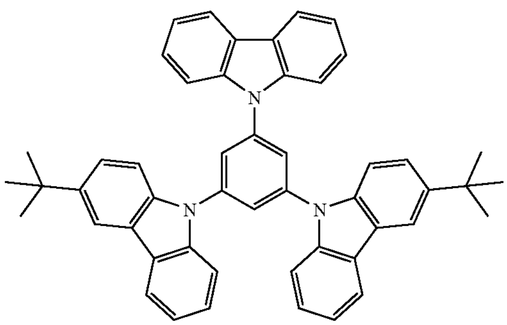
A-6
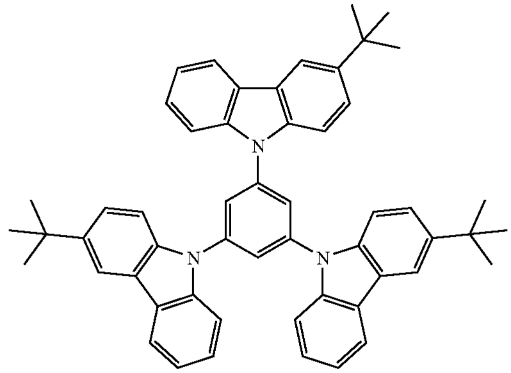
A-7
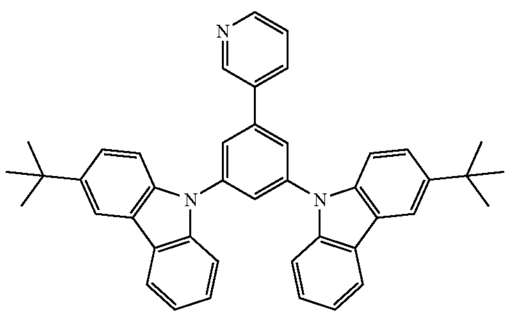
A-8
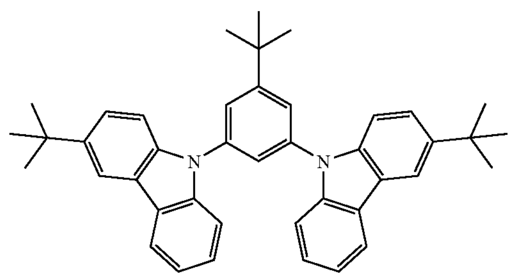
A-9
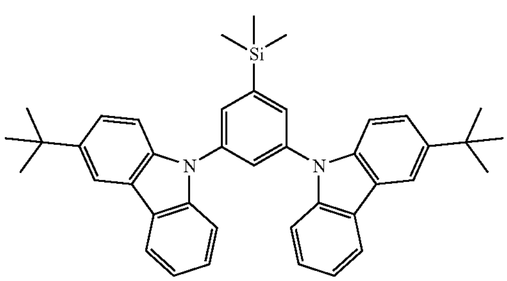
A-10
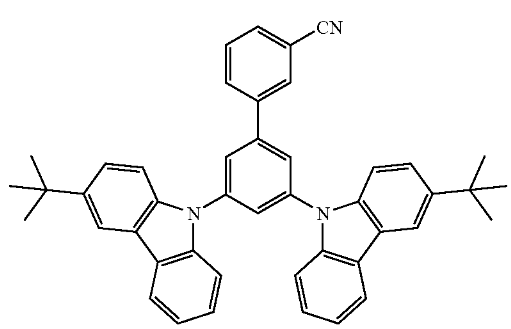

-continued
A-11
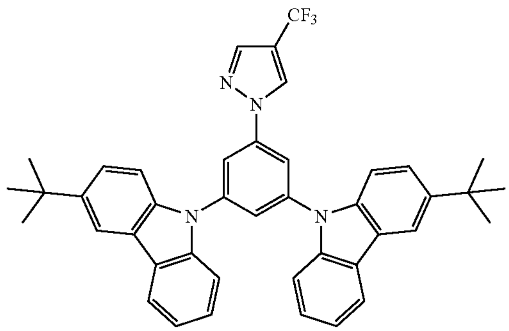
A-12
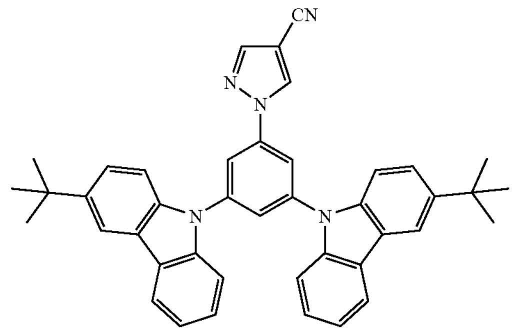
B-1
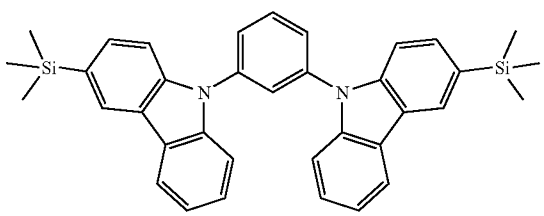
B-2
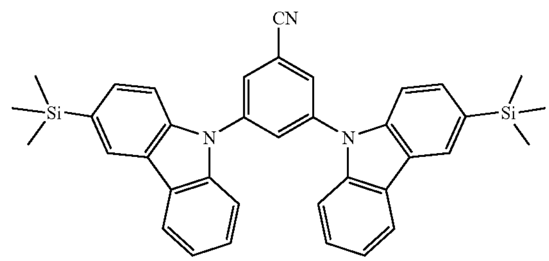
B-3
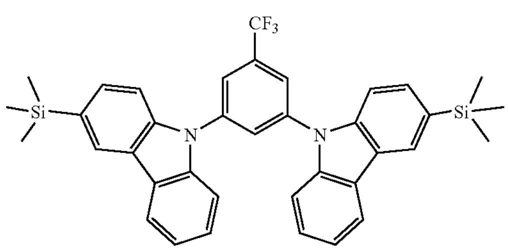
B-4
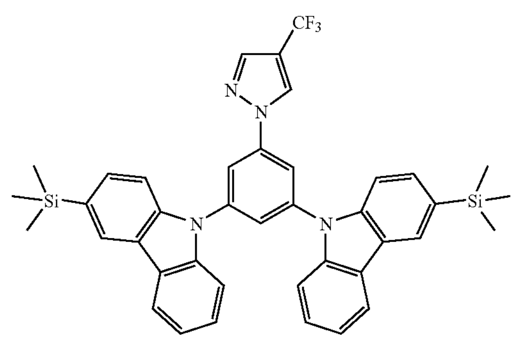
B-5
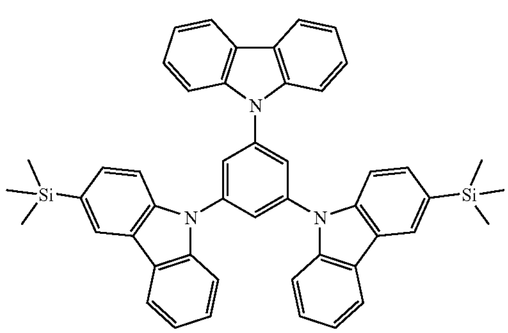
B-6
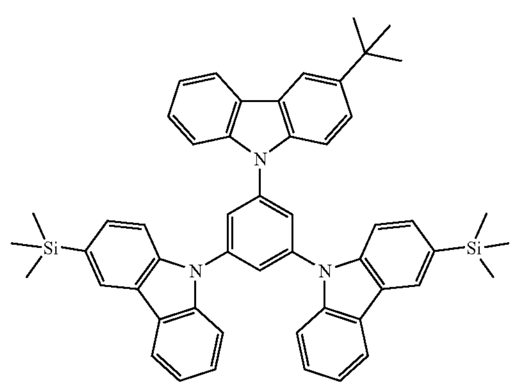

-continued
B-7
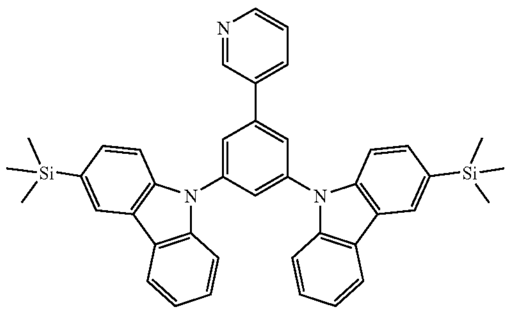
B-8
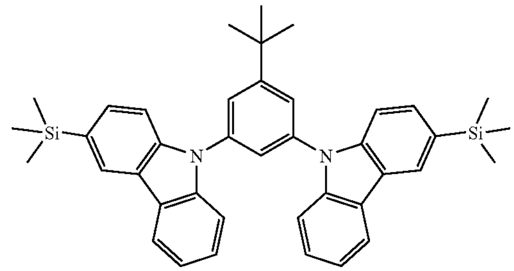
B-9
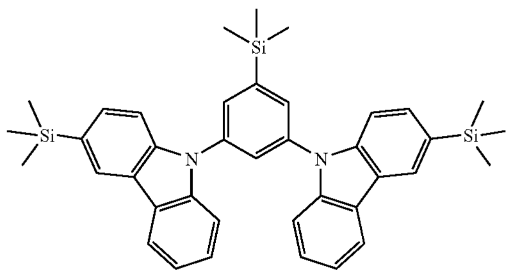
B-10
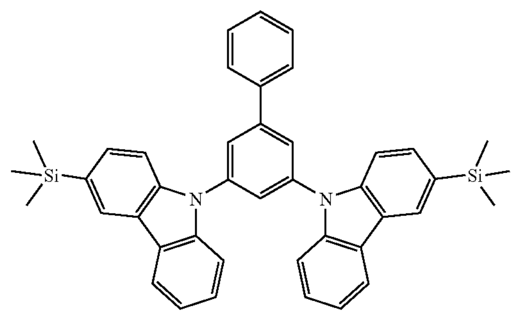
B-11
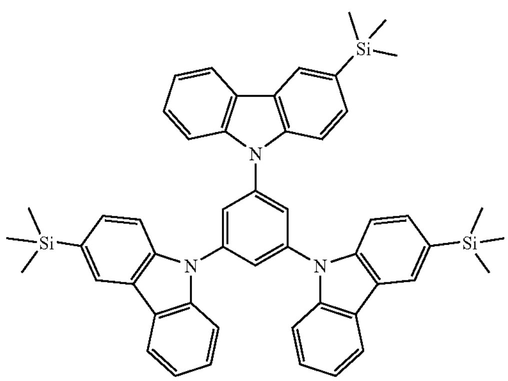
B-12
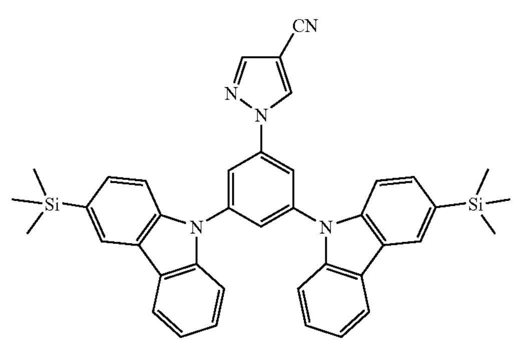
C-1
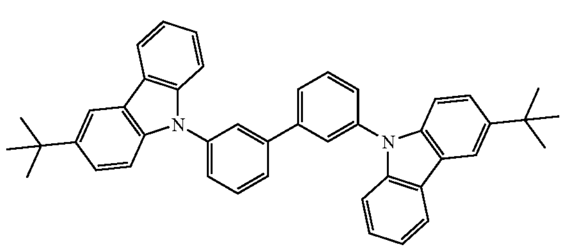
C-2
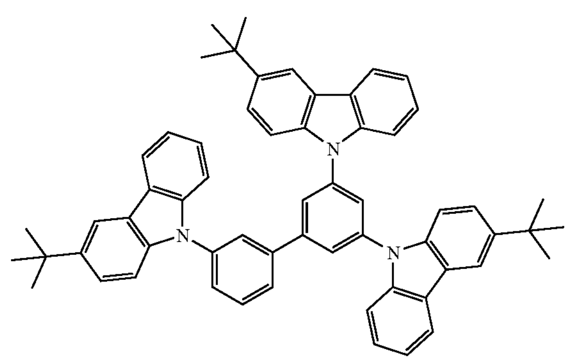

-continued
C-3
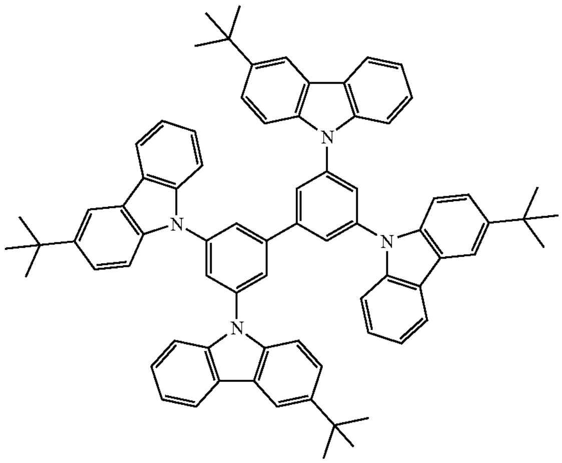
C-4
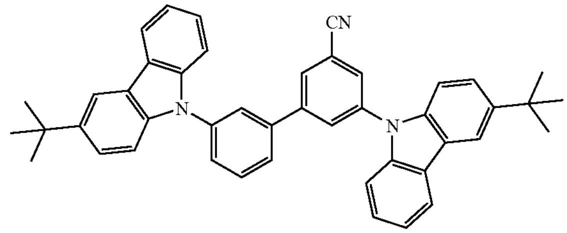
C-5
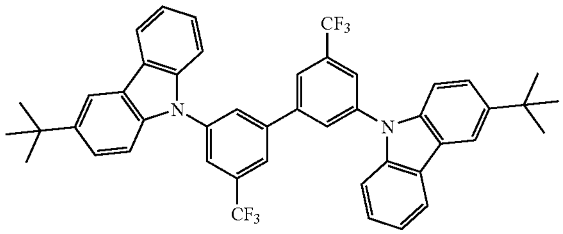
C-6
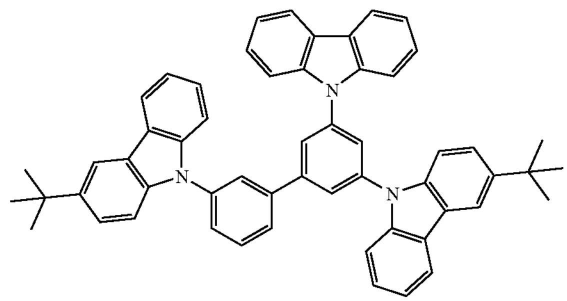
C-7
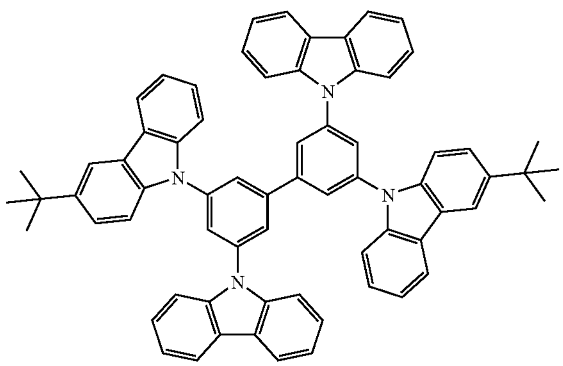
C-8
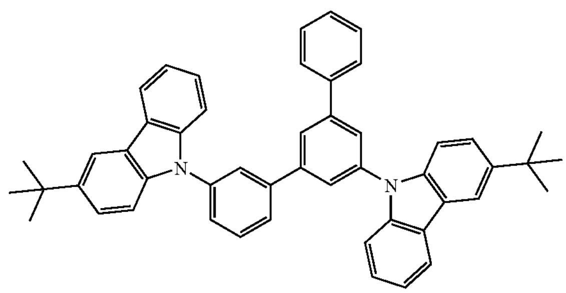
C-9
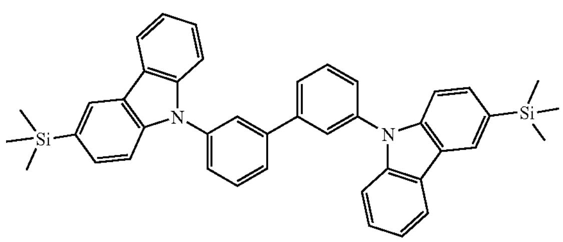
C-10
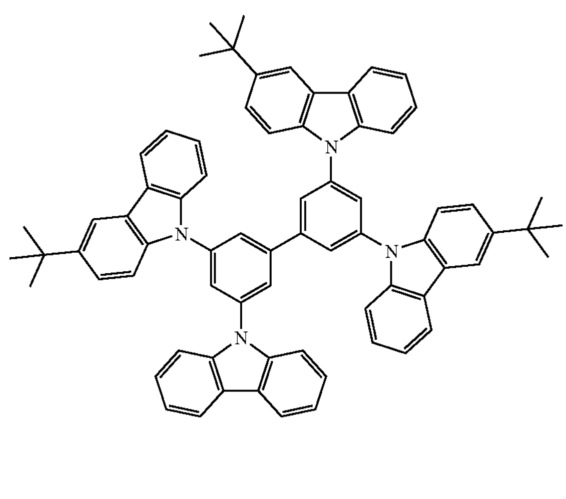

-continued
C-11
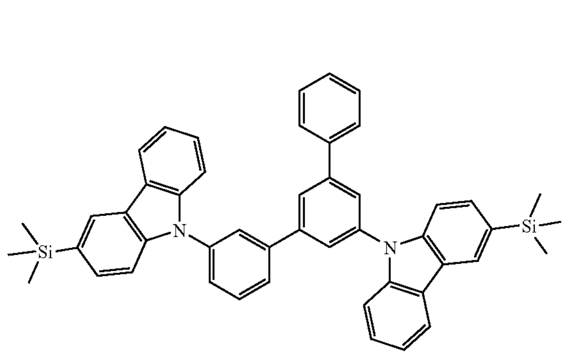
C-12
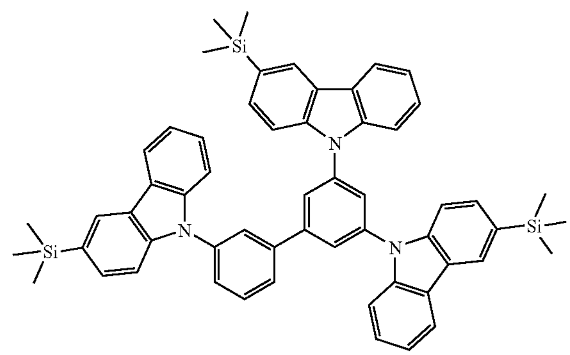
C-13
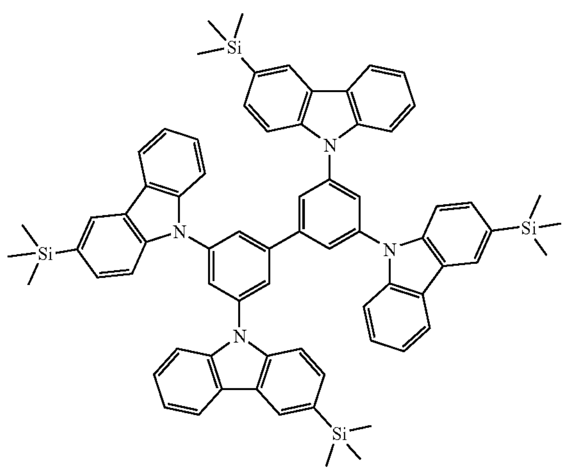
C-14
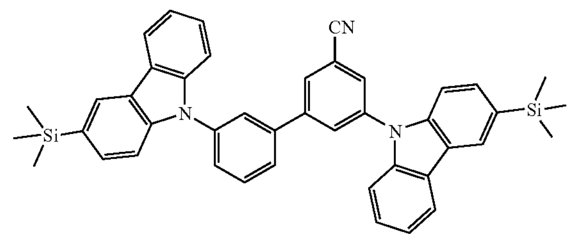
C-15
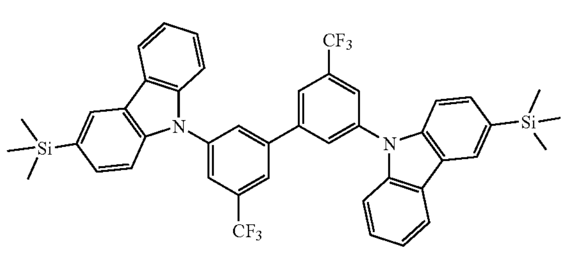
C-16
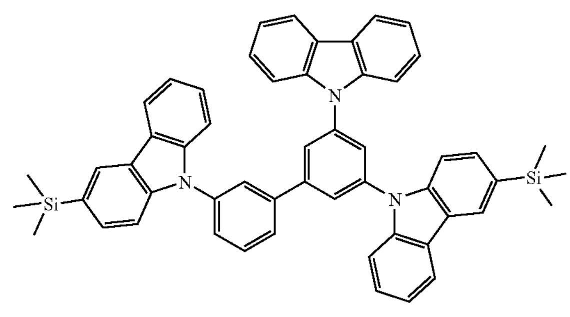
E-1
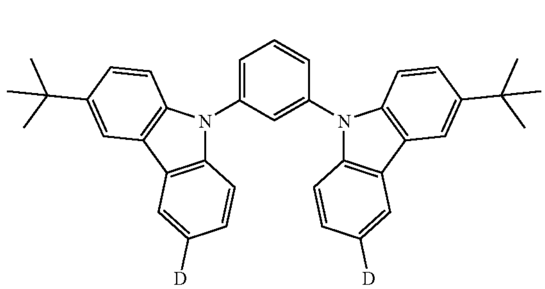
E-2
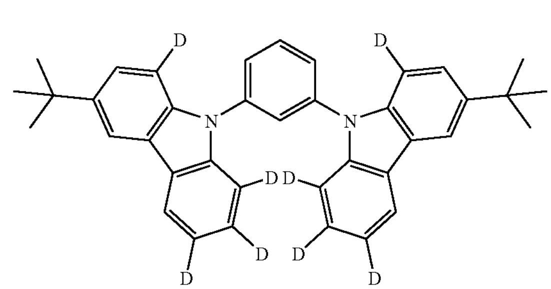

-continued
E-3
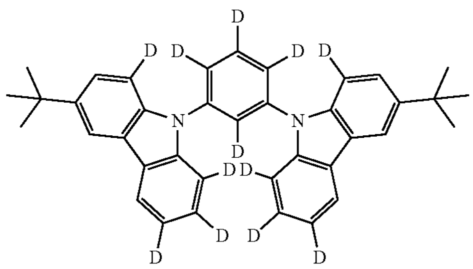
E-4
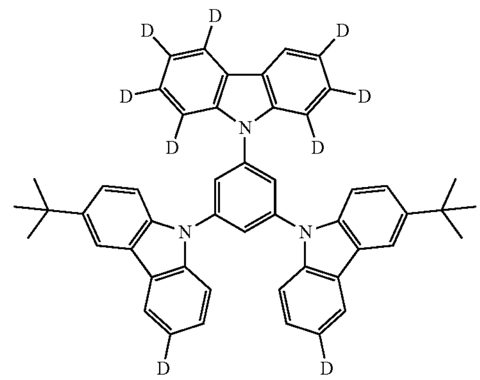
E-5
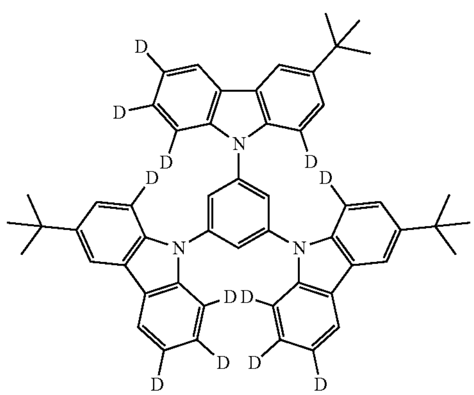
E-6
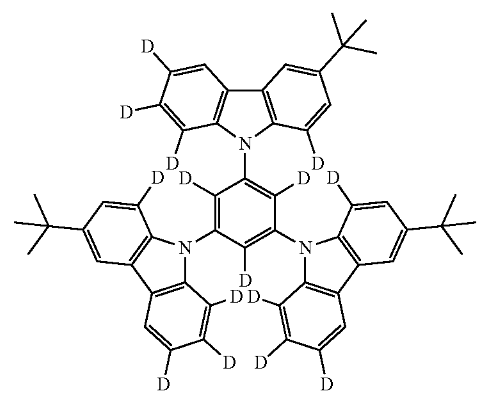
E-7
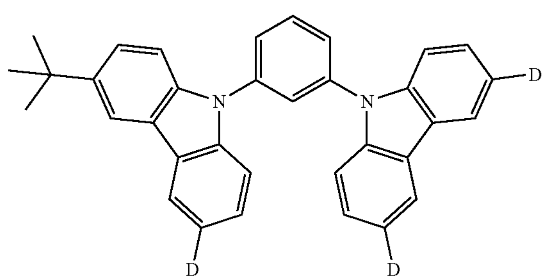
E-8
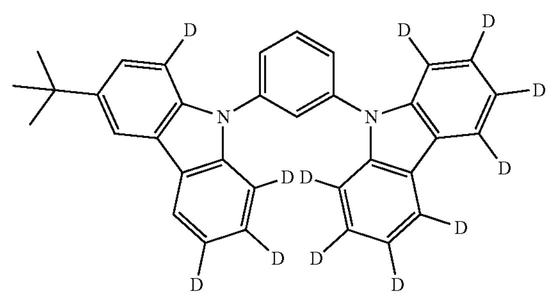
E-9
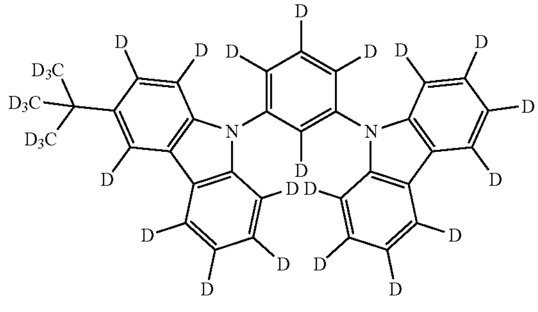
E-10
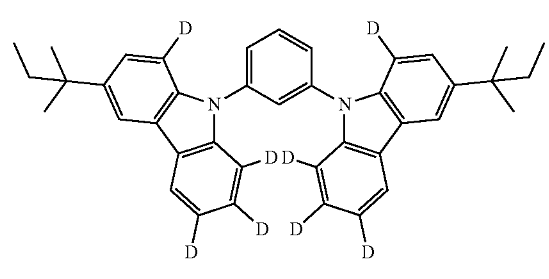

-continued
E-11
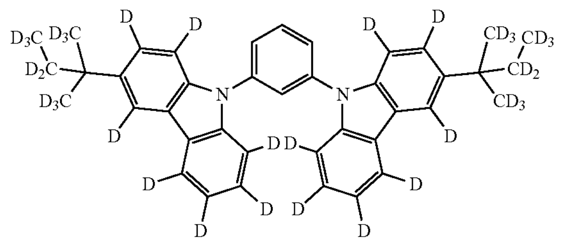
E-12
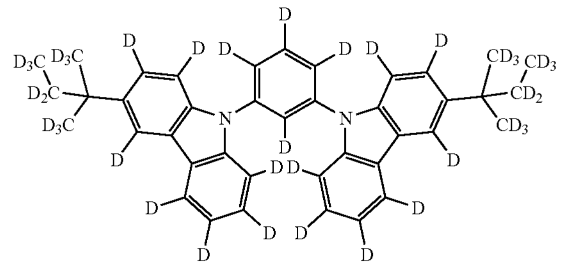
E-13
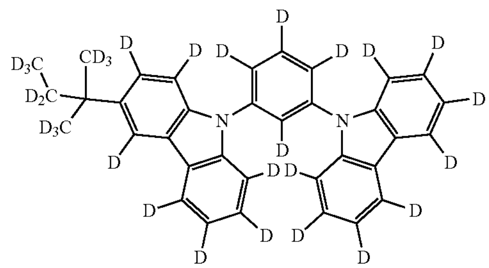
F-1
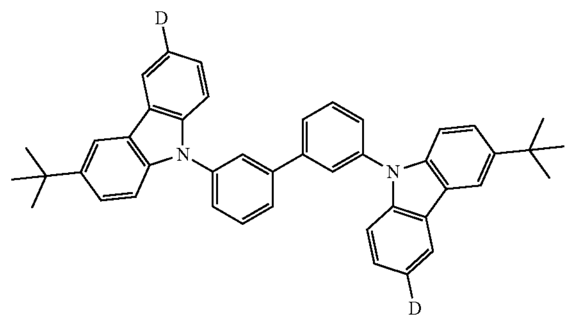
F-2
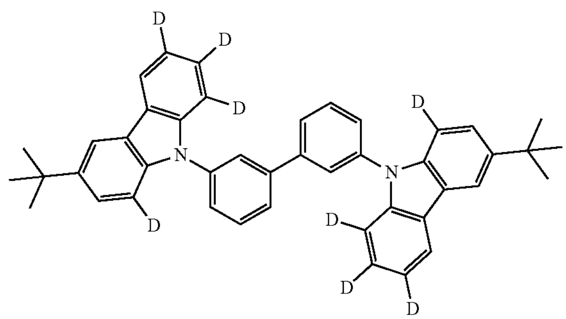
F-3
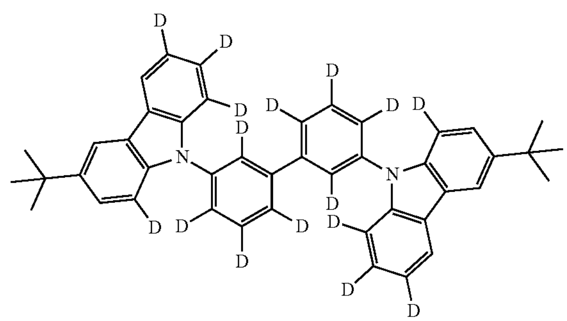
F-4
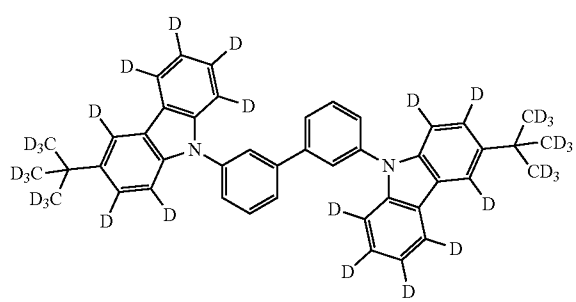
F-5
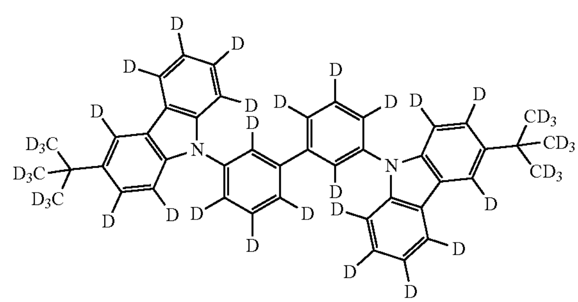
F-6
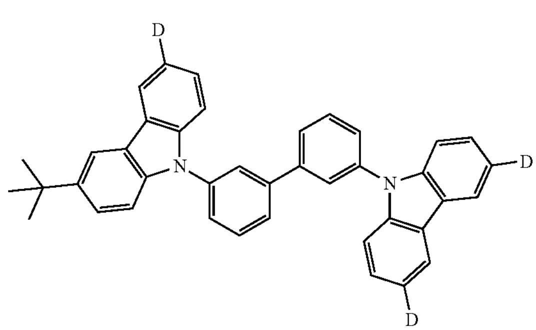
F-7
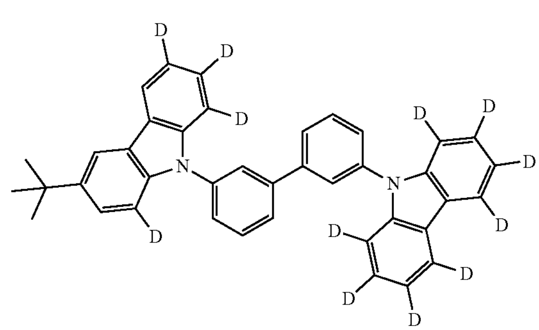

-continued
F-8
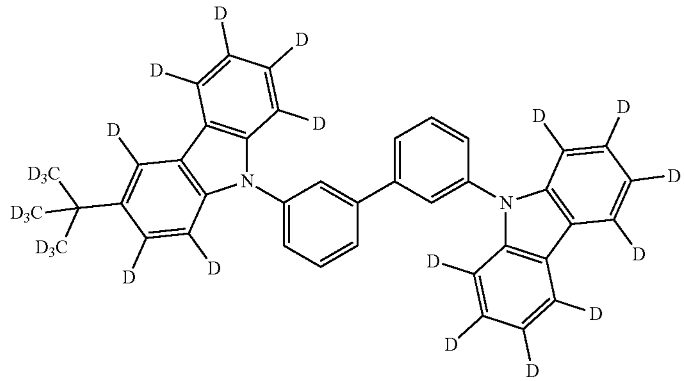
F-9
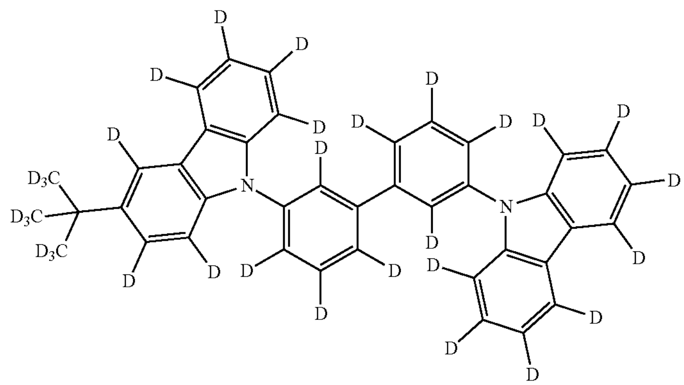
F-10
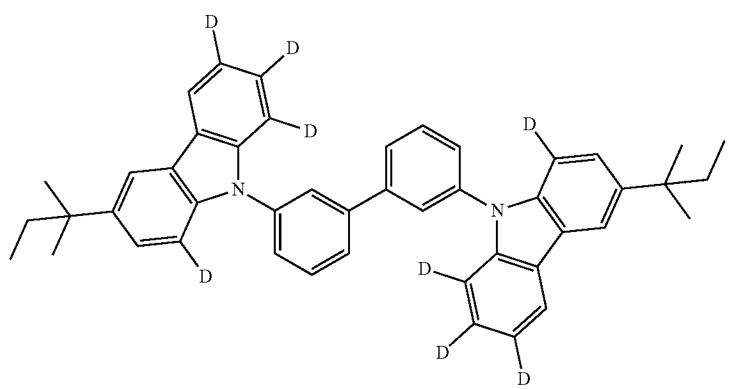
F-11
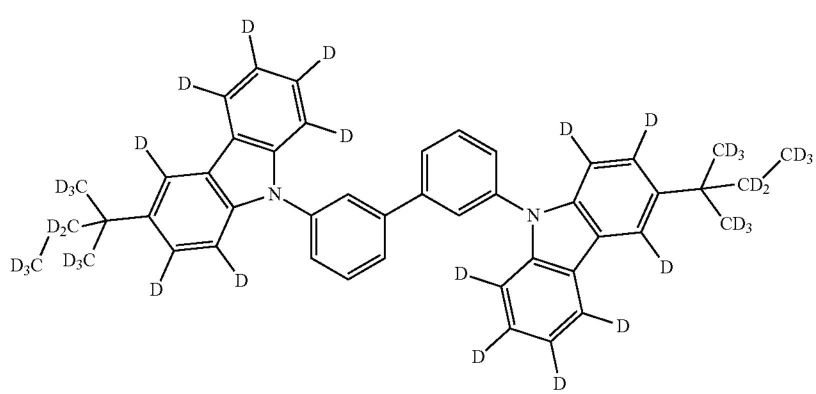

-continued
F-12
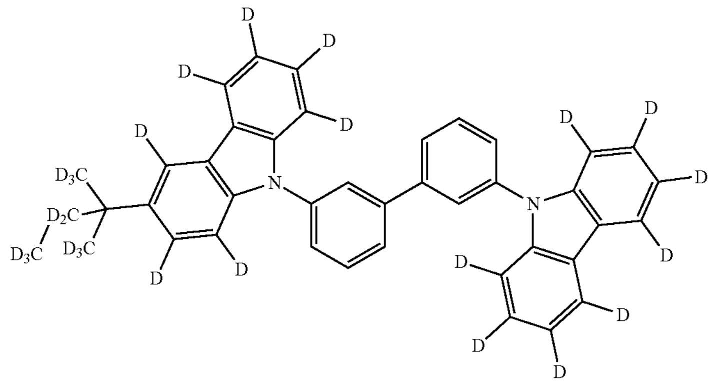
F-13
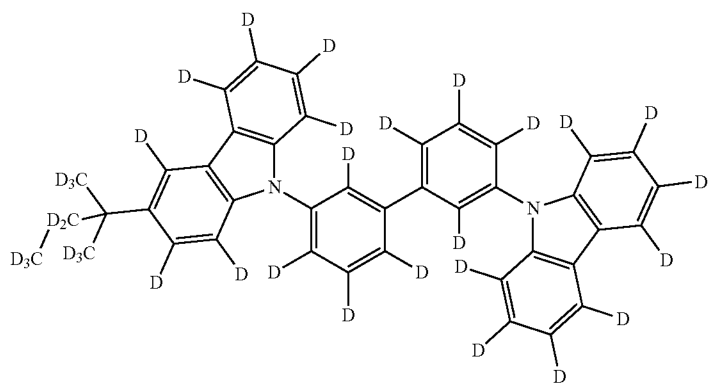
TABLE 1
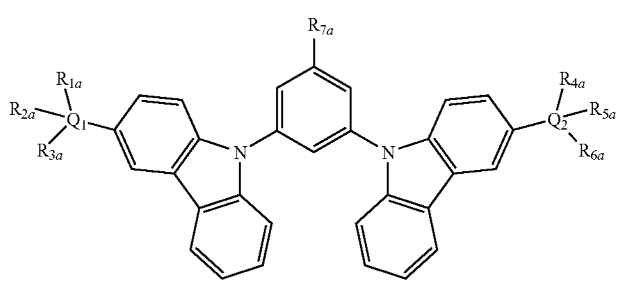
| | Q1 | R1a | R2a | R3a | Q2 | R4a | R5a | R6a | R7a |
|---|---|---|---|---|---|---|---|---|---|
| A-13 | C | Et | Me | Me | C | Et | Me | Me | H |
| A-14 | C | Et | Me | Me | C | Et | Me | Me | CN |
| A-15 | C | Et | Me | Me | C | Et | Me | Me | CF3 |
| A-16 | C | Et | Me | Me | C | Et | Me | Me | Ph |
| A-17 | C | Et | Me | Me | C | Et | Me | Me | 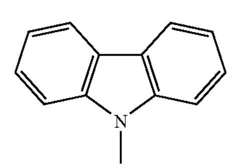 |

TABLE 1-continued
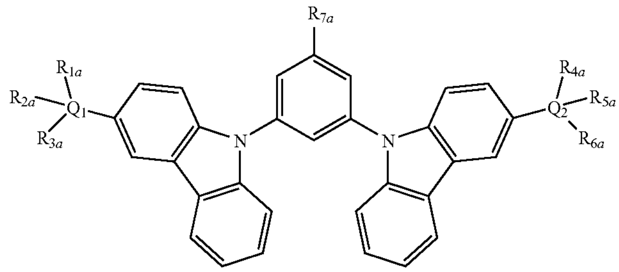
| | Q1 | R1a | R2a | R3a | Q2 | R4a | R5a | R6a | R7a |
|---|---|---|---|---|---|---|---|---|---|
| A-18 | C | Et | Me | Me | C | Et | Me | Me | 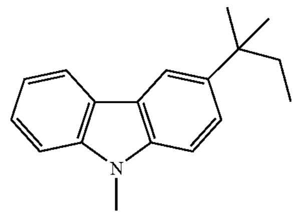 |
| A-19 | C | Et | Me | Me | C | Et | Me | Me | 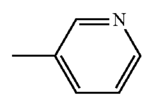 |
| A-20 | C | Et | Me | Me | C | Et | Me | Me | t-Bu |
| A-21 | C | Et | Me | Me | C | Et | Me | Me | SiMe3 |
| A-22 | C | Et | Me | Me | C | Et | Me | Me | 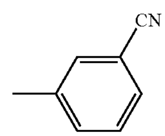 |
| A-23 | C | Et | Me | Me | C | Et | Me | Me | 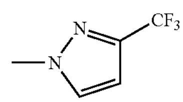 |
| A-24 | C | Et | Me | Me | C | Et | Me | Me | 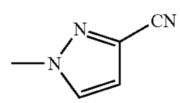 |
| A-25 | C | Et | Me | Me | H | — | — | — | H |
| A-26 | C | Et | Me | Me | H | — | — | — | CN |
| A-27 | C | Et | Me | Me | H | — | — | — | CF3 |
| A-28 | C | Et | Me | Me | H | — | — | — | Ph |
| A-29 | C | Et | Me | Me | H | — | — | — | 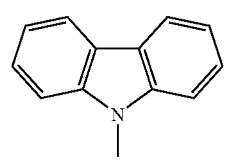 |
| A-30 | C | Et | Me | Me | H | — | — | — | 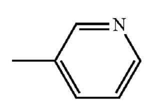 |
| A-31 | C | Et | Me | Me | H | — | — | — | tBu |
| A-32 | C | Et | Me | Me | H | — | — | — | SiMe3 |
| A-33 | C | Et | Me | Me | H | — | — | — | 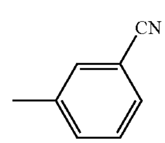 |

TABLE 1-continued
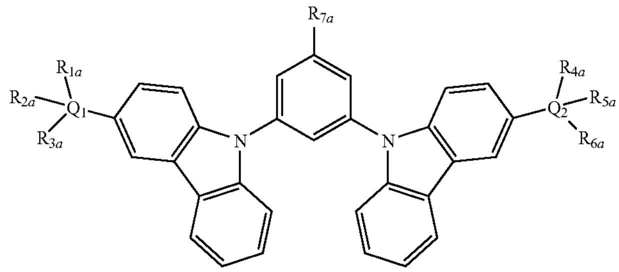
| | Q1 | R1a | R2a | R3a | Q2 | R4a | R5a | R6a | R7a |
|---|---|---|---|---|---|---|---|---|---|
| A-34 | C | Et | Me | Me | H | — | — | — | 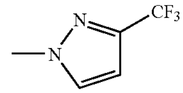 |
| A-35 | C | Et | Me | Me | H | — | — | — | 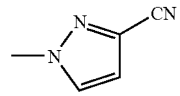 |
| A-36 | C | Me | Me | Me | H | — | — | — | H |
| A-37 | C | Me | Me | Me | H | — | — | — | CN |
| A-38 | C | Me | Me | Me | H | — | — | — | CF3 |
| A-39 | C | Me | Me | Me | H | — | — | — | Ph |
| A-40 | C | Me | Me | Me | H | — | — | — | 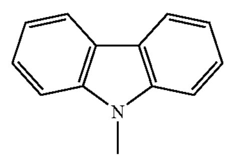 |
| A-41 | C | Me | Me | Me | H | — | — | — | 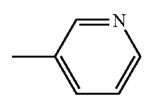 |
| A-42 | C | Me | Me | Me | H | — | — | — | tBu |
| A-43 | C | Me | Me | Me | H | — | — | — | SiMe3 |
| A-44 | C | Me | Me | Me | H | — | — | — | 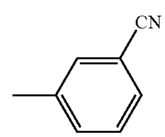 |
| A-45 | C | Me | Me | Me | H | — | — | — | 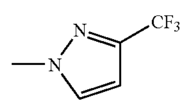 |
| A-46 | C | Me | Me | Me | H | — | — | — | 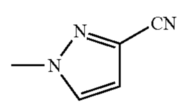 |
| A-47 | C | n-Pr | Me | Me | C | n-Pr | Me | Me | H |
| A-48 | C | n-Pr | Me | Me | C | n-Pr | Me | Me | CN |
| A-49 | C | n-Pr | Me | Me | C | n-Pr | Me | Me | 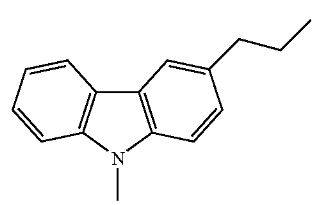 |
| A-50 | C | n-Pr | Me | Me | H | — | — | — | H |
| A-51 | C | n-Pr | Me | Me | H | — | — | — | Ph |

TABLE 1-continued

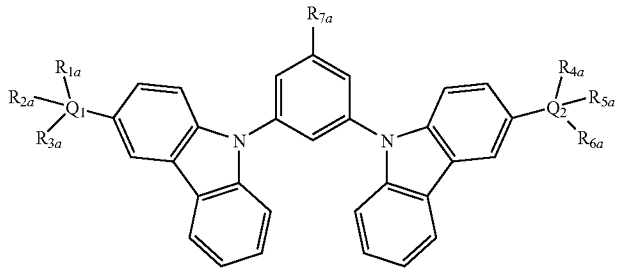

| | Q1 | R1a | R2a | R3a | Q2 | R4a | R5a | R6a | R7a |
|---|---|---|---|---|---|---|---|---|---|
| A-52 | C | n-Pr | Me | Me | H | — | — | — | tBu |
| A-53 | C | iso-Pr | Me | Me | C | iso-Pr | Me | Me | H |
| A-54 | C | iso-Pr | Me | Me | C | iso-Pr | Me | Me | 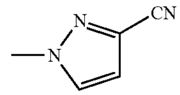 |
| A-55 | C | iso-Pr | Me | Me | C | iso-Pr | Me | Me | SiMe3 |
| A-56 | C | iso-Pr | Me | Me | H | — | — | — | H |
| A-57 | C | iso-Pr | Me | Me | H | — | — | — | Ph |
| A-58 | C | iso-Pr | Me | Me | H | — | — | — | CN |
| A-59 | C | n-Bu | Me | Me | C | n-Bu | Me | Me | H |
| A-60 | C | n-Bu | Me | Me | C | n-Bu | Me | Me | 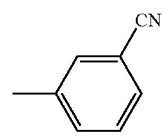 |
| A-61 | C | n-Bu | Me | Me | C | n-Bu | Me | Me | CF3 |
| A-62 | C | n-Bu | Me | Me | H | — | — | — | H |
| A-63 | C | n-Bu | Me | Me | H | — | — | — | SiMe3 |
| A-64 | C | n-Bu | Me | Me | H | — | — | — | CF3 |
| A-65 | C | sec-Bu | Me | Me | C | sec-Bu | Me | Me | H |
| A-66 | C | sec-Bu | Me | Me | C | sec-Bu | Me | Me | 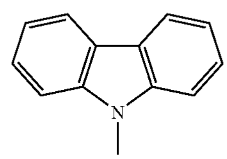 |
| A-67 | C | sec-Bu | Me | Me | C | sec-Bu | Me | Me | tBu |
| A-68 | C | sec-Bu | Me | Me | H | — | — | — | H |
| A-69 | C | sec-Bu | Me | Me | H | — | — | — | 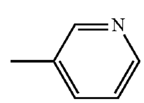 |
| A-70 | C | sec-Bu | Me | Me | H | — | — | — | 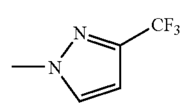 |
| A-71 | C | n-Pentyl | Me | Me | C | n-Pentyl | Me | Me | H |
| A-72 | C | n-Pentyl | Me | Me | C | n-Pentyl | Me | Me | CN |
| A-73 | C | n-Pentyl | Me | Me | C | n-Pentyl | Me | Me | CF3 |
| A-74 | C | n-Pentyl | Me | Me | H | — | — | — | H |
| A-75 | C | n-Pentyl | Me | Me | H | — | — | — | CN |
| A-76 | C | n-Pentyl | Me | Me | H | — | — | — | CF3 |
| A-77 | C | iso-Pentyl | Me | Me | C | iso-Pentyl | Me | Me | H |
| A-78 | C | iso-Pentyl | Me | Me | C | iso-Pentyl | Me | Me | CF3 |
| A-79 | C | iso-Pentyl | Me | Me | C | iso-Pentyl | Me | Me | 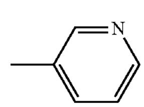 |
| A-80 | C | iso-Pentyl | Me | Me | H | — | — | — | H |

TABLE 1-continued

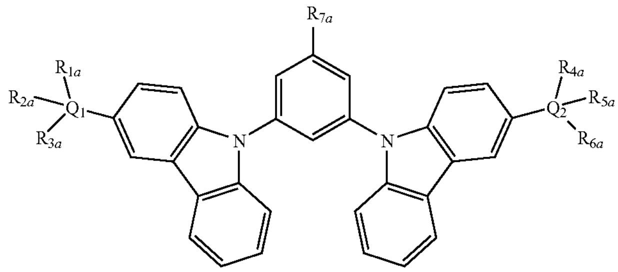

| | Q1 | R1a | R2a | R3a | Q2 | R4a | R5a | R6a | R7a |
|---|---|---|---|---|---|---|---|---|---|
| A-81 | C | iso-Pentyl | Me | Me | H | — | — | — | Ph |
| A-82 | C | iso-Pentyl | Me | Me | H | — | — | — | 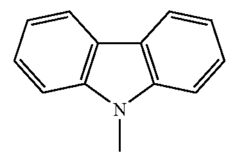 |
| A-83 | C | neo-Pentyl | Me | Me | C | neo-Pentyl | Me | Me | H |
| A-84 | C | neo-Pentyl | Me | Me | C | neo-Pentyl | Me | Me | SiMe3 |
| A-85 | C | neo-Pentyl | Me | Me | C | neo-Pentyl | Me | Me | tBu |
| A-86 | C | neo-Pentyl | Me | Me | H | — | — | — | H |
| A-87 | C | neo-Pentyl | Me | Me | H | — | — | — | tBu |
| A-88 | C | neo-Pentyl | Me | Me | H | — | — | — | CN |
| A-89 | C | n-Hex | Me | Me | C | n-Hex | Me | Me | H |
| A-90 | C | n-Hex | Me | Me | C | n-Hex | Me | Me | CN |
| A-91 | C | n-Hex | Me | Me | C | n-Hex | Me | Me | Ph |
| A-92 | C | n-Hex | Me | Me | H | — | — | — | H |
| A-93 | C | n-Hex | Me | Me | H | — | — | — | tBu |
| A-94 | C | n-Hex | Me | Me | H | — | — | — | Ph |
| A-95 | C | iso-Hex | Me | Me | C | iso-Hex | Me | Me | H |
| A-96 | C | iso-Hex | Me | Me | C | iso-Hex | Me | Me | 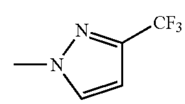 |
| A-97 | C | iso-Hex | Me | Me | C | iso-Hex | Me | Me | tBu |
| A-98 | C | iso-Hex | Me | Me | H | — | — | — | H |
| A-99 | C | iso-Hex | Me | Me | H | — | — | — | 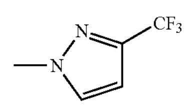 |
| A-100 | C | iso-Hex | Me | Me | H | — | — | — | tBu |
| A-101 | C | cyclohexyl | Me | Me | C | cyclohexyl | Me | Me | H |
| A-102 | C | cyclohexyl | Me | Me | C | cyclohexyl | Me | Me | CN |
| A-103 | C | cyclohexyl | Me | Me | C | cyclohexyl | Me | Me | CF3 |
| A-104 | C | cyclohexyl | Me | Me | H | — | — | — | H |
| A-105 | C | cyclohexyl | Me | Me | H | — | — | — | Ph |
| A-106 | C | cyclohexyl | Me | Me | H | — | — | — | 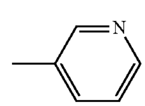 |
| A-107 | C | Et | Et | Et | C | Et | Et | Et | H |
| A-108 | C | Et | Et | Et | C | Et | Et | Et | tBu |
| A-109 | C | Et | Et | Et | C | Et | Et | Et | SiMe3 |
| A-110 | C | Et | Et | Et | H | — | — | — | H |
| A-111 | C | Et | Et | Et | H | — | — | — | tBu |
| A-112 | C | Et | Et | Et | H | — | — | — | SiMe3 |
| A-113 | C | n-Pr | n-Pr | n-Pr | C | n-Pr | n-Pr | n-Pr | H |
| A-114 | C | n-Pr | n-Pr | n-Pr | C | n-Pr | n-Pr | n-Pr | 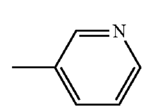 |

TABLE 1-continued

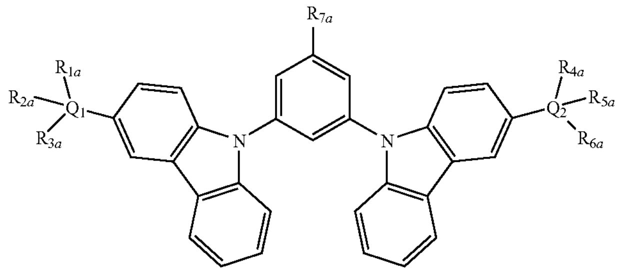

| | Q1 | R1a | R2a | R3a | Q2 | R4a | R5a | R6a | R7a |
|---|---|---|---|---|---|---|---|---|---|
| A-115 | C | n-Pr | n-Pr | n-Pr | C | n-Pr | n-Pr | n-Pr | 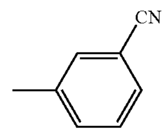 |
| A-116 | C | n-Pr | n-Pr | n-Pr | H | — | — | — | H |
| A-117 | C | n-Pr | n-Pr | n-Pr | H | — | — | — | 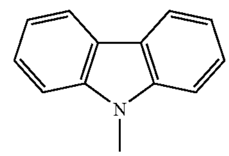 |
| 4-118 | C | n-Pr | n-Pr | n-Pr | H | — | — | — | 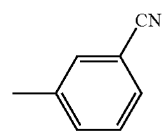 |
| A-119 | C | iso-Pr | iso-Pr | iso-Pr | C | iso-Pr | iso-Pr | iso-Pr | H |
| A-120 | C | iso-Pr | iso-Pr | iso-Pr | C | iso-Pr | iso-Pr | iso-Pr | Ph |
| A-121 | C | iso-Pr | iso-Pr | iso-Pr | C | iso-Pr | iso-Pr | iso-Pr | 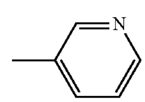 |
| A-122 | C | iso-Pr | iso-Pr | iso-Pr | H | — | — | — | H |
| A-123 | C | iso-Pr | iso-Pr | iso-Pr | H | — | — | — | Ph |
| A-124 | C | iso-Pr | iso-Pr | iso-Pr | H | — | — | — | 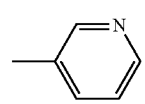 |
| A-125 | C | n-Bu | n-Bu | n-Bu | C | n-Bu | n-Bu | n-Bu | H |
| A-126 | C | n-Bu | n-Bu | n-Bu | C | n-Bu | n-Bu | n-Bu | 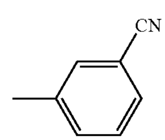 |
| A-127 | C | n-Bu | n-Bu | n-Bu | C | n-Bu | n-Bu | n-Bu | 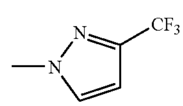 |
| A-128 | C | n-Bu | n-Bu | n-Bu | H | — | — | — | H |
| A-129 | C | n-Bu | n-Bu | n-Bu | H | — | — | — | 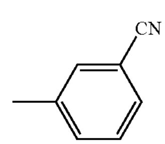 |

TABLE 1-continued

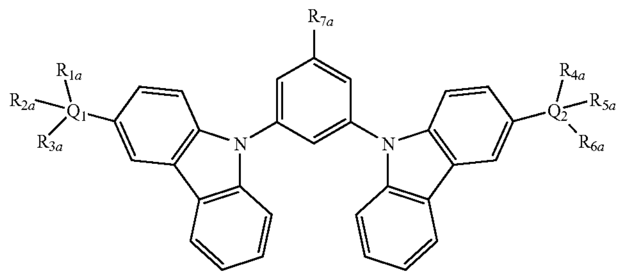

| | Q1 | R1a | R2a | R3a | Q2 | R4a | R5a | R6a | R7a |
|---|---|---|---|---|---|---|---|---|---|
| A-130 | C | n-Bu | n-Bu | n-Bu | H | — | — | — | 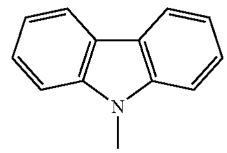 |
| A-131 | C | n-Hex | n-Hex | n-Hex | C | n-Hex | n-Hex | n-Hex | H |
| A-132 | C | n-Hex | n-Hex | n-Hex | C | n-Hex | n-Hex | n-Hex | SiMe3 |
| A-133 | C | n-Hex | n-Hex | n-Hex | C | n-Hex | n-Hex | n-Hex | Ph |
| A-134 | C | n-Hex | n-Hex | n-Hex | H | — | — | — | H |
| A-135 | C | n-Hex | n-Hex | n-Hex | H | — | — | — | tBu |
| A-136 | C | n-Hex | n-Hex | n-Hex | H | — | — | — | 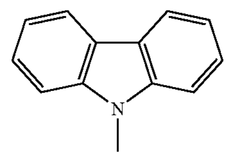 |
| A-137 | C | iso-Pentyl | Et | Me | C | iso-Pentyl | Et | Me | H |
| A-138 | C | iso-Pentyl | Et | Me | C | iso-Pentyl | Et | Me | Ph |
| A-139 | C | iso-Pentyl | Et | Me | C | iso-Pentyl | Et | Me | CN |
| A-140 | C | iso-Pentyl | Et | Me | H | — | — | — | H |
| A-141 | C | iso-Pentyl | Et | Me | H | — | — | — | CF3 |
| A-142 | C | iso-Pentyl | Et | Me | H | — | — | — | 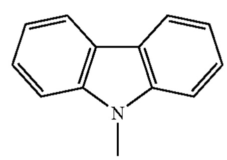 |

TABLE 2

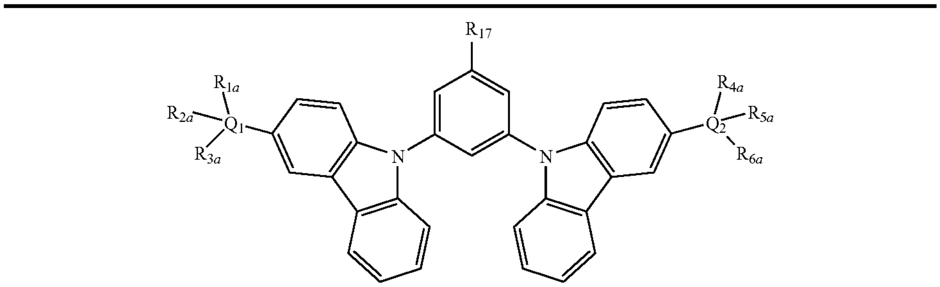

| | Q1 | R1a | R2a | R3a | Q2 | R4a | R5a | R6a | R7a |
|---|---|---|---|---|---|---|---|---|---|
| B-13 | Si | Et | Me | Me | Si | Et | Me | Me | H |
| B-14 | Si | Et | Me | Me | Si | Et | Me | Me | CN |
| B-15 | Si | Et | Me | Me | Si | Et | Me | Me | CF3 |
| B-16 | Si | Et | Me | Me | Si | Et | Me | Me | Ph |

TABLE 2-continued
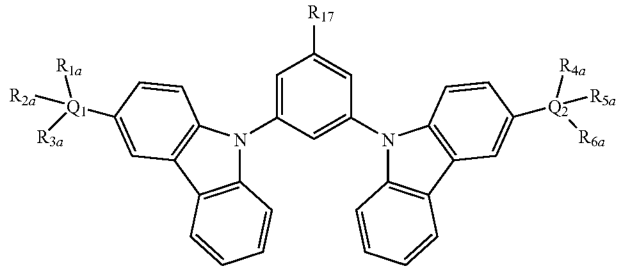
| | Q1 | R1a | R2a | R3a | Q2 | R4a | R5a | R6a | R7a |
|---|---|---|---|---|---|---|---|---|---|
| B-17 | Si | Et | Me | Me | Si | Et | Me | Me | 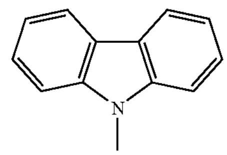 |
| B-18 | Si | Et | Me | Me | Si | Et | Me | Me | 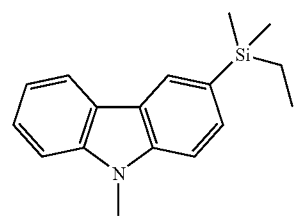 |
| B-19 | Si | Et | Me | Me | Si | Et | Me | Me | 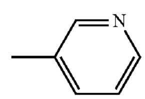 |
| B-20 | Si | Et | Me | Me | Si | Et | Me | Me | tBu |
| B-21 | Si | Et | Me | Me | Si | Et | Me | Me | SiMe3 |
| B-22 | Si | Et | Me | Me | Si | Et | Me | Me | 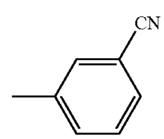 |
| B-23 | Si | Et | Me | Me | Si | Et | Me | Me | 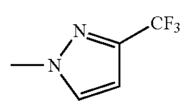 |
| B-24 | Si | Et | Me | Me | Si | Et | Me | Me | 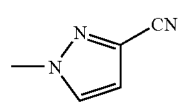 |
| B-25 | Si | Et | Me | Me | H | — | — | — | H |
| B-26 | Si | Et | Me | Me | H | — | — | — | CN |
| B-27 | Si | Et | Me | Me | H | — | — | — | CF3 |
| B-28 | Si | Et | Me | Me | H | — | — | — | Ph |
| B-29 | Si | Et | Me | Me | H | — | — | — | 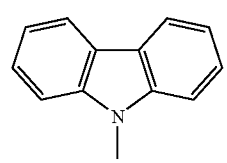 |
| B-30 | Si | Et | Me | Me | H | — | — | — | 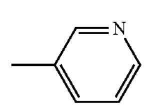 |
| B-31 | Si | Et | Me | Me | H | — | — | — | tBu |

TABLE 2-continued
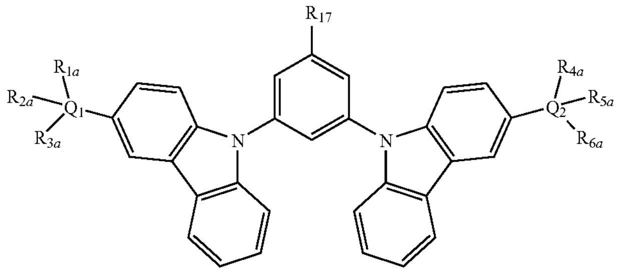
| | Q1 | R1a | R2a | R3a | Q2 | R4a | R5a | R6a | R7a |
|---|---|---|---|---|---|---|---|---|---|
| B-32 | Si | Et | Me | Me | H | — | — | — | SiMe3 |
| B-33 | Si | Et | Me | Me | H | — | — | — | 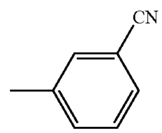 |
| B-34 | Si | Et | Me | Me | H | — | — | — | 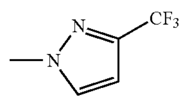 |
| B-35 | Si | Et | Me | Me | H | — | — | — | 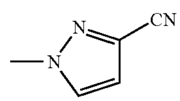 |
| B-36 | Si | Me | Me | Me | H | — | — | — | H |
| B-37 | Si | Me | Me | Me | H | — | — | — | CN |
| B-38 | Si | Me | Me | Me | H | — | — | — | CF3 |
| B-39 | Si | Me | Me | Me | H | — | — | — | Ph |
| B-40 | Si | Me | Me | Me | H | — | — | — | 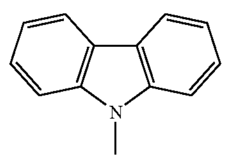 |
| B-41 | Si | Me | Me | Me | H | — | — | — | 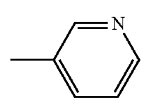 |
| B-42 | Si | Me | Me | Me | H | — | — | — | tBu |
| B-43 | Si | Me | Me | Me | H | — | — | — | SiMe3 |
| B-44 | Si | Me | Me | Me | H | — | — | — | 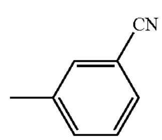 |
| B-45 | Si | Me | Me | Me | H | — | — | — | 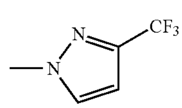 |
| B-46 | Si | Me | Me | Me | H | — | — | — | 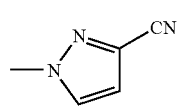 |
| B-47 | Si | Et | Et | Et | Si | Et | Et | Et | H |
| B-48 | Si | Et | Et | Et | Si | Et | Et | Et | CF3 |

TABLE 2-continued

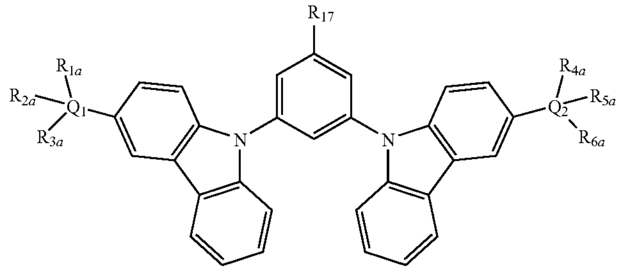

| | Q1 | R1a | R2a | R3a | Q2 | R4a | R5a | R6a | R7a |
|---|---|---|---|---|---|---|---|---|---|
| B-49 | Si | Et | Et | Et | Si | Et | Et | Et | 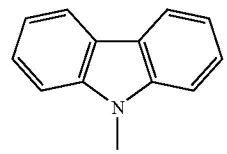 |
| B-50 | Si | Et | Et | Et | H | — | — | — | H |
| B-51 | Si | Et | Et | Et | H | — | — | — | Ph |
| B-52 | Si | Et | Et | Et | H | — | — | — | 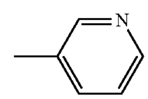 |
| B-53 | Si | n-Pr | Me | Me | Si | n-Pr | Me | Me | H |
| B-54 | Si | n-Pr | Me | Me | Si | n-Pr | Me | Me | tBu |
| B-55 | Si | n-Pr | Me | Me | Si | n-Pr | Me | Me | SiMe3 |
| B-56 | Si | n-Pr | Me | Me | H | — | — | — | H |
| B-57 | Si | n-Pr | Me | Me | H | — | — | — | tBu |
| B-58 | Si | n-Pr | Me | Me | H | — | — | — | SiMe3 |
| B-59 | Si | n-Pr | n-Pr | n-Pr | Si | n-Pr | n-Pr | n-Pr | H |
| B-60 | Si | n-Pr | n-Pr | n-Pr | Si | n-Pr | n-Pr | n-Pr | 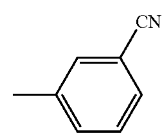 |
| B-61 | Si | n-Pr | n-Pr | n-Pr | Si | n-Pr | n-Pr | n-Pr | 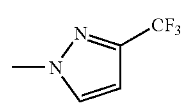 |
| B-62 | Si | n-Pr | n-Pr | n-Pr | H | — | — | — | H |
| B-63 | Si | n-Pr | n-Pr | n-Pr | H | — | — | — | 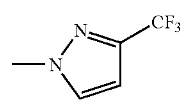 |
| B-64 | Si | n-Pr | n-Pr | n-Pr | H | — | — | — | 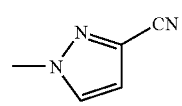 |
| B-65 | Si | iso-Pr | Me | Me | Si | iso-Pr | Me | Me | H |
| B-66 | Si | iso-Pr | Me | Me | Si | iso-Pr | Me | Me | CN |
| B-67 | Si | iso-Pr | Me | Me | Si | iso-Pr | Me | Me | Ph |
| B-68 | Si | iso-Pr | Me | Me | H | — | — | — | H |
| B-69 | Si | iso-Pr | Me | Me | H | — | — | — | CN |
| B-70 | Si | iso-Pr | Me | Me | H | — | — | — | Ph |
| B-71 | Si | iso-Pr | Et | Et | Si | iso-Pr | Et | Et | H |
| B-72 | Si | iso-Pr | Et | Et | Si | iso-Pr | Et | Et | CF3 |
| B-73 | Si | iso-Pr | Et | Et | Si | iso-Pr | Et | Et | Ph |
| B-74 | Si | iso-Pr | Et | Et | H | — | — | — | H |
| B-75 | Si | iso-Pr | Et | Et | H | — | — | — | CF3 |
| B-76 | Si | iso-Pr | Et | Et | H | — | — | — | Ph |
| B-77 | Si | iso-Pr | iso-Pr | iso-Pr | Si | iso-Pr | iso-Pr | iso-Pr | H |
| B-78 | Si | iso-Pr | iso-Pr | iso-Pr | Si | iso-Pr | iso-Pr | iso-Pr | CN |

TABLE 2-continued

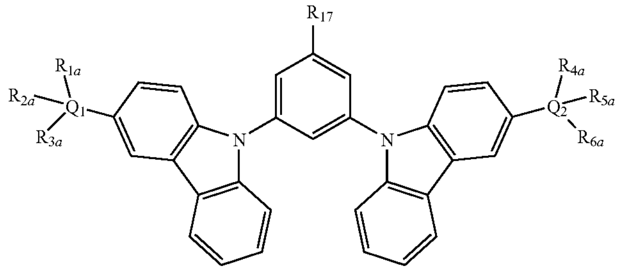

| | Q1 | R1a | R2a | R3a | Q2 | R4a | R5a | R6a | R7a |
|---|---|---|---|---|---|---|---|---|---|
| B-79 | Si | iso-Pr | iso-Pr | iso-Pr | Si | iso-Pr | iso-Pr | iso-Pr | 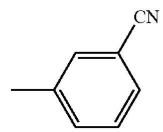  |
| B-80 | Si | iso-Pr | iso-Pr | iso-Pr | H | — | — | — | H |
| B-81 | Si | iso-Pr | iso-Pr | iso-Pr | H | — | — | — | CN |
| B-82 | Si | iso-Pr | iso-Pr | iso-Pr | H | — | — | — | 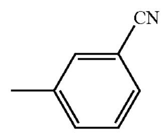  |
| B-83 | Si | n-Bu | Me | Me | Si | n-Bu | Me | Me | H |
| B-84 | Si | n-Bu | Me | Me | Si | n-Bu | Me | Me | Ph |
| B-85 | Si | n-Bu | Me | Me | Si | n-Bu | Me | Me | 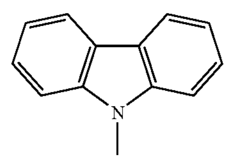  |
| B-86 | Si | n-Bu | Me | Me | H | — | — | — | H |
| B-87 | Si | n-Bu | Me | Me | H | — | — | — | Ph |
| B-88 | Si | n-Bu | Me | Me | H | — | — | — | 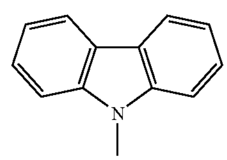  |
| B-89 | Si | n-Bu | n-Bu | n-Bu | Si | n-Bu | n-Bu | n-Bu | H |
| B-90 | Si | n-Bu | n-Bu | n-Bu | Si | n-Bu | n-Bu | n-Bu | Ph |
| B-91 | Si | n-Bu | n-Bu | n-Bu | Si | n-Bu | n-Bu | n-Bu | 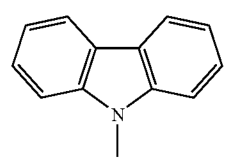  |
| B-92 | Si | n-Bu | n-Bu | n-Bu | H | — | — | — | H |
| B-93 | Si | n-Bu | n-Bu | n-Bu | H | — | — | — | Ph |
| B-94 | Si | n-Bu | n-Bu | n-Bu | H | — | — | — | 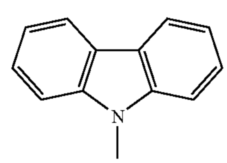  |
| B-95 | Si | sec-Bu | sec-Bu | sec-Bu | Si | sec-Bu | sec-Bu | sec-Bu | H |
| B-96 | Si | sec-Bu | sec-Bu | sec-Bu | Si | sec-Bu | sec-Bu | sec-Bu | tBu |
| B-97 | Si | sec-Bu | sec-Bu | sec-Bu | Si | sec-Bu | sec-Bu | sec-Bu | Ph |

TABLE 2-continued

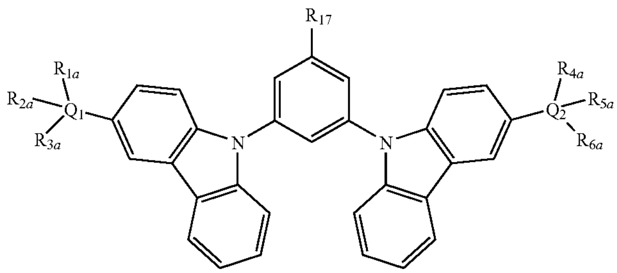

| | Q1 | R1a | R2a | R3a | Q2 | R4a | R5a | R6a | R7a |
|---|---|---|---|---|---|---|---|---|---|
| B-98 | Si | sec-Bu | sec-Bu | sec-Bu | H | — | — | — | H |
| B-99 | Si | sec-Bu | sec-Bu | sec-Bu | H | — | — | — | tBu |
| B-100 | Si | sec-Bu | sec-Bu | sec-Bu | H | — | — | — | Ph |
| B-101 | Si | t-Bu | Me | Me | Si | t-Bu | Me | Me | H |
| B-102 | Si | t-Bu | Me | Me | Si | t-Bu | Me | Me | SiMe3 |
| B-103 | Si | t-Bu | Me | Me | Si | t-Bu | Me | Me | Ph |
| B-104 | Si | t-Bu | Me | Me | H | — | — | — | H |
| B-105 | Si | t-Bu | Me | Me | H | — | — | — | SiMe3 |
| B-106 | Si | t-Bu | Me | Me | H | — | — | — | Ph |
| B-107 | Si | cyclohexyl | Me | Me | Si | cyclohexyl | Me | Me | H |
| B-108 | Si | cyclohexyl | Me | Me | Si | cyclohexyl | Me | Me | Ph |
| B-109 | Si | cyclohexyl | Me | Me | Si | cyclohexyl | Me | Me | 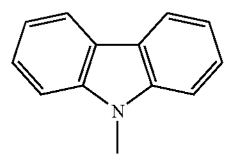 |
| B-110 | Si | cyclohexyl | Me | Me | H | — | — | — | H |
| B-111 | Si | cyclohexyl | Me | Me | H | — | — | — | Ph |
| B-112 | Si | cyclohexyl | Me | Me | H | — | — | — | 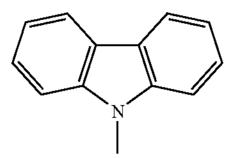 |

TABLE 3

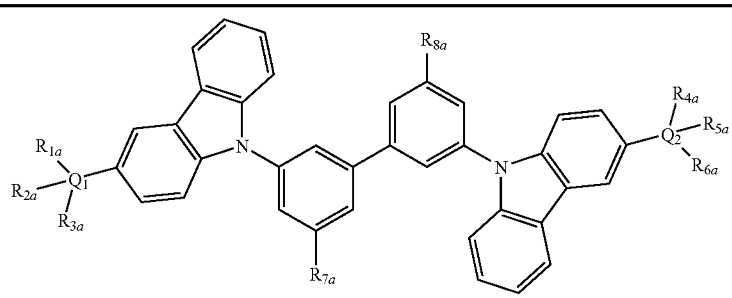

| | Q1 | R1a | R2a | R3a | Q2 | R4a | Ra5a | R6a | R7a | R8a |
|---|---|---|---|---|---|---|---|---|---|---|
| C-18 | C | Et | Me | Me | C | Et | Me | Me | H | H |
| C-19 | C | Et | Me | Me | C | Et | Me | Me | H | 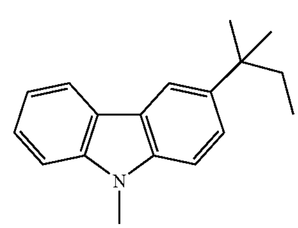 |

TABLE 3-continued
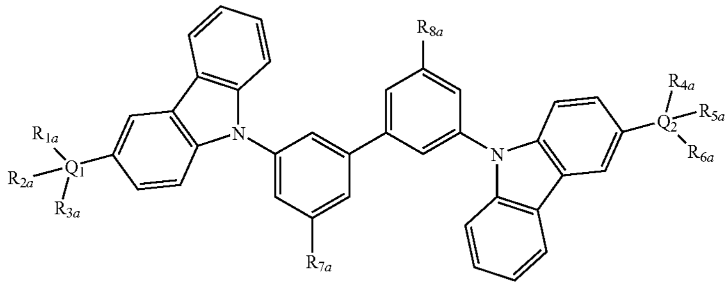
| | Q1 | R1a | R2a | R3a | Q2 | R4a | Ra5a | R6a | R7a | R8a |
|---|---|---|---|---|---|---|---|---|---|---|
| C-20 | C | Et | Me | Me | C | Et | Me | Me | 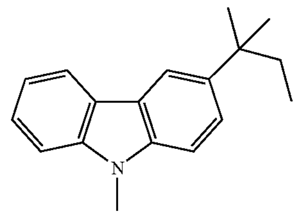 | 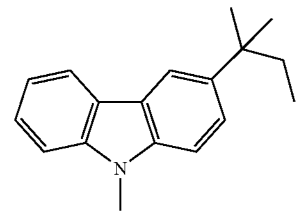 |
| C-21 | C | Et | Me | Me | C | Et | Me | Me | H | CN |
| C-22 | C | Et | Me | Me | C | Et | Me | Me | CF3 | CF3 |
| C-23 | C | Et | Me | Me | C | Et | Me | Me | 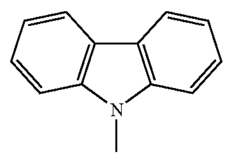 | H |
| C-24 | C | Et | Me | Me | C | Et | Me | Me | 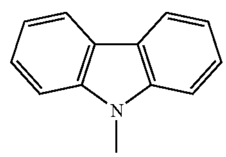 | 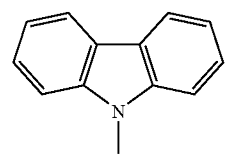 |
| C-25 | C | Et | Me | Me | C | Et | Me | Me | Ph | H |
| C-26 | C | Et | Me | Me | H | — | — | — | H | H |
| C-27 | C | Et | Me | Me | H | — | — | — | H | 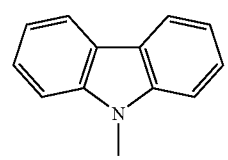 |
| C-28 | C | Et | Me | Me | H | — | — | — | 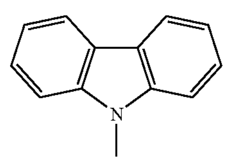 | 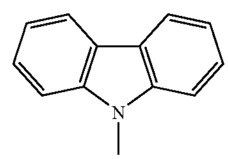 |
| C-29 | C | Et | Me | Me | H | — | — | — | 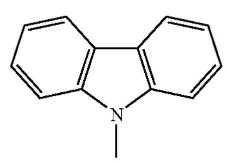 | H |
| C-30 | C | Et | Me | Me | H | — | — | — | CF3 | CF3 |
| C-31 | C | Et | Me | Me | H | — | — | — | CN | H |
| C-32 | C | Et | Me | Me | H | — | — | — | H | CN |
| C-33 | C | Et | Me | Me | H | — | — | — | Ph | H |
| C-34 | C | Et | Me | Me | H | — | — | — | H | Ph |
| C-35 | C | Me | Me | Me | H | — | — | — | H | H |

TABLE 3-continued

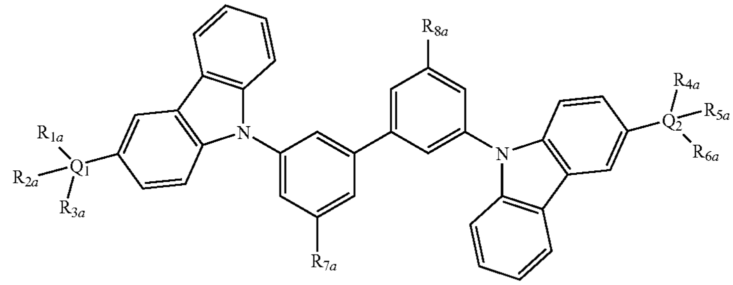

| | Q1 | R1a | R2a | R3a | Q2 | R4a | Ra5a | R6a | R7a | R8a |
|---|---|---|---|---|---|---|---|---|---|---|
| C-36 | C | Me | Me | Me | H | — | — | — | H | 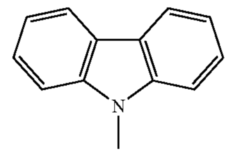 |
| C-37 | C | Me | Me | Me | H | — | — | — | 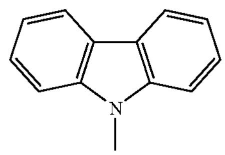 | 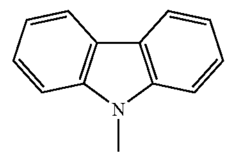 |
| C-38 | C | Me | Me | Me | H | — | — | — | 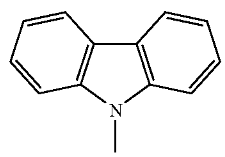 | H |
| C-39 | C | Me | Me | Me | H | — | — | — | CF3 | CF3 |
| C-40 | C | Me | Me | Me | H | — | — | — | CN | H |
| C-41 | C | Me | Me | Me | H | — | — | — | H | CN |
| C-42 | C | Me | Me | Me | H | — | — | — | Ph | H |
| C-43 | C | Me | Me | Me | H | — | — | — | H | Ph |
| C-44 | C | n-Pr | Me | Me | C | n-Pr | Me | Me | H | H |
| C-45 | C | n-Pr | Me | Me | C | n-Pr | Me | Me | H | Ph |
| C-46 | C | n-Pr | Me | Me | C | n-Pr | Me | Me | H | CN |
| C-47 | C | n-Pr | Me | Me | H | — | — | — | H | H |
| C-48 | C | n-Pr | Me | Me | H | — | — | — | H | Ph |
| C-49 | C | n-Pr | Me | Me | H | — | — | — | H | CN |
| C-50 | C | iso-Pr | Me | Me | C | iso-Pr | Me | Me | H | H |
| C-51 | C | iso-Pr | Me | Me | C | iso-Pr | Me | Me | CF3 | CF3 |
| C-52 | C | iso-Pr | Me | Me | C | iso-Pr | Me | Me | CN | H |
| C-53 | C | iso-Pr | Me | Me | H | — | — | — | H | H |
| C-54 | C | iso-Pr | Me | Me | H | — | — | — | CF3 | CF3 |
| C-55 | C | iso-Pr | Me | Me | H | — | — | — | CN | H |
| C-56 | C | n-Bu | Me | Me | C | n-Bu | Me | Me | H | H |
| C-57 | C | n-Bu | Me | Me | C | n-Bu | Me | Me | H | tBu |
| C-58 | C | n-Bu | Me | Me | C | n-Bu | Me | Me | H | CN |
| C-59 | C | n-Bu | Me | Me | H | — | — | — | H | H |
| C-60 | C | n-Bu | Me | Me | H | — | — | — | H | tBu |
| C-61 | C | n-Bu | Me | Me | H | — | — | — | H | CN |
| C-62 | C | sec-Bu | Me | Me | C | sec-Bu | Me | Me | H | H |
| C-63 | C | sec-Bu | Me | Me | C | sec-Bu | Me | Me | 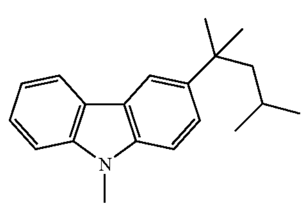 | 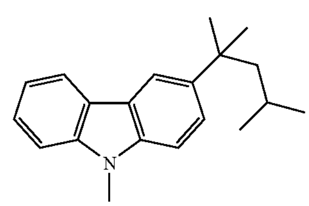 |
| C-64 | C | sec-Bu | Me | Me | C | sec-Bu | Me | Me | H | Ph |
| C-65 | C | sec-Bu | Me | Me | H | — | — | — | H | H |

TABLE 3-continued

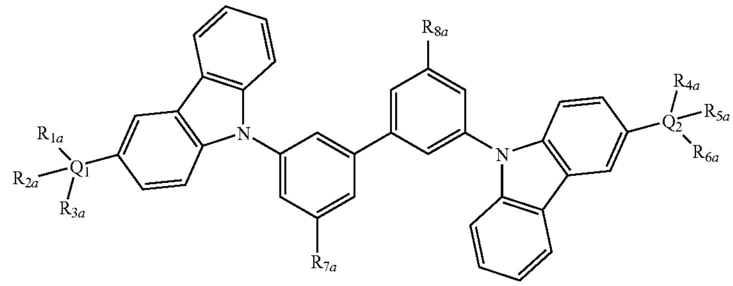

| | Q1 | R1a | R2a | R3a | Q2 | R4a | Ra5a | R6a | R7a | R8a |
|---|---|---|---|---|---|---|---|---|---|---|
| C-66 | C | sec-Bu | Me | Me | H | — | — | — | H | 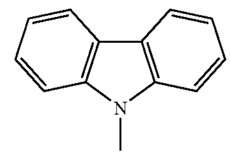 |
| C-67 | C | sec-Bu | Me | Me | H | — | — | — | H | Ph |
| C-68 | C | n-Pentyl | Me | Me | C | n-Pentyl | Me | Me | H | H |
| C-69 | C | n-Pentyl | Me | Me | C | n-Pentyl | Me | Me | H | Ph |
| C-70 | C | n-Pentyl | Me | Me | C | n-Pentyl | Me | Me | H | CN |
| C-71 | C | n-Pentyl | Me | Me | H | — | — | — | H | H |
| C-72 | C | n-Pentyl | Me | Me | H | — | — | — | H | Ph |
| C-73 | C | n-Pentyl | Me | Me | H | — | — | — | H | CN |
| C-74 | C | iso-Pentyl | Me | Me | C | iso-Pentyl | Me | Me | H | H |
| C-75 | C | iso-Pentyl | Me | Me | C | iso-Pentyl | Me | Me | H | tBu |
| C-76 | C | iso-Pentyl | Me | Me | C | iso-Pentyl | Me | Me | H | CN |
| C-77 | C | iso-Pentyl | Me | Me | H | — | — | — | H | H |
| C-78 | C | iso-Pentyl | Me | Me | H | — | — | — | H | tBu |
| C-79 | C | iso-Pentyl | Me | Me | H | — | — | — | H | CN |
| C-80 | C | neo-Pentyl | Me | Me | C | neo-Pentyl | Me | Me | H | H |
| C-81 | C | neo-Pentyl | Me | Me | C | neo-Pentyl | Me | Me | CF3 | CF3 |
| C-82 | C | neo-Pentyl | Me | Me | C | neo-Pentyl | Me | Me | H | CN |
| C-83 | C | neo-Pentyl | Me | Me | H | — | — | — | H | H |
| C-84 | C | neo-Pentyl | Me | Me | H | — | — | — | CF3 | CF3 |
| C-85 | C | neo-Pentyl | Me | Me | H | — | — | — | H | CN |
| C-86 | C | n-Hex | Me | Me | C | n-Hex | Me | Me | H | H |
| C-87 | C | n-Hex | Me | Me | C | n-Hex | Me | Me | Ph | Ph |
| C-88 | C | n-Hex | Me | Me | C | n-Hex | Me | Me | H | CF3 |
| C-89 | C | n-Hex | Me | Me | H | — | — | — | H | H |
| C-90 | C | n-Hex | Me | Me | H | — | — | — | Ph | H |
| C-91 | C | n-Hex | Me | Me | H | — | — | — | CF3 | H |
| C-92 | C | iso-Hex | Me | Me | C | iso-Hex | Me | Me | H | H |
| C-93 | C | iso-Hex | Me | Me | C | iso-Hex | Me | Me | Ph | Ph |
| C-94 | C | iso-Hex | Me | Me | C | iso-Hex | Me | Me | H | CF3 |
| C-95 | C | iso-Hex | Me | Me | H | — | — | — | H | H |
| C-96 | C | iso-Hex | Me | Me | H | — | — | — | Ph | Ph |
| C-97 | C | iso-Hex | Me | Me | H | — | — | — | H | CF3 |
| C-98 | C | cyclo-hexyl | Me | Me | C | cyclo-hexyl | Me | Me | H | H |
| C-99 | C | cyclo-hexyl | Me | Me | C | cyclo-hexyl | Me | Me | H | CN |
| C-100 | C | cyclo-hexyl | Me | Me | C | cyclo-hexyl | Me | Me | H | CF3 |
| C-101 | C | cyclo-hexyl | Me | Me | H | — | — | — | H | H |
| C-102 | C | cyclo-hexyl | Me | Me | H | — | — | — | H | CN |
| C-103 | C | cyclo-hexyl | Me | Me | H | — | — | — | H | CF3 |

TABLE 3-continued

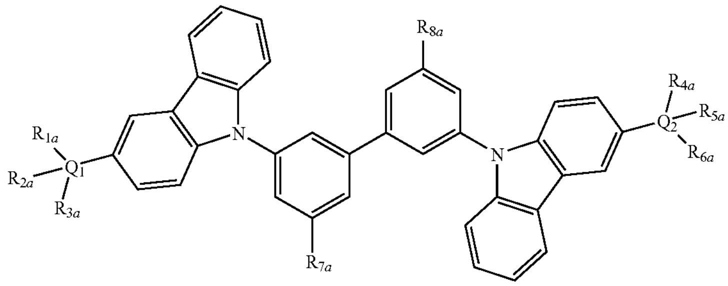

| | Q1 | R1a | R2a | R3a | Q2 | R4a | Ra5a | R6a | R7a | R8a |
|---|---|---|---|---|---|---|---|---|---|---|
| C-104 | C | Et | Et | Et | C | Et | Et | Et | H | H |
| C-105 | C | Et | Et | Et | C | Et | Et | Et | 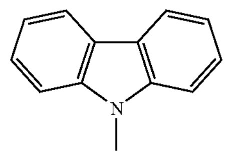 | 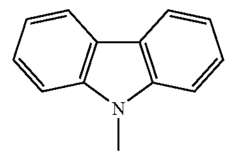 |
| C-106 | C | Et | Et | Et | C | Et | Et | Et | Ph | Ph |
| C-107 | C | Et | Et | Et | H | — | — | — | H | H |
| C-108 | C | Et | Et | Et | H | — | — | — | Ph | H |
| C-109 | C | Et | Et | Et | H | — | — | — | H | 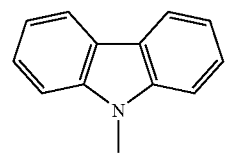 |
| C-110 | C | n-Pr | n-Pr | n-Pr | C | n-Pr | n-Pr | n-Pr | H | H |
| C-111 | C | n-Pr | n-Pr | n-Pr | C | n-Pr | n-Pr | n-Pr | Ph | Ph |
| C-112 | C | n-Pr | n-Pr | n-Pr | C | n-Pr | n-Pr | n-Pr | Ph | H |
| C-113 | C | n-Pr | n-Pr | n-Pr | H | — | — | — | H | H |
| C-114 | C | n-Pr | n-Pr | n-Pr | H | — | — | — | Ph | H |
| C-115 | C | n-Pr | n-Pr | n-Pr | H | — | — | — | H | Ph |
| C-116 | C | iso-Pr | iso-Pr | iso-Pr | C | iso-Pr | iso-Pr | iso-Pr | H | H |
| C-117 | C | iso-Pr | iso-Pr | iso-Pr | C | iso-Pr | iso-Pr | iso-Pr | 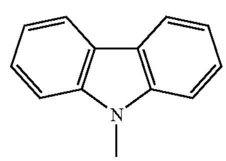 | 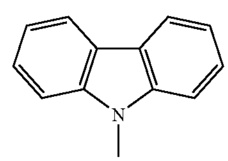 |
| C-118 | C | iso-Pr | iso-Pr | iso-Pr | C | iso-Pr | iso-Pr | iso-Pr | 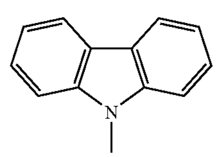 | 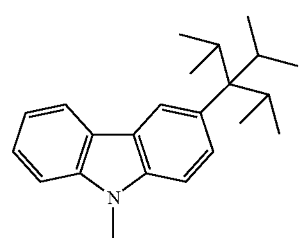 |
| C-119 | C | iso-Pr | iso-Pr | iso-Pr | H | — | — | — | H | H |

TABLE 3-continued

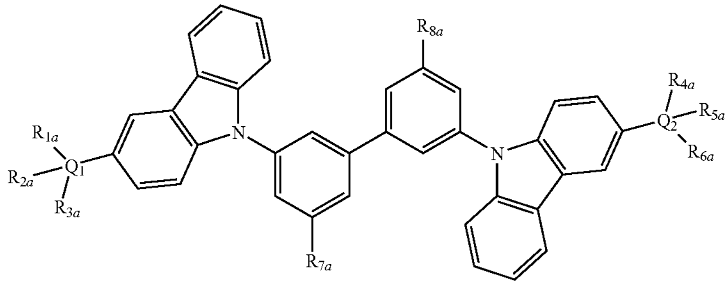

| | Q1 | R1a | R2a | R3a | Q2 | R4a | Ra5a | R6a | R7a | R8a |
|---|---|---|---|---|---|---|---|---|---|---|
| C-120 | C | iso-Pr | iso-Pr | iso-Pr | H | — | — | — | H | 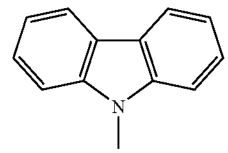 |
| C-121 | C | iso-Pr | iso-Pr | iso-Pr | H | — | — | — | 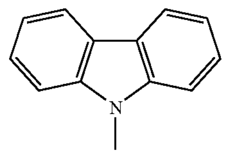 | 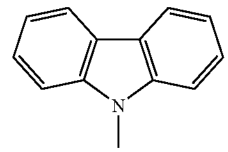 |
| C-122 | C | n-Bu | n-Bu | n-Bu | C | n-Bu | n-Bu | n-Bu | H | H |
| C-123 | C | n-Bu | n-Bu | n-Bu | C | n-Bu | n-Bu | n-Bu | H | CN |
| C-124 | C | n-Bu | n-Bu | n-Bu | C | n-Bu | n-Bu | n-Bu | CF3 | CF3 |
| C-125 | C | n-Bu | n-Bu | n-Bu | H | — | — | — | H | H |
| C-126 | C | n-Bu | n-Bu | n-Bu | H | — | — | — | H | CF3 |
| C-127 | C | n-Bu | n-Bu | n-Bu | H | — | — | — | CF3 | H |
| C-128 | C | n-Hex | n-Hex | n-Hex | C | n-Hex | n-Hex | n-Hex | H | H |
| C-129 | C | n-Hex | n-Hex | n-Hex | C | n-Hex | n-Hex | n-Hex | tBu | tBu |
| C-130 | C | n-Hex | n-Hex | n-Hex | C | n-Hex | n-Hex | n-Hex | H | Ph |
| C-131 | C | n-Hex | n-Hex | n-Hex | H | — | — | — | H | H |
| C-132 | C | n-Hex | n-Hex | n-Hex | H | — | — | — | tBu | H |
| C-133 | C | n-Hex | n-Hex | n-Hex | H | — | — | — | Ph | H |
| C-134 | C | iso-Pentyl | Et | Me | C | iso-Pentyl | Et | Me | H | H |
| C-135 | C | iso-Pentyl | Et | Me | C | iso-Pentyl | Et | Me | Ph | H |
| C-136 | C | iso-Pentyl | Et | Me | C | iso-Pentyl | Et | Me | CN | H |
| C-137 | C | iso-Pentyl | Et | Me | H | — | — | — | H | H |
| C-138 | C | iso-Pentyl | Et | Me | H | — | — | — | H | 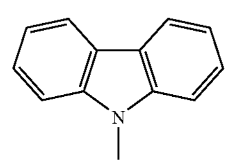 |
| C-139 | C | iso-Pentyl | Et | Me | H | — | — | — | CF3 | H |

TABLE 4
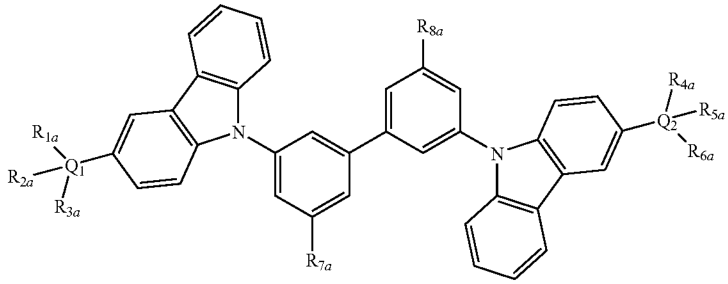
| | Q1 | R1a | R2a | R3a | Q2 | R4a | R5a | R6a | R7a | R8 |
|---|---|---|---|---|---|---|---|---|---|---|
| D-1 | Si | Et | Me | Me | C | Et | Me | Me | H | H |
| D-2 | Si | Et | Me | Me | C | Et | Me | Me | H | 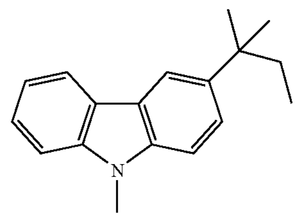 |
| D-3 | Si | Et | Me | Me | C | Et | Me | Me | 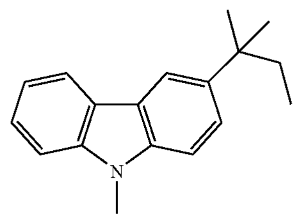 | 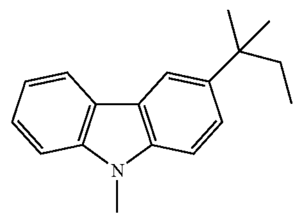 |
| D-4 | Si | Et | Me | Me | C | Et | Me | Me | H | CN |
| D-5 | Si | Et | Me | Me | C | Et | Me | Me | CF3 | CF3 |
| D-6 | Si | Et | Me | Me | C | Et | Me | Me | 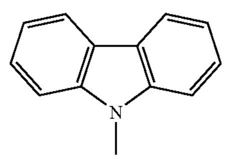 | H |
| D-7 | Si | Et | Me | Me | C | Et | Me | Me | 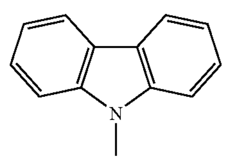 | 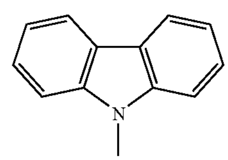 |
| D-8 | Si | Et | Me | Me | C | Et | Me | Me | Ph | H |
| D-9 | Si | Et | Me | Me | H | — | — | — | H | H |
| D-10 | Si | Et | Me | Me | H | — | — | — | H | 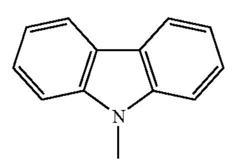 |
| D-11 | Si | Et | Me | Me | H | — | — | — | 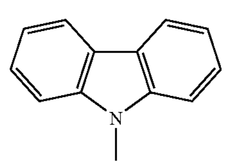 | 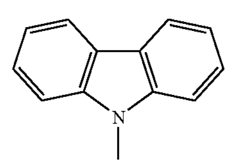 |

TABLE 4-continued

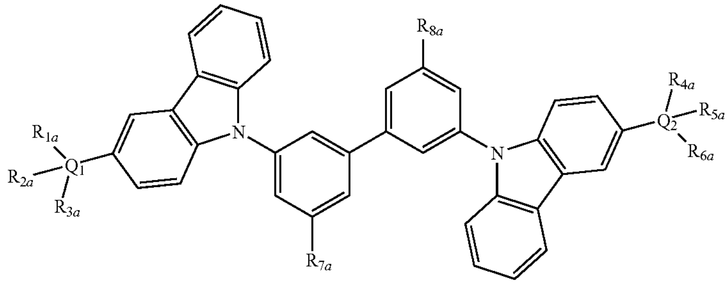

| | Q1 | R1a | R2a | R3a | Q2 | R4a | R5a | R6a | R7a | R8 |
|---|---|---|---|---|---|---|---|---|---|---|
| D-12 | Si | Et | Me | Me | H | — | — | — | 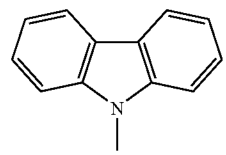 | H |
| D-13 | Si | Et | Me | Me | H | — | — | — | CF3 | CF3 |
| D-14 | Si | Et | Me | Me | H | — | — | — | CN | H |
| D-15 | Si | Et | Me | Me | H | — | — | — | H | CN |
| D-16 | Si | Et | Me | Me | H | — | — | — | Ph | H |
| D-17 | Si | Et | Me | Me | H | — | — | — | H | Ph |
| D-18 | Si | Me | Me | Me | H | — | — | — | H | H |
| D-19 | Si | Me | Me | Me | H | — | — | — | H | 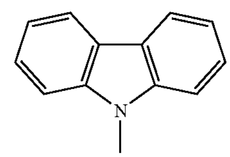 |
| D-20 | Si | Me | Me | Me | H | — | — | — | 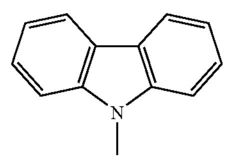 | 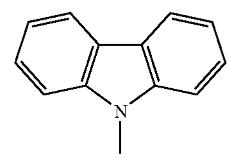 |
| D-21 | Si | Me | Me | Me | H | — | — | — | 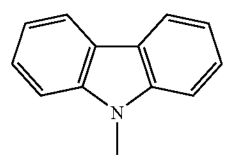 | H |
| D-22 | Si | Me | Me | Me | H | — | — | — | CF3 | CF3 |
| D-23 | Si | Me | Me | Me | H | — | — | — | CN | H |
| D-24 | Si | Me | Me | Me | H | — | — | — | H | CN |
| D-25 | Si | Me | Me | Me | H | — | — | — | Ph | H |
| D-26 | Si | Me | Me | Me | H | — | — | — | H | Ph |
| D-27 | Si | Et | Et | Et | Si | Et | Et | Et | H | H |
| D-28 | Si | Et | Et | Et | Si | Et | Et | Et | CF3 | CF3 |
| D-29 | Si | Et | Et | Et | Si | Et | Et | Et | 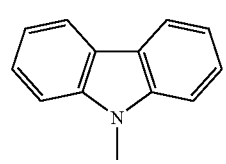 | 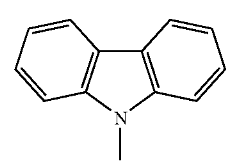 |
| D-30 | Si | Et | Et | Et | H | — | — | — | H | H |
| D-31 | Si | Et | Et | Et | H | — | — | — | Ph | H |
| D-32 | Si | Et | Et | Et | H | — | — | — | 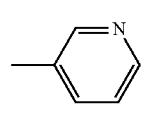 | H |

TABLE 4-continued

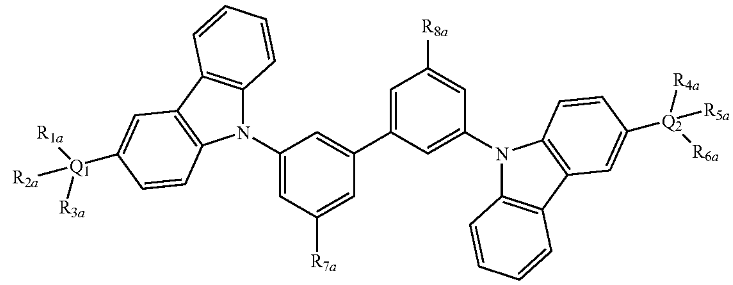

| | Q1 | R1a | R2a | R3a | Q2 | R4a | R5a | R6a | R7a | R8 |
|---|---|---|---|---|---|---|---|---|---|---|
| D-33 | Si | n-Pr | Me | Me | Si | n-Pr | Me | Me | H | H |
| D-34 | Si | n-Pr | Me | Me | Si | n-Pr | Me | Me | H | Ph |
| D-35 | Si | n-Pr | Me | Me | Si | n-Pr | Me | Me | SiMe3 | H |
| D-36 | Si | n-Pr | Me | Me | H | — | — | — | H | H |
| D-37 | Si | n-Pr | Me | Me | H | — | — | — | Ph | H |
| D-38 | Si | n-Pr | Me | Me | H | — | — | — | SiMe3 | H |
| D-39 | Si | n-Pr | n-Pr | n-Pr | Si | n-Pr | n-Pr | n-Pr | H | H |
| D-40 | Si | n-Pr | n-Pr | n-Pr | Si | n-Pr | n-Pr | n-Pr | Ph | Ph |
| D-41 | Si | n-Pr | n-Pr | n-Pr | Si | n-Pr | n-Pr | n-Pr | H | Ph |
| D-42 | Si | n-Pr | n-Pr | n-Pr | H | — | — | — | H | H |
| D-43 | Si | n-Pr | n-Pr | n-Pr | H | — | — | — | H | Ph |
| D-44 | Si | n-Pr | n-Pr | n-Pr | H | — | — | — | Ph | H |
| D-45 | Si | iso-Pr | Me | Me | Si | iso-Pr | Me | Me | H | H |
| D-46 | Si | iso-Pr | Me | Me | Si | iso-Pr | Me | Me | H | Ph |
| D-47 | Si | iso-Pr | Me | Me | Si | iso-Pr | Me | Me | H | CN |
| D-48 | Si | iso-Pr | Me | Me | H | — | — | — | H | H |
| D-49 | Si | iso-Pr | Me | Me | H | — | — | — | H | CN |
| D-50 | Si | iso-Pr | Me | Me | H | — | — | — | Ph | H |
| D-51 | Si | iso-Pr | Et | Et | Si | iso-Pr | Et | Et | H | H |
| D-52 | Si | iso-Pr | Et | Et | Si | iso-Pr | Et | Et | CF3 | CF3 |
| D-53 | Si | iso-Pr | Et | Et | Si | iso-Pr | Et | Et | Ph | H |
| D-54 | Si | iso-Pr | Et | Et | H | — | — | — | H | H |
| D-55 | Si | iso-Pr | Et | Et | H | — | — | — | CF3 | H |
| D-56 | Si | iso-Pr | Et | Et | H | — | — | — | Ph | H |
| D-57 | Si | iso-Pr | iso-Pr | iso-Pr | Si | iso-Pr | iso-Pr | iso-Pr | H | H |
| D-58 | Si | iso-Pr | iso-Pr | iso-Pr | Si | iso-Pr | iso-Pr | iso-Pr | CN | H |
| D-59 | Si | iso-Pr | iso-Pr | iso-Pr | Si | iso-Pr | iso-Pr | iso-Pr | Ph | H |
| D-60 | Si | iso-Pr | iso-Pr | iso-Pr | H | — | — | — | H | H |
| D-61 | Si | iso-Pr | iso-Pr | iso-Pr | H | — | — | — | CN | H |
| D-62 | Si | iso-Pr | iso-Pr | iso-Pr | H | — | — | — | Ph | H |
| D-63 | Si | n-Bu | Me | Me | Si | n-Bu | Me | Me | H | H |
| D-64 | Si | n-Bu | Me | Me | Si | n-Bu | Me | Me | CN | H |
| D-65 | Si | n-Bu | Me | Me | Si | n-Bu | Me | Me | 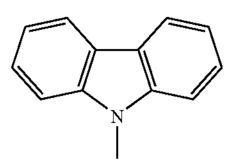 N | |
| D-66 | Si | n-Bu | Me | Me | H | — | — | — | H | H |
| D-67 | Si | n-Bu | Me | Me | H | — | — | — | CN | H |
| D-68 | Si | n-Bu | Me | Me | H | — | — | — | H | CN |
| D-69 | Si | n-Bu | n-Bu | n-Bu | Si | n-Bu | n-Bu | n-Bu | H | H |
| D-70 | Si | n-Bu | n-Bu | n-Bu | Si | n-Bu | n-Bu | n-Bu | Ph | Ph |
| D-71 | Si | n-Bu | n-Bu | n-Bu | Si | n-Bu | n-Bu | n-Bu | 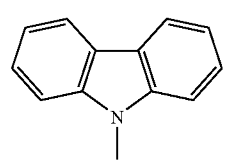 N | H |
| D-72 | Si | n-Bu | n-Bu | n-Bu | H | — | — | — | H | H |
| D-73 | Si | n-Bu | n-Bu | n-Bu | H | — | — | — | Ph | H |
| D-74 | Si | n-Bu | n-Bu | n-Bu | H | — | — | — | H | Ph |
| D-75 | Si | sec-Bu | sec-Bu | sec-Bu | Si | sec-Bu | sec-Bu | sec-Bu | H | H |
| D-76 | Si | sec-Bu | sec-Bu | sec-Bu | Si | sec-Bu | sec-Bu | sec-Bu | tBu | H |
| D-77 | Si | sec-Bu | sec-Bu | sec-Bu | Si | sec-Bu | sec-Bu | sec-Bu | Ph | H |
| D-78 | Si | sec-Bu | sec-Bu | sec-Bu | H | — | — | — | H | H |
| D-79 | Si | sec-Bu | sec-Bu | sec-Bu | H | — | — | — | tBu | H |

TABLE 4-continued

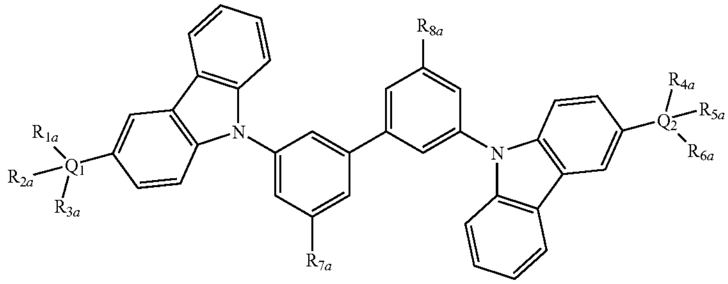

| | Q1 | R1a | R2a | R3a | Q2 | R4a | R5a | R6a | R7a | R8 |
|---|---|---|---|---|---|---|---|---|---|---|
| D-80 | Si | sec-Bu | sec-Bu | sec-Bu | H | — | — | — | Ph | H |
| D-81 | Si | t-Bu | Me | Me | Si | t-Bu | Me | Me | H | H |
| D-82 | Si | t-Bu | Me | Me | Si | t-Bu | Me | Me | Ph | H |
| D-83 | Si | t-Bu | Me | Me | Si | t-Bu | Me | Me | Ph | Ph |
| D-84 | Si | t-Bu | Me | Me | H | — | — | — | H | H |
| D-85 | Si | t-Bu | Me | Me | H | — | — | — | H | SiMe3 |
| D-86 | Si | t-Bu | Me | Me | H | — | — | — | Ph | H |
| D-87 | Si | cyclo-hexyl | Me | Me | Si | cyclo-hexyl | Me | Me | H | H |
| D-88 | Si | cyclo-hexyl | Me | Me | Si | cyclo-hexyl | Me | Me | Ph | H |
| D-89 | Si | cyclo-hexyl | Me | Me | Si | cyclo-hexyl | Me | Me | 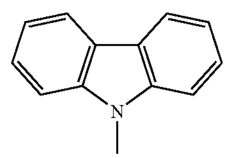 | 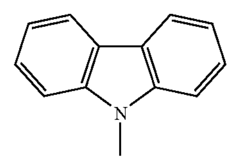 |
| D-90 | Si | cyclo-hexyl | Me | Me | H | — | — | — | H | H |
| D-91 | Si | cyclo-hexyl | Me | Me | H | — | — | — | Ph | H |
| D-92 | Si | cyclo-hexyl | Me | Me | H | — | — | — | 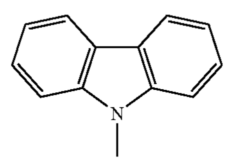 | H |

The compounds of the invention represented by the formulae (I) to (V) can be synthesized by using various known synthesis processes in combination.

Examples of the conventional process for obtaining a carbazole compound include (A) an aza-Cope rearrangement reaction of a condensate between an aryl hydrazine and a cyclohexane derivative, followed by dehydroaromatization (L. F. Tietze and Th. Eicher, *Precision Organic Synthesis*, translated by Takano and Ogasawara, published by Nankodo, 039) and (B) an amination reaction between an arylbenzene derivative and an aniline derivative or a reaction between an aryl triflate derivative and an aniline derivative in the presence of a palladium catalyst, followed by an intramolecular direct arylation reaction in the presence of a palladium catalyst (*Organic Letters,* 7, 1857 (2005), *Journal of American Society,* 128, 581 (2006), *Tetrahedron,* 64, 6038 (2008)). Examples of a coupling reaction between the resulting carbazole compound and an aryl halide compound in the presence of a palladium catalyst or a copper catalyst include processes described in *Tetrahedron Letters,* 39, 617 (1998), 39, 2367 (1998), and 40, 6393 (1999). Examples of a synthesis process of an asymmetric compound include (D) a nucleophilic substitution reaction between the carbazole compound and bromofluorobenzene, followed by a coupling reaction of the carbazole compound in the presence of a palladium or copper catalyst; and (E) boron oxidation of an N-(3-bromophenyl)carbazole derivative, followed by a Suzuki coupling reaction with an N-(3-bromophenyl)carbazole derivative. No particular limitation is imposed on the reaction temperature and reaction time and conditions described in the above-described literatures can be employed.

A)

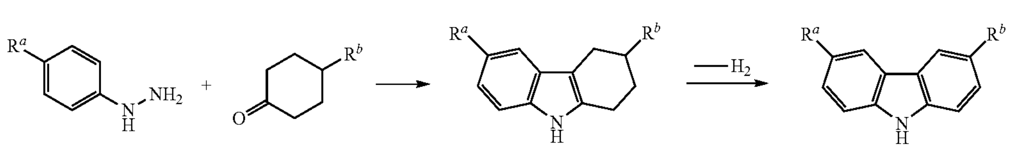

-continued
B)
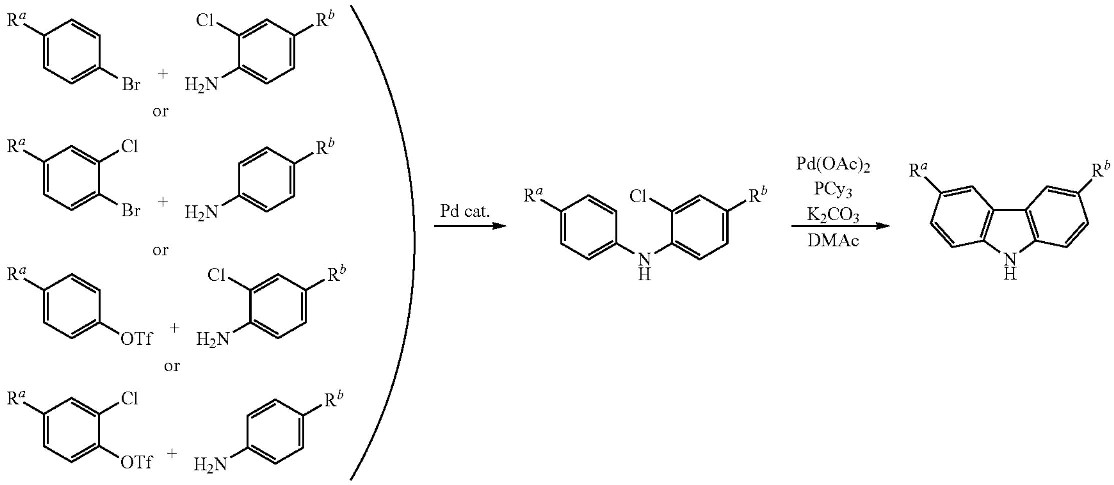
C)
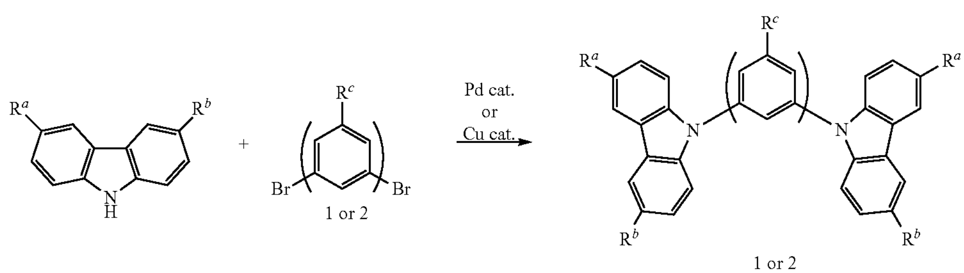
D)
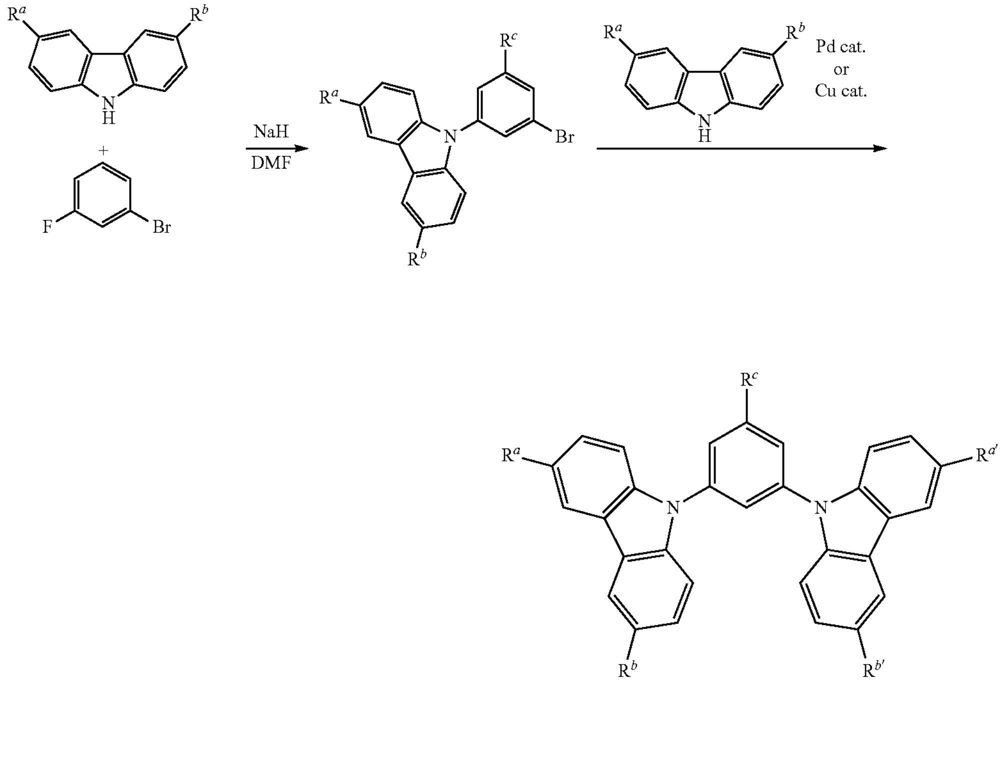

-continued

E)

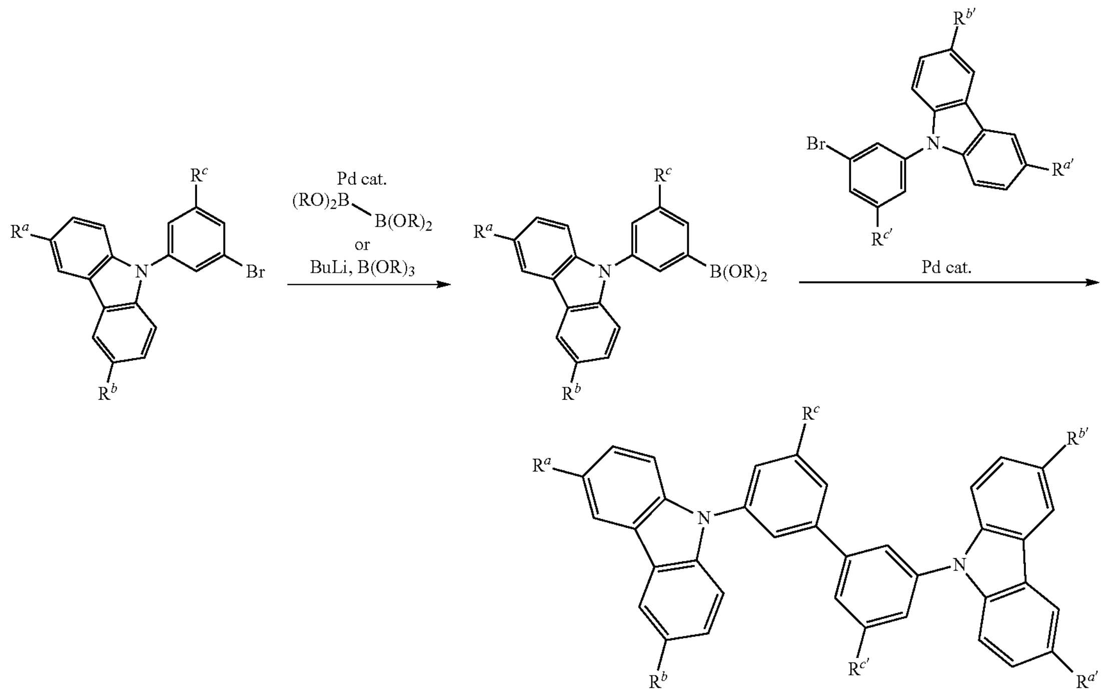

When the device of the invention is a luminescence device utilizing phosphorescence, the compound of the invention has preferably a lowest excited triplet energy ($T_1$ energy) of preferably 61 kcal/mol (255.59 kJ/mol) or greater but not greater than 95 kcal/mol (398.05 kJ/mol), more preferably 63 kcal/mol (263.97 kJ/mol) or greater but not greater than 95 kcal/mol (398.05 kJ/mol), still more preferably 65 kcal/mol (272.35 kJ/mol) or greater but not greater than 95 kcal/mol (398.05 kJ/mol).

The $T_1$ energy can be determined from the short-wavelength end of a phosphorescence spectrum of a thin film of a material which has been obtained by measurement. The $T_1$ energy can be determined, for example, by depositing the material on a cleaned quartz glass substrate by vacuum deposition to form a film of about 50 nm thick, measuring the phosphorescence spectrum of the thin film at a liquid nitrogen temperature by using "F-7000 Fluorescence Spectrophotometer" (product of Hitachi High-Technologies), and converting the rising wavelength on the short wavelength side of the resulting phosphorescence spectrum to its equivalent in energy unit.

An organic electroluminescent device containing the compound of the invention will next be described.

<Organic Electroluminescent Device>

It is preferred that the organic electroluminescent device has at least one organic layer between a light emitting layer and a cathode and contains the compound represented by the formula (I) in the organic layer between the light emitting layer and the cathode.

The organic electroluminescent device of the invention has, on a substrate thereof, a cathode and an anode and it has therebetween one or more organic layers including a light emitting layer. At least one of the anode and the cathode is preferably transparent in consideration of the properties of the electroluminescent device.

In the invention, the organic layers are preferably stacked in the order of a hole transport layer, a light emitting layer, and an electron transport layer from the anode side. Further, the device has a hole injection layer between the hole transport layer and the anode and/or an electron transport intermediate layer between the light emitting layer and the electron transport layer. It may have a hole transport intermediate layer between the light emitting layer and the hole transport layer and similarly, an electron injection layer between the cathode and the electron transport layer.

Each layer may be composed of a plurality of layers.

FIG. 1 illustrates one example of the constitution of the organic electroluminescent device of the invention. An organic electroluminescent device 10 of the invention illustrated in FIG. 1 has a light emitting layer 6 between an anode 3 and a cathode 9 on a supporting substrate 2. Described specifically, between the anode 3 and the cathode 9, a hole injection layer 4, a hole transport layer 5, the light emitting layer 6, a hole blocking layer 7, and an electron transport layer 8 are stacked one after another in the order of mention.

Each layer constituting the organic layers can be preferably formed by any of dry film forming processes such as vacuum deposition and sputtering, a transfer process, a printing process, a process of application, an inkjet process, and a spraying process.

The members constituting the electroluminescent device of the invention will next be described in detail.

(Substrate)

A substrate to be used in the invention preferably does not scatter or attenuate light emitted from the organic layer.

(Anode)

No particular limitation is imposed on the shape, structure, size or the like of an anode insofar as it usually has a function of injecting holes to the organic layers as an electrode. Materials of the anode can be selected as needed from known electrode materials, depending on the intended use or purpose of the electroluminescent device. As described above, the anode is usually provided as a transparent anode.

(Cathode)

No particular limitation is imposed on the shape, structure, size or the like of a cathode insofar as it usually has a function of injecting electrons to the organic layers as an electrode. Materials of the cathode can be selected as needed from known electrode materials, depending on the intended use or purpose of the electroluminescent device.

(Organic Layer)

The organic EL device of the invention has at least one organic layer including a light emitting layer. Examples of the organic layer other than a light emitting layer include, as described above, a hole transport layer, an electron transport layer, a charge blocking layer, a hole injection layer, and an electron injection layer.

(Light Emitting Layer)

The light emitting layer has a function of, at the time of electric field application, accepting holes from the anode, hole injection layer, or hole transport layer, accepting electrons from the cathode, electron injection layer, or electron transport layer, and providing a recombination site of holes and electrons to cause light emission.

The substrate, anode, cathode, organic layer, and light emitting layer are described in detail in, for example, Japanese Patent Laid-Open No. 2008-270736 and Japanese Patent Laid-Open No. 2007-266458. Matters described in these publications can be applied to the invention. The light emitting layer may contain a material that does not have a charge transport property and therefore does not emit light.

<Light Emitting Material>

As the light emitting material in the invention, both a phosphorescent material and a fluorescent material are usable.

The light emitting layer in the invention may contain two or more light emitting materials in order to improve color purity or widen an emission wavelength region. At least one of the light emitting materials is preferably a phosphorescent material.

The light emitting layer in the invention preferably satisfies the following relationship between it and the host material from the standpoint of driving durability:

$$1.2\ \text{ev} > \Delta Ip > 0.2\ \text{ev and/or } 1.2\ \text{eV} > \Delta Ea > 0.2\ \text{eV}$$

wherein, ΔIp means a difference in Ip between the host material and the light emitting material and ΔEa means a difference in Ea between the host material and the light emitting material.

At least one of the light emitting materials is preferably a platinum complex material or an iridium complex material.

In the invention, the light emitting layer contains preferably a platinum complex material, more preferably a platinum complex material having a tetradentate ligand.

The fluorescent materials and phosphorescent materials are described in detail, for example, in Japanese Patent Laid-Open No. 2008-270736 and Japanese Patent Laid-Open No. 2007-266458 and matters described in these publications can be applied to the invention.

The platinum complex is preferably a platinum complex represented by the following formula (C-1):

(C-1)

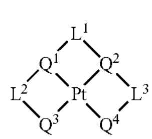

(wherein, $Q^1$, $Q^2$, $Q^3$, and $Q^4$ each independently represents a ligand coordinated to Pt and $L_1$, $L_2$, and $L_3$ each independently represents a single bond or a divalent linking group).

The formula (C-1) will next be described. $Q^1$, $Q^2$, $Q^3$, and $Q^4$ each independently represents a ligand coordinated to Pt. At this time, $Q^1$, $Q^2$, $Q^3$, and $Q^4$ each may be bound to Pt through any of a covalent bond, an ionic bond, and a coordinate bond. As the atom in $Q^1$, $Q^2$, $Q^3$, and $Q^4$ that is bound to Pt, a carbon atom, a nitrogen atom, an oxygen atom, a sulfur atom, and a phosphorus atom are preferred. Preferably, at least one of the atoms in $Q^1$, $Q^2$, $Q^3$, and $Q^4$ bound to Pt is a carbon atom; more preferably, two of them are carbon atoms; and especially preferably, two of them are carbon atoms and two of them are nitrogen atoms.

$Q^1$, $Q^2$, $Q^3$, and $Q^4$ bound to Pt through a carbon atom may be either an anionic ligand or a neutral ligand. Examples of the anionic ligand include a vinyl ligand, aromatic hydrocarbon ring ligands (such as benzene ligand, naphthalene ligand, anthracene ligand, and phenanthrene ligand), and heterocyclic ligands (such as furan ligand, thiophene ligand, pyridine ligand, pyrazine ligand, pyrimidine ligand, pyridazine ligand, triazine ligand, thiazole ligand, oxazole ligand, pyrrole ligand, imidazole ligand, pyrazole ligand, and triazole ligand, and fused ring derivatives containing these ligands (such as quinoline ligand and benzothiazole ligand)). Examples of the neutral ligand include a carbene ligand.

$Q^1$, $Q^2$, $Q^3$, and $Q^4$ bound to Pt through a nitrogen atom may be either a neutral ligand or an anionic ligand. Examples of the neutral ligand include nitrogen-containing aromatic heterocyclic ligands (such as pyridine ligand, pyrazine ligand, pyrimidine ligand, pyridazine ligand, triazine ligand, imidazole ligand, pyrazole ligand, triazole ligand, oxazole ligand, and thiazole ligand, and fused ring derivatives containing these ligands (such as quinoline ligand and benzimidazole ligand)), an amine ligand, a nitrile ligand, and an imine ligand. Examples of the anionic ligand include an amino ligand, an imino ligand, and nitrogen-containing aromatic heterocyclic ligands (such as pyrrole ligand, imidazole ligand, and triazole ligand, and fused ring derivatives containing these ligands (such as indole ligand and benzimidazole ligand)).

$Q^1$, $Q^2$, $Q^3$, and $Q^4$ bound to Pt through an oxygen atom may be either a neutral ligand or an anionic ligand. Examples of the neutral ligand include an ether ligand, a ketone ligand, an ester ligand, an amide ligand, and oxygen-containing heterocyclic ligands (such as furan ligand and oxazole ligand, and fused ring derivatives containing these ligands (such as benzoxazole ligand)). Examples of the anionic ligand include an alkoxy ligand, an aryloxy ligand, a heteroaryloxy ligand, an acyloxy ligand, and a silyloxy ligand.

$Q^1$, $Q^2$, $Q^3$, and $Q^4$ bound to Pt via a sulfur atom may be either a neutral ligand or an anionic ligand. Examples of the neutral ligand include a thioether ligand, a thioketone ligand, a thioester ligand, a thioamide ligand, and sulfur-containing heterocyclic ligands (such as thiophene ligand and thiazole ligand, and fused ring derivatives containing these ligands (such as benzothiazole ligand)). Examples of the anionic ligand include an alkylmercapto ligand, an arylmercapto ligand, and a heteroarylmercapto ligand.

$Q^1$, $Q^2$, $Q^3$, and $Q^4$ bound to Pt via a phosphorus atom may be either a neutral ligand or an anionic ligand. Examples of the neutral ligand include a phosphine ligand, a phosphoric ester ligand, a phosphorous ester ligand, and phosphorus-containing heterocyclic ligands (such as phosphinine ligand). Examples of the anionic ligand include a phosphino ligand, a phosphinyl ligand, and a phosphoryl ligand.

Each of the groups represented by $Q^1$, $Q^2$, $Q^3$, and $Q^4$ may have a substituent. As the substituent, those exemplified in the substituent group A can be employed as needed. The substituents may be linked to each other (linking $Q^3$ and $Q^4$ yields a Pt complex with a cyclic tetradentate ligand).

The groups represented by $Q^1$, $Q^2$, $Q^3$, and $Q^4$ are each preferably an aromatic hydrocarbon ring ligand bound to Pt through a carbon atom, an aromatic heterocyclic ligand bound to Pt through a carbon atom, a nitrogen-containing aromatic heterocyclic ligand bound to Pt through a nitrogen atom, an acyloxy ligand, an alkyloxy ligand, an aryloxy ligand, a heteroaryloxy ligand, or a silyloxy ligand; more preferably an aromatic hydrocarbon ring ligand bound to Pt through a carbon atom, an aromatic heterocyclic ligand bound to Pt through a carbon atom, a nitrogen-containing aromatic heterocyclic ligand bound to Pt through a nitrogen atom, an acyloxy ligand, or an aryloxy ligand; still more preferably an aromatic hydrocarbon ring ligand bound to Pt through a carbon atom, an aromatic heterocyclic ligand bound to Pt through a carbon atom, a nitrogen-containing aromatic heterocyclic ligand bound to Pt via a nitrogen atom, or an acyloxy ligand.

Each of $L^1$, $L^2$ and $L^3$ represents a single bond or a divalent linking group. Examples of the divalent linking groups represented by $L^1$, $L^2$ and $L^3$ include alkylene groups (such as methylene, ethylene, and propylene), arylene groups (such as phenylene and naphthalenediyl), heteroarylene groups (such as pyridinediyl and thiophenediyl), imino groups (—NR—) (such as phenylimino group), an oxy group (—O—), a thio group (—S—), phosphinidene groups (—PR—) (such as phenylphosphinidene group), and silylene groups (—SiRR'—) (such as dimethylsilylene group and diphenylsilylene group), and combinations thereof. These linking groups may further have a substituent.

From the standpoints of stability of the complex and emission quantum efficiency, $L^1$, $L^2$ and $L^3$ each represents preferably a single bond, an alkylene group, an arylene group, a heteroarylene group, an imino group, an oxy group, a thio group, or a silylene group, more preferably a single bond, an alkylene group, an arylene group, or an imino group, still more preferably a single bond, an alkylene group, or an arylene group, still more preferably a single bond, a methylene group, or a phenylene group, still more preferably a single bond, a di-substituted methylene group, still more preferably a single bond, a dimethylmethylene group, a diethylmethylene group, a diisobutylmethylene group, a dibenzylmethylene group, an ethylmethylmethylene group, a methylpropylmethylene group, an isobutylmethylmethylene group, a diphenylmethylene group, a methylphenylmethylene group, a cyclohexanediyl group, a cyclopentanediyl group, a fluorenediyl group, or a fluoromethylmethylene group, especially preferably a single bond, a dimethylmethylene group, a diphenylmethylene group, or a cyclohexanediyl group.

The platinum complex represented by formula (C-1) is more preferably a platinum complex represented by the following formula (C-2).

(C-2)

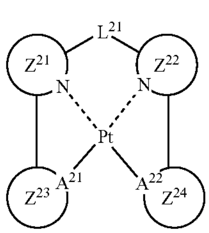

(wherein, $L^{21}$ represents a single bond or a divalent linking group; $A^{21}$ and $A^{22}$ independently represents C or N; $Z^{21}$ and $Z^{22}$ each independently represents a nitrogen-containing aromatic heterocycle, and $Z^{23}$ and $Z^{24}$ each independently represents a benzene ring or an aromatic heterocycle).

The formula (C-2) will next be described. $L^{21}$ has the same meaning as $L^1$ in the formula (C-1) and the preferred range of it is also the same.

$A^{21}$ and $A^{22}$ each independently represents a carbon atom or a nitrogen atom. It is preferred that at least one of $A^{21}$ and $A^{22}$ represents a carbon atom. From the standpoints of stability and emission quantum efficiency of the complex, it is more preferred that both of $A^{21}$ and $A^{22}$ represent carbon atoms.

$Z^{21}$ and $Z^{22}$ each independently represents a nitrogen-containing aromatic heterocycle. Examples of the nitrogen-containing aromatic heterocycle represented by $Z^{21}$ or $Z^{22}$ include a pyridine ring, a pyrimidine ring, a pyrazine ring, a triazine ring, an imidazole ring, a pyrazole ring, an oxazole ring, a thiazole ring, a triazole ring, an oxadiazole ring, and a thiadiazole ring. From the standpoints of stability, emission wavelength control, and emission quantum efficiency of the complex, the ring represented by $Z^{21}$ or $Z^{22}$ is preferably a pyridine ring, a pyrazine ring, an imidazole ring, or a pyrazole ring, more preferably a pyridine ring, an imidazole ring, or a pyrazole ring, still more preferably a pyridine ring or a pyrazole ring, especially preferably a pyridine ring.

The nitrogen-containing aromatic heterocycle represented by $Z^{21}$ and $Z^{22}$ may have a substituent. As the substituent on the carbon atom, those exemplified in the substituent group A can be employed, while as the substituent on the nitrogen atom, those exemplified in the substituent group B can be employed. Preferred examples of the substituent on the carbon atom include alkyl groups, polyfluoroalkyl groups, aryl groups, aromatic heterocyclic groups, dialkylamino groups, diarylamino groups, alkoxy groups, a cyano group, and halogen atoms. The substituent is selected as needed for controlling the emission wavelength or potential, but in order to shorten the wavelength, electron donating groups, a fluorine atom, and aromatic cyclic groups are preferred. For example, an alkyl group, a dialkylamino group, an alkoxy group, a fluorine atom, an aryl group, or an aromatic heterocyclic group is selected. In order to prolong the wavelength, electron attracting groups are preferred. For example, a cyano group or a polyfluoroalkyl group is selected. The substituent on N is preferably an alkyl group, an aryl group, or an aromatic heterocyclic group. From the standpoint of the stability of the complex, alkyl groups and aryl groups are preferred. The above-described substituents may be coupled to form a fused ring. Examples of the fused ring thus formed include a benzene ring, a pyridine ring, a pyrazine ring, a pyridazine ring, a pyrimidine ring, an imidazole ring, an oxazole ring, a thiazole ring, a pyrazole ring, a thiophene ring, and a furan ring.

$Z^{23}$ and $Z^{24}$ each independently represents a benzene ring or an aromatic heterocycle. Examples of the nitrogen-containing aromatic heterocycle represented by $Z^{23}$ or $Z^{24}$ include a pyridine ring, a pyrimidine ring, a pyrazine ring, a pyridazine ring, a triazine ring, an imidazole ring, a pyrazole ring, an oxazole ring, a thiazole ring, a triazole ring, an oxadiazole ring, a thiadiazole ring, a thiophene ring, and a furan ring. From the standpoints of the stability, emission wavelength control, and emission quantum efficiency of the complex, the ring represented by $Z^{23}$ or $Z^{24}$ is preferably a benzene ring, a pyridine ring, a pyrazine ring, an imidazole ring, a pyrazole ring, or a thiophene ring, more preferably a benzene ring, a pyridine ring, or a pyrazole ring, still more preferably a benzene ring or a pyridine ring.

The benzene ring and nitrogen-containing aromatic heterocycle represented by $Z^{23}$ or $Z^{24}$ may have a substituent. As the substituent on the carbon atom, those exemplified in the substituent group A can be employed, while as the substituent on the nitrogen atom, those exemplified in the substituent group B can be employed. Preferred examples of the substituent on the carbon atom include alkyl groups, polyfluoroalkyl groups, aryl groups, aromatic heterocyclic groups, dialkylamino groups, diarylamino groups, alkoxy groups, a cyano group, and halogen atoms. The substituent may be selected as needed for controlling the emission wavelength or potential. In order to prolong the wavelength, electron donating groups and aromatic cyclic groups are preferred and for example, an alkyl group, a dialkylamino group, an alkoxy group, an aryl group, or an aromatic heterocyclic group is selected. In order to shorten the wavelength, electron attracting groups are preferred and for example, a fluorine group, a cyano group, or a polyfluoroalkyl group is selected. The substituent on N is preferably an alkyl group, an aryl group, or an aromatic heterocyclic group. From the standpoint of stability of the complex, alkyl groups and aryl groups are preferred. The above-described substituents may be coupled to form a fused ring. Examples of the fused ring thus formed include a benzene ring, a pyridine ring, a pyrazine ring, a pyridazine ring, a pyrimidine ring, an imidazole ring, an oxazole ring, a thiazole ring, a pyrazole ring, a thiophene ring, and a furan ring.

One of the more preferred modes of the platinum complex represented by the formula (C-2) is a platinum complex represented by the following formula (C-4):

(C-4)

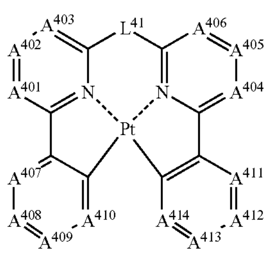

(in the formula (C-4), $A^{401}$ to $A^{414}$ each independently represents C—R or N in which R represents a hydrogen atom or a substituent, and $L^{41}$ represents a single bond or a divalent linking group).

The formula (C-4) will next be described.

$A^{401}$ to $A^{414}$ each independently represents C—R or N in which R represents a hydrogen atom or a substituent.

$L^{41}$ has the same meaning as $L^{21}$ in the formula (C-2) and the preferred range of it is also the same.

$A^{401}$ to $A^{406}$ each independently represents CR— or N in which R represents a hydrogen atom or a substituent. Examples of the substituent represented by R include those listed in the substituent group A.

$A^{401}$ to $A^{406}$ are each preferably C—R and Rs may be coupled to each other to form a ring. When $A^{401}$ to $A^{406}$ each represents C—R, the R of $A^{402}$ and $A^{405}$ is preferably a hydrogen atom, an alkyl group, an aryl group, an amino group, an alkoxy group, an aryloxy group, a fluorine group, or a cyano group, more preferably a hydrogen atom, an amino group, an alkoxy group, an aryloxy group, or a fluorine group, especially preferably a hydrogen atom or a fluorine group. The R of $A^{401}$, $A^{403}$, $A^{404}$, and $A^{406}$ is preferably a hydrogen atom, an alkyl group, an aryl group, an amino group, an alkoxy group, an aryloxy group, a fluorine group, or a cyano group, more preferably a hydrogen atom, an amino group, an alkoxy group, an aryloxy group, or a fluorine group, especially preferably a hydrogen atom.

With respect to $A^{407}$ to $A^{414}$, the number of N (nitrogen atoms) in $A^{407}$ to $A^{410}$ and $A^{411}$ to $A^{414}$ is preferably from 0 to 2, more preferably from 0 to 1. When the emission wavelength is shifted to the short wavelength side, it is preferred that at least one of $A^{408}$ and $A^{412}$ is an N atom and it is more preferred that both of $A^{408}$ and $A^{412}$ are N atoms.

When $A^{407}$ to $A^{414}$ each represents C—R, the R of $A^{408}$ and $A^{412}$ is preferably a hydrogen atom, an alkyl group, a polyfluoroalkyl group, an aryl group, an amino group, an alkoxy group, an aryloxy group, a fluorine group, or a cyano group, more preferably a hydrogen atom, a polyfluoroalkyl group, an alkyl group, an aryl group, a fluorine atom, or a cyano group, especially preferably a hydrogen atom, a phenyl group, a polyfluoroalkyl group, or a cyano group. The R of $A^{407}$, $A^{409}$, $A^{411}$, and $A^{413}$ is preferably a hydrogen atom, an alkyl group, a polyfluoroalkyl group, an aryl group, an amino group, an alkoxy group, an aryloxy group, a fluorine group, or a cyano group, more preferably a hydrogen atom, a polyfluoroalkyl group, a fluorine group, or a cyano group, especially preferably a hydrogen atom, a phenyl group, or a fluorine group. The R of $A^{410}$ and $A^{414}$ is preferably a hydrogen atom or a fluorine group, more preferably a hydrogen atom. When any one of $A^{407}$ to $A^{409}$ and $A^{411}$ to $A^{413}$ represents C—R, Rs may be coupled to each other to form a ring.

One of the more preferred modes of the platinum complex represented by the formula (C-2) is a platinum complex represented by the following formula (C-5):

(C-5)

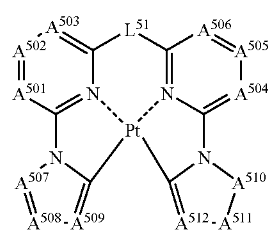

(in the formula (C-5), $A^{501}$ to $A^{512}$ each independently represents C—R or N in which R represents a hydrogen atom or a substituent, and $L^{51}$ represents a single bond or a divalent linking group).

The formula (C-5) will next be described. $A^{501}$ to $A^{506}$ and $L^{51}$ have the same meanings as $A^{401}$ to $A^{406}$ and $L^{41}$ in the formula (C-4) and the preferred ranges of them are also the same.

$A^{507}$, $A^{508}$, and $A^{509}$ and $A^{510}$, $A^{511}$, and $A^{512}$ each independently represents C—R or N in which R represents a hydrogen atom or a substituent. Examples of the substituent represented by R include those listed in the substituent group A. When $A^{507}$, $A^{508}$, and $A^{509}$ and $A^{510}$, $A^{511}$, and $A^{512}$ each represents C—R, R is preferably a hydrogen atom, an alkyl group, a polyfluoroalkyl group, an aryl group, an aromatic heterocyclic group, a dialkylamino group, a diarylamino group, an alkyloxy group, a cyano group, or a halogen atom, more preferably a hydrogen atom, an alkyl group, a polyfluoroalkyl group, an aryl group, a dialkylamino group, a cyano group, or a fluorine atom, still more preferably a hydrogen atom, an alkyl group, a trifluoromethyl group, or a fluorine atom. If possible, the substituents may be coupled to each other to form a fused ring structure. Preferably at least one of $A^{507}$, $A^{508}$, and $A^{509}$ or at least one of $A^{510}$, $A^{511}$, and $A^{512}$ represents N and especially preferably $A^{510}$ represents N.

Another preferred mode of the platinum complex represented by the formula (C-1) is a platinum complex represented by the following formula (C-6):

(C-6)

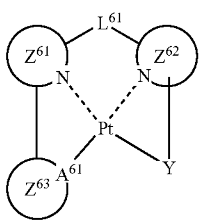

(wherein, $L^{61}$ represents a single bond or a divalent linking group, $A^{61}$s each independently represents C or N, $Z^{61}$ and $Z^{62}$ each independently represents a nitrogen-containing aromatic heterocycle, $Z^{63}$s each independently represents a benzene ring or an aromatic heterocycle, and Y represents an anionic non-cyclic ligand bound to Pt).

The formula (C-6) will next be described. $L^{61}$ has the same meaning as $L^{1}$ in the formula (C-1) and the preferred range of it is also the same.

$A^{61}$ represents C or N. From the standpoints of the stability and emission quantum efficiency of the complex, $A^{61}$ is preferably C.

$Z^{61}$ and $Z^{62}$ have the same meanings as $Z^{21}$ and $Z^{22}$ in the formula (C-2), respectively and the preferred ranges of them are also the same. $Z^{63}$ has the same meaning as $Z^{23}$ in the formula (C-2) and the preferred range of it is also the same.

Y represents an anionic non-cyclic ligand bound to Pt. The term "non-cyclic ligand" means a ligand whose atom bound to Pt does not form a ring. The atom bound to Pt in Y is preferably a carbon atom, a nitrogen atom, an oxygen atom, or a sulfur atom, more preferably a nitrogen atom or an oxygen atom, most preferably an oxygen atom. Y bound to Pt through a carbon atom is, for example, a vinyl ligand. Y bound to Pt through an oxygen atom is, for example, an alkoxy ligand, an aryloxy ligand, a heteroaryloxy ligand, an acyloxy ligand, a silyloxy ligand, a carboxyl ligand, a phosphoric acid ligand, a sulfonic acid ligand, or the like. Y bound to Pt through a sulfur atom is, for example, an alkylmercapto ligand, an arylmercapto ligand, a heteroarylmercapto ligand, or a thiocarboxylic acid ligand.

The ligand represented by Y may have a substituent and as the substituent, those exemplified in the substituent group A can be employed. In addition, the substituents may be coupled to each other.

The ligand represented by Y is preferably a ligand bound to Pt through an oxygen atom, more preferably an acyloxy ligand, an alkyloxy ligand, an aryloxy ligand, a heteroaryloxy ligand, or a silyloxy ligand, more preferably an acyloxy ligand.

One of the more preferred modes of the platinum complex represented by the formula (C-6) is a platinum complex represented by the following formula (C-7):

(C-7)

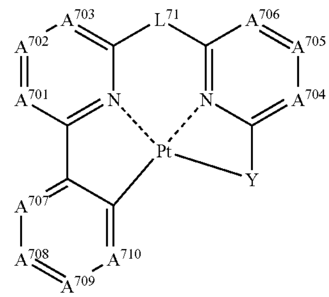

(wherein, $A^{701}$ to $A^{710}$ each independently represents C—R or N in which R represents a hydrogen atom or a substituent, $L^{71}$ represents a single bond or a divalent linking group, and Y represents an anionic non-cyclic ligand bound to Pt).

The formula (C-7) will next be described. $L^{71}$ has the same meaning as $L^{61}$ in the formula (C-6) and the preferred range of it is also the same. $A^{701}$ to $A^{710}$ have the same meanings as $A^{401}$ to $A^{410}$ in the formula (C-4) and the preferred ranges of them are also the same. Y has the same meaning as in the formula (C-6) and the preferred range of it is also the same.

Specific examples of the platinum complex represented by the formula (C-1) include the compounds described in [0143] to [0152], [0157] to [0158], and [0162] to [0168] in Japanese Patent Laid-Open No. 2005-310733, the compounds described in [0065] to [0083] in Japanese Patent Laid-Open No. 2006-256999, the compounds described in [0065] to [0090] in Japanese Patent Laid-Open No. 2006-93542, the compounds described in [0063] to [0071] in Japanese Patent Laid-Open No. 2007-73891, the compounds described in [0079] to [0083] in Japanese Patent Laid-Open No. 2007-324309, the compounds described in [0065] to [0090] in Japanese Patent Laid-Open No. 2006-93542, the compounds described in [0055] to [0071] in Japanese Patent Laid-Open No. 2007-96255, and the compounds described in [0043] to [0046] in Japanese Patent Laid-Open No. 2006-313796. Additional examples include platinum complexes exemplified below.

1-1

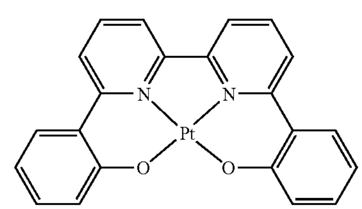

1-2

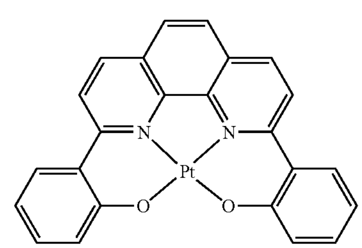

-continued
1-3
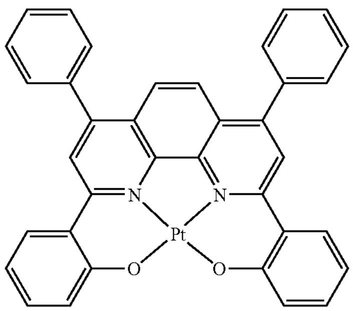
2-1
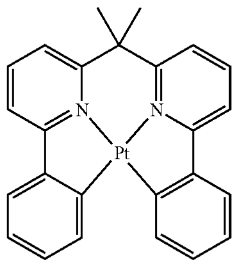
2-1
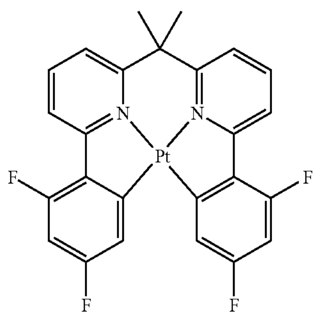
2-2
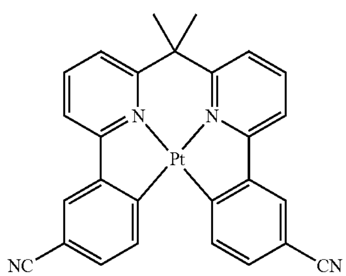
2-3
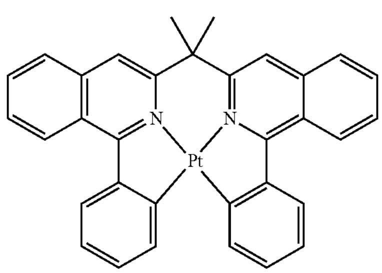
-continued
3-4
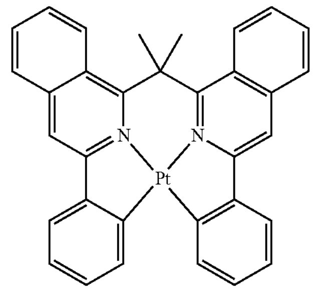
2-5
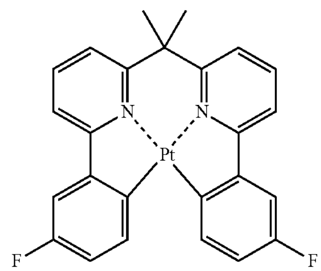
2-6
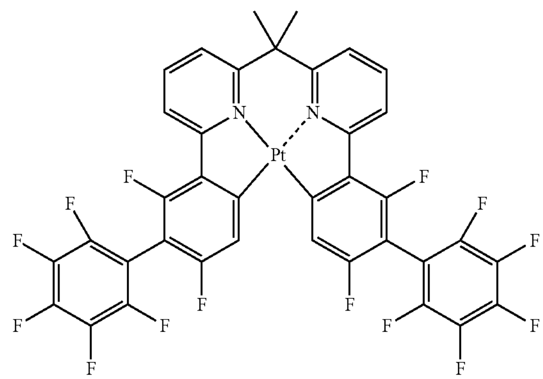
2-7
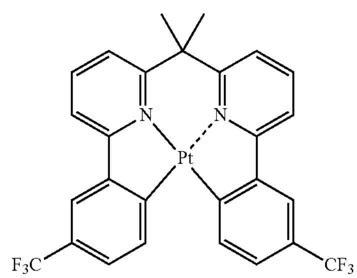
2-8
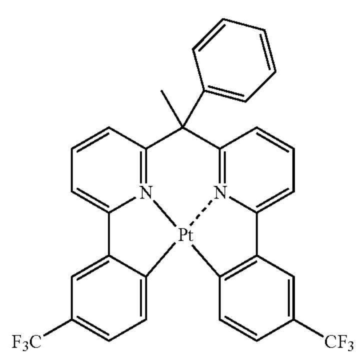

2-9
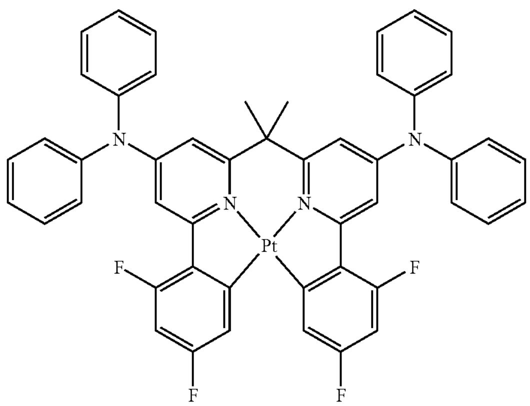
2-10
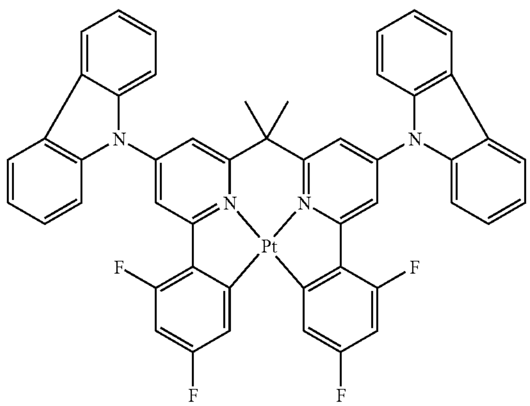
2-11
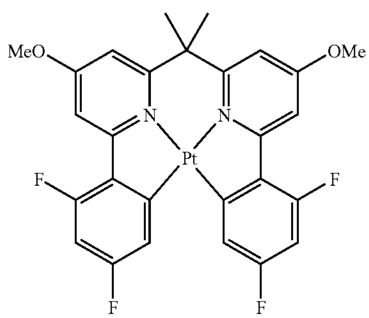
2-12
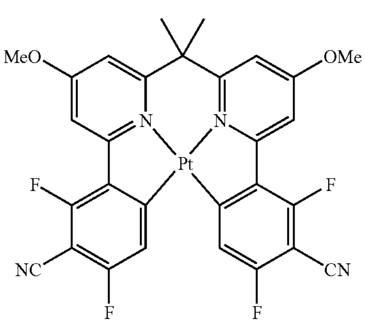
3-1
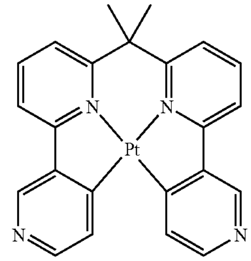
3-2
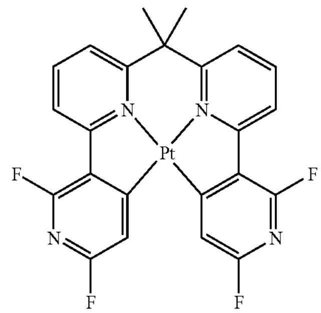
3-3
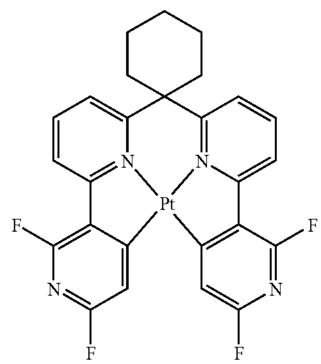
3-4
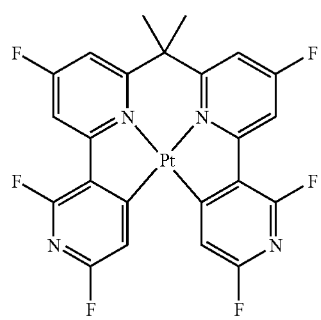
3-5
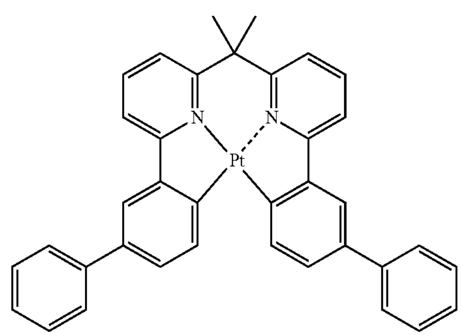

-continued
4-1
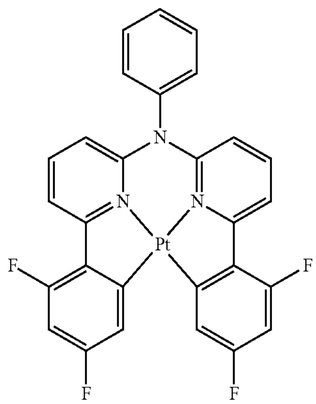
4-2
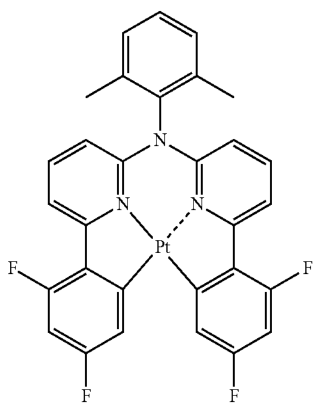
4-3
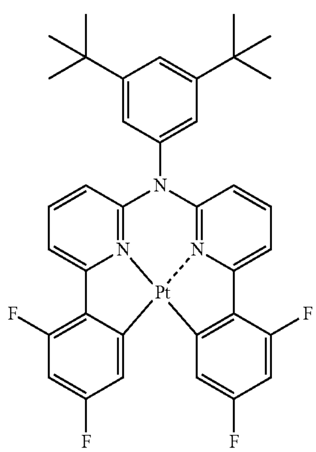
4-4
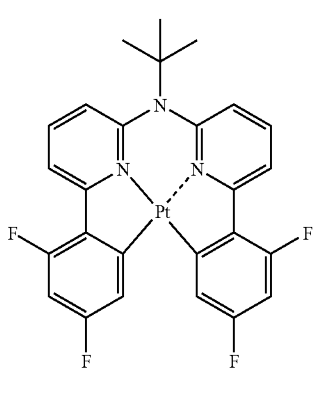
-continued
4-5
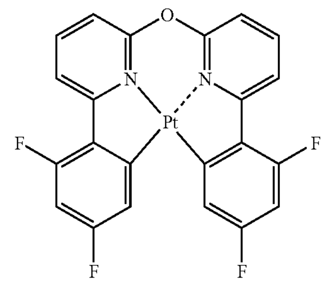
5-1
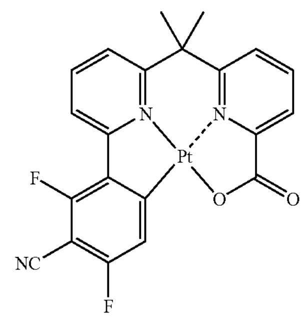
5-2
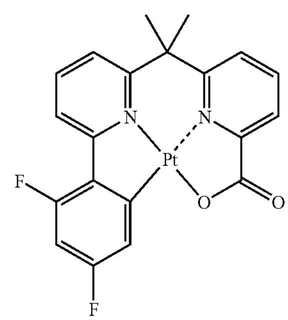
5-3
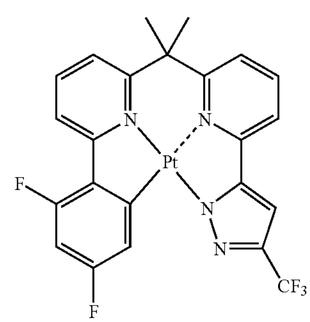
5-5
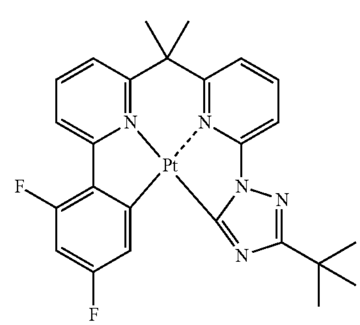

-continued
6-1
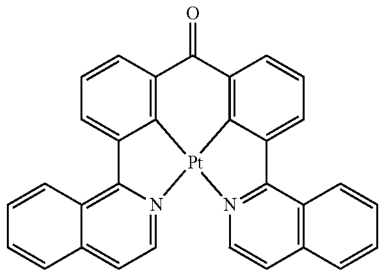
6-2
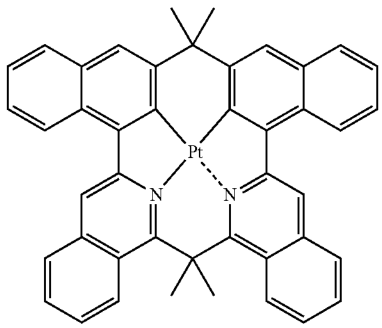
6-3
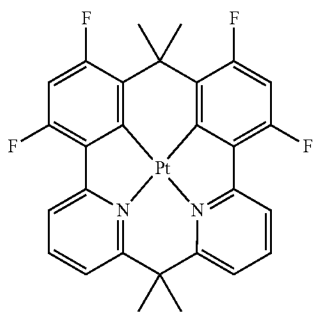
6-4
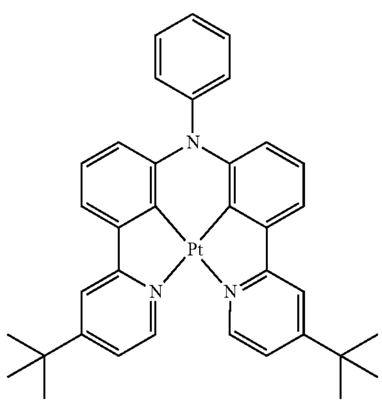
6-6
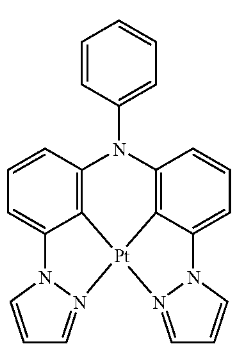
-continued
7-1
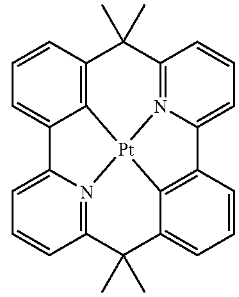
7-2
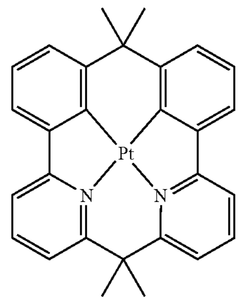
7-3
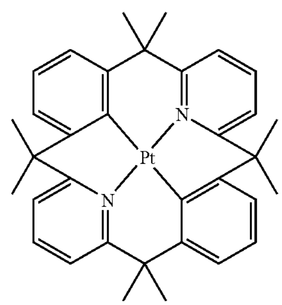
7-4
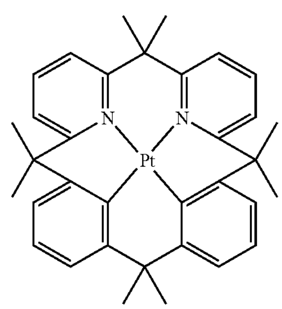
7-5
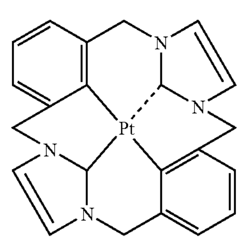

-continued
8-1
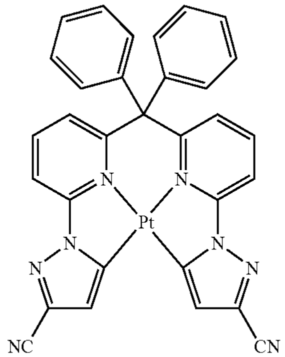
8-2
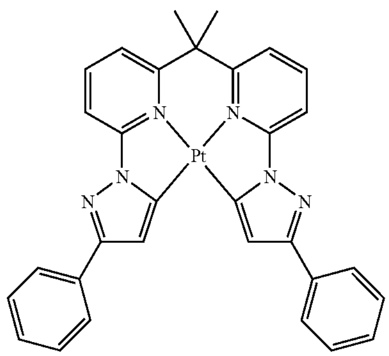
8-3
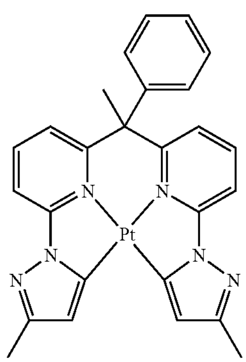
8-4
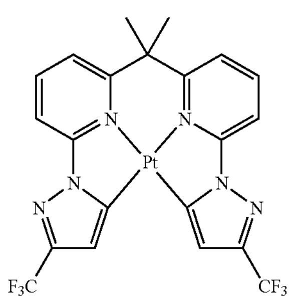
-continued
8-5
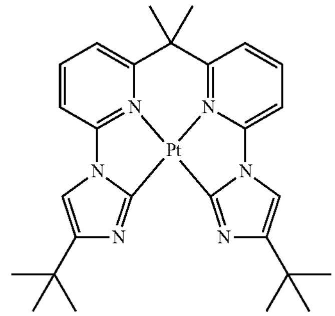
8-6
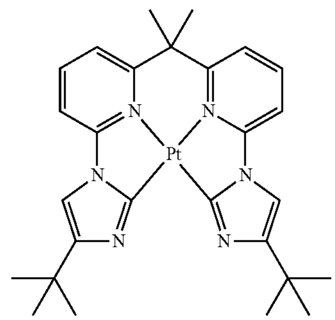
8-8
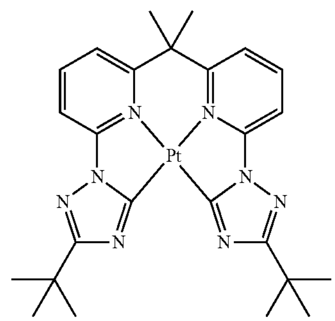
8-9
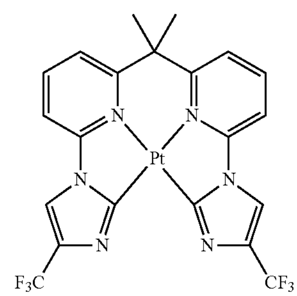
8-10
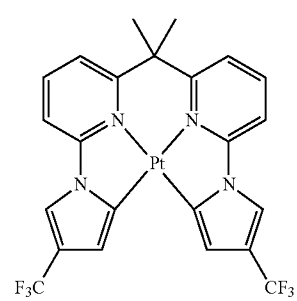

-continued
8-11
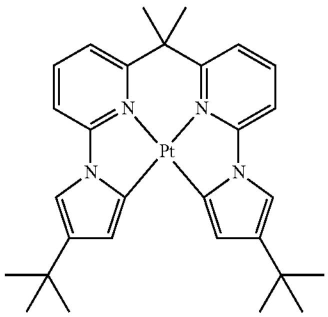
9-1
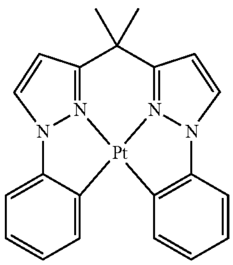
9-2
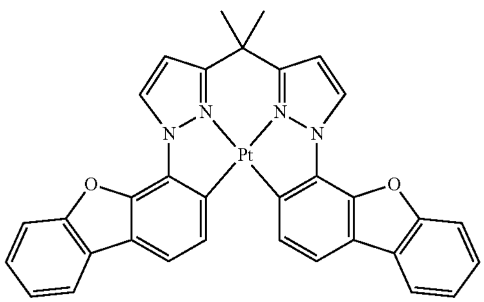
9-3
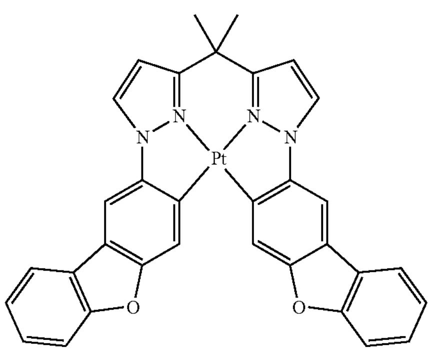
9-4
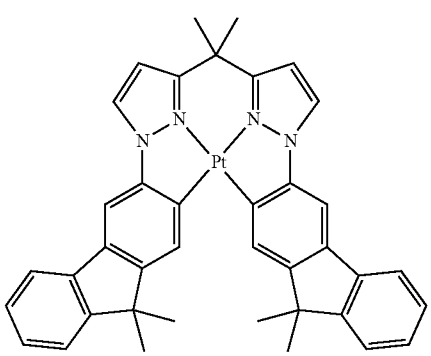
-continued
9-5
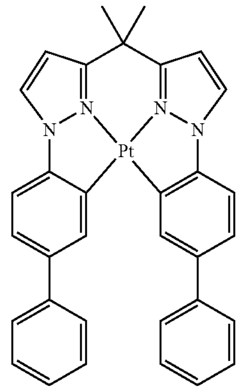
9-6
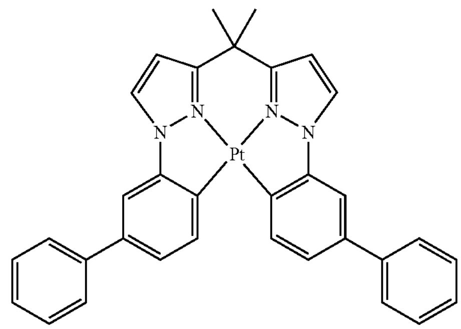
9-7
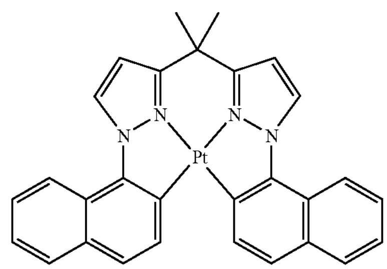
9-8
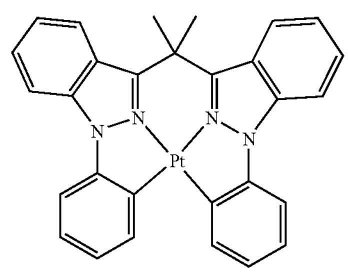
9-9
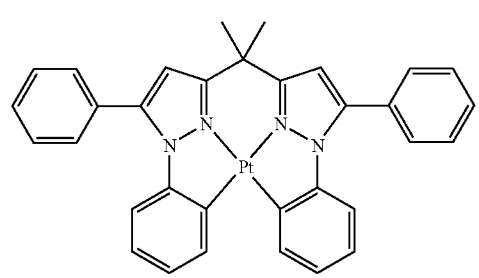

-continued
9-10
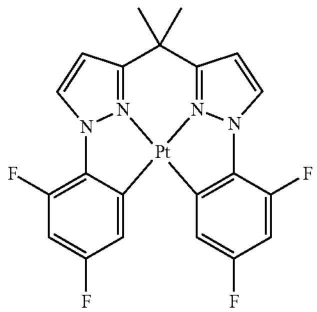
9-11
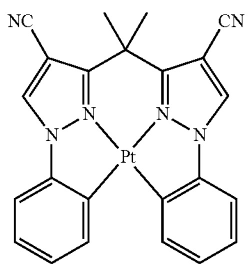
9-12
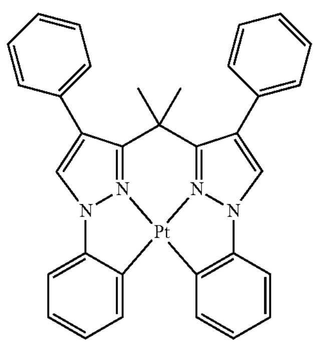
9-13
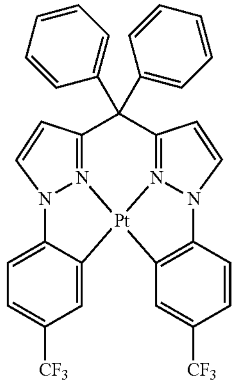
-continued
9-14
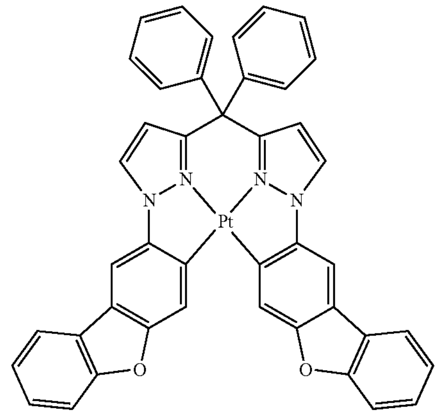
9-15
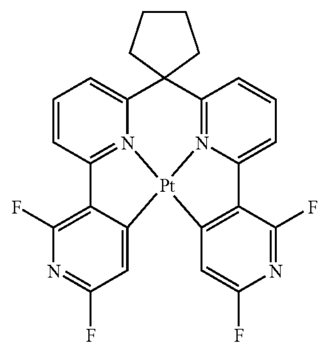
9-16
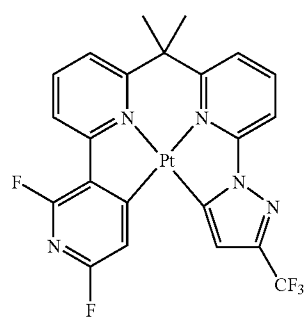
9-17
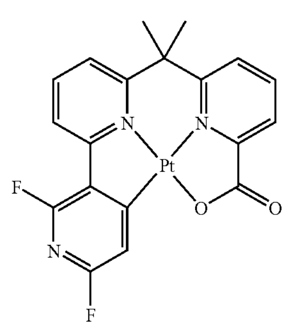

-continued 9-18

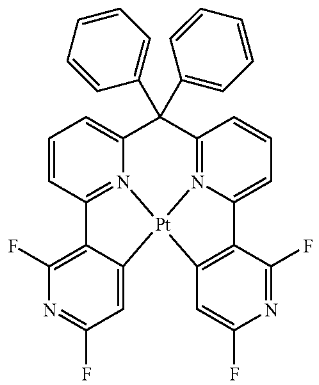

9-19

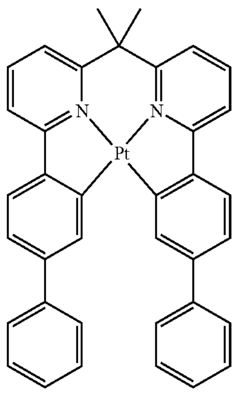

The platinum complex compounds represented by the formula (C-1) can be synthesized by various processes, for example, the processes described in G. R. Newkome et al., *Journal of Organic Chemistry,* 53, 786 (1988), page 789, line 53 of left column to line 7 of right column, page 790, lines 18 to 38 of left column, and page 790, lines 19 to 30 of right column, and combinations of these processes; and the processes described in H. Lexy et al., *Chemische Berichte,* 113, 2749 (1980), page 2752, lines 26 to 35.

For example, the platinum complex compound can be obtained by placing under the condition of a temperature not greater than a room temperature or heating (in addition to ordinary heating, microwave heating is also effective) a ligand or a dissociated product thereof and a metal compound in a solvent (such as halogen-based solvent, alcohol-based solvent, ether-based solvent, ester-based solvent, ketone-based solvent, nitrile-based solvent, amide-based solvent, sulfone-based solvent, sulfoxide-based solvent, or water) or in a solventless manner in the presence of a base (various inorganic and organic bases such as sodium methoxide, t-butoxy potassium, triethylamine, and potassium carbonate) or in the absence of a base.

The content of the compound represented by the formula (C-1) in the light emitting layer of the invention is preferably from 1 to 30 mass %, more preferably from 3 to 25 mass %, still more preferably from 5 to 20 mass %.

The platinum complex material is preferably a platinum complex material represented by the following formula (1).

In one mode of the invention, the light emitting layer preferably contains at least one of the compounds represented by the above formulae (I) to (X) and at least one of tetradentate platinum complexes represented by the following formula (1).

(1)

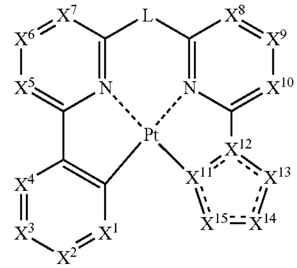

(in the formula (1), $X^1$, $X^2$, $X^3$, and $X^4$ each independently represents a carbon atom or a nitrogen atom, with the proviso that any one or more of $X^1$, $X^2$, $X^3$, and $X^4$ each represents a nitrogen atom, $X^5$, $X^6$, $X^7$, $X^8$, $X^9$, and $X^{10}$ each independently represents a carbon atom or a nitrogen atom, $X^{11}$ and $X^{12}$ each independently represents a carbon atom or a nitrogen atom, $X^{13}$, $X^{14}$, and $X^{15}$ each independently represents a carbon atom, a nitrogen atom, an oxygen atom, or a sulfur atom, with the proviso that the number of nitrogen atoms contained in the 5-membered ring skeleton represented by $X^{11}$, $X^{12}$, $X^{13}$, $X^{14}$, and $X^{15}$ is 2 or less, and L represents a single bond or a divalent linking group).

$X^1$, $X^2$, $X^3$, and $X^4$ each independently represents a carbon atom or a nitrogen atom. When $X^1$, $X^2$, $X^3$, and $X^4$ can be substituted further, they each may independently have a substituent. When $X^1$, $X^2$, $X^3$, or $X^4$ has a substituent, examples of the substituent include those exemplified in the substituent group A. The substituent is preferably an alkyl group, a perfluoroalkyl group, an aryl group, an aromatic heterocyclic group, a dialkylamino group, a diarylamino group, an alkyloxy group, a cyano group, or a halogen atom, more preferably, an alkyl group, a perfluoroalkyl group, an aryl group, a dialkylamino group, a cyano group, or a fluorine atom, still more preferably an alkyl group, a trifluoromethyl group, or a fluorine atom. If possible, the substituents may be coupled to each other to form a ring fused structure.

Any one or more of $X^1$, $X^2$, $X^3$, and $X^4$ represent a nitrogen atom. The number of nitrogen atoms is preferably from 1 or 2, more preferably 1.

Any of $X^1$, $X^2$, $X^3$, and $X^4$ may a nitrogen atom. Preferably, either one of $X^2$ or $X^3$ represents a nitrogen atom. More preferably, $X^3$ represents a nitrogen atom.

In the formula (1), examples of a 6-membered ring formed of two carbon atoms, $X^1$, $X^2$, $X^3$, and $X^4$ include a pyridine ring, a pyrazine ring, a pyrimidine ring, a pyridazine ring, and a triazine ring. Of these, a pyridine ring, a pyrazine ring, a pyrimidine ring, and a pyridazine ring are more preferred, with a pyridine ring being especially preferred. It is advantageous that the 6-membered ring formed of $X^1$, $X^2$, $X^3$, and $X^4$ is a pyridine ring, a pyrazine ring, a pyrimidine ring, or a pyridazine ring (especially preferably, a pyridine ring) because compared with the case where the 6-membered ring is a benzene ring, a metal complex can be formed more easily because of improvement in the acidity of the hydrogen atom present at a metal-carbon bond forming position.

$X^5$, $X^6$, $X^7$, $X^8$, $X^9$, and $X^{10}$ each independently represents a carbon atom or a nitrogen atom. $X^5$, $X^6$, $X^7$, $X^8$, $X^9$, and $X^{10}$ represents preferably a carbon atom.

When $X^5$, $X^6$, $X^7$, $X^8$, $X^9$, and $X^{10}$ may be substituted further, they each may independently have a substituent. When $X^5$, $X^6$, $X^7$, $X^8$, $X^9$, or $X^{10}$ has a substituent, examples of the substituent include those exemplified in the substituent group A. The substituent is preferably an alkyl group, a perfluoroalkyl group, an aryl group, an aromatic heterocyclic group, a dialkylamino group, a diarylamino group, an alkyloxy group, a cyano group, or a halogen atom, more preferably, an alkyl group, a perfluoroalkyl group, an aryl group, a dialkylamino group, a cyano group, or a fluorine atom, still more preferably an alkyl group, a dialkylamino group, a trifluoromethyl group, or a fluorine atom. If possible, the substituents may be coupled to each other to form a ring fused structure.

$X^{11}$ and $X^{12}$ each independently represents a carbon atom or a nitrogen atom. It is preferred that either one of $X^{11}$ and $X^{12}$ represents a carbon atom and the other one represents a nitrogen atom.

$X^{13}$, $X^{14}$, and $X^{15}$ each independently represents a carbon atom, a nitrogen atom, an oxygen atom, or a sulfur atom, preferably a carbon atom or a nitrogen atom.

The number of nitrogen atoms contained in a 5-membered ring skeleton represented by $X^{11}$, $X^{12}$, $X^{13}$, $X^{14}$, and $X^{15}$ is 2 or less (0, 1, or 2), preferably 1 or 2, more preferably 2.

When $X^{11}$, $X^{12}$, $X^{13}$, $X^{14}$, and $X^{15}$ can be substituted further, they each may independently have a substituent. When $X^{11}$, $X^{12}$, $X^{13}$, $X^{14}$, or $X^{15}$ has a substituent, examples of the substituent include those exemplified in the substituent group A. The substituent is preferably an alkyl group, a perfluoroalkyl group, an aryl group, an aromatic heterocyclic group, a dialkylamino group, a diarylamino group, an alkyloxy group, a cyano group, or a halogen atom, more preferably, an alkyl group, a perfluoroalkyl group, an aryl group, a dialkylamino group, a cyano group, or a fluorine atom, still more preferably an alkyl group, a cyano group, a trifluoromethyl group, or a fluorine atom. If possible, the substituents may be coupled to each other to form a ring fused structure.

The bond in the 5-membered ring skeleton represented by $X^{11}$, $X^{12}$, $X^{13}$, $X^{14}$, and $X^{15}$ may be any combination of a single bond and a double bond. Examples of the 5-membered ring formed of $X^{11}$, $X^{12}$, $X^{13}$, $X^{14}$, and $X^{15}$ include a pyrrole ring, a pyrazole ring, an imidazole ring, a furan ring, and a thiophene ring, more preferably a pyrrole ring, a pyrazole ring, and an imidazole ring, still more preferably a pyrrole ring, and a pyrazole ring. It is advantageous that the 5-membered ring formed of $X^{11}$, $X^{12}$, $X^{13}$, $X^{14}$, and $X^{15}$ is a pyrrole ring, a pyrazole ring, or an imidazole ring (more preferably, a pyrrole ring or a pyrazole ring) because such a ring improves the stability of the metal complex.

L represents a single bond or a divalent linking group. Examples of the divalent linking group represented by L include alkylene groups (such as methylene, ethylene, and propylene), arylene groups (such as phenylene and naphthalenediyl), heteroarylene groups (such as pyridinediyl and thiophenediyl), imino groups (—NR—) (such as phenylimino group), an oxy group (—O—), a thio group (—S—), phosphinidene groups (—PR—) (such as phenylphosphinidene), and silylene groups (—SiRR'—) (such as dimethylsilylene and diphenylsilylene), and combinations thereof. These linking groups may have a substituent further. When these linking groups have a substituent, examples of the substituent include those exemplified in the substituent group A.

L represents preferably a single bond, an alkylene group, an arylene group, a heteroarylene group, an imino group, an oxy group, a thio group, or a silylene group, more preferably a single bond, an alkylene group, an arylene group, or an imino group, more preferably a single bond, an alkylene group, or an arylene group, still more preferably a single bond, a methylene group, or a phenylene group, still more preferably a single bond or a di-substituted methylene group, still more preferably a single bond, a dimethylmethylene group, a diethylmethylene group, a diisobutylmethylene group, a dibenzylmethylene group, an ethylmethylmethylene group, a methylpropylmethylene group, an isobutylmethylmethylene group, a diphenylmethylene group, a methylphenylmethylene group, a cyclohexanediyl group, a cyclopentanediyl group, a fluorenediyl group, or a fluoromethylmethylene group, especially preferably a single bond, a dimethylmethylene group, a diphenylmethylene group, or a cyclohexanediyl group, most preferably a dimethylmethylene group, a diphenylmethylene group.

The following are specific examples of the divalent linking group but they are not limited to these examples.

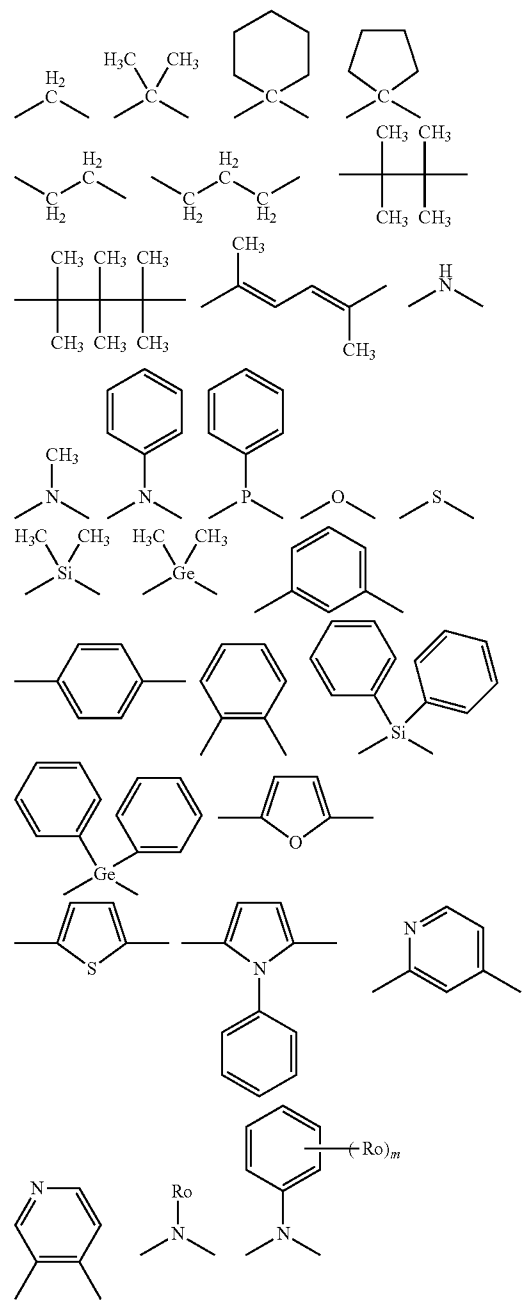

The $R_0$ represents a substituent selected from the substituent group A. Ro represents preferably an alkyl group, more preferably a $C_{1-6}$ alkyl group. m stands for an integer of from 1 to 5, preferably from 2 to 5, more preferably from 2 to 3.

The metal complex represented by the formula (1) is preferably a platinum complex represented by the formula (2).

(2)

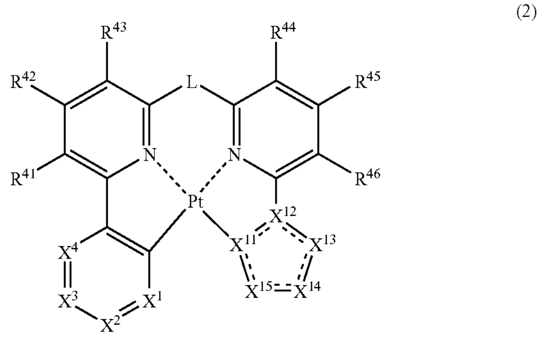

(wherein, $X^1$, $X^2$, $X^3$, and $X^4$ each independently represents a carbon atom or a nitrogen atom, with the proviso that any one or more of $X^1$, $X^2$, $X^3$, and $X^4$ represents a nitrogen atom, $R^{41}$, $R^{42}R^{43}$, $R^{44}$, $R^{45}$, and $R^{46}$ each independently represents a hydrogen atom or a substituent, $X^{11}$ and $X^{12}$ each independently represents a carbon atom or a nitrogen atom, $X^{13}$, $X^{14}$, and $X^{15}$ each independently represents a carbon atom, a nitrogen atom, an oxygen atom, or a sulfur atom, with the proviso that the number of nitrogen atoms contained in the 5-membered ring skeleton represented by $X^{11}$, $X^{12}$, $X^{13}$, $X^{14}$, and $X^{15}$ is 2 or less, and L represents a single bond or a divalent linking group).

$X^1$, $X^2$, $X^3$, $X^4$, $X^{11}$, $X^{12}$, $X^{13}$, $X^{14}$, $X^{15}$ and L in the formula (2) have the same meanings as $X^1$, $X^2$, $X^3$, $X^4$, $X^{11}$, $X^{12}$, $X^{13}$, $X^{14}$, $X^{15}$ L in the formula (1) and the preferred ranges of them are also the same.

$R^{41}$, $R^{42}$, $R^{43}$, $R^{44}$, $R^{45}$ and $R^{46}$ in the formula (2) each independently represents a hydrogen atom or a substituent. The substituents represented by $R^{41}$, $R^{42}$, $R^{43}$, $R^{44}$, and $R^{46}$ have the same meanings as the substituent group A. If possible, $R^{41}$, $R^{42}$, $R^{43}$, $R^{44}$, $R^{45}$, and $R^{46}$ may be coupled to each other to form a ring.

$R^{41}$ and $R^{46}$ are each preferably a hydrogen atom, an alkyl group, an aryl group, an amino group, an alkoxy group, an aryloxy group, an acyl group, an alkoxycarbonyl group, an alkylthio group, a sulfonyl group, a hydroxy group, a halogen atom, a cyano group, a nitro group, or a heterocyclic group, more preferably a hydrogen atom, an alkyl group, an aryl group, a halogen atom, a cyano group, or a heterocyclic group, still more preferably a hydrogen atom, a methyl group, a t-butyl group, a trifluoromethyl group, a phenyl group, a fluorine atom, a cyano group, or a pyridyl group, still more preferably a hydrogen atom, a methyl group, or a fluorine atom, especially preferably a hydrogen atom.

$R^{43}$ and $R^{44}$ preferably have the same meanings as preferred examples of $R^{41}$ and $R^{46}$.

$R^{42}$ and $R^{45}$ each represents preferably a hydrogen atom, an alkyl group, an aryl group, an amino group, an alkoxy group, an aryloxy group, an alkylthio group, an arylthio group, a halogen atom, a cyano group, or a heterocyclic group, more preferably a hydrogen atom, an alkyl group, an aryl group, an amino group, an alkoxy group, an aryloxy group, a halogen atom, or a heterocyclic group, more preferably a hydrogen atom, an alkyl group, an amino group, an alkoxy group, a halogen atom, or a heterocyclic group, still more preferably a hydrogen atom, a methyl group, a t-butyl group, a dialkylamino group, a diphenylamino group, a methoxy group, a phenoxy group, a fluorine atom, an imidazolyl group, a pyrrolyl group, or a carbazoyl group, especially preferably a hydrogen atom, a fluorine atom, or a methyl group, most preferably a hydrogen atom.

One of the preferred modes of the platinum complex represented by the formula (2) is a platinum complex represented by the formula (2a-1):

(2a-1)

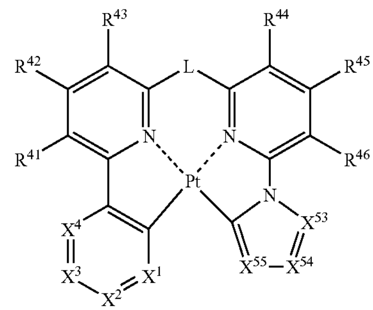

(wherein, $X^1$, $X^2$, $X^3$, and $X^4$ each independently represents a carbon atom or a nitrogen atom, with the proviso that any one or more of $X^1$, $X^2$, $X^3$, and $X^4$ represents a nitrogen atom, $R^{41}$, $R^{42}$, $R^{43}$, $R^{44}$, $R^{45}$, and $R^{46}$ each independently represents a hydrogen atom or a substituent, $X^{53}$, $X^{54}$, and $X^{55}$ each independently represents a carbon atom or a nitrogen atom, with the proviso that the number of nitrogen atoms contained in the 5-membered ring skeleton containing $X^{53}$, $X^{54}$, and $X^{55}$ is 1 or 2, and L represents a single bond or a divalent linking group).

$X^1$, $X^2$, $X^3$, $X^4$, $R^{41}$, $R^{42}$, $R^{43}$, $R^{44}$, $R^{45}$, $R^{46}$ and L in the formula (2a-1) have the same meanings as $X^1$, $X^2$, $X^3$, $X^4$, $R^{41}$, $R^{42}$, $R^{43}$, $R^{44}$, $R^{45}$, $R^{46}$ and L in the formula (2) and the preferred ranges of them are also the same.

$X^{53}$, $X^{54}$, and $X^{55}$ each independently represents a carbon atom or a nitrogen atom. When $X^{53}$, $X^{54}$, or $X^{55}$ can be substituted further, it may have a substituent. When $X^{53}$, $X^{54}$, or $X^{55}$ has a substituent, examples of the substituent include those exemplified in the substituent group A. The substituent is preferably an alkyl group, a perfluoroalkyl group, an aryl group, an aromatic heterocyclic group, a dialkylamino group, a diarylamino group, an alkyloxy group, a cyano group, or a halogen atom, more preferably, an alkyl group, a perfluoroalkyl group, an aryl group, a dialkylamino group, a cyano group, or a fluorine atom, still more preferably an alkyl group, a trifluoromethyl group, or a fluorine atom. If possible, the substituents may be coupled to each other to form a ring fused structure.

In the formula (2a-1), the number of nitrogen atoms contained in the 5-membered ring skeleton formed of a carbon atom, a nitrogen atom, $X^{53}$, $X^{54}$, and $X^{55}$ is 1 or 2, preferably 2.

Examples of the 5-membered ring formed of a carbon atom, a nitrogen atom, $X^{53}$, $X^{54}$, and $X^{55}$ include a pyrrole ring, a pyrazole ring, and an imidazole ring. Of these, a pyrrole ring and a pyrazole ring are more preferred, with a pyrazole ring being most preferred.

The platinum complex represented by the formula (2a-1) is preferably a platinum complex represented by the formula (2a-2).

(2a-2)

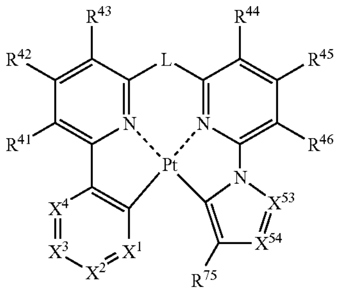

(wherein, $X^1$, $X^2$, $X^3$, and $X^4$ each independently represents a carbon atom or a nitrogen atom, with the proviso that any one or more of $X^1$, $X^2$, $X^3$, and $X^4$ each represents a nitrogen atom, $R^{41}$, $R^{42}$, $R^{43}$, $R_{44}$, $R^{45}$, and $R^{46}$ each independently represents a hydrogen atom or a substituent, $X^{53}$ or $X^{54}$ each independently represents a carbon atom or a nitrogen atom, with the proviso that the number of nitrogen atoms contained in a 5-membered ring skeleton containing $X^{53}$ and $X^{54}$ is 1 or 2, $R^{75}$ represents a hydrogen atom or a substituent, and L represents a single bond or a divalent linking group).

$X^1$, $X^2$, $X^3$, $X^4$, $X^{53}$, $X^{54}$, $R^{41}$, $R^{42}$, $R^{43}$, $R^{44}$, $R^{45}$, $R^{46}$ and L in the formula (2a-2) have the same meanings as $X^1$, $X^2$, $X^3$, $X^4$, $X^{53}$, $X^{54}$, $R^{41}$, $R^{42}$, $R^{43}$, $R^{44}$, $R^{45}$, $R^{46}$ and L in the formula (2a-1) and the preferred ranges of them are also the same.

$R^{75}$ represents a hydrogen atom or a substituent. Examples of the substituent include those exemplified in the substituent group A. $R^{75}$ is preferably a hydrogen atom, an alkyl group, a perfluoroalkyl group, an aryl group, an aromatic heterocyclic group, a dialkylamino group, a diarylamino group, an alkyloxy group, a cyano group, or a halogen atom, more preferably a hydrogen atom, an alkyl group, a perfluoroalkyl group, an aryl group, a dialkylamino group, a cyano group, or a fluorine atom, more preferably a hydrogen atom, an alkyl group, a trifluoromethyl group, a cyano group, or a fluorine atom, most preferably a cyano group, a fluorine atom, or a hydrogen atom. If possible, it may be coupled to the substituent of $X^{54}$ or $X^{53}$ to form a ring fused structure.

The platinum complex represented by the formula (2a-2) is preferably a platinum complex represented by the formula (2a-3).

(2a-3)

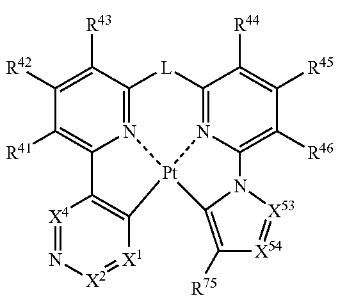

(wherein, $X^1$, $X^2$, and $X^4$ each independently represents a carbon atom or a nitrogen atom, $R^{41}$, $R^{42}$, $R^{43}$, $R^{44}$, $R^{45}$, and $R^{46}$ each independently represents a hydrogen atom or a substituent, $X^{53}$ and $X^{54}$ each independently represents a carbon atom or a nitrogen atom, with the proviso that the number of nitrogen atoms contained in the 5-membered ring skeleton containing $X^{53}$ and $X^{54}$ is 1 or 2, $R^{75}$ represents a hydrogen atom or a substituent, and L represents a single bond or a divalent linking group).

$X^1$, $X^2$, $X^4$, $X^{53}$, $X^{54}$, $R^{41}$, $R^{42}$, $R^{43}$, $R^{44}$, $R^{45}$, $R^{46}$, $R^{75}$, and L in the formula (2a-3) have the same meanings as $X^1$, $X^2$, $X^4$, $X^{53}$, $X^{54}$, $R^{41}$, $R^{42}$, $R^{43}$, $R^{44}$, $R^{45}$, $R^{46}$, $R^{75}$, and L in the formula (2a-2) and the preferred ranges of them are also the same.

In the formula (2a-3), the number of nitrogen atoms contained in the 6-membered ring skeleton formed of $X^1$, $X^2$, a nitrogen atom, $X^4$, a carbon atom, and a carbon atom is preferably 1 or greater but not greater than 3, more preferably 1 or 2, still more preferably 1. Specific examples of the 6-membered ring include a pyridine ring, a pyrazine ring, a pyrimidine ring, a pyridazine ring, and a triazine ring, more preferably a pyridine ring, a pyrazine ring, a pyrimidine ring, or a pyridazine ring, still more preferably a pyridine ring, a pyrazine ring, or a pyrimidine ring, especially preferably a pyridine ring.

The platinum complex represented by the formula (2a-3) is preferably a platinum complex represented by the following formula (2a-4). The platinum complex represented by the formula (2a-4) is a novel compound.

(2a-4)

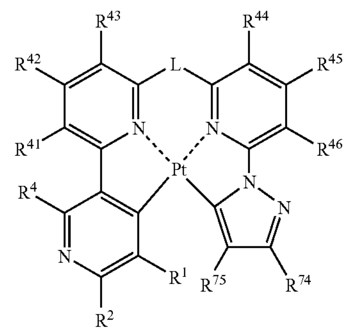

(wherein, $R^1$, $R^2$, $R^4$, $R^{41}$, $R^{42}$, $R^{43}$, $R^{44}$, $R^{45}$, $R^{46}$, $R^{74}$, and $R^{75}$ each independently represents a hydrogen atom or a substituent and L represents a single bond or a divalent linking group).

$R^{41}$, $R^{42}$, $R^{43}$, $R^{44}$, $R^{45}$, $R^{46}$, $R^{75}$ and L in the formula (2a-4) have the same meanings as $R^{41}$, $R^{42}$, $R^{43}$, $R^{44}$, $R^{45}$, $R^{46}$, $R^{75}$ and L in the formula (2a-3) and the preferred ranges of them are also the same.

$R^1$, $R^2$, $R^4$, and $R^{74}$ each independently represents a hydrogen atom or a substituent. Examples of the substituent include those exemplified in the substituent group A. If possible, the substituents of $R^4$ and $R^{41}$ or the substituents of $R^1$ and $R^2$ may be coupled to each other to form a ring fused structure, or the substituents of $R^1$ and $R^{75}$ may be coupled to each other to form a ring fused structure.

$R^1$ represents preferably a hydrogen atom, an alkyl group, an aryl group, an amino group, an alkoxy group, an aryloxy group, an acyl group, an alkoxycarbonyl group, an alkylthio group, a sulfonyl group, a hydroxy group, a halogen atom, a cyano group, a nitro group, or a heterocyclic group, more preferably a hydrogen atom, an alkyl group, an aryl group, an alkoxy group, an aryloxy group, an alkylthio group, a halogen atom, or a cyano group, more preferably a hydrogen atom, an alkyl group, a perfluoroalkyl group, an aryl group, a halogen atom, or a cyano group, still more preferably a hydrogen atom, a methyl group, a trifluoromethyl group, or a cyano group, especially preferably a hydrogen atom, a trifluoromethyl group, a fluorine atom, or a cyano group.

$R^2$ and $R^4$ each represents preferably a hydrogen atom, a halogen atom, a phenyl group substituted with a fluorine atom, an alkoxy group substituted with fluorine, a perfluoroalkyl group, a cyano group, a nitro group, or an aryloxy group, more preferably a hydrogen atom, a fluorine atom, a phenyl group substituted with a fluorine atom, a trifluoromethoxy group, a trifluoromethyl group, a cyano group, or a phenoxy group, more preferably a hydrogen atom, a fluorine atom, a perfluorophenyl group, a trifluoromethyl group, a cyano group, or a phenoxy group substituted with an electron attracting substituent, especially preferably a hydrogen atom or a fluorine atom, most preferably a fluorine atom.

$R^{74}$ represents preferably a hydrogen atom, an alkyl group, an aryl group, an amino group, an alkoxy group, an aryloxy group, an acyl group, an alkoxycarbonyl group, an alkylthio group, a sulfonyl group, a hydroxy group, a halogen atom, a cyano group, a nitro group, or a heterocyclic group, more preferably a hydrogen atom, an alkyl group, an aryl group, an alkoxy group, an aryloxy group, an alkylthio group, a halogen atom, or a cyano group, still more preferably a hydrogen atom, an alkyl group, a perfluoroalkyl group, an aryl group, a halogen atom, or a cyano group, still more preferably a hydrogen atom, a methyl group, a trifluoromethyl group, or a cyano group, especially preferably a hydrogen atom, a trifluoromethyl group, a fluorine atom, or a cyano group, most preferably a trifluoromethyl group or a cyano group.

The platinum complex represented by the formula (2a-4) can be used as, as well as various materials for organic EL devices, light emitting materials suited for use in the fields of display devices, displays, backlights, electron photographs, light sources for illumination, recording, exposure, or reading, signs, signboards, and interiors, medical purposes, fluorescent brighteners, photographic materials, UV absorption materials, laser dyes, materials for recording media, inkjet pigments, dyes for color filters, color conversion filters, materials for analysis, materials for solar cells, and materials for organic thin-film transistors.

Another preferred mode of the platinum complex represented by the formula (2) is a platinum complex represented by the formula (2b-1).

(2b-1)

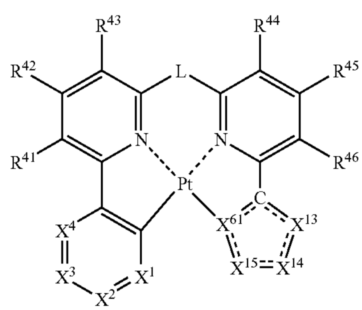

(wherein, $X^1$, $X^2$, $X^3$, and $X^4$ each independently represents a carbon atom or a nitrogen atom, with the proviso that any one or more of $X^1$, $X^2$, $X^3$, and $X^4$ each represents a nitrogen atom, $R^{41}$, $R^{42}$, $R^{43}$, $R^{44}$, $R^{45}$, and $R^{46}$ each independently represents a hydrogen atom or a substituent, $X^{61}$ represents a carbon atom or a nitrogen atom, $X^{13}$, $X^{14}$, and $X^{15}$ each independently represents a carbon atom, a nitrogen atom, an oxygen atom, or a sulfur atom, with the proviso that the number of nitrogen atoms contained in the 5-membered ring skeleton formed of $X^{61}$, a carbon atom, $X^{13}$, $X^{14}$, and $X^{15}$ is 2 or less, and L represents a single bond or a divalent linking group).

$X^1$, $X^2$, $X^3$, $X^4$, $X^{13}$, $X^{14}$, $X^{15}$, $R^{41}$, $R^{42}$, $R^{43}$, $R^{44}$, $R^{45}$, $R^{46}$ and L in the formula (2b-1) have the same meanings as $X^1$, $X^2$, $X^3$, $X^4$, $X^{13}$, $X^{14}$, $X^{15}$, $R^{41}$, $R^{42}$, $R^{43}$, $R^{44}$, $R^{45}$, $R^{46}$ and L in the formula (2) and the preferred ranges of them are also the same.

$X^{61}$ represents a carbon atom or a nitrogen atom, preferably a nitrogen atom.

In the formula (2b-1), the number of nitrogen atoms contained in the 5-membered ring skeleton formed of $X^{61}$, a carbon atom, $X^{13}$, $X^{14}$, and $X^{15}$ is 0, 1, or 2, preferably 1 or 2, more preferably 2.

The bonds in the 5-membered ring skeleton formed of $X^{61}$, a carbon atom, $X^{13}$, $X^{14}$, and $X^{15}$ may be any combination of a single bond and a double bond. Examples of the 5-membered ring formed of $X^{61}$, a carbon atom, $X^{13}$, $X^{14}$, and $X^{15}$ include a pyrrole ring, a pyrazole ring, an imidazole ring, a furan ring, and a thiophene ring. Of these, a pyrrole ring, a pyrazole ring, an imidazole ring are preferred, with a pyrazole ring being more preferred.

The platinum complex represented by the formula (2b-1) is preferably a platinum complex represented by the formula (2b-2).

(2b-2)

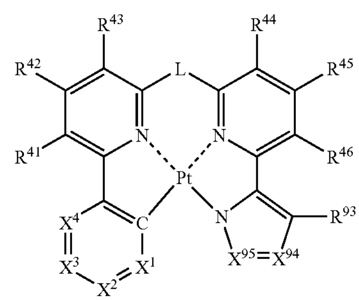

(wherein, $X^1$, $X^2$, $X^3$, and $X^4$ each independently represents a carbon atom or a nitrogen atom, with the proviso that any one or more of $X^1$, $X^2$, $X^3$, and $X^4$ each represents a nitrogen atom, $R^{41}$, $R^{42}$, $R^{43}$, $R^{44}$, $R^{45}$ and $R^{46}$ each independently represents a hydrogen atom or a substituent, $X^{94}$ and $X^{95}$ each independently represents a carbon atom or a nitrogen atom, with the proviso that at least either one of $X^{94}$ and $X^{95}$ represents a carbon atom, $R^{93}$ represents a hydrogen atom or a substituent, and L represents a single bond or a divalent linking group).

$X^1$, $X^2$, $X^3$, $X^4$, $R^{41}$, $R^{42}$, $R^{43}$, $R^{44}$, $R^{45}$, $R^{46}$ and L in the formula (2b-2) have the same meanings as $X^1$, $X^2$, $X^3$, $X^4$, $R^{41}$, $R^{42}$, $R^{43}$, $R^{44}$, $R^{45}$, $R^{46}$ and L in the formula (2b-1) and the preferred ranges of them are also the same.

$X^{94}$ and $X^{95}$ each independently represents a carbon atom or a nitrogen atom, with the proviso that either one of $X^{94}$ and $X^{95}$ represents a carbon atom. It is preferred that $X^{94}$ represents a carbon atom and $X^{95}$ represents a nitrogen atom.

When $X^{94}$ and $X^{95}$ can be substituted further, they may independently have a substituent. When $X^{94}$ or $X^{95}$ has a substituent, examples of the substituent include those exemplified in the substituent group A. The substituent is preferably an alkyl group, a perfluoroalkyl group, an aryl group, an aromatic heterocyclic group, a dialkylamino group, a diarylamino group, an alkyloxy group, a cyano group, or a halogen atom, more preferably an alkyl group, a perfluoroalkyl group, an aryl group, a dialkylamino group, a cyano group, or a fluorine atom, more preferably an alkyl group, a trifluoromethyl group, or a fluorine atom. If possible, the substituents may be coupled to each other to form a ring fused structure.

Examples of the 5-membered ring formed of a nitrogen atom, a carbon atom, a carbon atom, $X^{94}$, and $X^{95}$ in the formula (2b-2) include a pyrrole ring, a pyrazole ring, and an imidazole ring. Of these, a pyrazole ring and an imidazole ring are preferred, with a pyrazole ring being more preferred.

$R^{93}$ represents a hydrogen atom or a substituent. Examples of the substituent include those exemplified in the substituent group A. $R^{93}$ is preferably a hydrogen atom, an alkyl group, a perfluoroalkyl group, an aryl group, an aromatic heterocyclic group, a dialkylamino group, a diarylamino group, an alkyloxy group, a cyano group, or a halogen atom, more preferably a hydrogen atom, an alkyl group, a perfluoroalkyl group, an aryl group, a dialkylamino group, a cyano group, or a fluorine atom, more preferably a hydrogen atom, an alkyl group, a trifluoromethyl group, or a fluorine atom, most preferably a fluorine atom or a hydrogen atom. If possible, the substituents of $X^{94}$ and $X^{95}$ may be coupled to each other to form a ring fused structure.

The platinum complex represented by the formula (2b-2) is preferably a platinum complex represented by the formula (2b-3).

(2b-3)

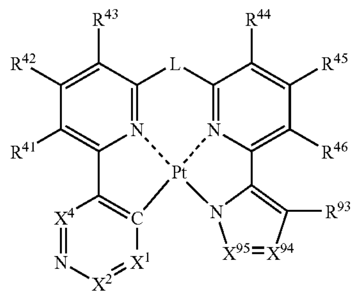

(wherein, $X^1$, $X^2$, and $X^4$ each independently represents a carbon atom or a nitrogen atom, with the proviso that any one or more of $X^1$, $X^2$, and $X^4$ represents a nitrogen atom, $R^{41}$, $R^{42}$, $R^{43}$, $R^{44}$, $R^{45}$, and $R^{46}$ each independently represents a hydrogen atom or a substituent, $X^{94}$ and $X^{95}$ each independently represents a carbon atom or a nitrogen atom, with the proviso that at least either one of $X^{94}$ and $X^{95}$ represents a carbon atom, $R^{93}$ represents a hydrogen atom or a substituent, and L represents a single bond or a divalent linking group).

$X^1$, $X^2$, $X^4$, $X^{94}$, $X^{95}$, $R^{41}$, $R^{42}$, $R^{43}$, $R^{44}$, $R^{45}$, $R^{46}$, $R^{93}$, and L in the formula (2b-3) have the same meanings as $X^1$, $X^2$, $X^4$, $X^{94}$, $X^{95}$, $R^{41}$, $R^{42}$, $R^{43}$, $R^{44}$, $R^{45}$, $R^{46}$, $R^{93}$, and L in the formula (2b-2) and the preferred ranges of them are also the same.

In the formula (2b-3), the number of nitrogen atoms contained in the 6-membered ring skeleton formed of $X^1$, $X^2$, a nitrogen atom, $X^4$, a carbon atom, and a carbon atom is preferably 1 or greater but not greater than 3, more preferably 1 or 2, still more preferably 1. Specific examples of the 6-membered ring include a pyridine ring, a pyrazine ring, a pyrimidine ring, a pyridazine ring, and a triazine ring, more preferably a pyridine ring, a pyrazine ring, a pyrimidine ring, or a pyridazine ring, still more preferably a pyridine ring, a pyrazine ring, or a pyrimidine ring, especially preferably a pyridine ring.

Although the above-described metal complexes having a specific structure may be low molecular weight compounds, high molecular weight compounds having a residue coupled to the polymer main chain thereof (compounds having preferably a mass average molecular weight of from 1000 to 5000000, more preferably from 5000 to 2000000, still more preferably from 10000 to 1000000), or high molecular weight compounds having, in the main chain thereof, the specific structure of the above-described metal complexes (compounds having preferably a mass average molecular weight of from 1000 to 5000000, more preferably from 5000 to 2000000, still more preferably from 10000 to 1000000), they are preferably low molecular weight compounds.

When the metal complex is the high molecular weight compound, it may be a homopolymer or a copolymer with another polymer. When it is a copolymer, it may be a random copolymer or a block copolymer. Further, when it is a copolymer, it may contain, in the polymer thereof, a compound having a light emitting function and/or a compound having a charge transport function.

The following are preferred specific examples of the metal complex represented by the formula (1), but the invention is not limited to them.

1

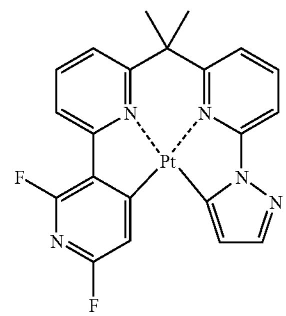

2

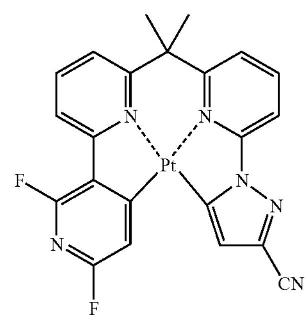

3

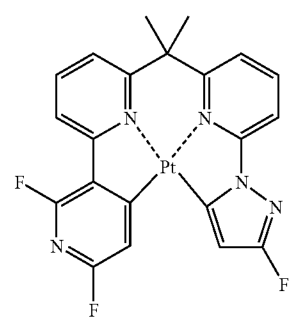

4

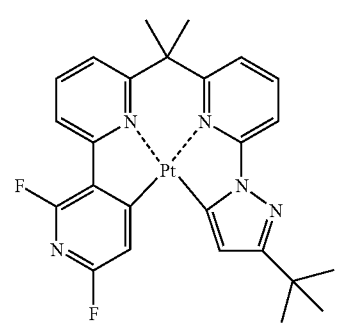

-continued
5
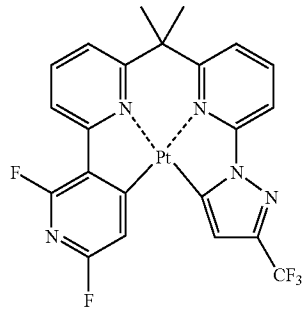
6
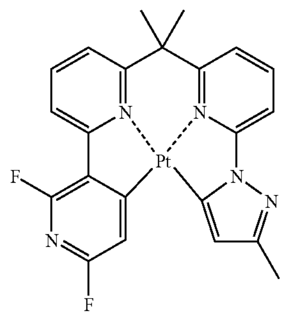
7
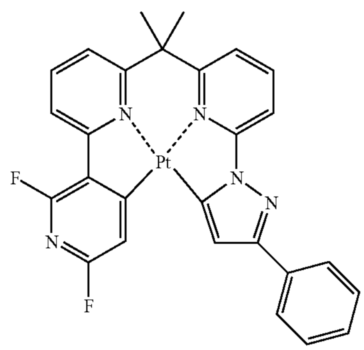
8
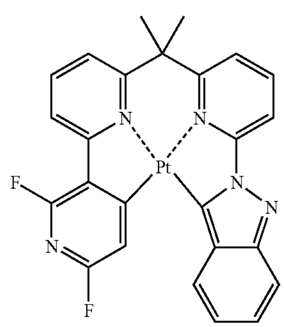
9
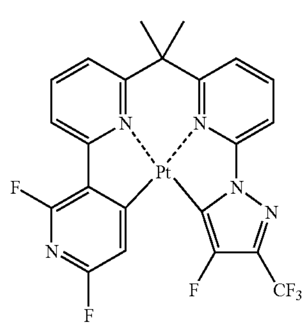
-continued
10
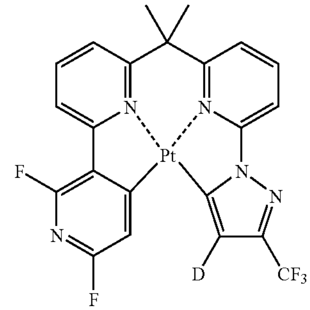
11
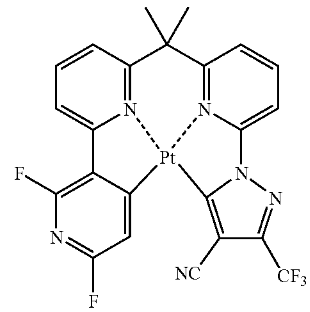
12
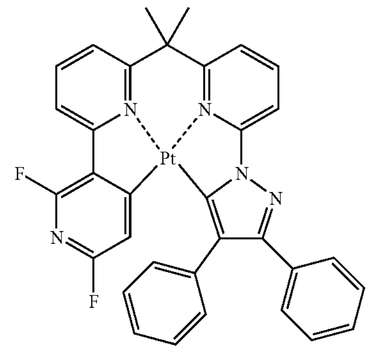
13
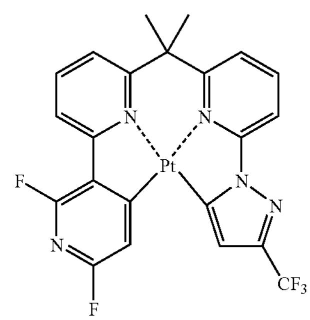
14
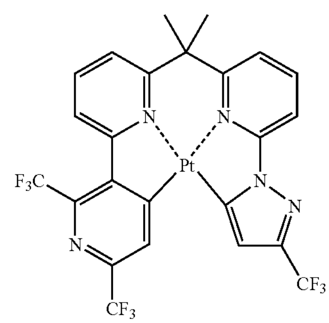

-continued
15
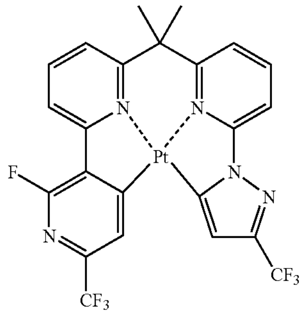
16
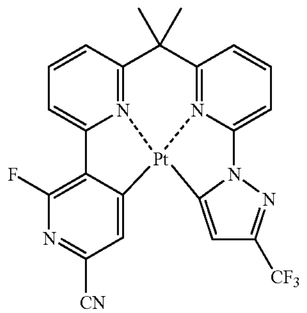
17
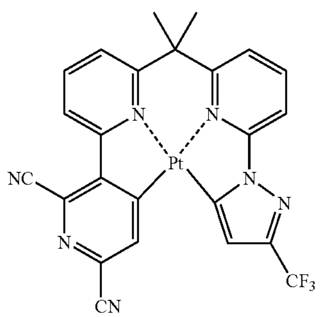
18
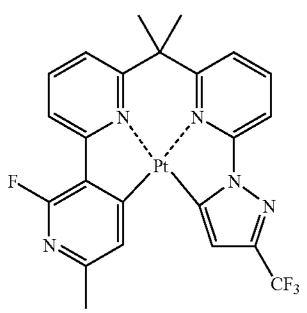
19
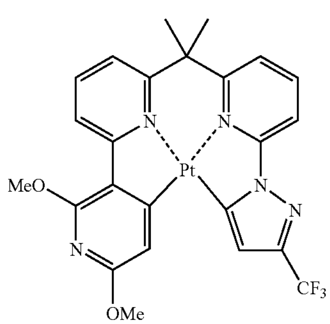
-continued
20
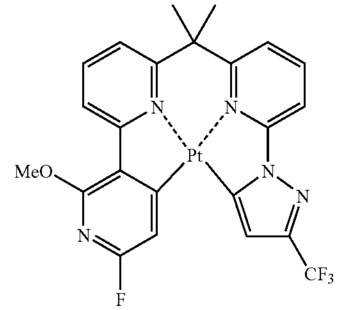
21
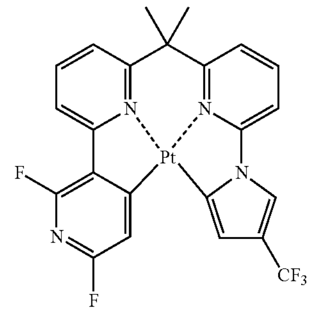
22
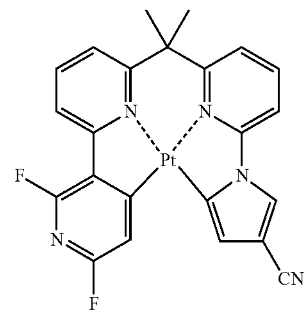
23
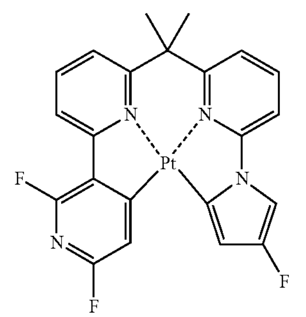
24
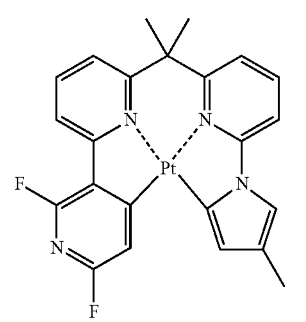

25
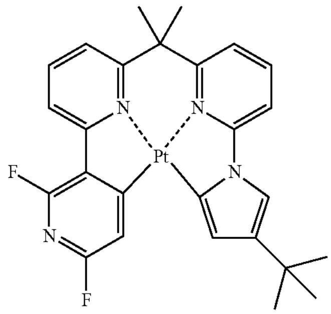
26
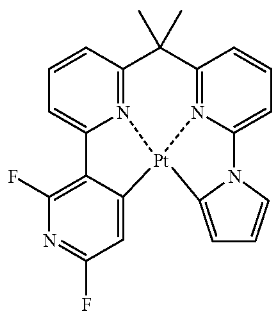
27
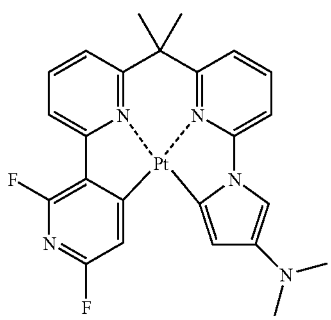
28
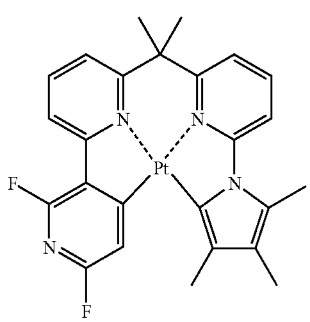
29
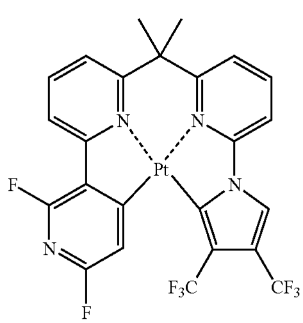
30
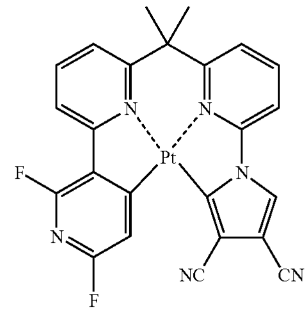
31
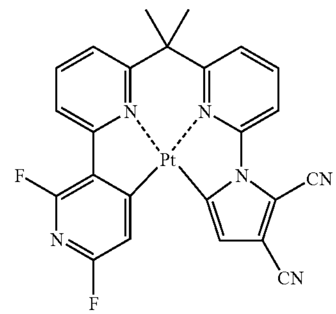
32
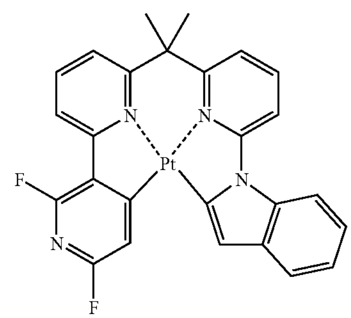
33
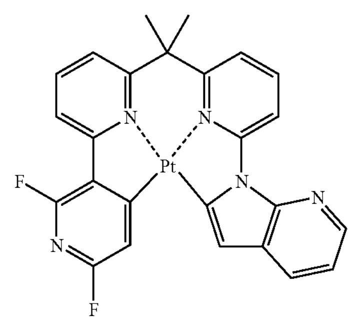
34
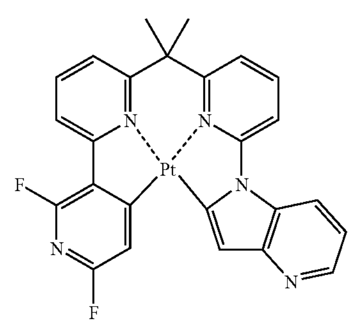

-continued
35
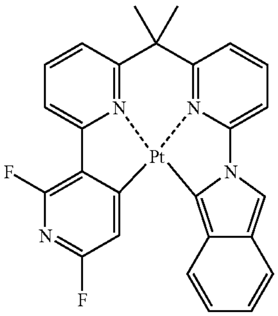
36
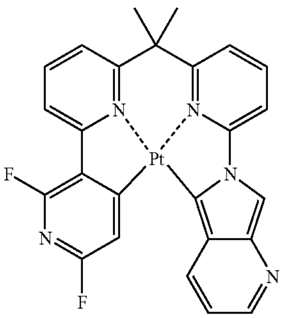
37
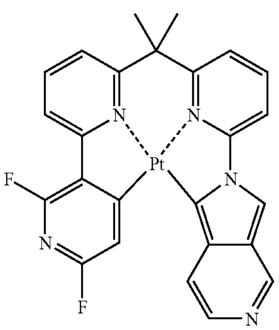
38
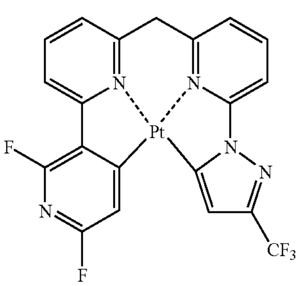
39
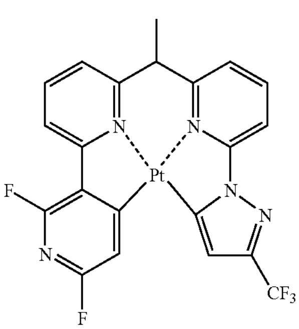
-continued
40
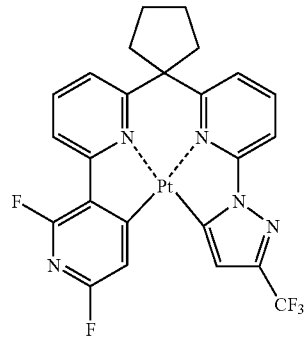
41
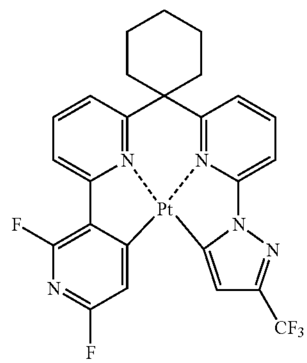
42
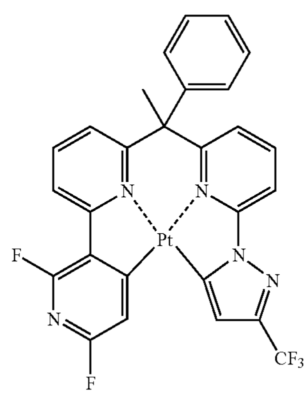
43
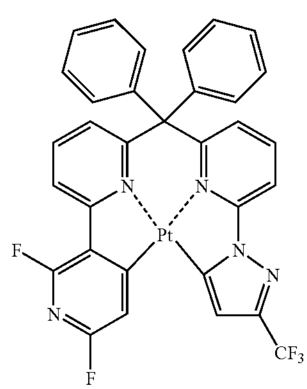

44
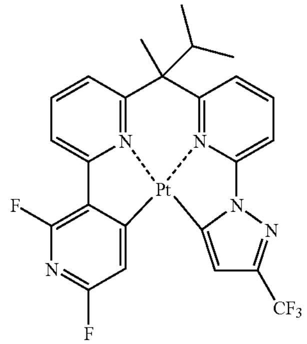
45
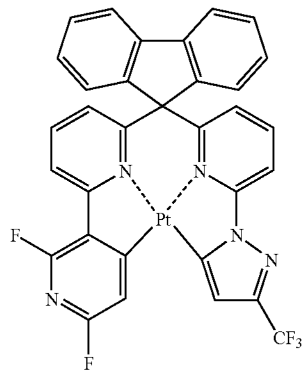
46
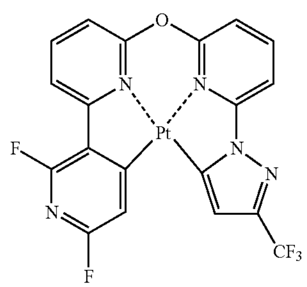
47
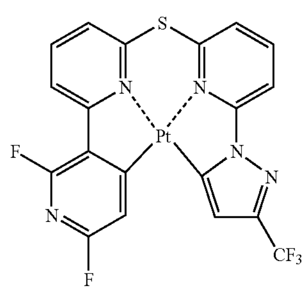
48
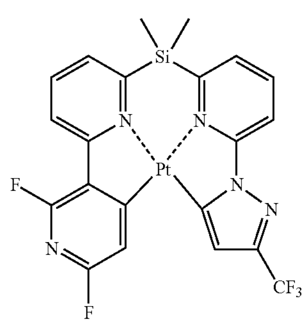
49
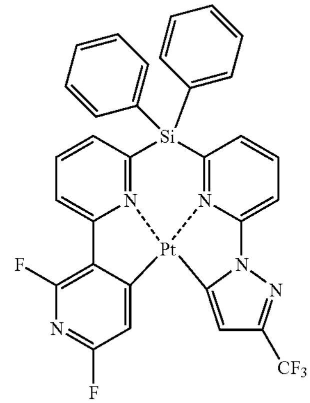
50
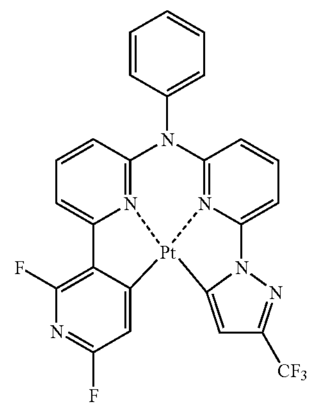
51
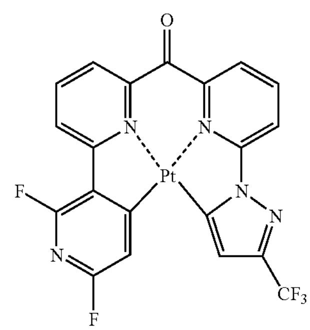
52
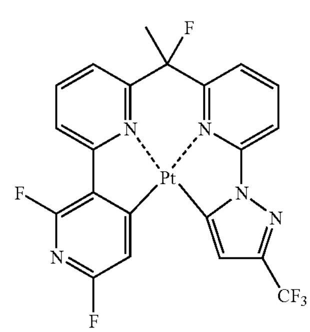

-continued
53
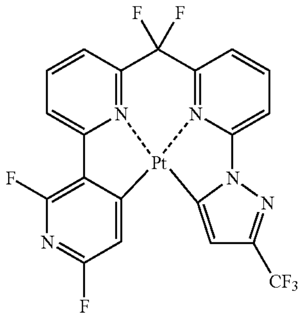
54
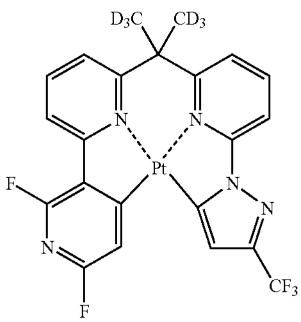
55
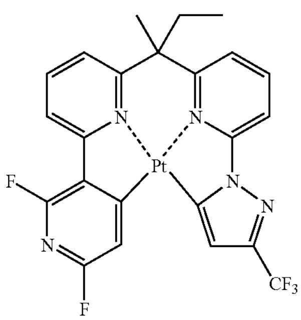
56
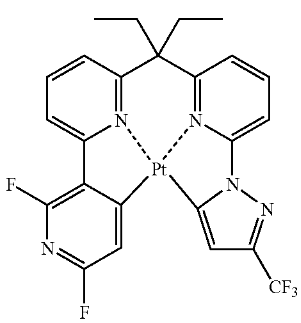
57
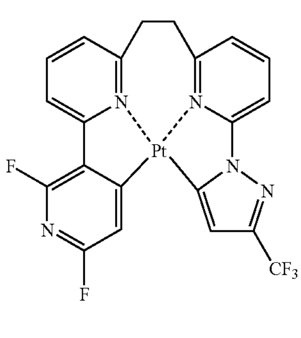
-continued
58
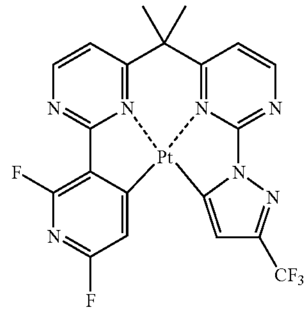
59
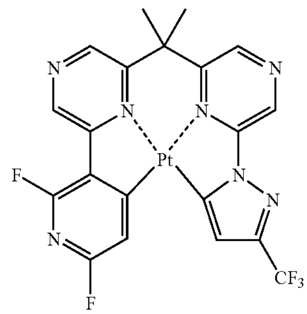
60
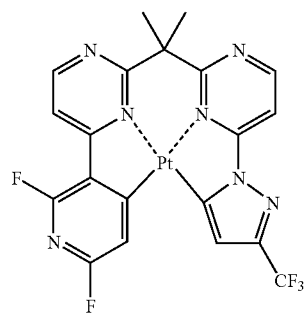
61
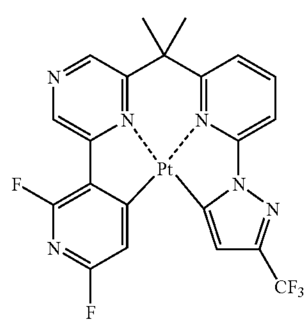
62
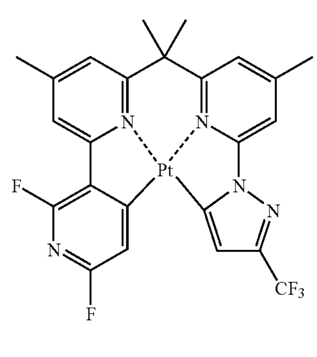

-continued
63
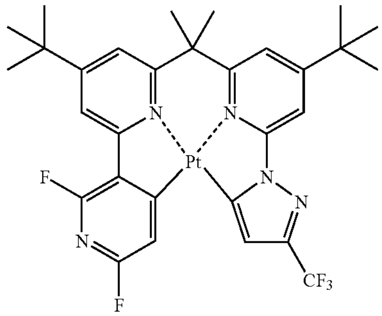
64
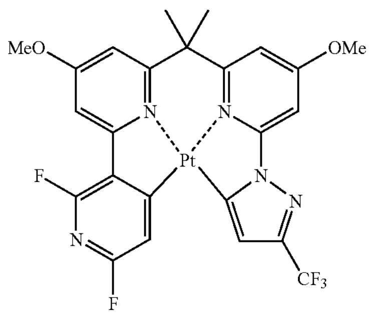
65
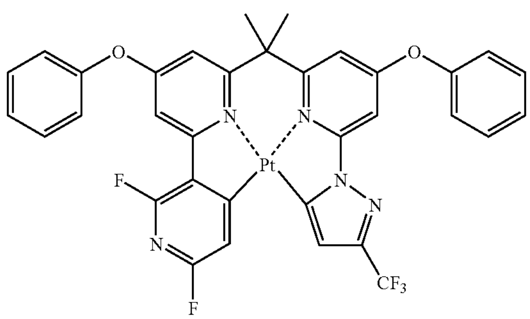
66
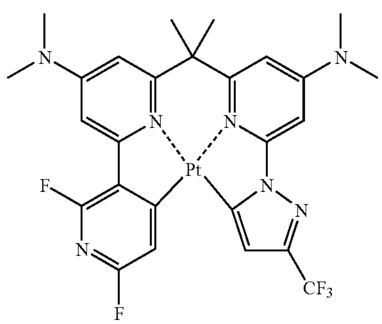
67
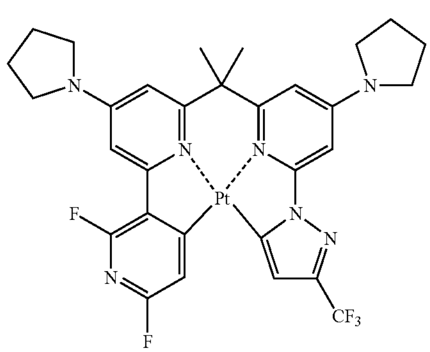
-continued
68
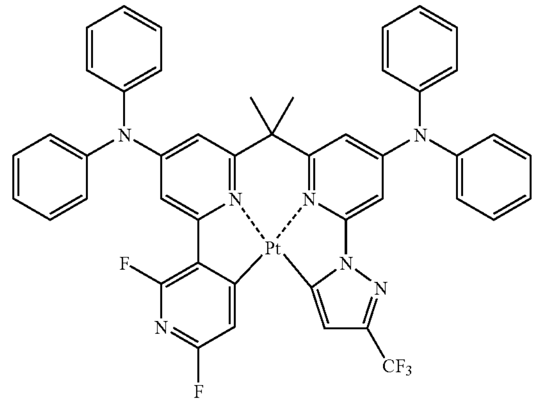
69
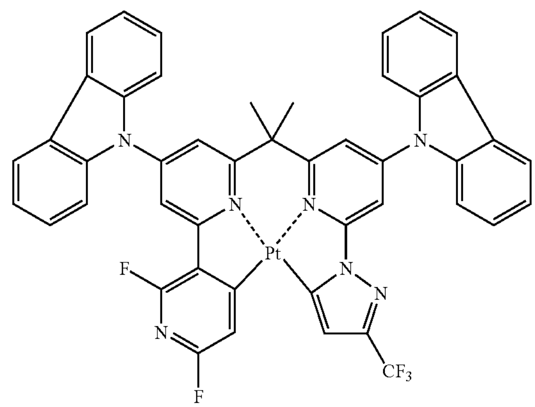
70
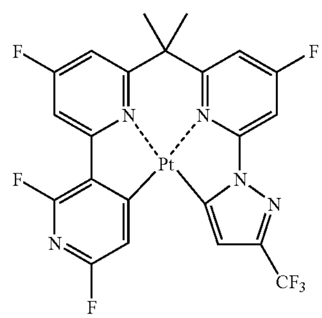
71
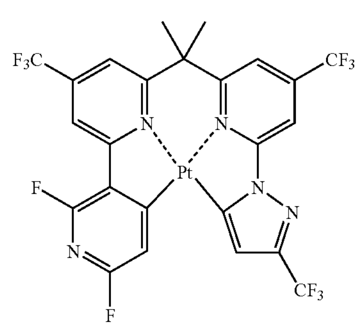

-continued
72
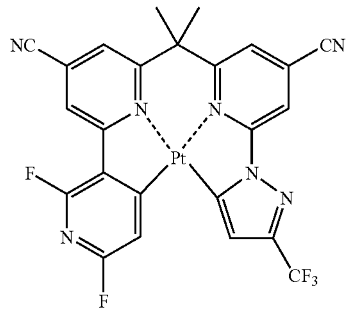
73
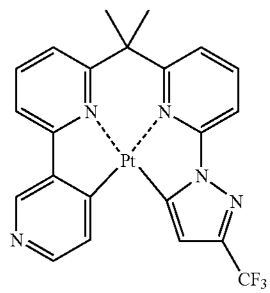
74
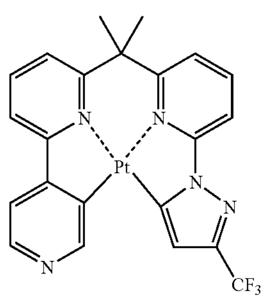
75
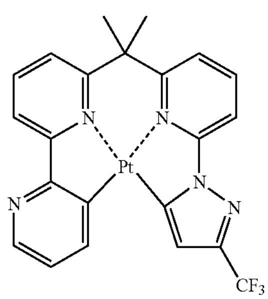
76
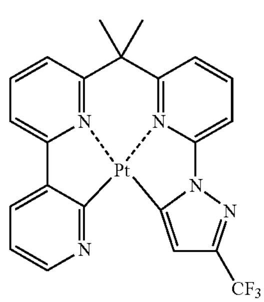
-continued
77
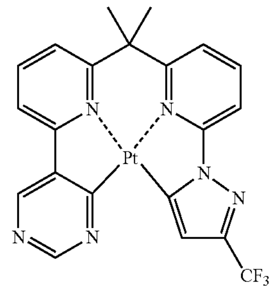
78
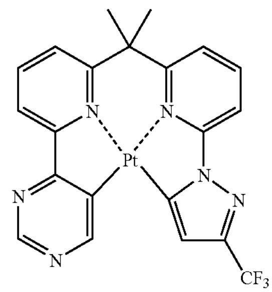
79
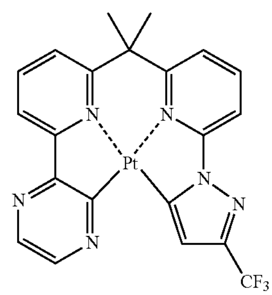
80
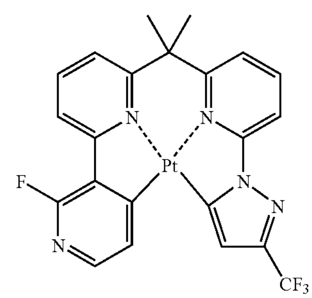
81
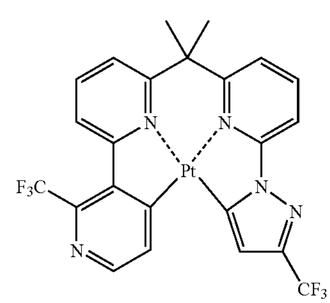

-continued
82
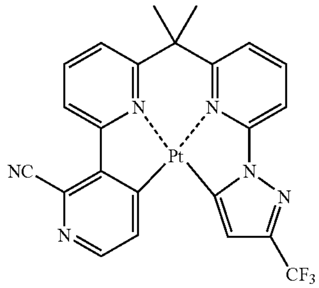
83
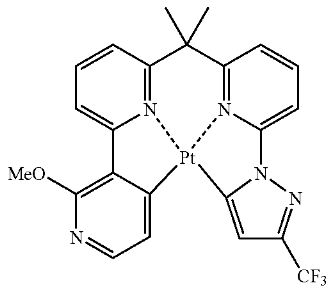
84
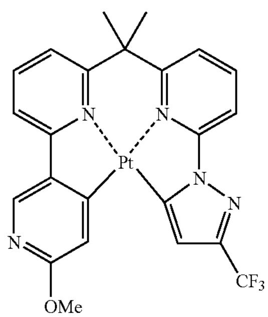
85
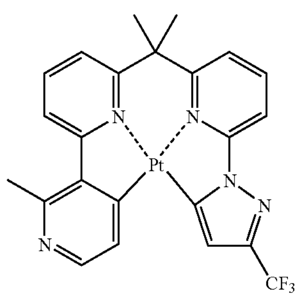
86
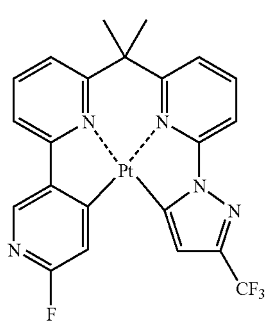
-continued
87
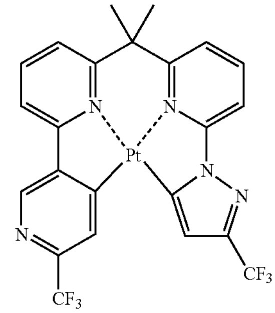
88
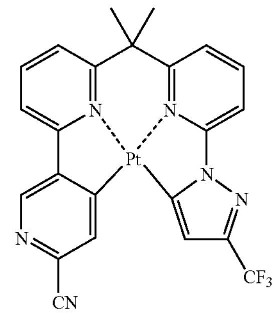
89
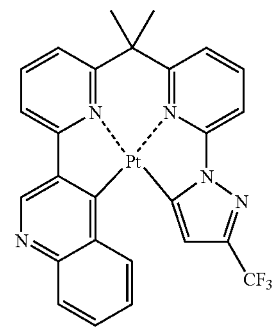
90
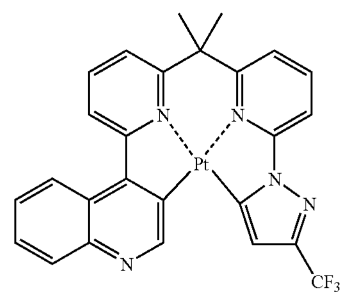
91
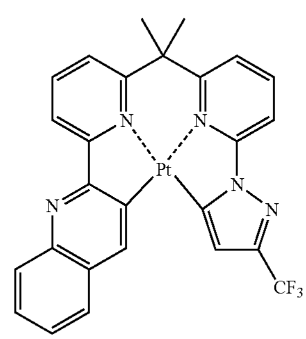

-continued
92
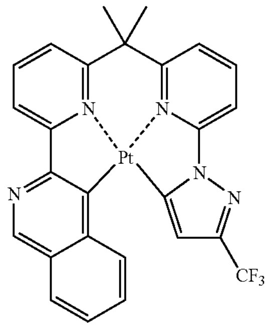
93
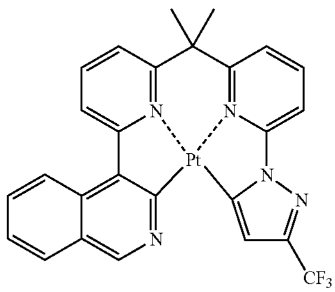
94
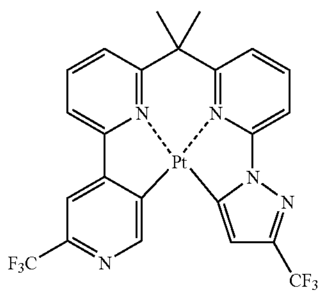
95
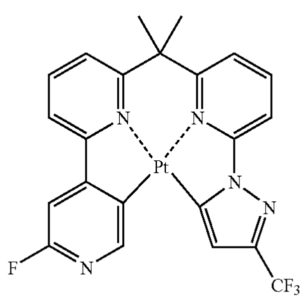
96
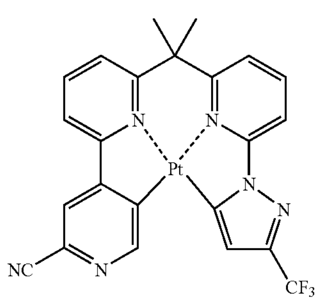
-continued
97
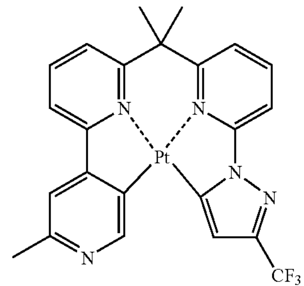
98
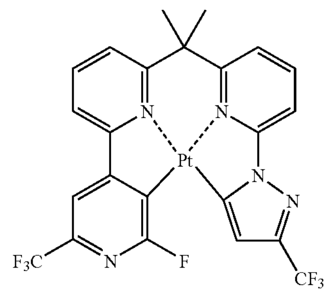
99
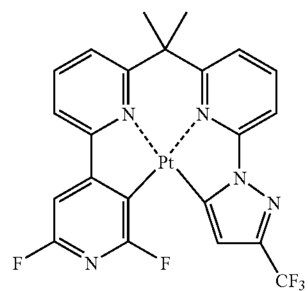
100
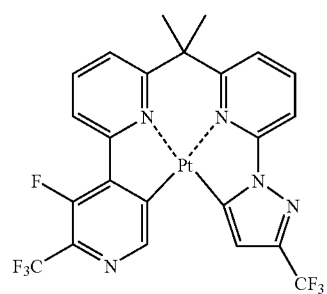
101
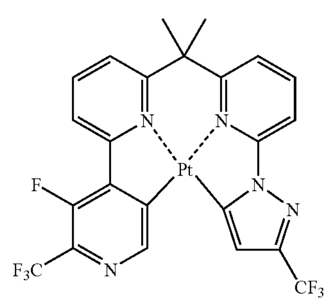

-continued
102
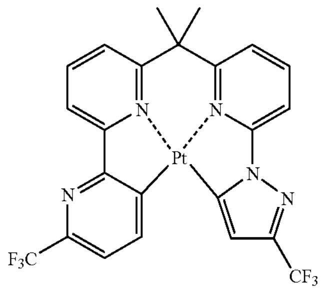
103
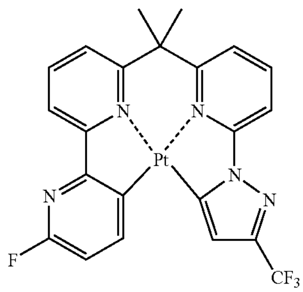
104
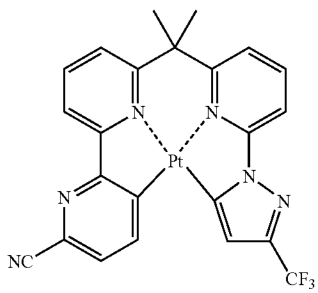
105
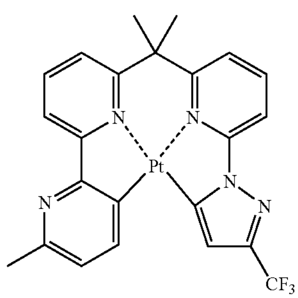
106
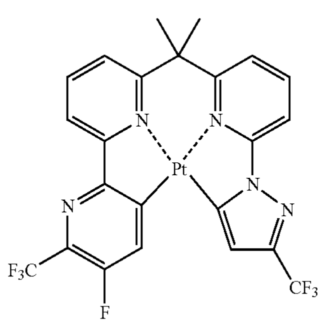
-continued
107
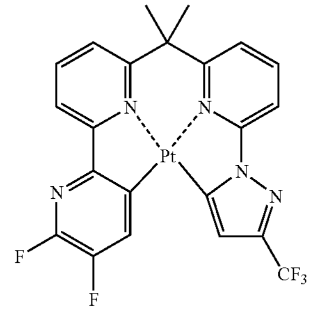
108
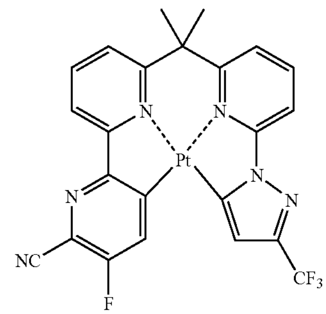
109
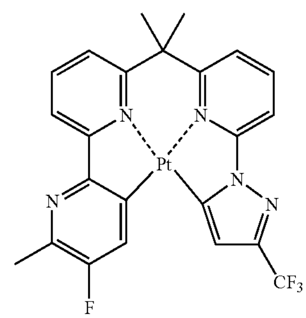
110
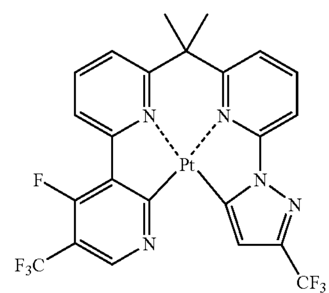
111
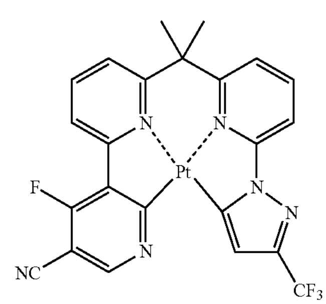

-continued
112
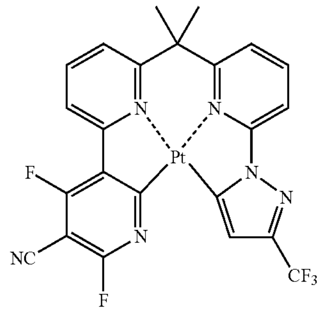
113
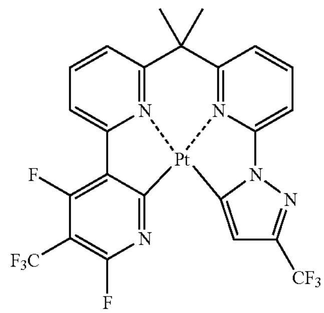
114
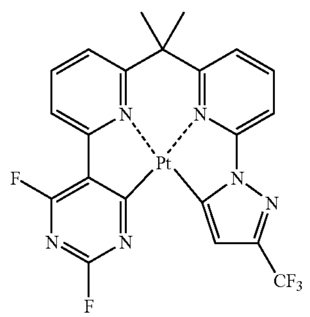
115
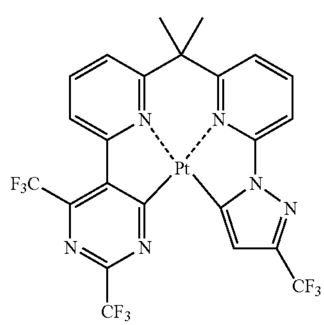
116
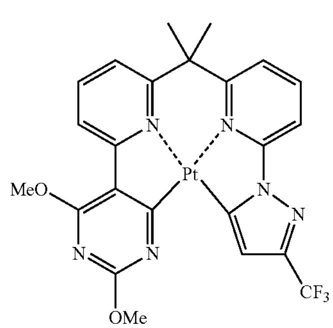
-continued
117
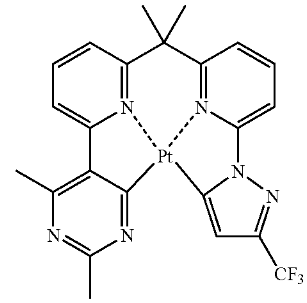
118
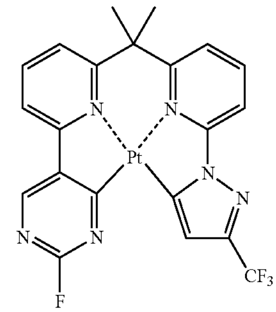
119
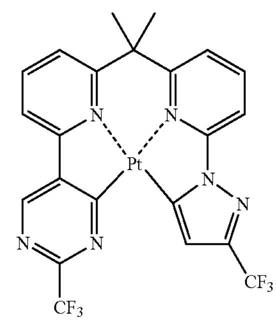
120
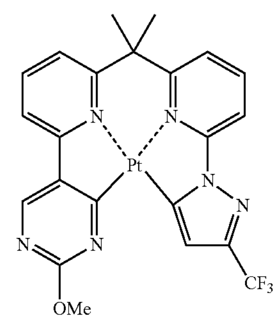
121
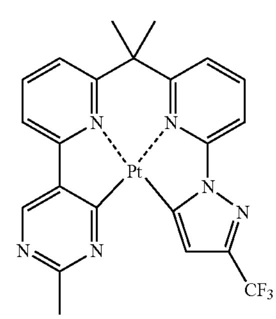

122
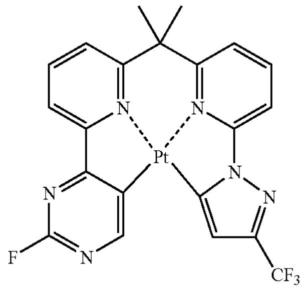
123
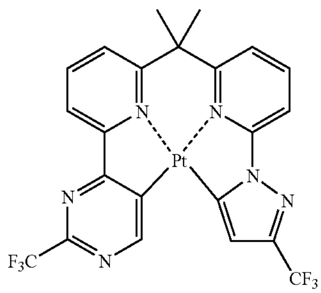
124
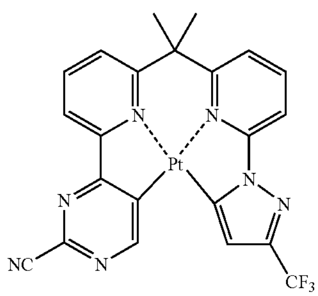
125
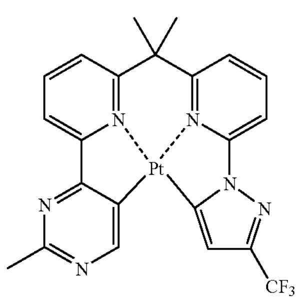
126
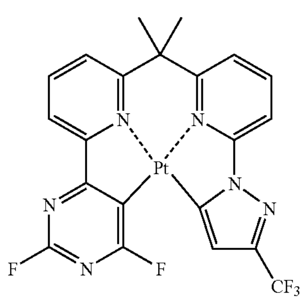
127
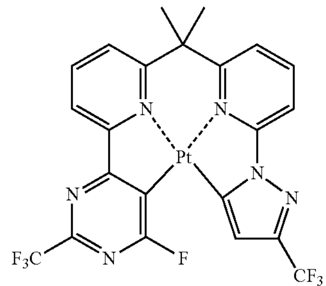
128
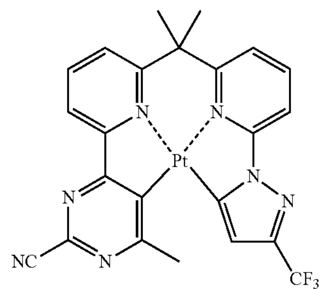
129
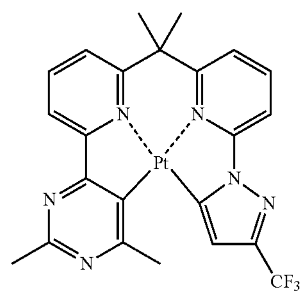
130
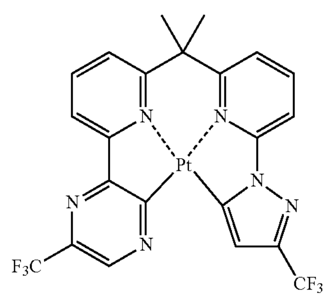
131
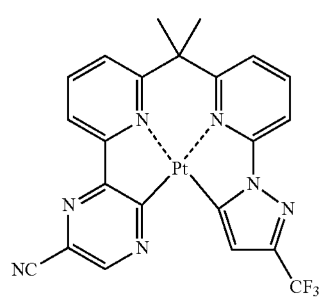

-continued
132
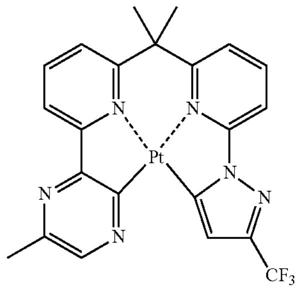
133
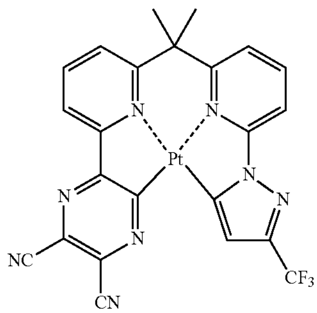
134
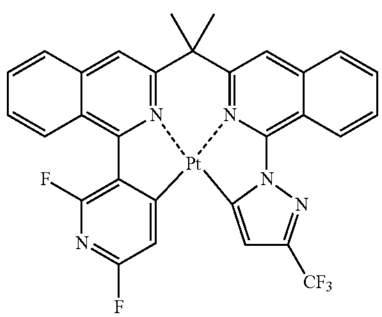
135
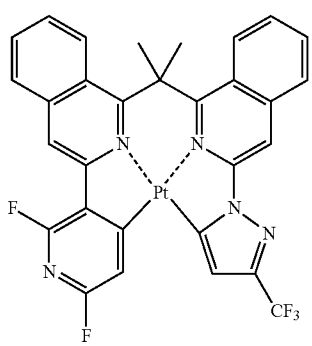
136
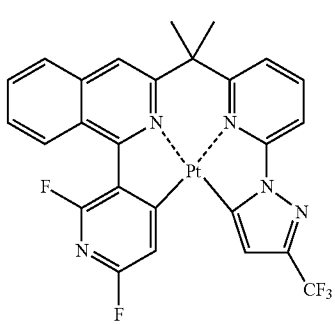
-continued
137
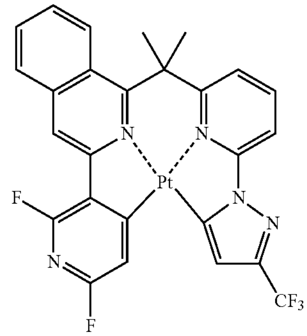
138
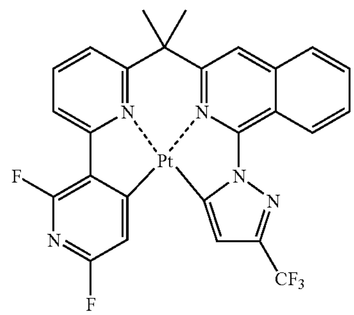
139
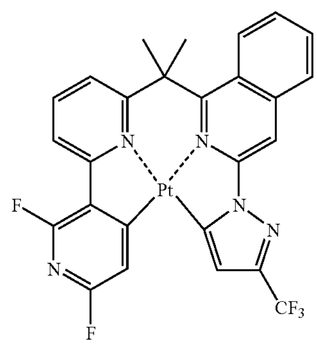
140
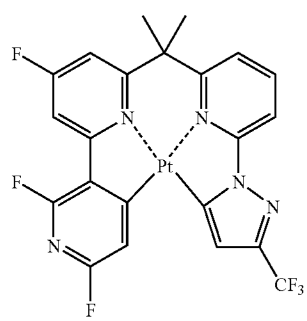
141
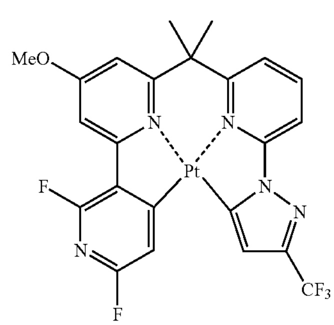

-continued
142
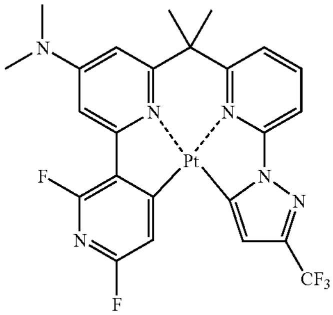
143
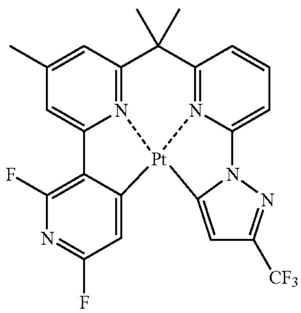
144
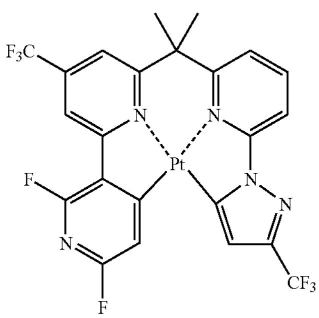
145
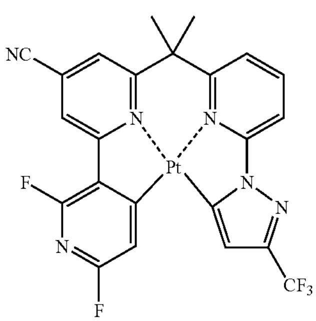
146
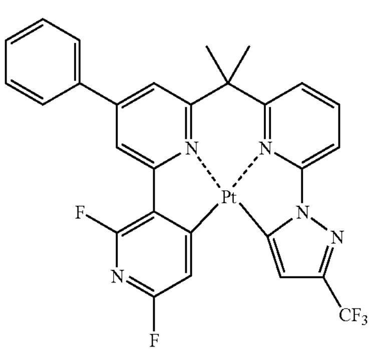
-continued
147
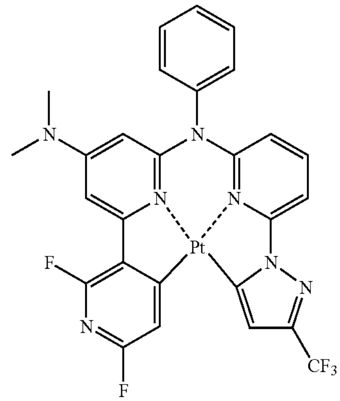
148
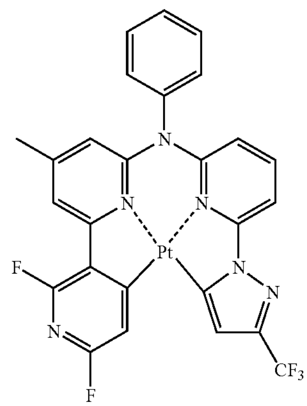
149
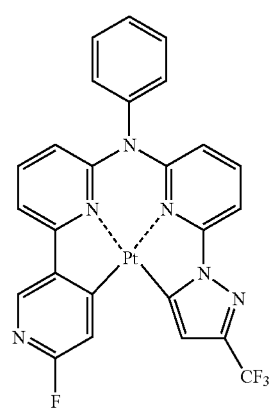
150
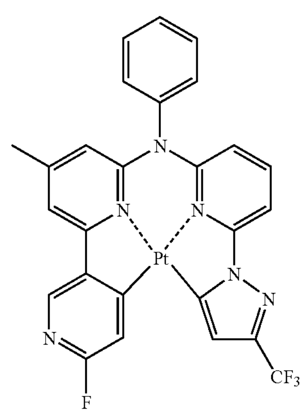

151
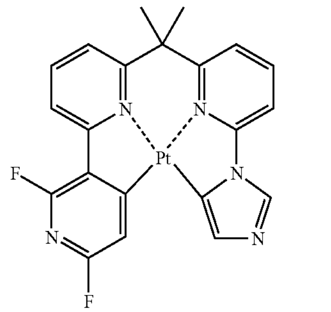
152
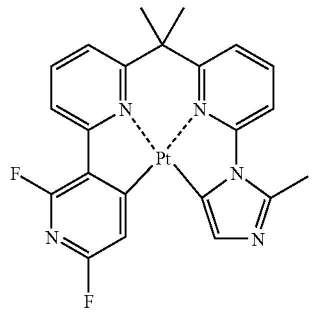
153
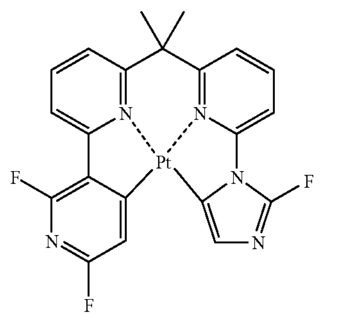
154
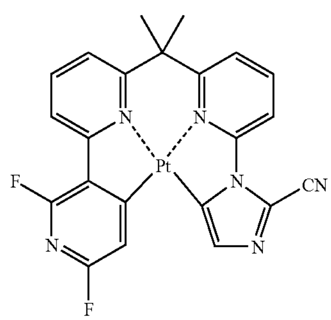
155
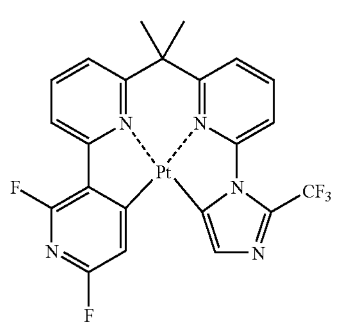
156
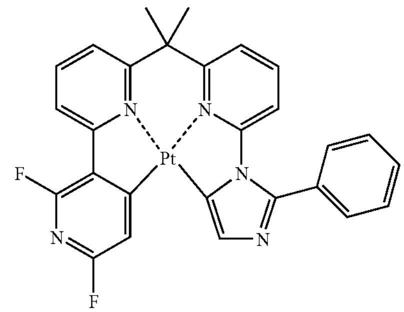
157
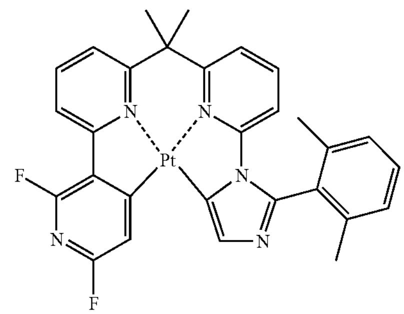
158
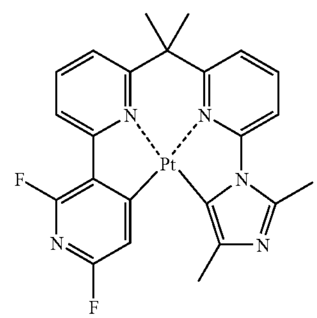
159
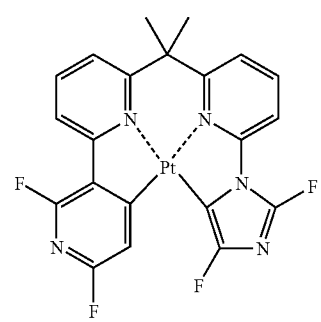
160
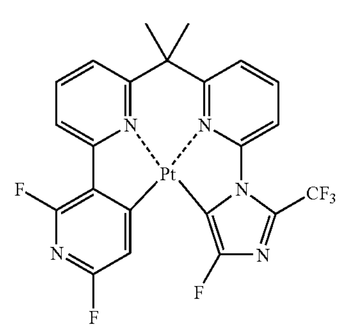

-continued
161
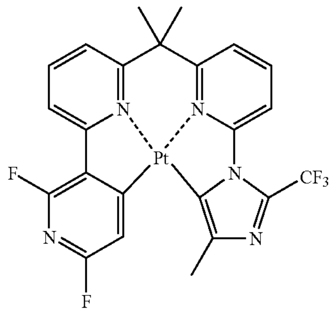
162
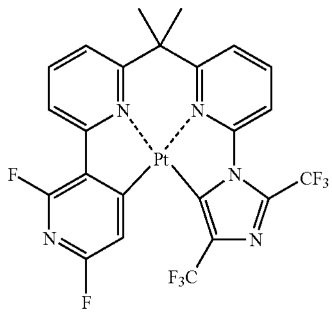
163
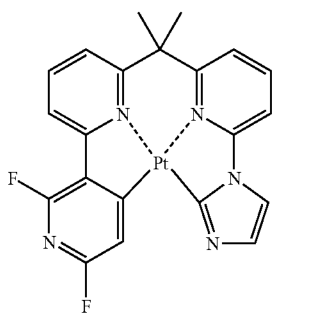
164
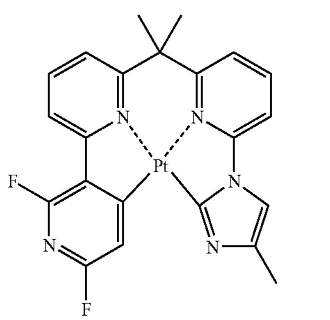
165
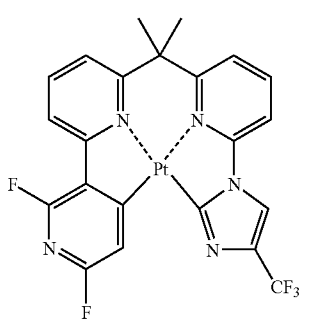
-continued
166
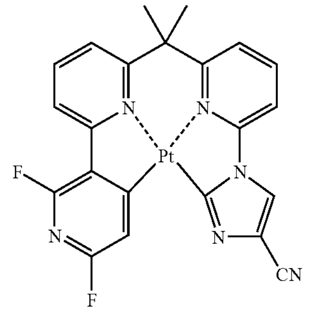
167
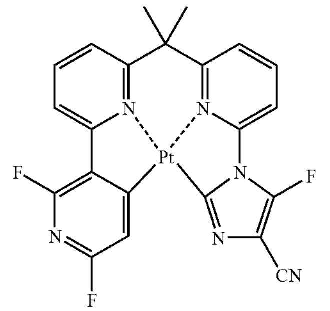
168
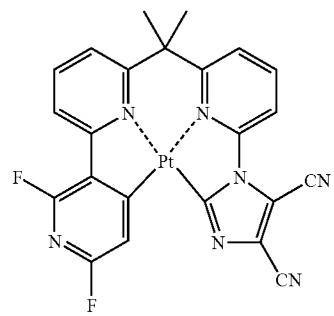
169
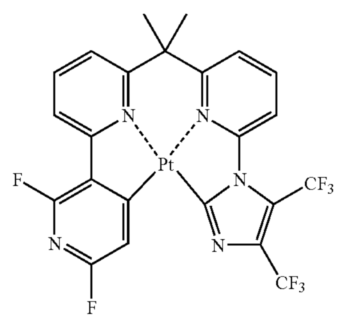
170
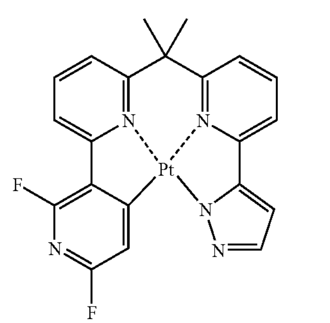

-continued
171
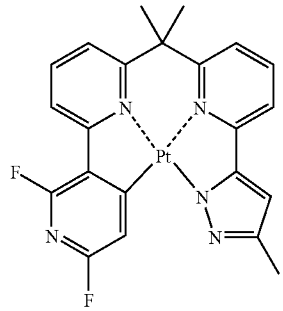
172
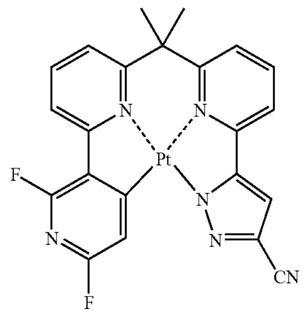
173
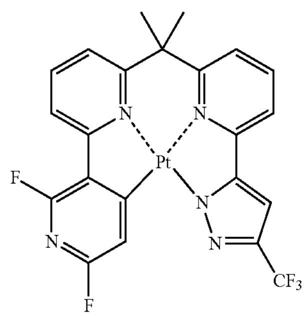
174
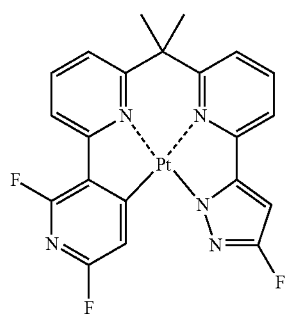
175
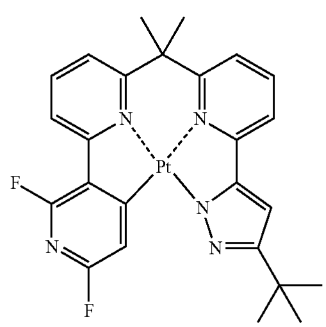
-continued
176
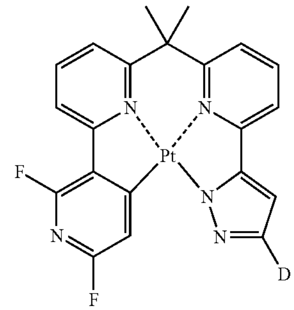
177
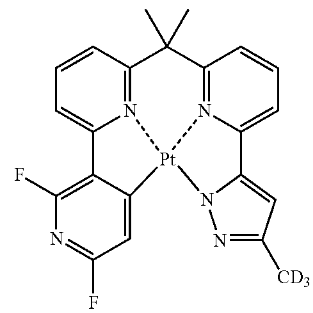
178
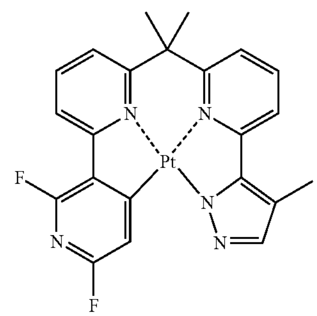
179
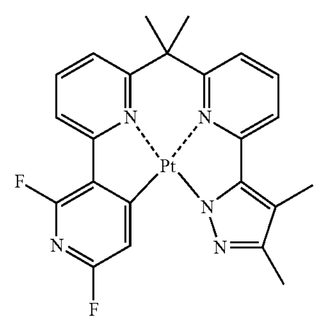
180
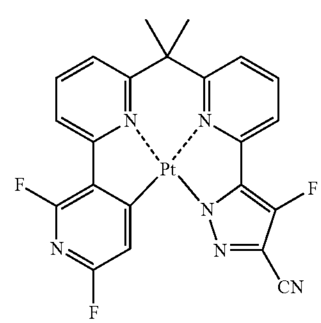

-continued
181
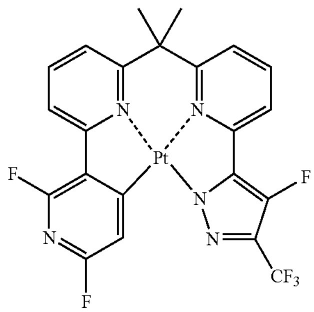
182
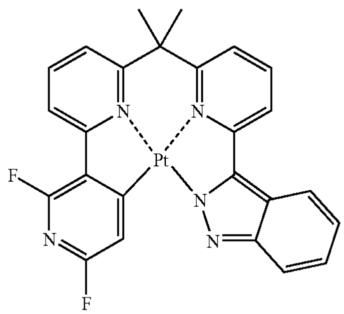
183
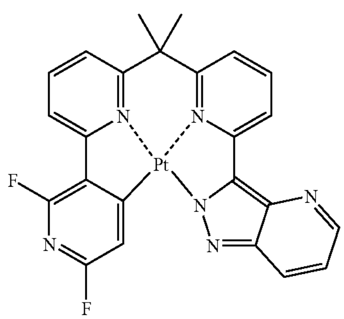
184
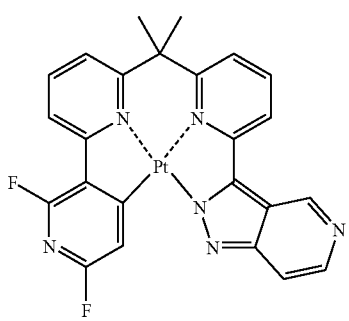
185
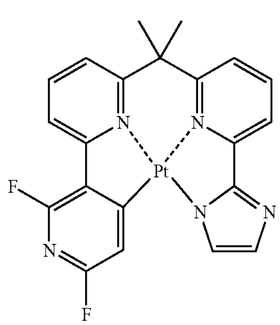
-continued
186
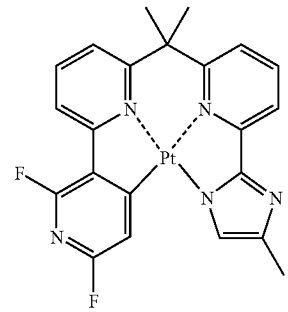
187
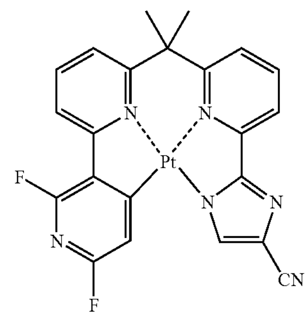
188
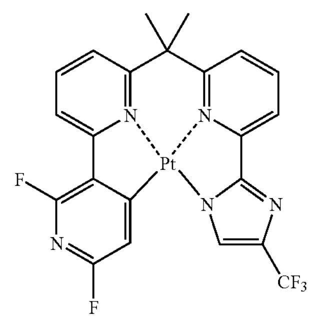
189
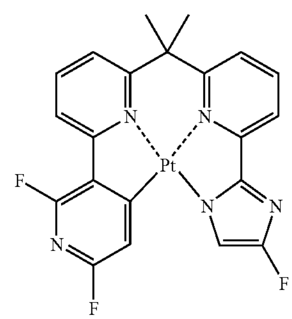
190
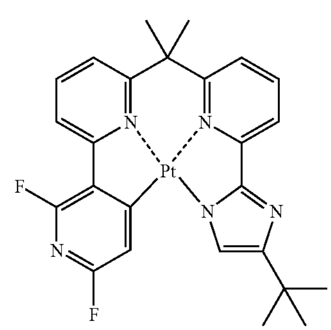

-continued
191
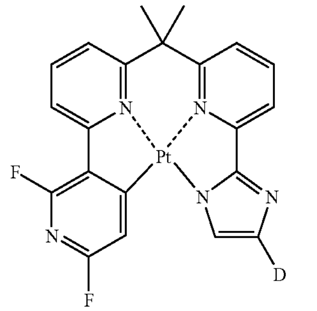
192
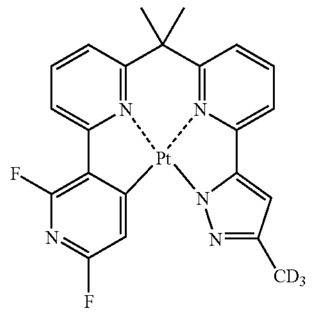
197
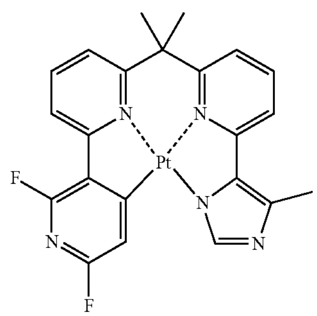
198
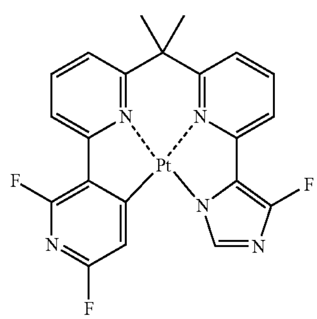
199
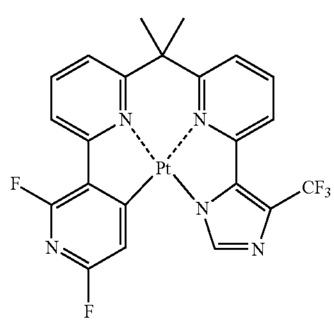
-continued
200
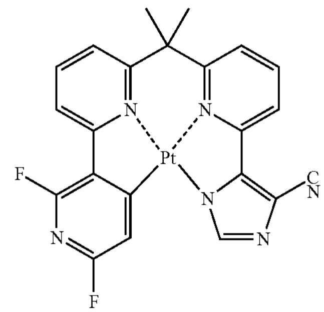
201
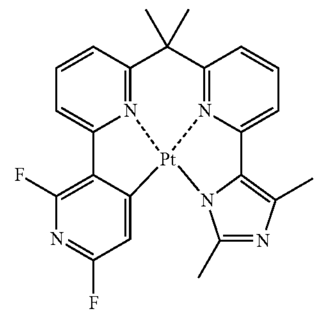
202
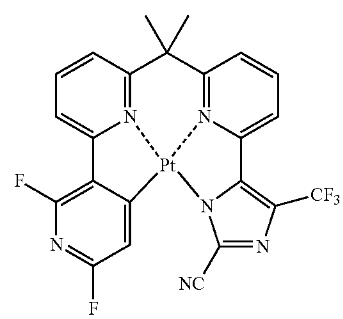
203
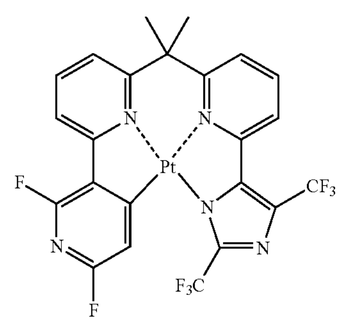
204
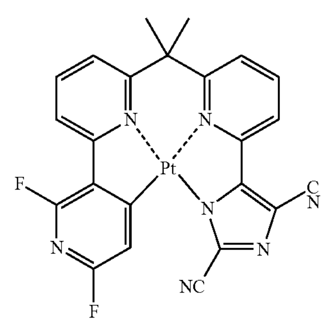

205
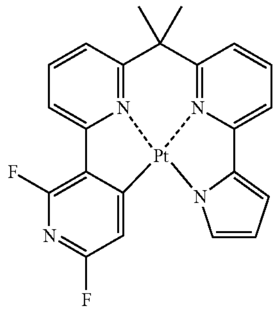
206
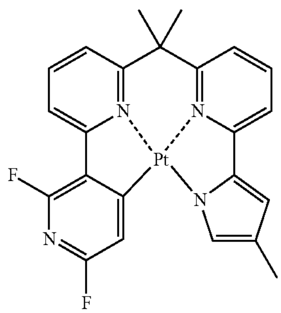
207
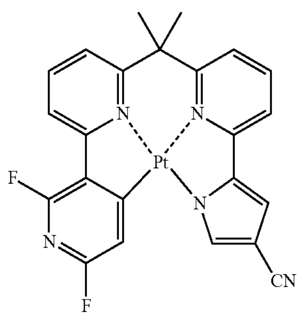
208
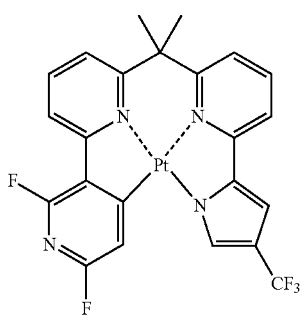
209
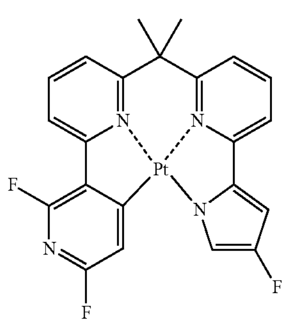
210
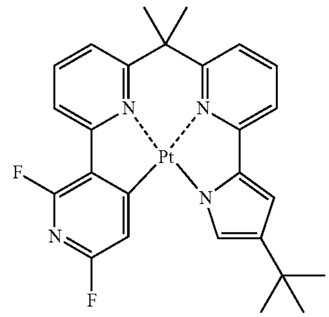
211
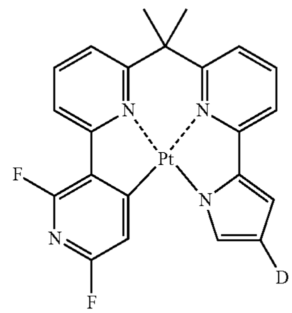
212
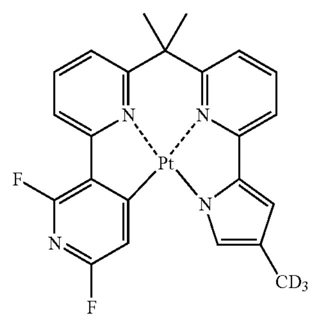
213
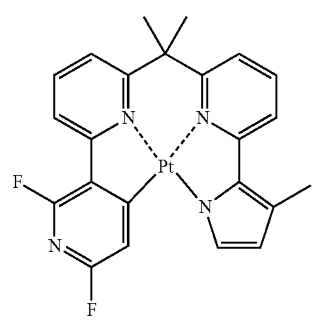
214
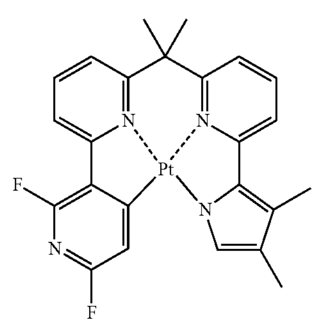

215
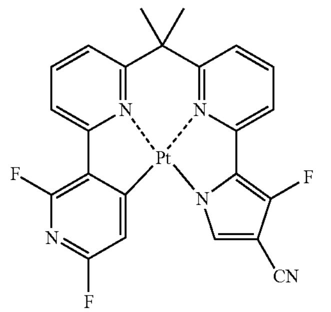
216
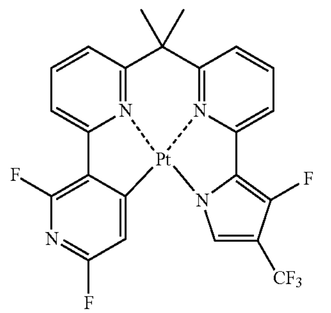
217
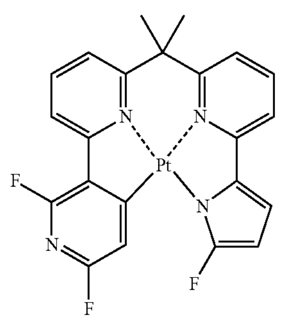
218
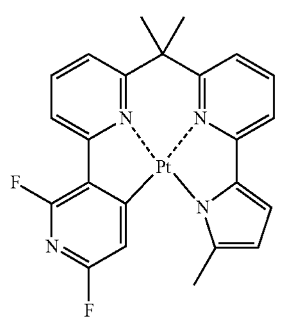
219
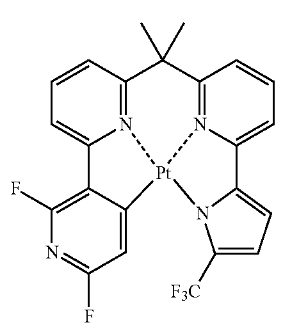
220
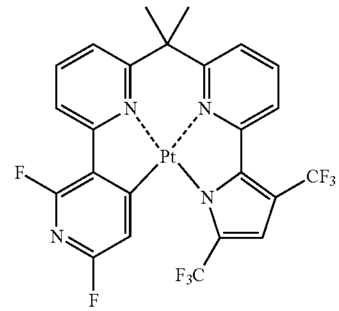
221
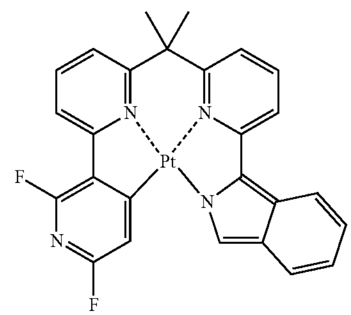
222
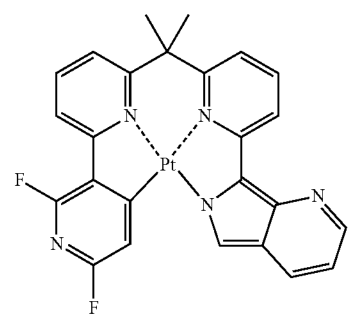
223
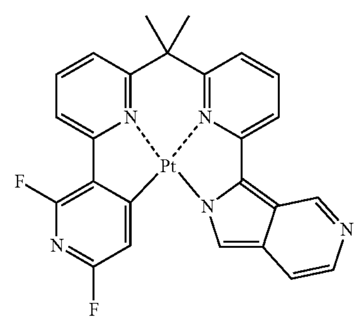
224
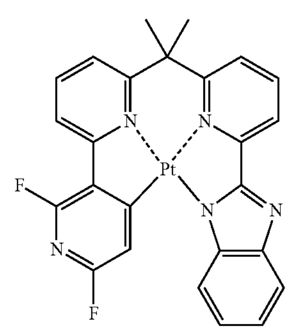

-continued
225
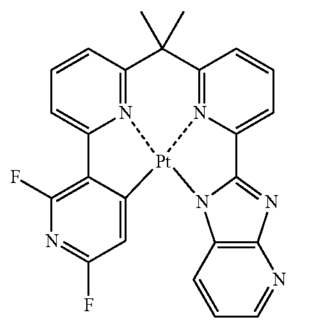
226
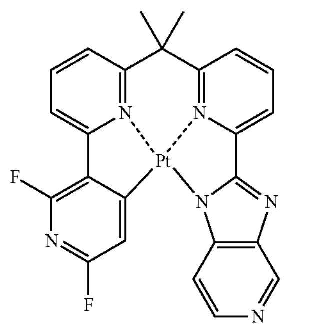
227
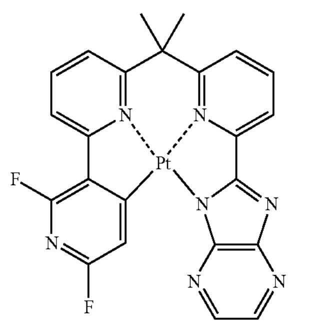
228
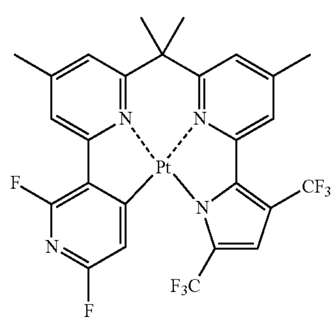
229
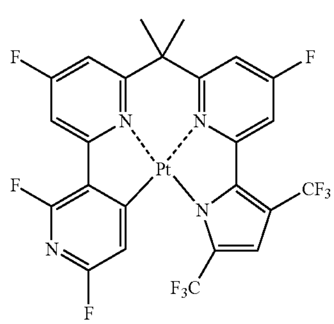
-continued
230
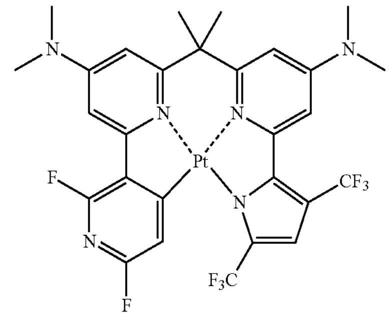
231
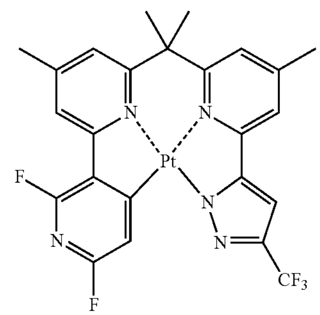
232
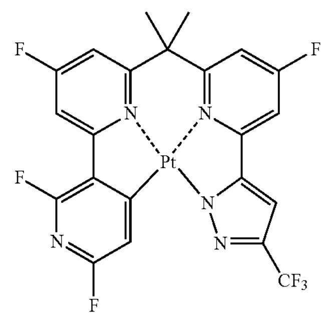
234
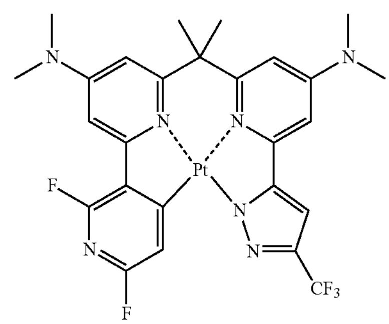
235
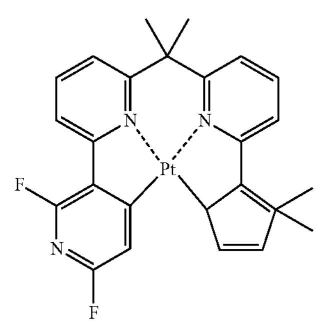

-continued
236
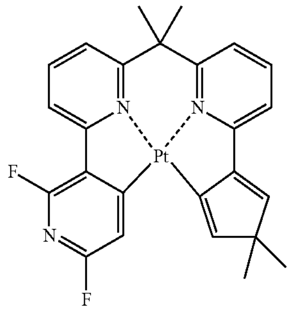
237
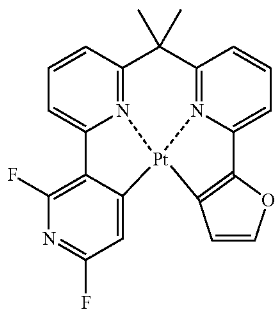
238
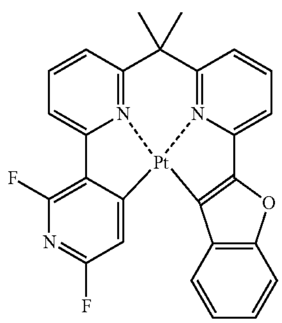
239
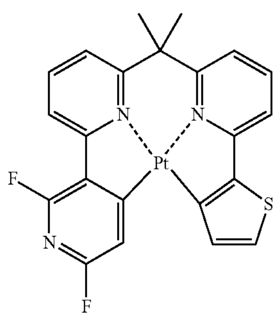
240
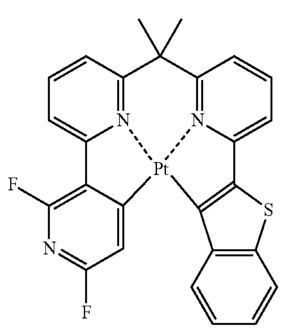
-continued
241
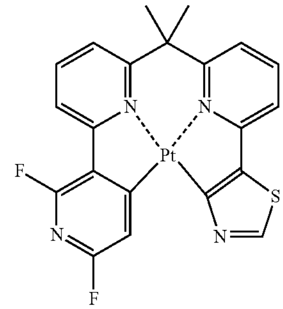
242
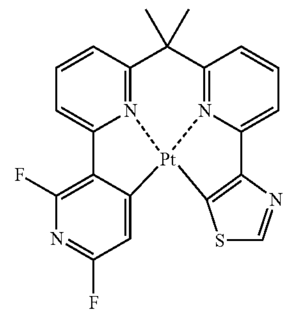
243
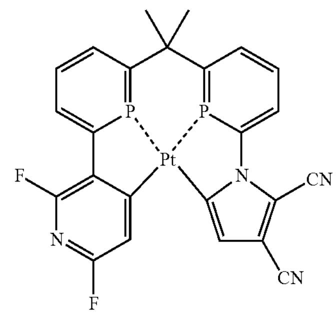
244
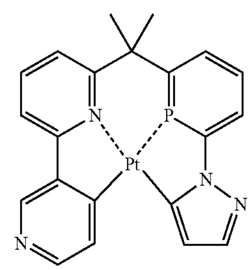
245
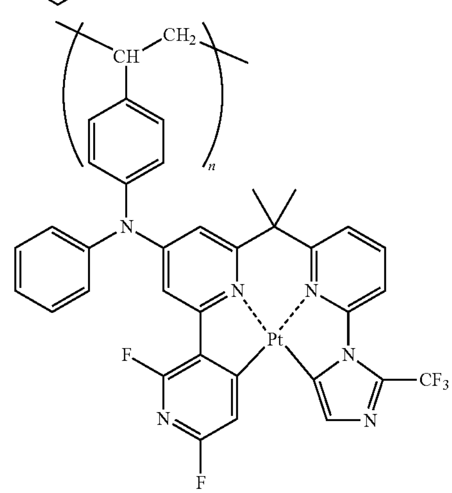
*n*: natural number -continued

246

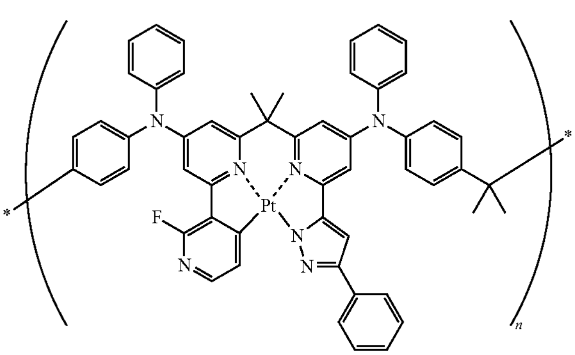

*n*: natural number

247

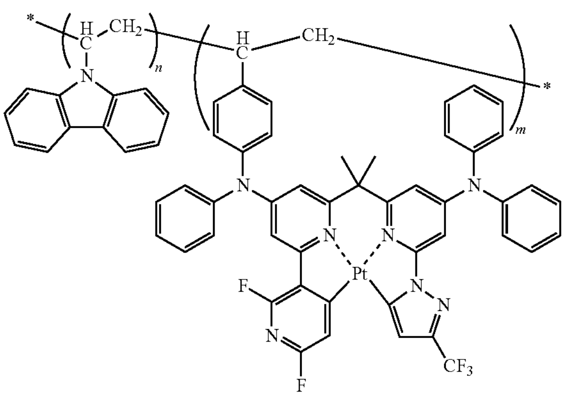

*n*, *m*: natural number

248

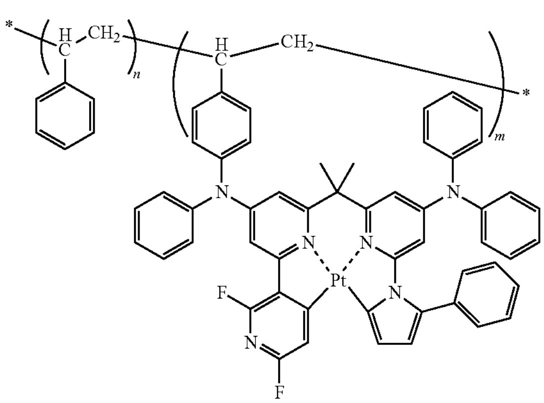

*n*, *m*: natural number

A preparation process of the metal complex represented by the formula (1) will next be described.

The metal complex represented by the formula (1) can be prepared by reacting, in the presence of a solvent, a platinum salt and a compound represented by the formula (C-0) (which may hereinafter be called "ligand").

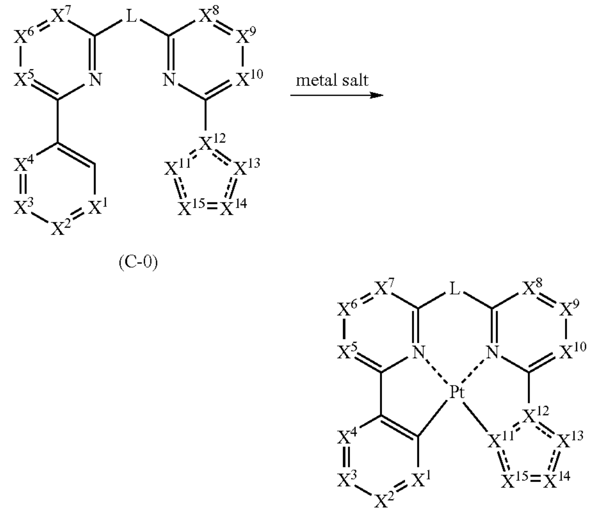

(C-0)

(1)

$X^1, X^2, X^3, X^4, X^5, X^6, X^7, X^8, X^9, X^{10}, X^{11}, X^{12}, X^{13}, X^{14}, X^{15}$, and L in the formula (C-0) have the same meanings as $X^1, X^2, X^3, X^4, X^5, X^6, X^7, X^8, X^9, X^{10}, X^{11}, X^{12}, X^{13}, X^{14}, X^{15}$, and L in the formula (1) and the preferred ranges of them are also the same.

In the preparation of the platinum complex, examples of a platinum salt to be used in the complex forming reaction with the ligand and containing divalent platinum include platinum chloride, platinum bromide, platinum iodide, platinum acetylacetonate, bis(benzonitrile)dichloroplatinum, bis(acetonitrile)dichloroplatinum, dichloro(1,5-cyclooctadiene)platinum, dibromobis(triphenylphosphine)platinum, dichloro(1,10-phenanthroline)platinum, dichlorobis(triphenylphosphine)platinum, ammonium tetrachloropalladate, diamminedibromopalladium, diamminedichloroplatinum, diamminediiodoplatinum, potassium tetrabromoplatinate, potassium tetrachloroplatinate, sodium tetrachloroplatinate, dimethylbis(dimethylsulfoxide)platinum, dimethylbis(dimethylsulfide)platinum, and dimethyl(bicyclo[2.2.1]hepta-2,5-diene)platinum.

Of these, platinum halides such as platinum chloride, platinum bromide, and platinum iodide, nitrile complexes such as bis(benzonitrile)dichloroplatinum, bis(benzonitrile)dichloroplatinum, and bis(acetonitrile)dichloroplatinum, olefin complexes such as dichloro(1,5-cyclooctadiene)platinum are preferred, of which the platinum halides such as platinum chloride and platinum bromide and nitrile complexes such as bis(benzonitrile)dichloroplatinum and bis(acetonitrile)dichloroplatinum are more preferred.

The platinum salt to be used in the preparation of the platinum complex may contain water of crystallization, a solvent of crystallization, or a coordinating solvent. The valence of the metal is not particularly limited, but the metal is preferably divalent or zero-valent, more preferably divalent.

In the preparation of the platinum complex, an amount of the platinum salt to be used for the complex forming reaction between the platinum salt and the ligand is, when the platinum salt contains one metal atom for forming the corresponding complex, typically from 0.1 to 10 mols, preferably from 0.5 to 5 mols, more preferably from 1 to 3 mols per mole of the ligand. When the platinum salt contains n pieces of metal atoms for forming the corresponding complex, the amount may be 1/n mol.

Examples of a solvent used at the time of a complex forming reaction between the platinum salt and the ligand in the preparation of the platinum complex include amides such as N,N-dimethylformamide, formamide, and N,N-dimethylacetamide, nitriles such as acetonitrile, propionitrile, butyronitrile, and benzonitrile, halogenated hydrocarbons such as dichloromethane, 1,2-dichloroethane, chloroform, carbon tetrachloride, chlorobenzene, and o-dichlorobenzene, aliphatic hydrocarbons such as pentane, hexane, octane, and decane, aromatic hydrocarbons such as benzene, toluene, xylene, and mesitylene, ethers such as diethyl ether, diisopropyl ether, butyl ether, tert-butyl methyl ether, 1,2-dimethoxyethane, tetrahydrofuran, and 1,4-dioxane, ketones such as acetone, methyl ethyl ketone, and methyl isobutyl ketone, alcohols such as methanol, ethanol, 1-propanol, 2-propanol, tert-butyl alcohol, 2-methoxyethanol, 2-ethoxyethanol, ethylene glycol and glycerin, and water.

Of these solvents, nitriles such as acetonitrile, propionitrile, butyronitrile, and benzonitrile, aromatic hydrocarbons such as benzene, toluene, xylene, and mesitylene, and alcohols such as methanol, ethanol, 1-propanol, 2-propanol, tert-butyl alcohol, 2-methoxyethanol, 2-ethoxyethanol, ethylene glycol, and glycerin are more preferred, with nitriles such as acetonitrile, propionitrile, butyronitrile, and benzonitrile and aromatic hydrocarbons such as benzene, toluene, xylene, and mesitylene being still more preferred.

These solvents may be used either singly or as a mixture of two or more thereof.

In the preparation of the platinum complex, an amount of the solvent to be used for the complex forming reaction between the platinum salt and the ligand is not particular limited insofar as it permits adequate progress of the reaction. It is used in an amount of typically from 1 to 200 times the volume, preferably from 5 to 100 times the volume of the ligand used in the reaction.

In the preparation of the platinum complex, when an acid substance such as hydrogen halide is formed during the complex forming reaction between the platinum salt and the ligand, the reaction may be performed in the presence of a basic substance. Examples of the basic substance include tertiary amines such as triethylamine, diisopropylethylamine, pyridine, and 1,8-dimethylaminonaphthalene, metal alkoxides such as sodium methoxide and sodium ethoxide, and inorganic bases such as sodium hydroxide, potassium hydroxide, potassium carbonate, and sodium bicarbonate.

In the preparation of the platinum complex, the complex forming reaction between the platinum salt and the ligand is performed preferably in an inert gas atmosphere. Examples of the inert gas include nitrogen and argon.

In the preparation of the platinum complex, the reaction temperature, the reaction time, and reaction pressure in the complex forming reaction between the platinum salt and the ligand each differs, depending on the raw materials or the solvent. However, the reaction temperature is typically from 20 to 300° C., preferably from 50 to 250° C., more preferably from 80 to 220° C.; the reaction time is typically from 30 minutes to 24 hours, preferably from 1 to 12 hours, more preferably from 2 to 10 hours; and the reaction pressure is typically normal pressure, but the reaction may be performed under pressure or under reduced pressure as needed.

In the preparation of the platinum complex, a heating unit to be used in the complex forming reaction between the platinum salt and the ligand is not particularly limited. Specifically, heating in an oil bath, heating in a mantle heater, or heating by exposure to microwaves can be employed.

The platinum complex prepared in such a manner may be isolated or purified as needed. Examples of the isolation or purification method include column chromatography, recrystallization, re-precipitation, and sublimation. They may be used either singly or in combination.

Of the platinum complexes represented by the formula (1), the platinum complex represented by the formula (2a-1) can also be synthesized by the preparation process shown below. But the preparation process is not limited to it.

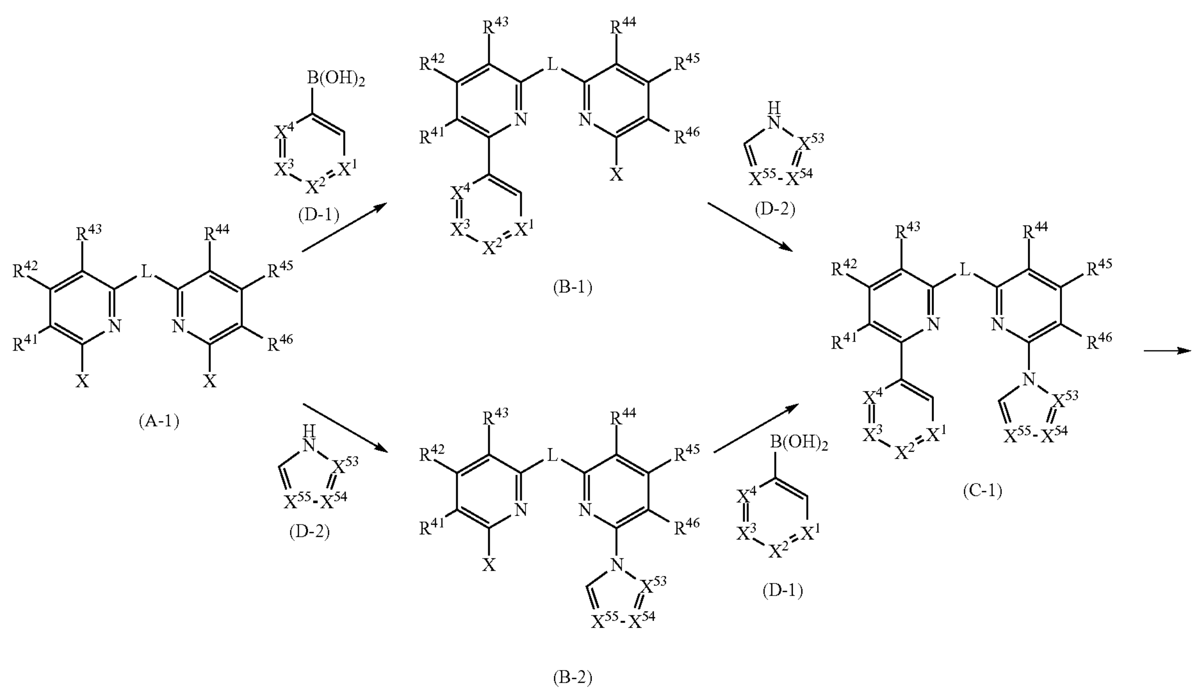

-continued

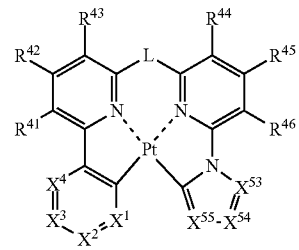

(5a-1)

(wherein, $X^1$, $X^2$, $X^3$, $X^4$, $X^{53}$, $X^{54}$, $X^{55}$, $R^{41}$, $R^{42}$, $R^{43}$, $R^{44}$, $R^{45}$, $R^{46}$, and L in the above formula have the same meanings as in the formula (2a-3). X is a group which can be substituted at the pyridine ring.)

As a step for obtaining Compound (B-1) from Compound (A-1) and a step for obtaining Compound (C-1) from Compound (B-2), the process as described in *Synth. Commun.*, 11, 513 (1981) can be employed for synthesizing the intended compounds.

As a step for obtaining Compound (C-1) from Compound (B-1) and a step for obtaining Compound (B-2) from Compound (A-1), the process as described in *Angew. Chem. Int. Ed.*, 42, 2051-2053 (2003) can be employed for synthesizing the intended compounds.

As a step for obtaining the platinum complex represented by the formula (2a-1), Compound (C-1) and from 1 to 1.5 equivalents of platinum chloride are dissolved in benzonitrile, the resulting solution is heated to from 130° C. to reflux temperature (the boiling point of benzonitrile: 191° C.), and the reaction mixture is stirred for from 30 minutes to 4 hours to obtain the intended compound. The platinum complex represented by the formula (4) can be purified by recrystallization from chloroform, dichloromethane, toluene, xylene, acetonitrile, butyronitrile, benzonitrile, or ethyl acetate, silica gel column chromatography, or sublimation.

In the above-described preparation process, when the substituent defined changes under certain conditions of the synthesis process or is not suited for enforcing the process, it is possible to prepare the intended compound easily, for example, by protecting or deprotecting a functional group (for example, *Protective Groups in Organic Synthesis*, written by T. W. Greene, published by John Wiley & Sons, Inc. in 1981). If necessary, the order of the reaction steps such as introduction of a substituent can be changed as needed.

In another mode of the invention, the light emitting layer contains preferably at least one of the compounds represented by the above formulae (I) to (X), a monoanionic bidentate ligand represented by the following formulae (A1) to (A4), and at least one phosphorescent metal complex containing a metal having an atomic weight of 40 or greater.

It is to be noted that in the formula of the ligand in the invention, * is a coordination site to a metal. The bond of $E_{1a}$ to a metal and the bond of $E_{1p}$ to a metal may independently be a covalent bond or a coordinate bond.

The bidentate ligands represented by the formulae (A1) to (A4) will next be described.

(Bidentate Ligands Represented by the Formulae (A1) to (A4))

A1

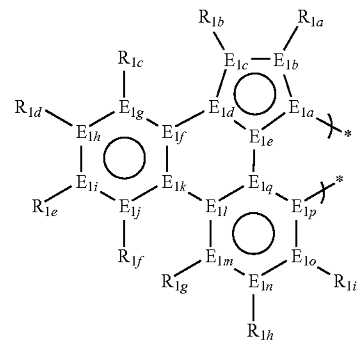

A2

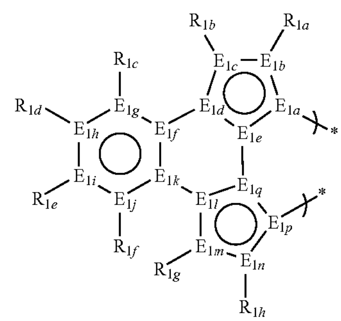

A3

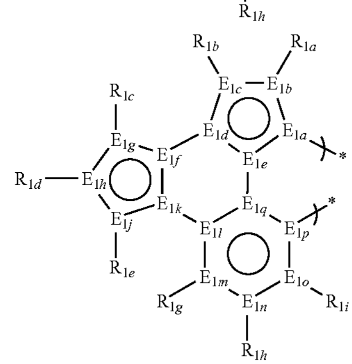

A4

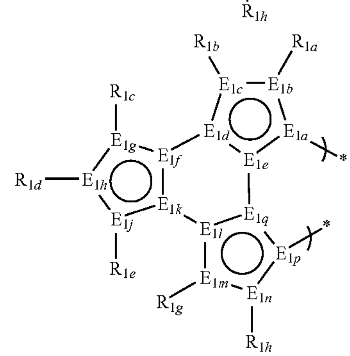

(in the formulae (A1) to (A4), $E_{1a}$ to $E_{1q}$ each independently represents a carbon atom or a hetero atom, $R_{1a}$ to $R_{1i}$ each independently represents a hydrogen atom or a substituent, and the skeletons represented by the formulae (A1) to (A4) each has a 18π electronic structure in total).

The bidentate ligand may bind to another ligand to form a tridentate, tetradentate, pentadentate, or hexadentate ligand.

$E_{1a}$ to $E_{1q}$ are selected from a carbon atom or hetero atoms and are preferably selected from a carbon atom and a nitrogen atom. $E_{1a}$ and $E_{1p}$ are preferably atoms different from each other. The metal complex has a 18π electronic structure.

The ring formed of $E_{1a}$ to $E_{1e}$ is a 5-membered heterocycle. Specifically, it is oxazole, thiazole, isoxazole, isothiazole, pyrrole, imidazole, pyrazole, triazole, or tetrazole, preferably imidazole or pyrazole, more preferably imidazole. These 5-membered rings may be fused with another ring.

It is preferred that at least one of $E_{1a}$ to $E_{1e}$ represents a nitrogen atom, more preferred that two or three of $E_{1a}$ to $E_{1e}$ represent a nitrogen atom; and especially preferred that two of $E_{1a}$ to $E_{1e}$ represent a nitrogen atom. When two of $E_{1a}$ to $E_{1e}$ represent a nitrogen atom, it is preferred that two of $E_{1a}$, $E_{1d}$, and $E_{1e}$ represent a nitrogen atom, more preferred that $E_{1a}$ and $E_{1d}$, or $E_{1a}$ and $E_{1e}$ represent a nitrogen atom, and still more preferred that $E_{1a}$ and $E_{1d}$ each represents a nitrogen atom.

The ring formed of $E_{1f}$ to $E_{1k}$ may be a 5- or 6-membered aromatic hydrocarbon ring or hetero ring, preferably a 6-membered ring, more preferably a 6-membered aromatic hydrocarbon ring. Specific examples of the ring formed of $E_{1f}$ to $E_{1k}$ include benzene, oxazole, thiazole, isoxazole, isothiazole, oxadiazole, thiadiazole, furan, thiophene, pyrrole, imidazole, pyrazole, triazole, pyridine, pyrazine, pyrimidine, pyridazine, and triazine. Of these, pyridine and benzene are preferred, with benzene being more preferred.

The ring formed of $E_{1l}$ to $E_{1q}$ is a 5- or 6-membered aromatic hydrocarbon ring or hetero ring, preferably a 6-membered ring, more preferably a 6-membered aromatic hydrocarbon ring. Specific examples of the ring formed of $E_{1l}$ to $E_{1q}$ include benzene, oxazole, thiazole, isoxazole, isothiazole, oxadiazole, thiadiazole, furan, thiophene, pyrrole, imidazole, pyrazole, triazole, pyridine, pyrazine, pyrimidine, pyridazine, and triazine. Of these, pyridine and benzene are preferred, with benzene being more preferred.

$R_{1a}$ to $R_{1i}$ each independently represents a hydrogen atom or a substituent. The substituent is preferably a group selected from the substituent group Z described below.

Specific examples of the substituent group Z include alkyl groups, alkenyl groups, alkynyl groups, aryl groups, heteroaryl groups, amino groups, alkoxy groups, aryloxy groups, heterocyclic oxy groups, acyl groups, alkoxycarbonyl groups, aryloxycarbonyl groups, acyloxy groups, acylamino groups, alkoxycarbonylamino groups, aryloxycarbonylamino groups, sulfonylamino groups, sulfamoyl groups, carbamoyl groups, alkylthio groups, arylthio groups, heteroarylthio groups, sulfonyl groups, sulfinyl groups, ureido groups, phosphoric acid amide groups, a hydroxy group, a mercapto group, halogen groups, a cyano group, a sulfo group, a carboxyl group, a nitro group, a hydroxamic acid group, a sulfino group, a hydrazino group, an imino group, heterocyclic groups other than heteroaryl groups, silyl groups, silyloxy groups, and deuterated hydrogen. These substituents may be substituted with another substituent further.

The alkyl groups are preferably $C_{1-30}$, more preferably $C_{1-20}$, especially preferably $C_{1-10}$ ones. Examples include methyl, ethyl, n-propyl, iso-propyl, n-butyl, tert-butyl, n-octyl, n-nonyl, n-decyl, n-dodecyl, n-octadecyl, n-hexadecyl, cyclopropyl, cyclobutyl, cyclopentyl, cyclohexyl, cyclooctyl, 1-adamantyl, and trifluoromethyl.

The alkenyl groups are preferably $C_{2-30}$, more preferably $C_{2-20}$, especially preferably $C_{2-10}$ ones. Examples include vinyl, allyl, 1-propenyl, 1-isopropenyl, 1-butenyl, 2-butenyl, and 3-pentenyl.

The alkynyl groups are preferably $C_{2-30}$, more preferably $C_{2-20}$, especially preferably $C_{2-10}$ ones. Examples include ethynyl, propargyl, 1-propynyl, and 3-pentynyl.

The term "aryl groups" means aromatic hydrocarbon monoradicals. When the aryl groups are substituted, the substituent is preferably a fluoro group, a hydrocarbon substituent, a hydrocarbon substituent substituted with a hetero atom, a cyano group, or the like. The aryl groups are preferably $C_{6-30}$, more preferably $C_{6-20}$, especially preferably $C_{6-12}$ ones. Examples include phenyl, o-methylphenyl, m-methylphenyl, p-methylphenyl, 2,6-xylyl, p-cumenyl, mesityl, naphthyl, and anthranyl.

The term "heteroaryl groups" means aromatic heterocyclic monoradicals. When they are substituted, the substituent is preferably a fluoro group, a hydrocarbon substituent, a hydrocarbon substituent substituted with a hetero element, a cyano group, or the like. Examples of the heterocyclic group include imidazolyl, pyrazolyl, pyridyl, pyrazyl, pyrimidyl, triazinyl, quinolyl, isoquinolinyl, pyrrolyl, indolyl, furyl, thienyl, benzoxazolyl, benzimidazolyl, benzthiazolyl, carbazolyl, and azepinyl.

The amino groups are preferably $C_{0-30}$, more preferably $C_{0-20}$, especially preferably $C_{0-10}$ ones. Examples include amino, methylamino, dimethylamino, diethylamino, dibenzylamino, diphenylamino, and ditolylamino.

The alkoxy groups are preferably $C_{1-30}$, more preferably $C_{1-20}$, especially preferably $C_{1-10}$ ones. Examples include methoxy, ethoxy, butoxy, and 2-ethylhexyloxy.

The aryloxy groups are preferably $C_{6-30}$, more preferably $C_{6-20}$, especially preferably $C_{6-12}$ ones. Examples include phenyloxy, 1-naphthyloxy, and 2-naphthyloxy.

The heterocyclic oxy groups are preferably $C_{1-30}$, more preferably $C_{1-20}$, especially preferably $C_{1-12}$ ones. Examples include pyridyloxy, pyrazyloxy, pyrimidyloxy, and quinolyloxy.

The acyl groups are preferably $C_{2-30}$, more preferably $C_{2-20}$, especially preferably $C_{2-12}$ ones. Examples include acetyl, benzoyl, formyl, and pivaloyl.

The alkoxycarbonyl groups are preferably $C_{2-30}$, more preferably $C_{2-20}$, especially preferably $C_{2-12}$ ones. Examples include methoxycarbonyl and ethoxycarbonyl.

The aryloxycarbonyl groups are preferably $C_{7-30}$, more preferably $C_{7-20}$, especially preferably $C_{7-12}$ ones. Examples include phenyloxycarbonyl.

The acyloxy groups are preferably $C_{2-30}$, more preferably $C_{2-20}$, especially preferably $C_{2-10}$ ones. Examples include acetoxy and benzoyloxy.

The acylamino groups are preferably $C_{2-30}$, more preferably $C_{2-20}$, especially preferably $C_{2-10}$ ones. Examples include acetylamino and benzoylamino.

The alkoxycarbonylamino groups are preferably $C_{2-30}$, more preferably $C_{2-20}$, especially preferably $C_{2-12}$ ones. Examples include methoxycarbonylamino.

The aryloxycarbonylamino groups are preferably $C_{7-30}$, more preferably $C_{7-20}$, especially preferably $C_{7-12}$ ones. Examples include phenyloxycarbonylamino.

The sulfonylamino groups are preferably $C_{1-30}$, more preferably $C_{1-20}$, especially preferably $C_{1-12}$ ones. Examples include methanesulfonylamino and benzenesulfonylamino.

The sulfamoyl groups are preferably $C_{0-30}$, more preferably $C_{0-20}$, especially preferably $C_{0-12}$ ones. Examples include sulfamoyl, methylsulfamoyl, dimethylsulfamoyl, and phenylsulfamoyl.

The carbamoyl groups are preferably $C_{1-30}$, more preferably $C_{1-20}$, especially preferably $C_{1-12}$ ones. Examples include carbamoyl, methylcarbamoyl, diethylcarbamoyl, and phenylcarbamoyl.

The alkylthio groups are preferably $C_{1-30}$, more preferably $C_{1-20}$, especially preferably $C_{1-12}$ ones. Examples include methylthio and ethylthio.

The arylthio groups are preferably $C_{6-30}$, more preferably $C_{6-20}$, especially preferably $C_{6-12}$ ones. Examples include phenylthio.

The heteroarylthio groups are preferably $C_{1-30}$, more preferably $C_{1-20}$, especially preferably $C_{1-12}$ ones. Examples include pyridylthio, 2-benzimidazolylthio, 2-benzoxazolylthio, and 2-benzthiazolylthio.

The sulfonyl groups are preferably $C_{1-30}$, more preferably $C_{1-20}$, especially preferably $C_{1-12}$ ones. Examples include mesyl, tosyl, and trifluoromethanesulfonyl.

The sulfinyl groups are preferably $C_{1-30}$, more preferably $C_{1-20}$, especially preferably $C_{1-12}$ ones. Examples include methanesulfinyl and benzenesulfinyl.

The ureido groups are preferably $C_{1-30}$, more preferably $C_{1-20}$, especially preferably $C_{1-12}$ ones. Examples include ureido, methylureido, and phenylureido.

The phosphoric acid amide groups are preferably $C_{1-30}$, more preferably $C_{1-20}$, especially preferably $C_{1-12}$ ones. Examples include diethylphosphoric acid amide and phenylphosphoric acid amide.

Examples of the halogen atoms include a fluorine atom, a chlorine atom, a bromine atom, and an iodine atom.

The heterocyclic groups other than heteroaryl groups are preferably $C_{1-30}$, more preferably $_{1-12}$ ones. Examples of the hetero atom include a nitrogen atom, an oxygen atom, and a sulfur atom. Specific examples of the heterocyclic groups include piperidyl, morpholino, and pyrrolidyl.

The silyl groups are preferably $C_{3-40}$, more preferably $C_{3-30}$, especially preferably $C_{3-24}$ ones. Examples include trimethylsilyl, triethylsilyl, triisopropylsilyl, dimethyl-tert-butylsilyl, dimethylphenylsilyl, diphenyl-tert-butylsilyl, triphenylsilyl, tri-1-naphthylsilyl, and tri-2-naphthylsilyl.

The silyloxy groups are preferably $C_{3-40}$, more preferably $C_{3-30}$, especially preferably $C_{3-24}$ ones. Examples include trimethylsilyloxy and triphenylsilyloxy.

$R_{1a}$ to $R_{1i}$ each represents preferably a hydrogen atom, a hydrocarbon substituent (preferably an alkyl group, a cycloalkyl group, or an aryl group), a cyano group, a fluoro group, $OR_{2a}$, $SR_{2a}$, $NR_{2a}R_{2b}$, $BR_{2a}R_{2b}$, or $SiR_{2a}R_{2b}R_{2c}$. $R_{2a}$ to $R_{2c}$ each independently represents a hydrocarbon substituent or a hydrocarbon substituent substituted with a hetero atom. Two of $R_{1a}$ to $R_{1i}$ and $R_{2a}$ to $R_{2c}$ may be coupled to each other to form a saturated or unsaturated, aromatic or non-aromatic ring. $R_{1a}$ to $R_{1i}$ do not exist when bound to a nitrogen atom.

At least one of $R_{1a}$ to $R_{1i}$ represents preferably an aryl group having a dihedral angle of 70° or greater relative to the main skeleton, more preferably a substituent represented by the following formula ss-1, still more preferably a 2,6-disubstituted aryl group. It is most preferred that $R_{1b}$ represents a 2,6-disubstituted aryl group.

ss-1

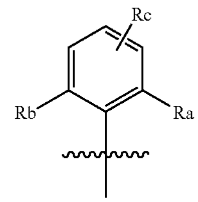

(in the formula ss-1, Ra, Rb, and Rc each independently represents a hydrogen atom, an alkyl group, or an aryl group and the number of Rc is from 0 to 3).

The alkyl groups represented by Ra, Rb, and Rc are preferably $C_{1-30}$, more preferably $C_{1-20}$, especially preferably $C_{1-10}$ ones. Examples include methyl, ethyl, n-propyl, isopropyl, n-butyl, tert-butyl, n-octyl, n-nonyl, n-decyl, n-dodecyl, n-octadecyl, n-hexadecyl, cyclopropyl, cyclobutyl, cyclopentyl, cyclohexyl, cyclooctyl, 1-adamantyl, and trifluoromethyl. Of these, methyl and isopropyl groups are preferred.

The aryl groups represented by Ra, Rb, and Rc are preferably $C_{6-30}$, more preferably $C_{6-20}$, especially preferably $C_{6-12}$ ones. Examples include phenyl, o-methylphenyl, m-methylphenyl, p-methylphenyl, 2,6-xylyl, p-cumenyl, mesityl, naphthyl, and anthranyl. Of these, phenyl, 2,6-xylyl, and mesityl groups are preferred, with a phenyl group being more preferred.

It is preferred that at least one of Ra and Rb is selected from alkyl groups or aryl groups; more preferred that at least one of Ra and Rb is selected from alkyl groups; still more preferred that both of Ra and Rb are alkyl groups; and most preferred that both of Ra and Rb represent a methyl group or an isopropyl group.

Preferred examples of the 2,6-disubstituted aryl group include 2,6-dimethylphenyl, 2,4,6-trimethylphenyl, 2,6-diisopropylphenyl, 2,4,6-triisopropylphenyl, 2,6-dimethyl-4-phenylphenyl, 2,6-dimethyl-4-(2,6-dimethylpyridin-4-yl)phenyl, 2,6-diphenylphenyl, 2,6-diphenyl-4-isopropylphenyl, 2,4,6-triphenylphenyl, 2,6-diisopropyl-4-(4-isopropylphenyl)phenyl, 2,6-diisopropyl-4-(3,5-dimethylphenyl)phenyl, 2,6-diisopropyl-4-(pyridin-4-yl)phenyl and 2,6-di-(3,5-dimethylphenyl)phenyl.

The number of Rcs is preferably 0 or 1. A plurality of Rcs may be the same or different.

On the other hand, it is preferred that at least one of $R_{1a}$ to $R_{1i}$ represents an alkyl group and especially preferred that $R_{1e}$ represents an alkyl group. The alkyl group is preferably an alkyl group comprised of four or more carbon atoms and branched at a site distant from the benzyl position, more preferably a methyl group or a neopentyl group, still more preferably a neopentyl group.

It is preferred that at least one of $R_{1a}$ and $R_{1b}$ represents an electron donating group; more preferred that $R_{1a}$ represents an electron donating substituent; and still more preferred that $R_{1a}$ represents a methyl group.

The term "hydrocarbon substituent" means a monovalent or divalent, linear, branched, or cyclic substituent comprised only of carbon atoms and hydrogen atoms.

Examples of the monovalent hydrocarbon substituent include $C_{1-20}$ alkyl groups, $C_{1-20}$ alkyl groups substituted with one or more groups selected from $C_{1-20}$ alkyl groups, $C_{3-8}$ cycloalkyl groups, and aryl groups, $C_{3-8}$ cycloalkyl groups, $C_{3-8}$ cycloalkyl groups substituted with one or more groups selected from $C_{1-20}$ alkyl groups, $C_{3-8}$ cycloalkyl groups, and aryl groups, $C_{6-18}$ aryl groups, and aryl groups substituted with one or more groups selected from $C_{1-20}$ alkyl groups, $C_{3-8}$ cycloalkyl groups, and aryl groups.

Examples of the divalent hydrocarbon group include —$CH_2$—, —$CH_2CH_2$—, —$CH_2CH_2CH_2$—, and 1,2-phenylene group.

The metal which the phosphorescent metal complex has in the invention is preferably a metal having an atomic weight of 40 or greater and belonging to Groups VIII to X of the periodic table. In addition, it is preferably nonradioactive. The metal which the phosphorescent metal complex has in the invention is more preferably any of Re, Ru, Os, Rh, Ir, Pd, Pt, Cu or Au, still more preferably Os, Ir, or Pt, especially preferably Ir or Pt. From the standpoints of high luminous efficiency, high complex stability, and control of a carrier balance in hole/electron transport in the light emitting layer, the metal is most preferably Ir.

In the invention, the metal complex comprised of the ligands represented by the formula may be comprised of a combination of a primary ligand or a tautomer thereof and a secondary ligand or a tautomer thereof, or all the ligands of the metal complex may be comprised only of a partial structure represented by the primary ligand or tautomer thereof.

The metal complex may have, as the secondary ligand, a ligand known to those skilled in the art (which may also be called coordination compounds) as a so-called ligand employed for conventionally known metal complex formation.

The complex may be formed of one or two kinds of ligands, more preferably one kind of a ligand in order to effectively achieve the advantage described in the invention. When a reactive group is introduced into the molecule of the complex, using two kinds of ligands is preferred from the standpoint of synthesis ease.

There are various known ligands to be used for the conventionally known metal complexes. Examples include ligands described, for example, in H. Yersin, *Photochemistry and Photophysics of Coordination Compounds*, Springer Verlag (1987) or Yamamoto Akio, *Organometallic Chemistry—Fundamentals and Applications*," Shokabo Publishing Co., Ltd. (1982) (such as halogen ligands preferably, a chlorine ligand, a cyano ligand, a phosphine ligand, and nitrogen-containing heteroaryl ligands (such as bipyridyl and phenanthroline), and diketone ligands (such as acetylacetone). Of these, diketones and picolinic acid derivatives are preferred.

The following are specific examples of the secondary ligands, but the invention is not limited thereto.

(I-1)

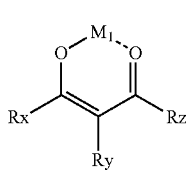

(I-2)

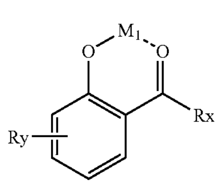

-continued (I-3)

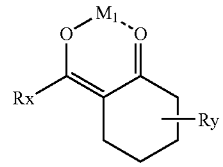

(I-4)

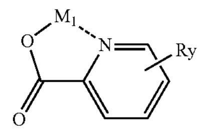

(I-5)

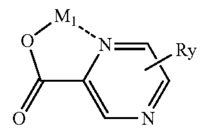

(I-6)

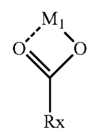

(I-7)

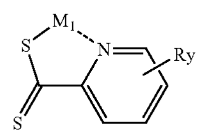

(I-8)

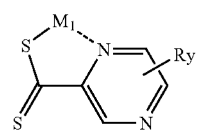

(I-9)

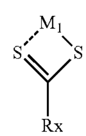

(I-10)

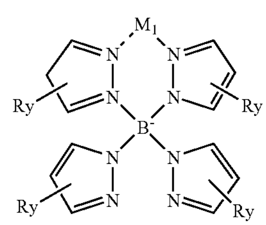

(I-11)

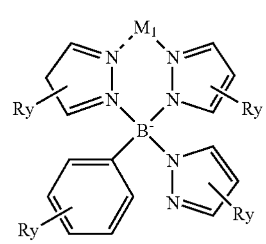

-continued (I-12)

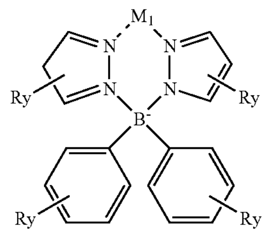

(I-13)

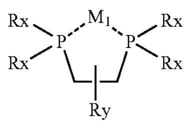

(I-14)

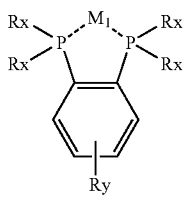

(wherein, $M_1$ represents a metal atom having an atomic weight of 40 or greater and Rx, Ry, and Rz each independently represent a hydrogen atom or a substituent).

The monoanionic bidentate represented by any of the formulae (A1) to (A4) is preferably a monoanionic bidentate represented by the formula (A1) or (A3).

The monoanionic bidentate represented by the formula (A1) or (A3) is preferably a monoanionic bidentate represented by the formula (A1-1) or (A3-1) or the formula (A1-2) or (A3-2), respectively.

(A1-1)

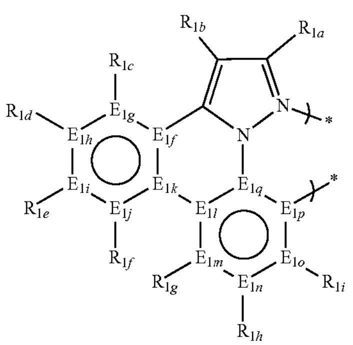

(A3-1)

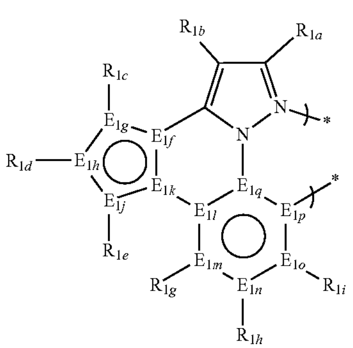

-continued (A1-2)

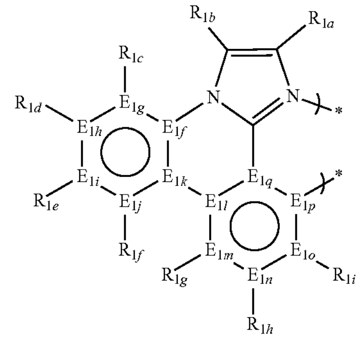

(A3-2)

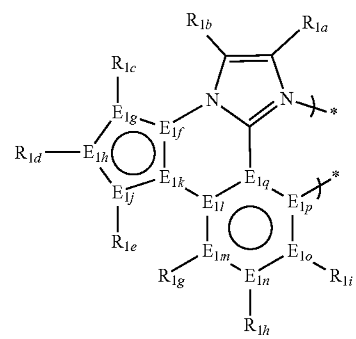

(in the formulae (A1-1), (A3-1), (A1-2), and (A3-2), $E_{1f}$ to $E_{1q}$ each independently represents a carbon atom or a hetero atom, $R_{1a}$ to $R_{1i}$ each independently represents a hydrogen atom or a substituent, and the skeletons represented by the formulae (A1-1), (A3-1), (A1-2), and (A3-2) each has a 18π electronic structure in total).

$E_{1f}$ to $E_{1q}$ and $R_{1a}$ to $R_{1i}$ in the formulae (A1-1), (A3-1), (A1-2), and (A3-2) have the same meanings as $E_{1f}$ to $E_{1q}$ and $R_{1a}$ to $R_{1i}$ in the formulae (A1) and (A3) and the preferred ranges of them are also the same.

The monoanionic bidentate ligands represented by the formulae (A1-1), (A3-1), (A1-2), and (A3-2) are preferably monoanionic bidentate ligands represented by the formulae (A1-3) and (A3-3).

(A1-3)

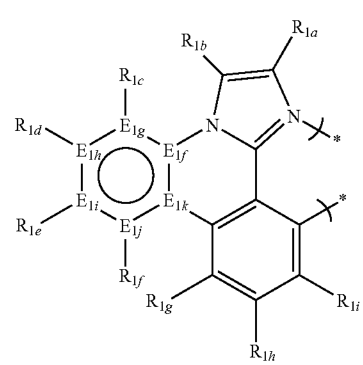

-continued (A3-3)

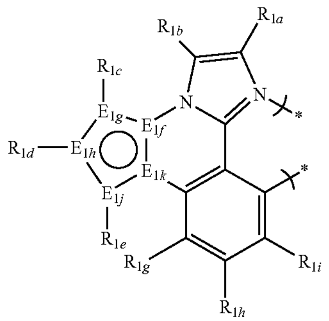

(in the formulae (A1-3) and (A3-3), $E_{1f}$ to $E_{1k}$ each independently represents a carbon atom or a hetero atom, $R_{1a}$ to $R_{1i}$ each independently represents a hydrogen atom or a substituent, and the skeletons represented by the formulae (A1-3) and (A3-3) each has a 18π electronic structure in total).

$E_{1f}$ to $E_1$(O) and $R_{1a}$ to $R_{1i}$ in the formulae (A1-3) and (A3-3) have the same meanings as $E_{1f}$ to $E_{1q}$ and $R_{1a}$ to $R_{1i}$ in the formulae (A1-1), (A3-1), (A1-2), and (A3-2) and the preferred ranges of them are also the same.

The phosphorescent metal complex containing the monoanionioc bidentate ligand represented by the formula (A1-3) or (A3-3) and a metal having an atomic weight of 40 or greater is preferably an iridium complex represented by the formula (A9).

(A9)

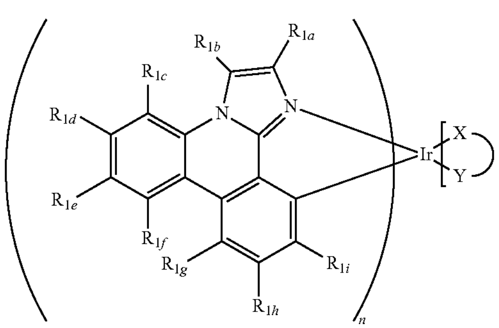

(in the formula (A9), $R_{1a}$ to $R_{1i}$ each independently represents a hydrogen atom or a substituent, X—Y represents at least one monoanionic bidentate ligand selected from the (I-1) to (I-14), and n stands for an integer from 1 to 3).

In the formula (A9), the preferred ranges of $R_{1a}$ to $R_{1i}$ are the same as those of $R_{1a}$ to $R_{1i}$ in the formula (A1).

X—Y represents a secondary ligand, while n stands for an integer from 1 to 3, preferably 3. As the secondary ligand, those specifically exemplified above can be preferably used. Of these, acetylacetonato ligand or substituted acetylacetonato ligand analogs are preferred.

From the standpoint of synthesis ease, n is preferably 3, but using an inexpensive secondary ligand having n of 1 or 2 instead of a ligand having n=3 is also preferred from the standpoint of cost reduction.

When n is 3, the formula (A9) corresponds to the following formula (A9-1).

(A9-1)

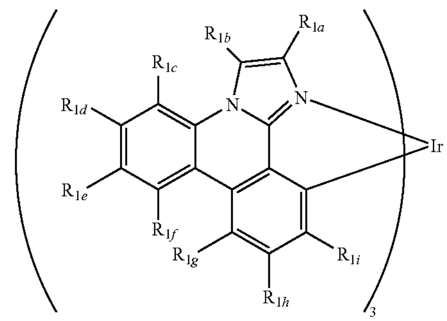

(in formula (A9-1), $R_{1a}$ to $R_{1i}$ each independently represents a hydrogen atom or a substituent.)

In the formula (A9-1), the preferred ranges of $R_{1a}$ to $R_{1i}$ are the same as those of $R_{1a}$ to $R_{1i}$ in the formula (A1).

The metal complex represented by the formula (A9) is preferably a metal complex represented by the formula (A10).

A10

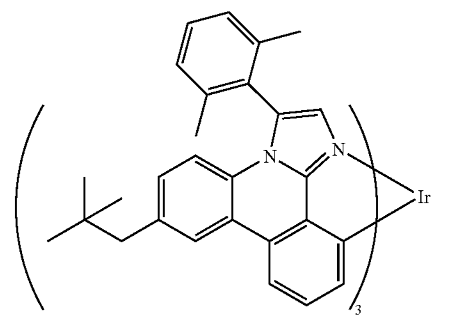

Specifically, the ligands represented by the formula (A1) and (A3) have preferably any of the structures as described below and of these, (X-64) to (X-68) are most preferred. In the following structures, $R^{1a}$ to $R^{1i}$ are the same as those of $R_{1a}$ to $R_{1i}$ in the formula (A1) and the preferred range are also the same as those in the formula (A1).

X-1

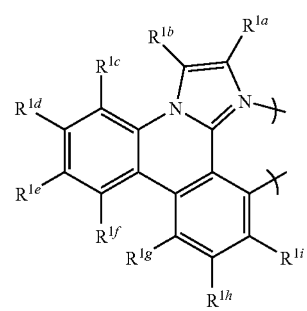

-continued
X-2
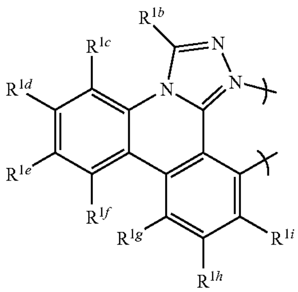
X-3
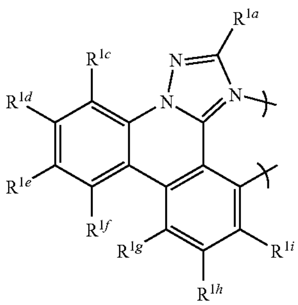
X-4
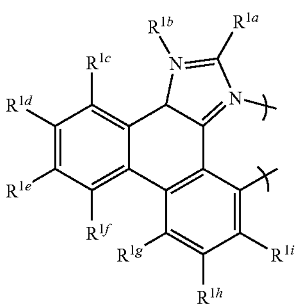
X-5
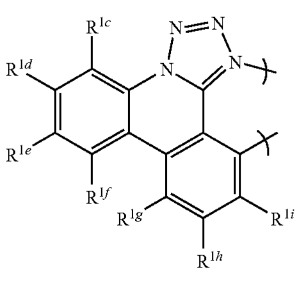
X-6
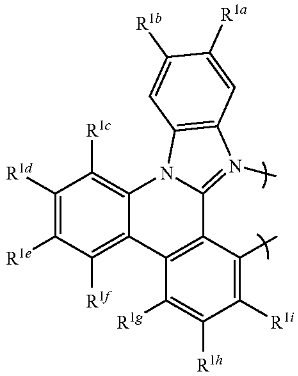
-continued
X-7
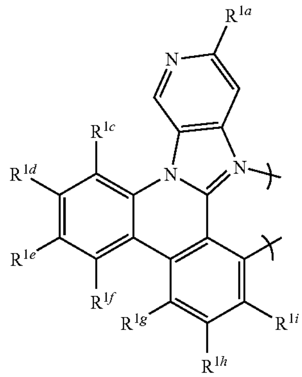
X-8
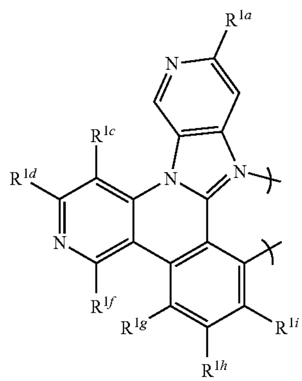
X-9
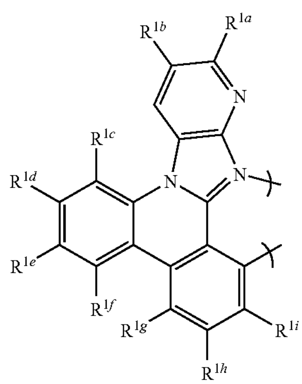
X-10
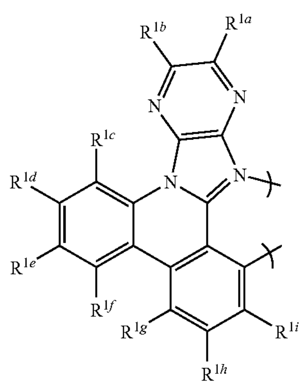

-continued
X-11
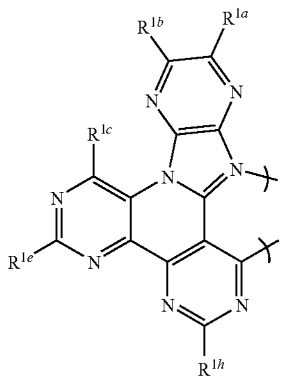
X-12
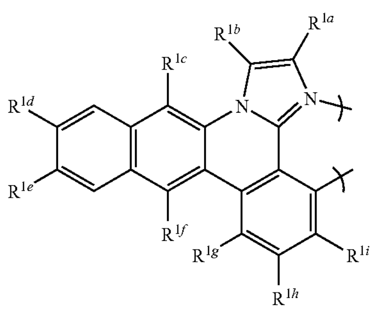
X-13
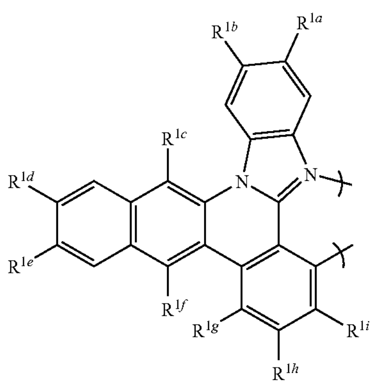
X-14
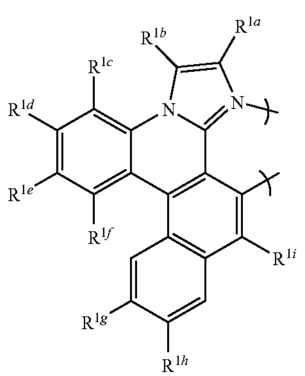
-continued
X-15
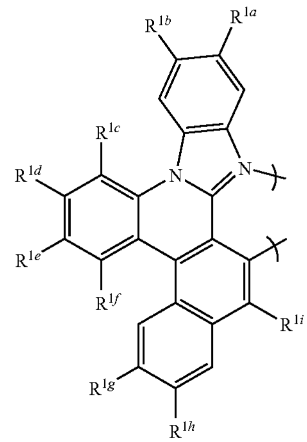
X-16
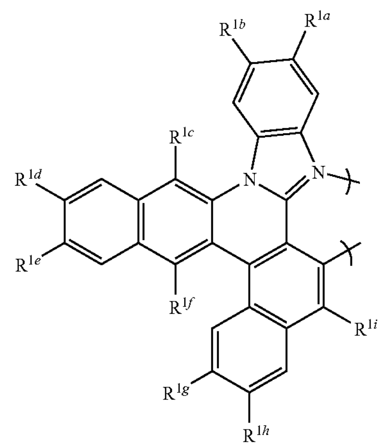
X-17
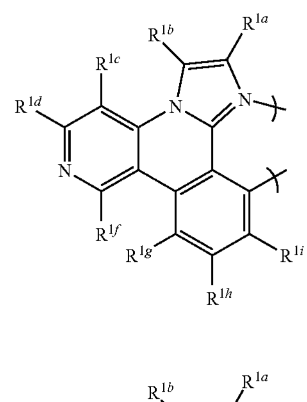
X-18
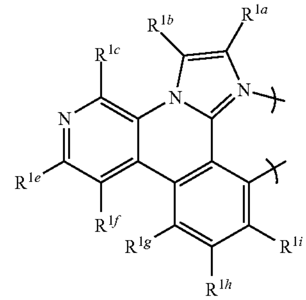

-continued
X-19
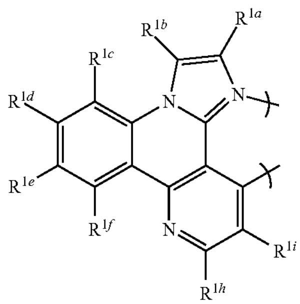
X-20
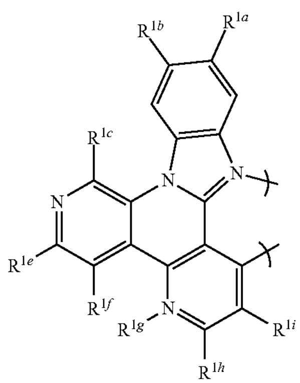
X-21
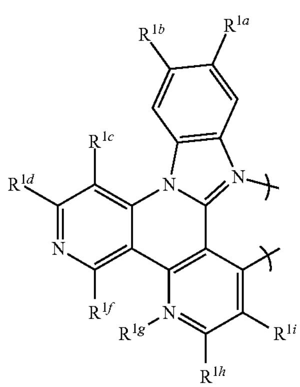
X-22
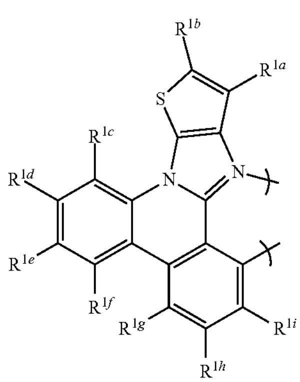
-continued
X-23
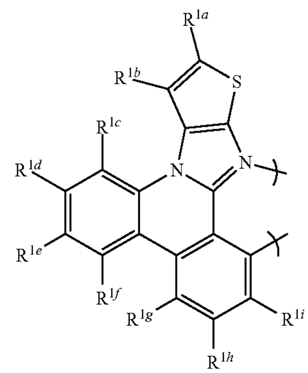
X-24
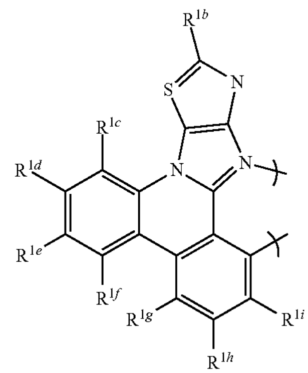
X-25
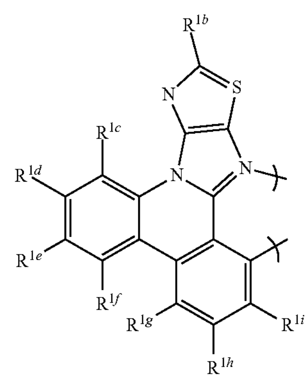
X-26
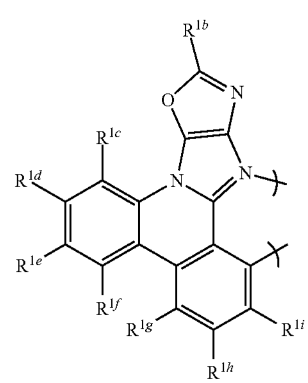

-continued
X-27
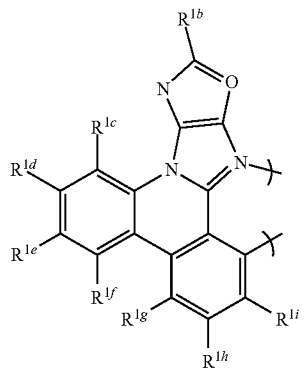
X-28
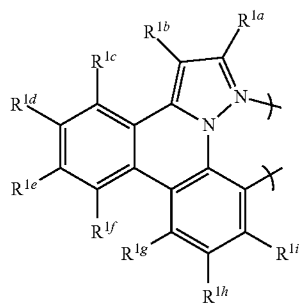
X-29
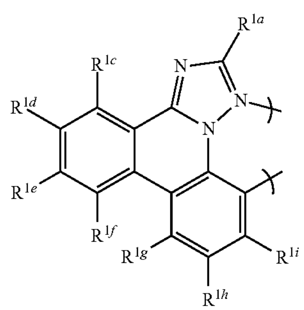
X-30
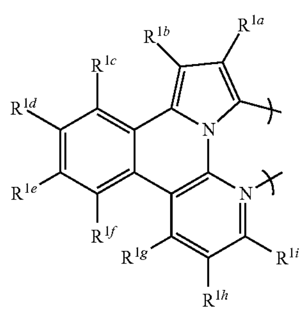
X-31
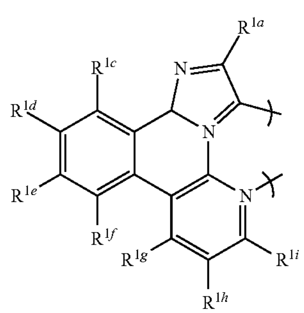
-continued
X-32
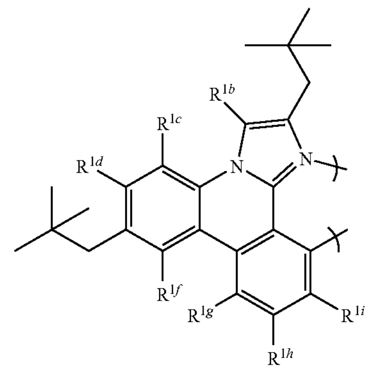
X-33
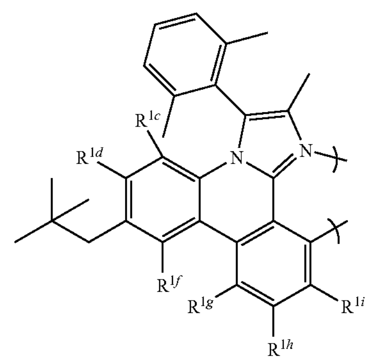
X-34
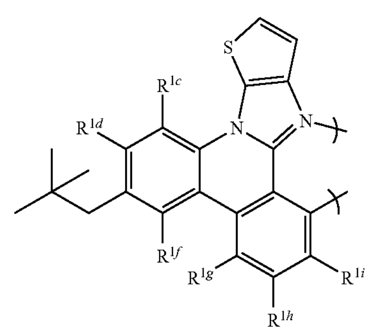
X-35
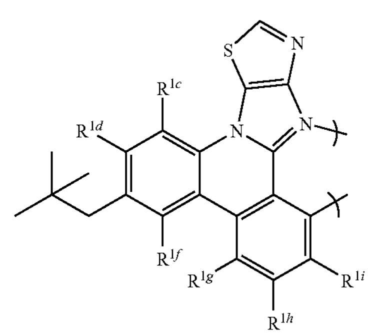

-continued
X-36
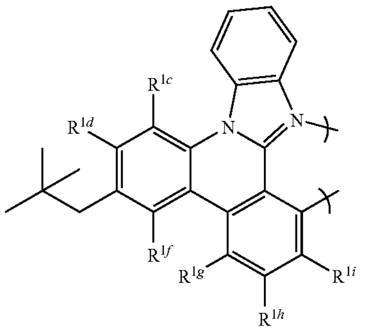
X-37
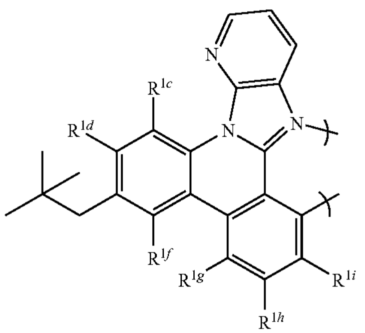
X-38
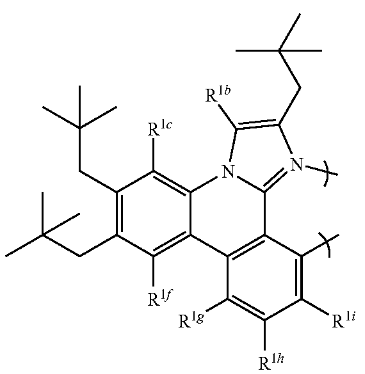
X-39
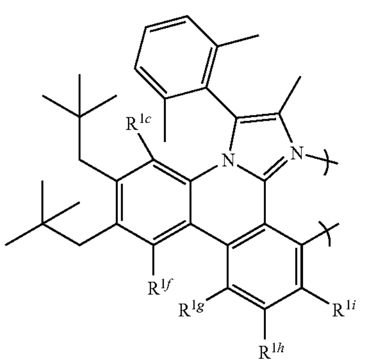
-continued
X-40
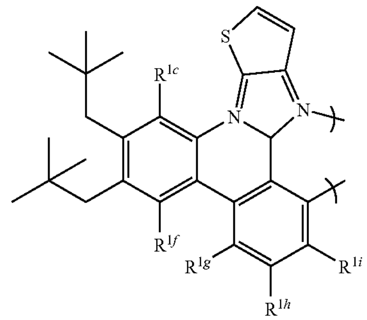
X-41
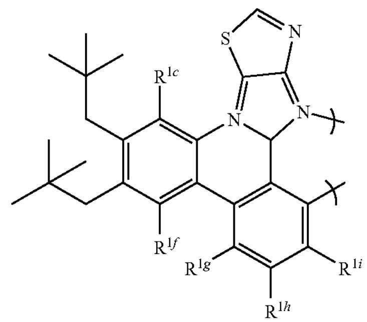
X-42
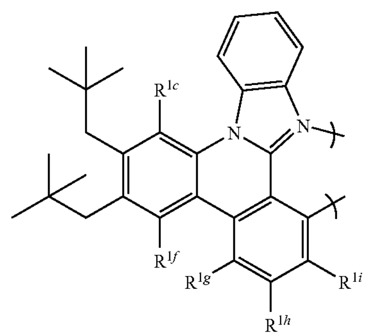
X-43
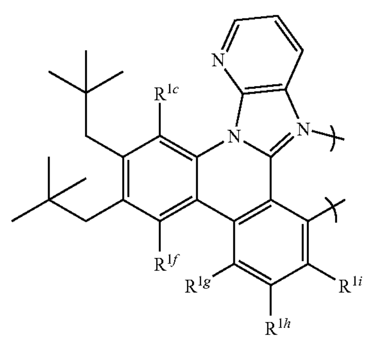
X-44
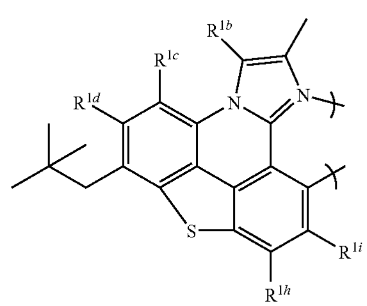

-continued
X-45
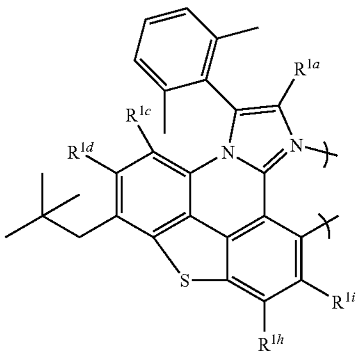
X-46
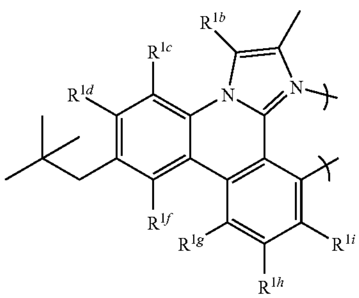
X-47
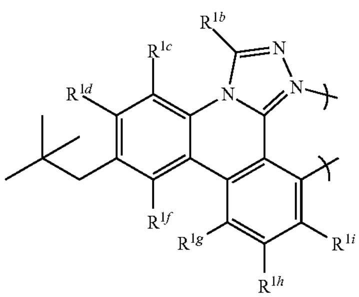
X-48
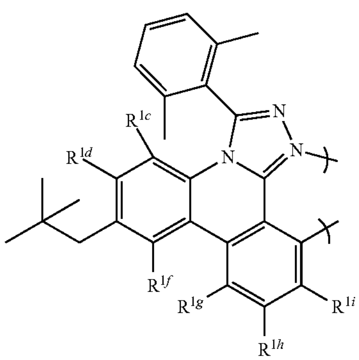
X-49
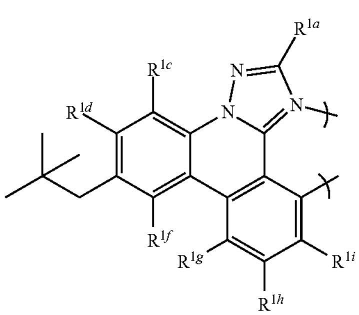
-continued
X-50
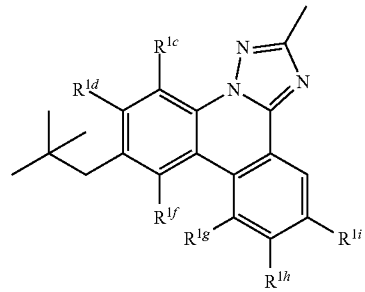
X-51
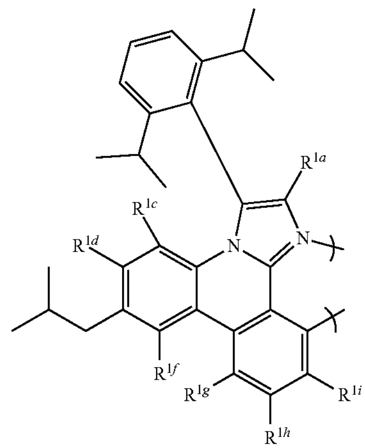
X-52
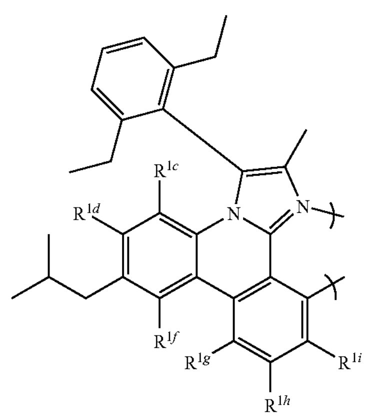
X-53
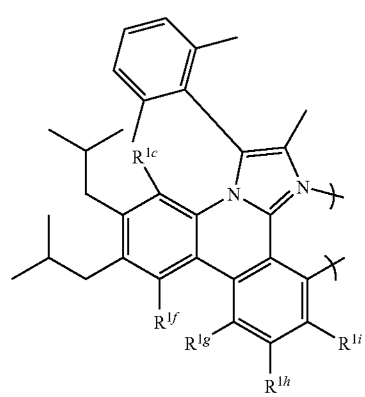

-continued
X-54
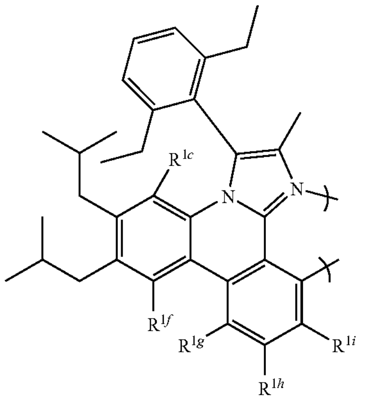
X-55
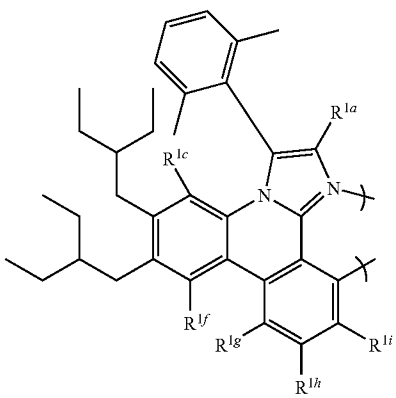
X-56
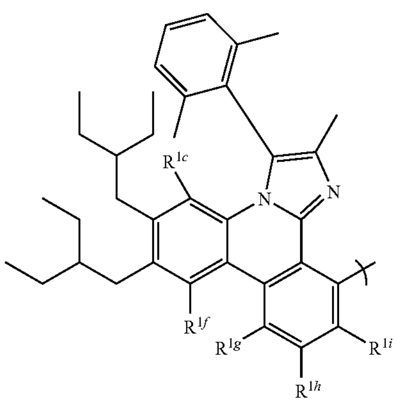
X-57
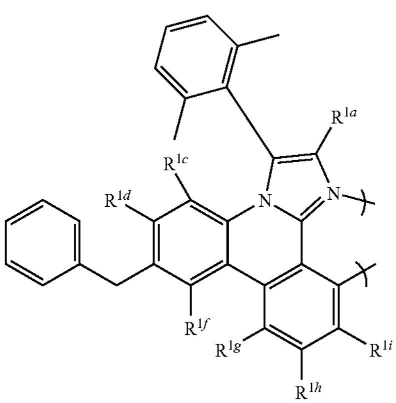
-continued
X-58
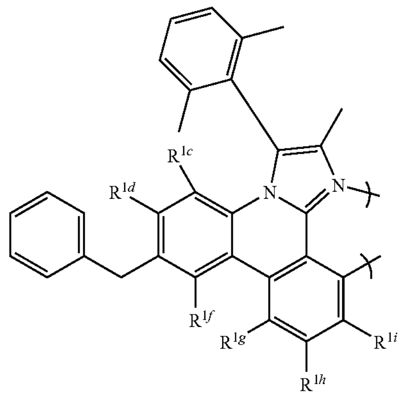
X-59
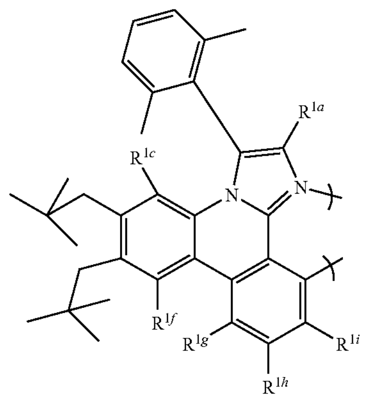
X-60
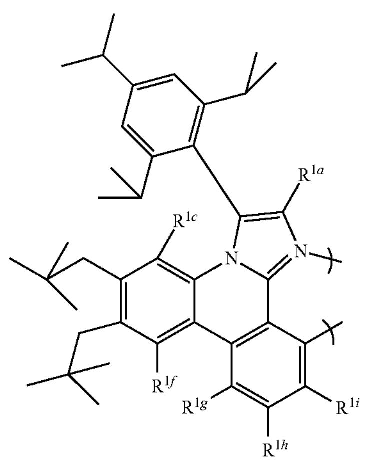
X-61
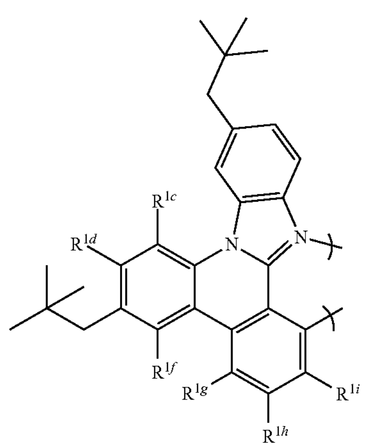

-continued

X-62

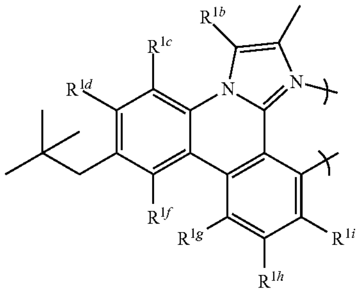

X-63

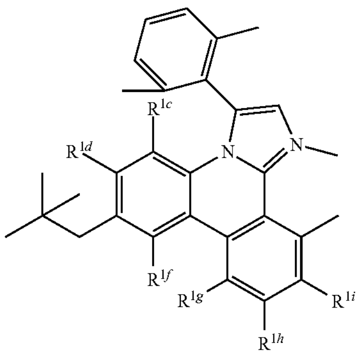

X-64

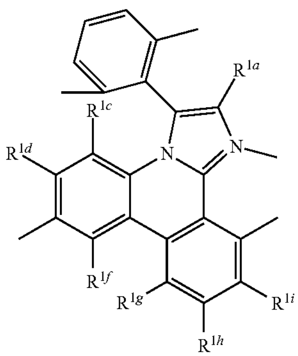

X-65

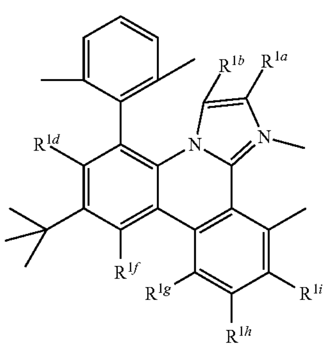

X-66

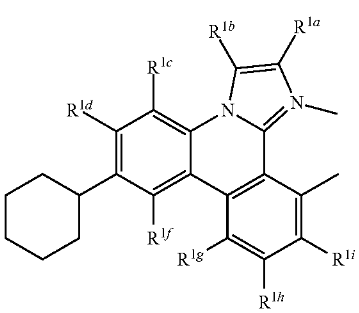

-continued

X-67

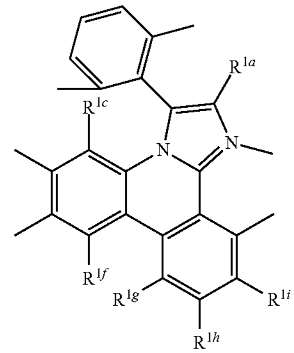

X-68

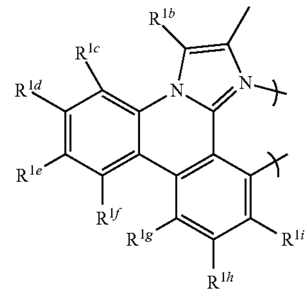

The light emitting material in the light emitting layer is usually contained in an amount of from 0.1 to 50 mass % based on the total mass of all the compounds constituting the light emitting layer. It is preferably from 1 to 50 mass %, more preferably from 2 to 40 mass % from the standpoints of durability and external quantum efficiency.

Although no particular limitation is imposed on the thickness of the light emitting layer, it is usually preferably from 2 to 500 nm. From the standpoint of external quantum efficiency, the thickness is more preferably from 3 to 200 nm, still more preferably from 5 to 100 nm.

<Host Material>

As the host material to be used in the invention, the compounds of the invention and, for example, the following materials can be used.

Host materials include electron transport materials and hole transport materials and of these, electron transport materials are preferred. The host materials may be used either singly or in combination. For example, a mixture of an electron transport host material and a hole transport host material can be used.

Specific examples include pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, porphyrin compounds, polysilane compounds, poly(N-vinylcarbazole), aniline copolymers, electrically conductive high-molecular oligomers such as thiophene oligomers and polythiophenes, organic silanes, carbon films, pyridine, pyrimidine, triazine, imidazole, pyrazole, triazole, oxazole, oxadiazole, fluorenone, anthraquinodimethane, anthrone, diphenylquinone, thiopyran dioxide, carbodiimide, fluorenylidenemethane, distyrylpyrazine, fluorine-substituted aromatic compounds, heterocyclic tetracarboxylic anhydrides such as naphthalene tetracarboxylic anhydride and perylene tetracarboxylic anhydride, phthalocyanine, and various metal complexes typified by metal complexes of a 8-quinolinol derivative, metal phthalocyanine, and metal complexes having benzoxazole or benzothiazole as a ligand, and derivatives (which may have a substituent or a fused ring) thereof.

In the light emitting layer of the invention, the lowest triplet excitation energy ($T_1$ energy) of the above-described host material (including the compound represented by the formula (I)) is higher than the $T_1$ energy of the phosphorescent material from the standpoints of color purity, luminous efficiency, and driving durability.

Although the content of the host compound in the invention is not particularly limited, it is preferably 15 mass % or greater but not greater than 95 mass % based on the total mass of all the compounds constituting the light emitting layer from the standpoints of luminous efficiency and drive voltage.

It is preferred that the organic electroluminescent device further contains, in the light emitting layer thereof, a compound represented by the compound (a) described below.

It is generally known that in charge (electron/hole) injection across the organic thin-film interface of a stack-type organic electronic device, when a difference in ionized potential (Ip) or electron affinity (Ea) between two materials adjacent to each other is smaller, an injection barrier of charges becomes smaller and a drive voltage of the organic electroluminescent device can be reduced. As well as the IP or Ea of the material, an energy level derived from the interaction between material molecules plays an important role. Also with regard to the transfer of charges in the organic layer, the charge mobility can be increased and drive voltage of the device can be reduced by controlling the intermolecular action between material molecules appropriately. Appropriate use of the compound represented by the formula (a) with a light emitting material enables to control the interaction between material molecules, resulting in reduction of a drive voltage.

A change in the interaction state (for example, association state) between material molecules during driving the device causes a change in the properties of the device, which may become one of the causes for reducing the luminance of the device (that is, device life). When the compound represented by the formula (a) is used, a stable interaction state can be formed in advance and this problem can be avoided. The compound represented by the formula (a) used in the organic electroluminescent device of the invention is excellent in chemical stability and undergoes a less change in the quality such as decomposition of a material during driving of the device so that a reduction in efficiency or life of the organic electroluminescent device due to the decomposition products of the material can be prevented.

The compound represented by the formula (a) to be used in the organic electroluminescent device of the invention will next be described specifically.

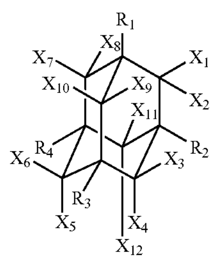

(a)

In the formula (a), $R_1$ to $R_4$ each independently represents a hydrogen atom, an alkyl group, an alkenyl group, an alkynyl group, an aryl group, a heteroaryl group, an alkoxy group, an acyl group, an acyloxy group, an amino group, a nitro group, a cyano group, an ester group, an amide group, a halogen group, a perfluoroalkyl group, or a silyl group, with the proviso that at least one of $R_1$ to $R_4$ is a group having a double bond or a triple bond. $X_1$ to $X_{12}$ each independently represents a hydrogen atom, an alkyl group, an alkynyl group, an aryl group, a heteroaryl group, an alkoxy group, an acyl group, an acyloxy group, an amino group, a nitro group, a cyano group, an ester group, an amide group, a halogen group, a perfluoroalkyl group, or a silyl group.

Examples of the alkyl group represented by $R_1$ to $R_4$ and $X_1$ to $X_{12}$ include methyl, ethyl, n-propyl, isopropyl, n-butyl, sec-butyl (i.e., 2-butyl), isobutyl, tert-butyl, n-pentyl, isopentyl, n-hexyl, cyclopropyl, cyclobutyl, cyclopentyl, and cyclohexyl.

Examples of the alkenyl group represented by $R_1$ to $R_4$ and $X_1$ to $X_{12}$ include vinyl, allyl (i.e., 1-(2-propenyl)), 1-(1-propenyl), 2-propenyl, 1-(1-butenyl), 1-(2-butenyl), 1-(3-butenyl), 1-(1,3-butadienyl), 2-(2-butenyl), 1-(1-pentenyl), 5-(cyclopentadienyl), and 1-(1-cyclohexenyl).

Examples of the alkynyl group represented by $R_1$ to $R_4$ and $X_1$ to $X_{12}$ include ethynyl, propargyl (i.e., 1-(2-propynyl)), 1-(1-propynyl), 1-butadiynyl, and 1-(1,3-pentadiynyl).

Examples of the aryl group represented by $R_1$ to $R_4$ and $X_1$ to $X_{12}$ include phenyl, o-tolyl (i.e., 1-(2-methylphenyl)), m-tolyl, p-tolyl, 1-(2,3-dimethylphenyl), 1-(3,4-dimethylphenyl), 2-(1,3-dimethylphenyl), 1-(3,5-dimethylphenyl), 1-(2,5-dimethylphenyl), p-cumenyl, mesityl, 1-naphtyl, 2-naphtyl, 1-anthranyl, 2-anthranyl, 9-anthranyl, biphenylyls such as 4-biphenylyl (i.e., 1-(4-phenyl)phenyl), 3-biphenylyl, and 2-biphenylyl, and terphenylyls such as 4-p-terphenylyl (i.e., 1-4-(4-biphenylyl)phenyl) and 4-m-terphenylyl (i.e., 1-4-(3-biphenylyl)phenyl).

The heteroaryl group represented by $R_1$ to $R_4$ and $X_1$ to $X_{12}$ contains a heteroatom such as a nitrogen atom, an oxygen atom, or a sulfur atom. Specific examples of the heteroaryl group include imidazolyl, pyrazolyl, pyridyl, pyrazyl, pyrimidyl, triazinyl, quinolyl, isoquinolinyl, pyrrolyl, indolyl, furyl, thienyl, benzoxazolyl, benzimidazolyl, benzthiazolyl, carbazolyl, and azepinyl Examples of the alkoxy group represented by $R_1$ to $R_4$ and $X_1$ to $X_{12}$ include methoxy, ethoxy, isopropoxy, cyclopropoxy, n-butoxy, tert-butoxy, cyclohexyloxy, and phenoxy.

Examples of the acyl group represented by $R_1$ to $R_4$ and $X_1$ to $X_{12}$ include acetyl, benzoyl, formyl, and pivaloyl.

Examples of the acyloxy group represented by $R_1$ to $R_4$ and $X_1$ to $X_{12}$ include acetoxy, and benzoyloxy.

Examples of the amino group represented by $R_1$ to $R_4$ and $X_1$ to $X_{12}$ include amino, methylamino, dimethylamino, diethylamino, dibenzylamino, diphenylamino, ditolylamino, pyrrolidino, piperidino, and morpholino.

Examples of the ester group represented by $R_1$ to $R_4$ and $X_1$ to $X_{12}$ include methyl ester (i.e., methoxycarbonyl), ethyl ester, isopropyl ester, phenyl ester, and benzyl ester.

Examples of the amide group represented by $R_1$ to $R_4$ and $X_1$ to $X_{12}$ include those linked through the carbon atom of the amide group such as N,N-dimethylamide (i.e., dimethylaminocarbonyl), N-phenylamide, and N,N-diphenylamide and those linked through the nitrogen atom of amide group such as N-methylacetamide (i.e., acetylmethylamino), N-phenylacetamide, and N-phenylbenzamide.

Examples of the halogen atom represented by $R_1$ to $R_4$ and $X_1$ to $X_{12}$ include a fluorine atom, a chlorine atom, a bromine atom, and an iodine atom.

Examples of the perfluoroalkyl group represented by $R_1$ to $R_4$ and $X_1$ to $X_{12}$ include trifluoromethyl, pentafluoroethyl, 1-perfluoropropyl, 2-perfluoropropyl, and perfluoropentyl.

Examples of the silyl group represented by $R_1$ to $R_4$ and $X_1$ to $X_{12}$ include trimethylsilyl, triethylsilyl, triisopropylsilyl, triphenylsilyl, methyldiphenylsilyl, dimethylphenylsilyl, tert-butyldimethylsilyl, and tert-butyldiphenylsilyl.

$R_1$ to $R_4$ and $X_1$ to $X_{12}$ described above may be further substituted with another substituent. Examples of an aryl-substituted alkyl group include benzyl, 9-fluorenyl, 1-(2-phenylethyl), and 1-(4-phenyl)cyclohexyl. Examples of a heteroaryl-substituted aryl group include 1-(4-N-carbazolyl) phenyl, 1-(3,5-di(N-carbazolyl))phenyl, and 1-(4-(2-pyridyl) phenyl).

$R_1$ to $R_4$ described above are each preferably a hydrogen atom, an alkyl group, an alkenyl group, an alkynyl group, an aryl group, a heteroaryl group, an alkoxy group, an amino group, an ester group, or a silyl group, more preferably a hydrogen atom, an alkyl group, an aryl group, a heteroaryl group, an alkoxy group, an amino group, or a silyl group, especially preferably a hydrogen atom, an alkyl group, or an aryl group.

$X_1$ to $X_{12}$ described above are each preferably a hydrogen atom, an alkyl group, an alkenyl group, an alkynyl group, an aryl group, a heteroaryl group, an alkoxy group, an amino group, an ester group, or a silyl group, more preferably a hydrogen atom, an alkyl group, or an aryl group, especially preferably a hydrogen atom.

The alkyl group represented by $R_1$ to $R_4$ and $X_1$ to $X_{12}$ is preferably methyl, ethyl, n-propyl, isopropyl, n-butyl, isobutyl, tert-butyl, n-pentyl, n-hexyl, cyclopentyl, or cyclohexyl, more preferably methyl, ethyl, tert-butyl, n-hexyl, or cyclohexyl, especially preferably methyl or ethyl.

The aryl group represented by $R_1$ to $R_4$ and $X_1$ to $X_{12}$ is preferably phenyl, o-tolyl, 1-(3,4-dimethylphenyl), 1-(3,5-dimethylphenyl), 1-naphtyl, 2-naphtyl, 9-anthranyl, biphenylyls, or terphenylyls, more preferably phenyl, biphenylyls, or terphenylyls, especially preferably phenyl.

The hydrogen atom represented by $R_1$ to $R_4$ and $X_1$ to $X_{12}$ may be a deuterium atom, preferably a deuterium atom.

The hydrogen atoms contained in the compound represented by formula (a) may be replaced partly or entirely with deuterium atoms.

At least one of $R_1$ to $R_4$ is a group having a double bond or a triple bond. Examples of the double bond include C═C, C═O, C═S, C═N, N═N, S═O, and P═O. The double bond is preferably C═C, C═O, C═N, S═O, or P═O, more preferably C═C, C═O or C═N, especially preferably C═C. Examples of the triple bond include C≡C and C≡N. The triple bond is preferably C≡C.

The group represented by $R_1$ to $R_4$ and having a double bond or a triple bond is preferably an aryl group, more preferably a phenyl group, a biphenylyl group or a terphenylyl group shown below, especially preferably a phenyl group.

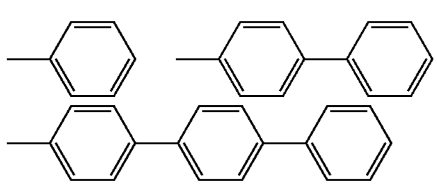

At least one of $R_1$ to $R_4$ represents a group having a double bond or a triple bond. The number of the groups having a double bond or a triple bond among $R_1$ to $R_4$ is preferably from 2 to 4, more preferably 3 or 4, especially preferably 4.

Among the groups represented by $R_1$ to $R_4$, when the number of the groups having a double bond or a triple bond is from 1 to 3, the remaining group(s) of $R_1$ to $R_4$ having only a single bond represent(s) preferably a hydrogen atom, an alkyl group, an alkoxy group, or a silyl group, more preferably a hydrogen atom, an alkyl group, or a silyl group, especially preferably a hydrogen atom or an alkyl group.

$R_1$ to $R_4$ and $X_1$ to $X_{12}$ may be coupled to each other to form a ring structure. For example, as shown below, $X_2$, $X_3$ and $X_9$ may be coupled to each other to form a diamantane structure. Further, $X_4$, $X_5$ and $X_{12}$ may be coupled to each other to form a triamantane structure. These diamantane and triamantane structures may be further substituted with a substituent.

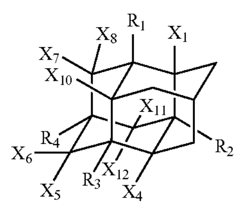

Diamantane structure

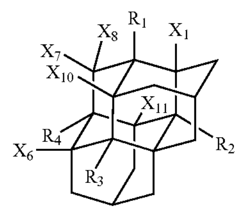

Triamantane structure

In the invention, a plurality of the compounds represented by the formula (a) are preferably incorporated as a mixture. Preferably, compounds different in the group having a double bond or compounds different in the number of substitution are incorporated as a mixture. Examples of the group having a double bond include phenyl group, biphenylyl group, and terphenylyl group described above and the number of substitution of them is from 1 to 4. For example, a mono-substituted compound in which the number of substitution of a group having a double bond is 1 may be mixed with a tetra-substituted compound in which the number of substitution is 4.

The following are specific examples of the compounds represented by the formula (a) to be used in the invention, but the compounds of the invention are not limited to them.

(1-1)

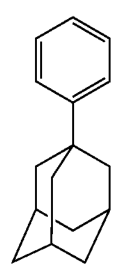

(1-2)

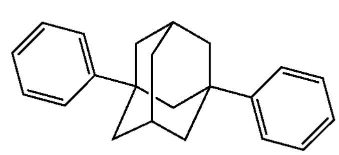

-continued
(1-3)
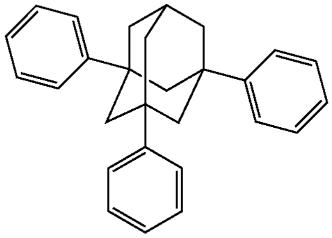
(1-4)
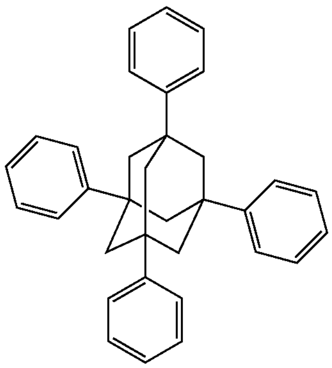
(1-5)
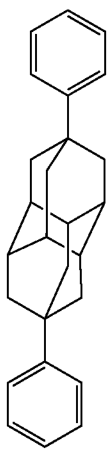
(1-6)
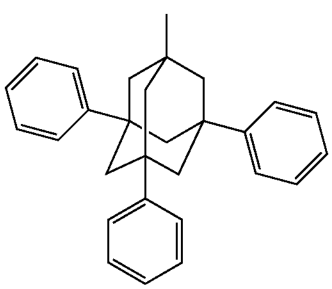
(1-7)
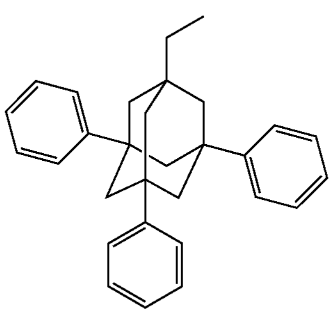
-continued
(1-8)
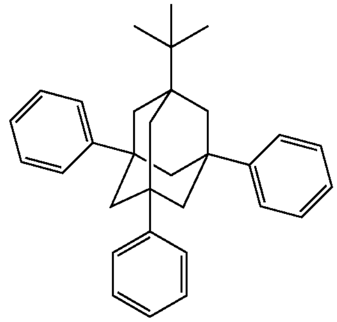
(1-9)
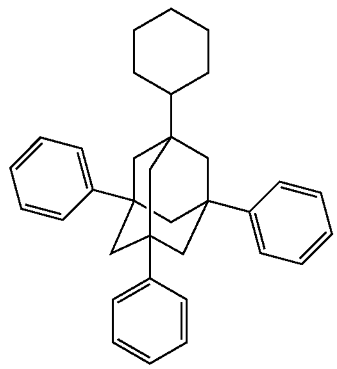
(1-10)
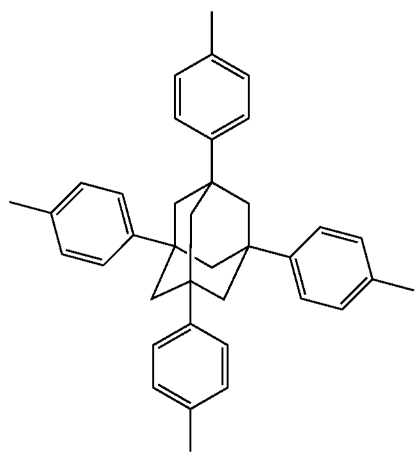
(1-11)
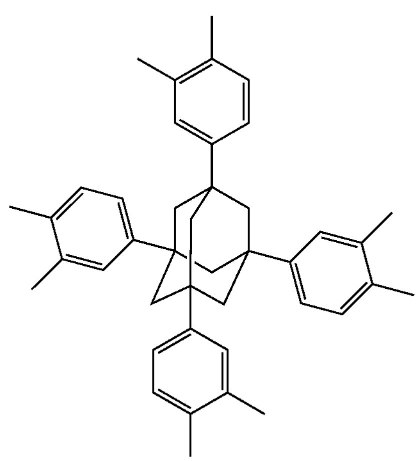

-continued
(1-12)
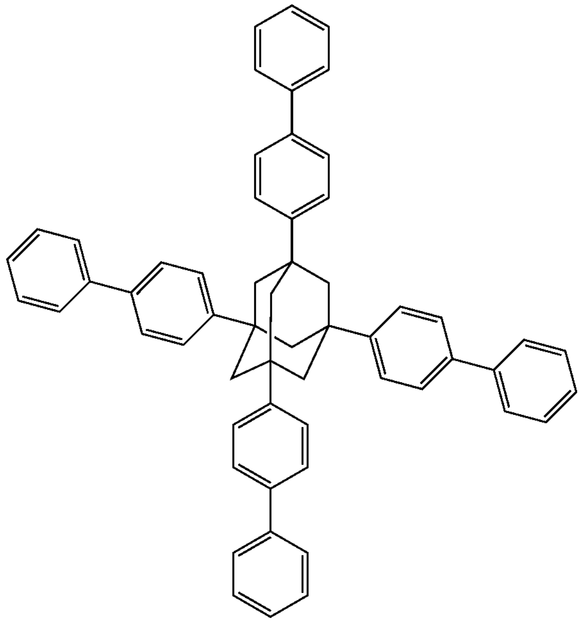
(1-13)
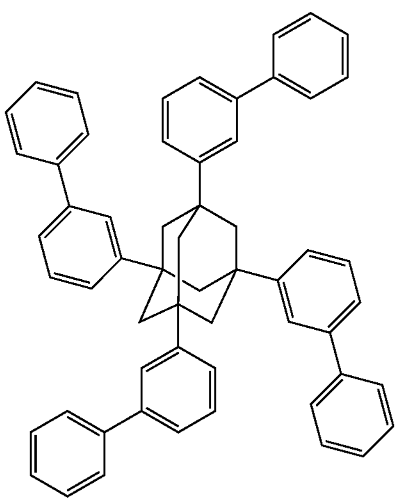
(1-14)
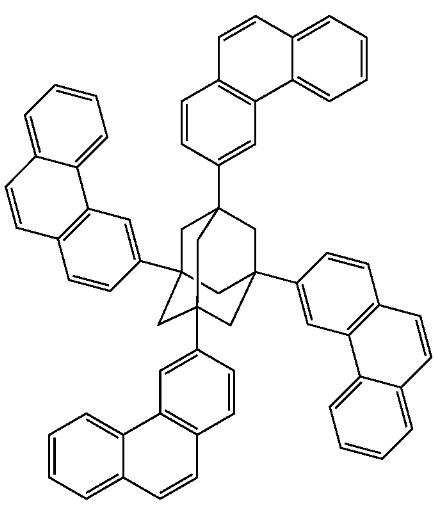
-continued
(1-15)
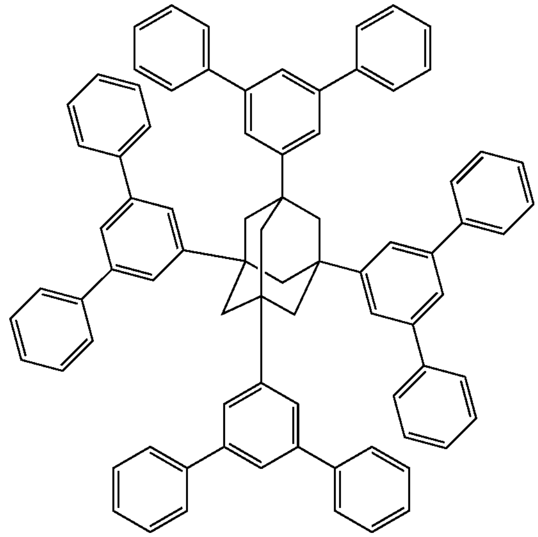
(1-16)
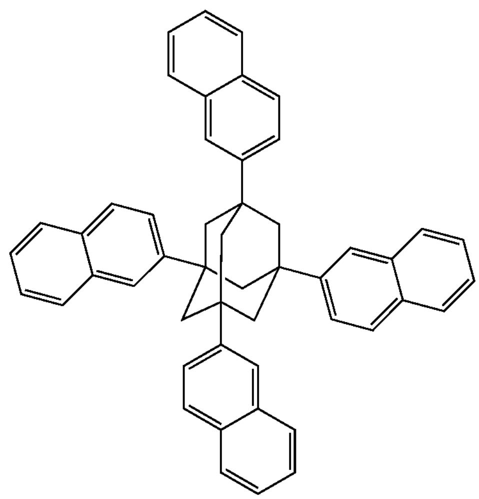
(1-17)
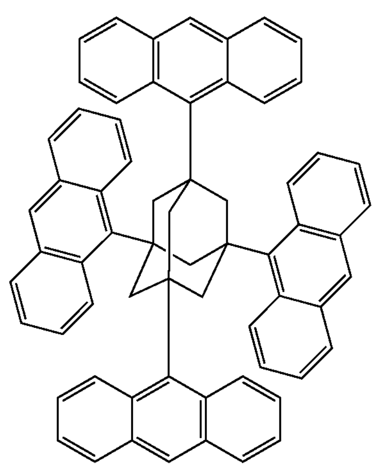

(1-18)
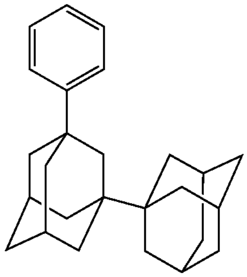
(1-19)
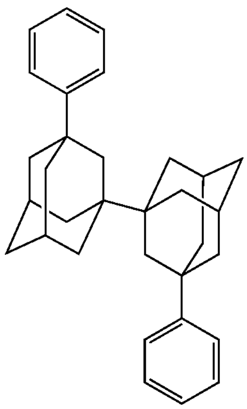
(1-20)
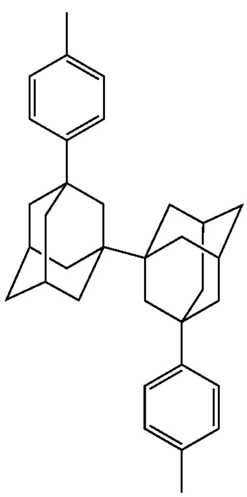
(1-21)
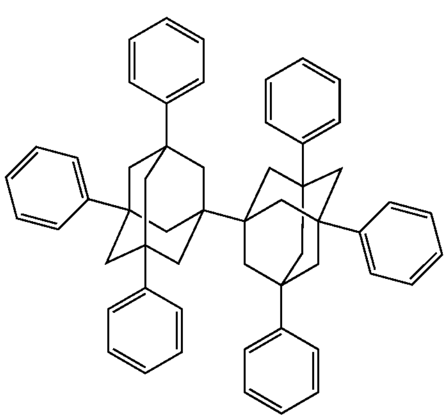
(1-22)
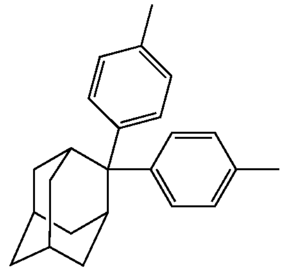
(1-23)
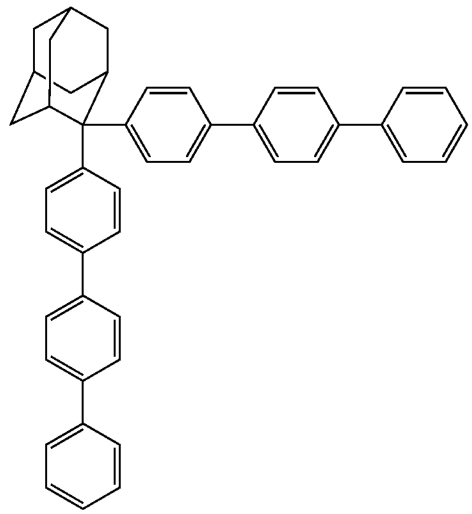
(1-24)
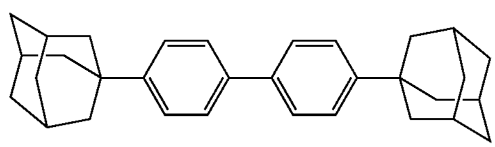
(1-25)
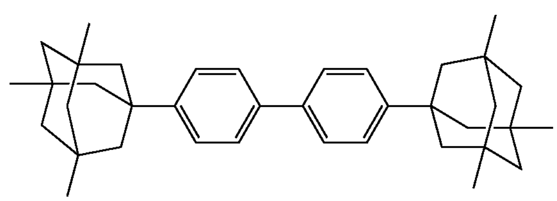
(1-26)
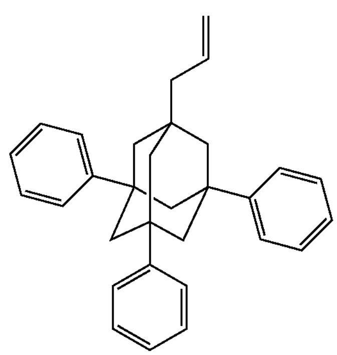

-continued
(1-27)
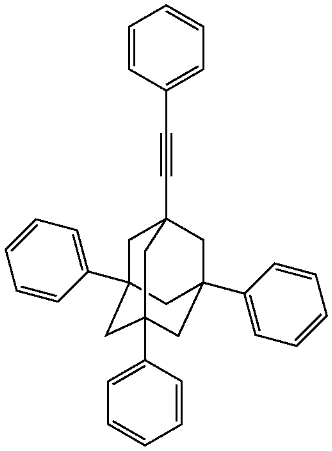
(1-28)
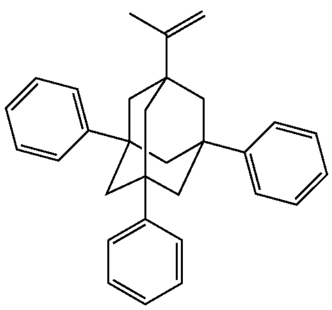
(1-29)
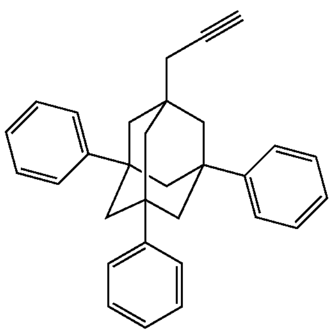
(1-30)
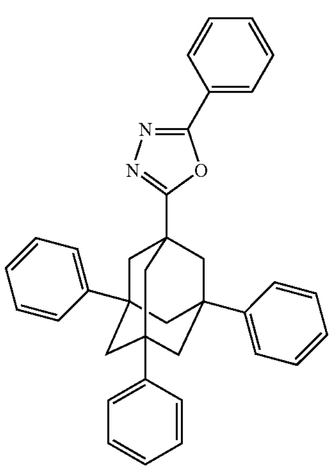
-continued
(1-31)
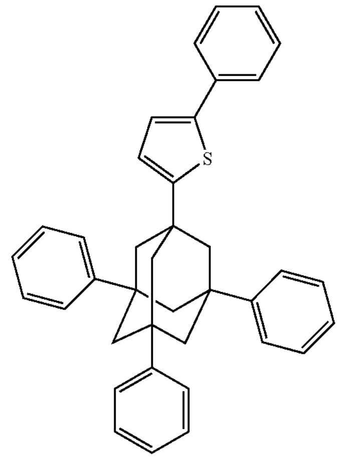
(1-32)
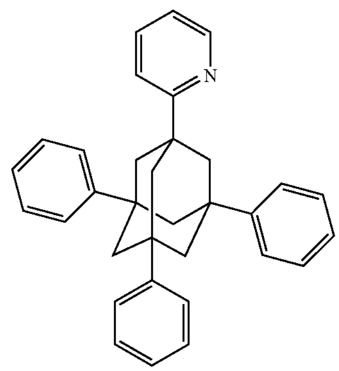
(1-33)
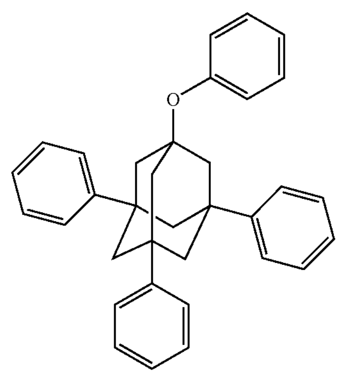
(1-34)
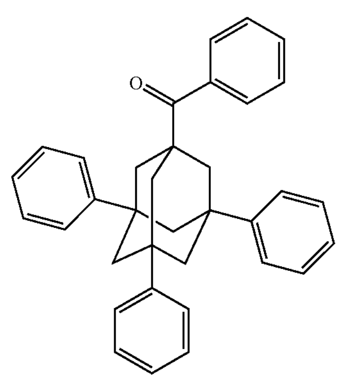

-continued
(1-35)
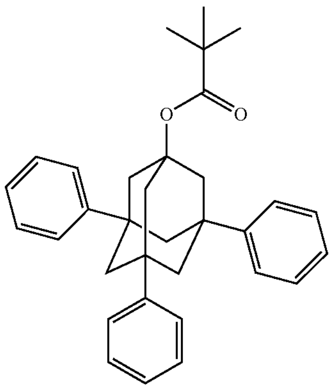
(1-36)
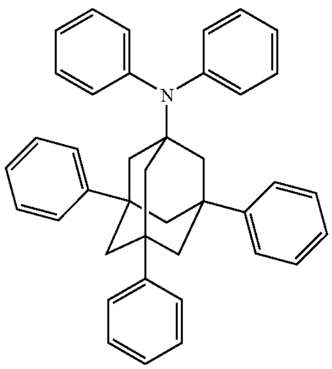
(1-37)
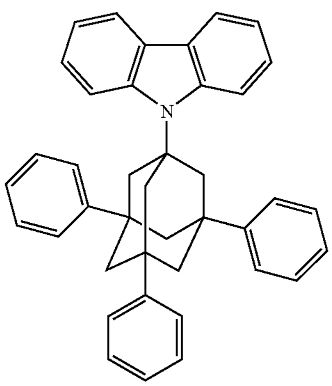
(1-38)
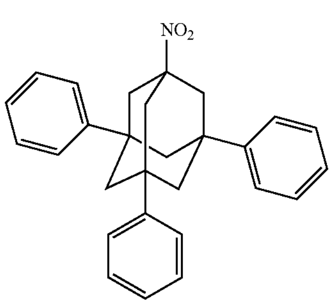
-continued
(1-39)
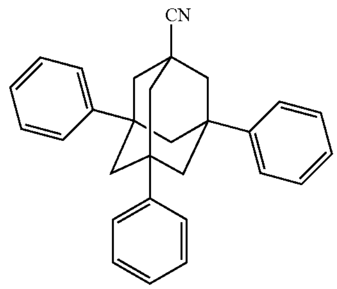
(1-40)
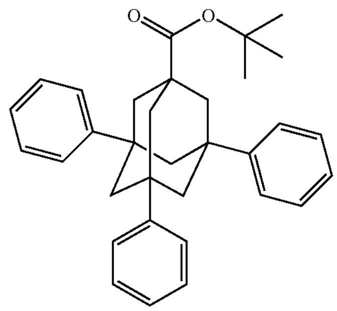
(1-41)
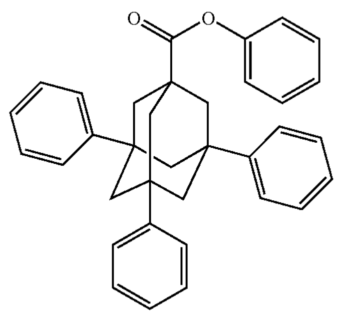
(1-42)
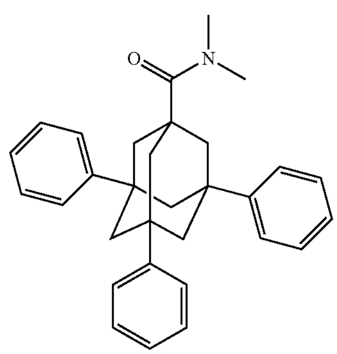
(1-43)
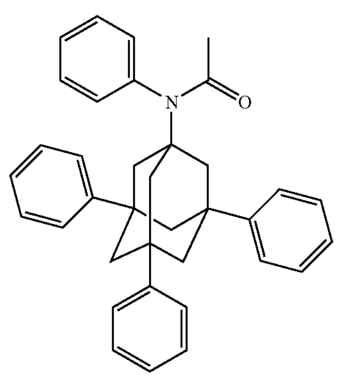

-continued (1-44)

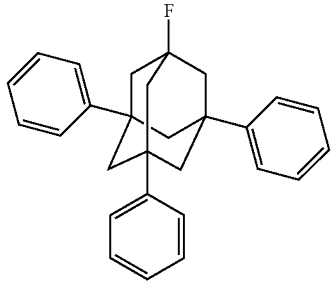

(1-45)

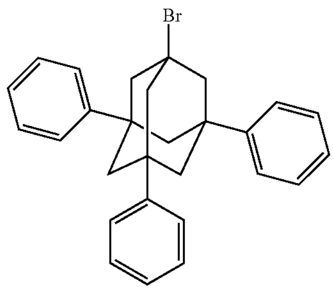

(1-46)

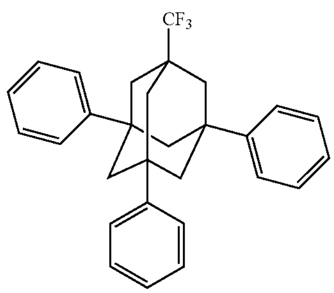

(1-47)

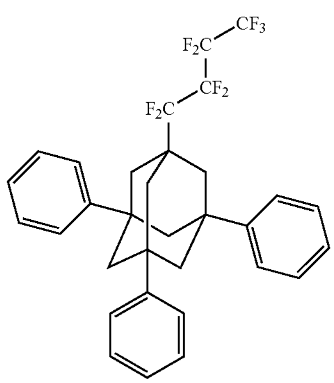

(1-48)

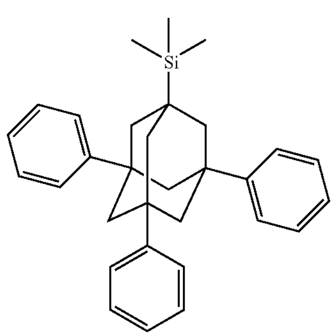

-continued (1-49)

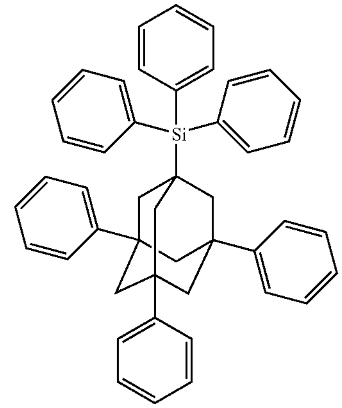

The compound represented by the formula (a) can be synthesized by appropriately combining adamantane or halogenated adamantane with an alkyl halide or alkyl magnesium halide (Grignard's reagent). For example, a halogenated adamantane and an alkyl halide can be coupled by using indium (Document 1). It is also possible to convert an alkyl halide to a corresponding alkyl copper reagent and coupling it with a Grignard's reagent of an aromatic compound (Document 2). It is also possible to couple an alkyl halide and a proper aryl boric acid in the presence of a palladium catalyst (Document 3).

Document 1: *Tetrahedron Lett.,* 39, 9557-9558 (1998)
Document 2: *Tetrahedron Lett.,* 39, 2095-2096 (1998)
Document 3: *J. Am. Chem. Soc.,* 124, 13662-13663 (2002)

An adamantane skeleton having an aryl group can be synthesized by using adamantane or a halogenated adamantane and a corresponding arene or aryl halide in proper combination.

In the above-described preparation process, when defined substituents change under the condition of a certain synthesis process or they are inappropriate to perform the process, the compound represented by the formula (a) can be prepared easily by protecting or deprotecting functional groups (e.g., T. W. Greene, *Protective Groups in Organic Synthesis*, John Wiley & Sons Inc. (1981)). Further, if necessary, it is also possible to change the order of reaction steps such as introduction of a substituent.

Since the electroluminescent device is formed by using vapor deposition or wet process such as application of a solution, the compound has a molecular weight of preferably 2000 or less, more preferably 1200 or less, especially preferably 1000 or less from the standpoints of deposition suitability and solubility. From the viewpoint of deposition suitability, the compound has a molecular weight of preferably 250 or greater, more preferably 350 or greater, especially preferably of 400 or more, because too small molecular weight decreases vapor pressure and prevents occurrence of a change from a gas phase to a solid phase, making it difficult to form an organic layer.

The compound represented by the formula (a) is used preferably in combination with the compound represented by the formula (I), more preferably in combination with the compound represented by the formula (I) and a platinum complex having a tetradentate.

The intended use of the compound of the invention represented by the formula (a) is not limited in the invention and it may be contained in any of the organic layers. The compound of the invention represented by the formula (a) is contained preferably in either one or some of a light emitting layer, a hole injection layer, a hole transport layer, an electron transport layer, an electron injection layer, an exciton blocking layer, and a charge blocking layer which will be described later; more preferably in either one or some of a light emitting layer, a hole injection layer, a hole transport layer, an electron transport layer, and an electron injection layer; especially preferably in either one or some of a light emitting layer, a hole injection layer, and a hole transport layer; most preferably in a light emitting layer.

The content of the compound represented by the formula (a) in the light emitting layer should be controlled to an amount not to suppress a charge transport property of a charge transport material. The content of the compound represented by the formula (a) of the invention is preferably from 0.1 to 70 mass %, more preferably from 0.1 to 30 mass %, especially preferably from 0.1 to 25 mass %.

Further, when the compound represented by the formula (a) is used in a plurality of layers, it is preferred to incorporate it in each of the layers in an amount within the above-described range.

The organic electroluminescent device of the invention preferably contains an anode as the electrode, a charge transport layer between the light emitting layer and the anode, and a carbazole compound in the charge transport layer.

(Charge Transport Layer)

The term "charge transport layer" means a layer in which transfer of charges occurs when a voltage is applied to the organic electroluminescent device. Specific examples include a hole injection layer, a hole transport layer, an electron blocking layer, a light emitting layer, a hole blocking layer, an electron transport layer, and an electron injection layer. Of these, preferred are a hole injection layer, a hole transport layer, an electron blocking layer, and a light emitting layer. When the charge transport layer formed by the process of application is a hole injection layer, a hole transport layer, an electron blocking layer, or a light emitting layer, an organic electroluminescent device can be manufactured at a low cost and high efficiency. The charge transport layer is more preferably a hole injection layer, a hole transport layer, or an electron blocking layer.

(Hole Injection Layer, Hole Transport Layer)

The hole injection layer or hole transport layer is a layer having a function of accepting holes from an anode or an anode side and transporting them to a cathode side. Hole injection materials or hole transport materials used for the formation of these layers may be either low molecular compounds or high molecular compounds.

The hole injection layer or hole transport layer preferably contains a carbazole compound.

The carbazole compound is preferably a carbazole compound represented by the following formula (b):

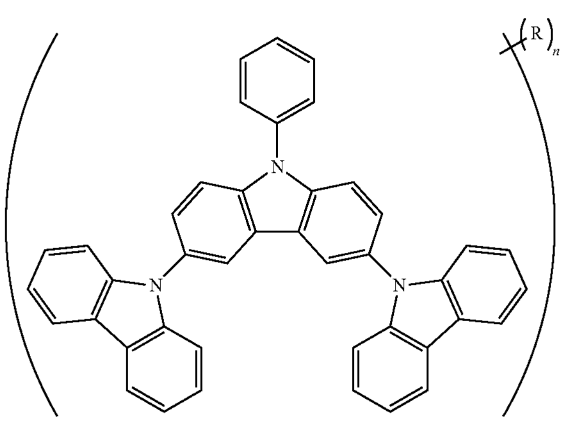

(in the formula (b), R represents a substituent substitutable on the hydrogen atom of the skeleton, with the proviso that when there are a plurality of Rs, they may be the same or different, and n stands for an integer from 0 to 8).

When the compound represented by the formula (b) is used in the hole transport layer, the content of the compound represented by the formula (b) is preferably from 50 to 100 mass %, more preferably from 80 to 100 mass %, especially preferably from 95 to 100 mass %.

When the compound represented by the formula (b) is used in a plurality of organic layers, the content of the compound in each of the layers is preferably within the above-described range.

One of the compounds represented by the formula (b) may be contained in any of the organic layers or a plurality of the compounds represented by the formula (b) may be used in combination at any ratio and contained in any of the organic layers.

The thickness of the hole transport layer containing the compound represented by the formula (b) is preferably from 1 to 500 nm, more preferably from 3 to 200 nm, still more preferably from 5 to 100 nm. The hole transport layer is preferably provided adjacent to the light emitting layer.

The hole transport layer may have a single-layer structure comprised of one or more of the above-described materials or a multilayer structure comprised of a plurality of layers having the same composition or different compositions.

Specific examples of the substituent represented by R include halogen atoms, alkoxy groups, cyano groups, a nitro group, alkyl groups, aryl groups, and aromatic heterocyclic groups. Of these, alkyl groups having 10 or less carbon atoms and substituted or unsubstituted aryl groups having 10 or less carbon atoms are preferred, with alkyl groups having 6 or less carbon atoms being more preferred. n stands for an integer from 0 to 8, preferably from 0 to 4, more preferably from 0 to 2.

The hydrogen atoms constituting the formula (b) may include an isotope of hydrogen (such as deuterium atom). In this case, all the hydrogen atoms of the compound may be substituted with an isotope of hydrogen or the compound may be a mixture partially containing a compound containing an isotope of hydrogen.

The compounds represented by the formula (b) can be synthesized by using various known synthesis processes in combination. It is the most common to prepare a carbazole compound by carrying out an aza-Cope rearrangement reaction of a condensate between an aryl hydrazine and a cyclohexane derivative, followed by dehydroaromatization (L. F. Tietze and Th. Eicher, *Precision Organic Synthesis*, translated by Takano and Ogasawara, published by Nankodo, p 339). For a coupling reaction between the resulting carbazole compound and an aryl halide compound in the presence of a palladium catalyst, processes described in *Tetrahedron Letters,* 39, 617 (1998); 39, 2367 (1998); and 40, 6393 (1999) can be used. No particular limitation is imposed on the reaction temperature and reaction time and conditions described in the above-described literatures can be employed.

In the invention, it is preferred to form a thin layer of the compound represented by the formula (b) by using vapor deposition, but wet process such as application of a solution is also preferred. The compound has a molecular weight of preferably 2000 or less, more preferably 1200 or less, especially preferably 800 or less from the standpoints of deposition suitability and solubility. From the viewpoint of deposition suitability, the compound has a molecular weight of preferably 250 or greater, especially preferably 300 or greater, because too small molecular weight decreases vapor pressure and prevents occurrence of a change from a gas phase to a solid phase, making it difficult to form an organic layer.
The following are specific examples of the compound represented by the formula (b) in the invention, but the invention is not limited to them.
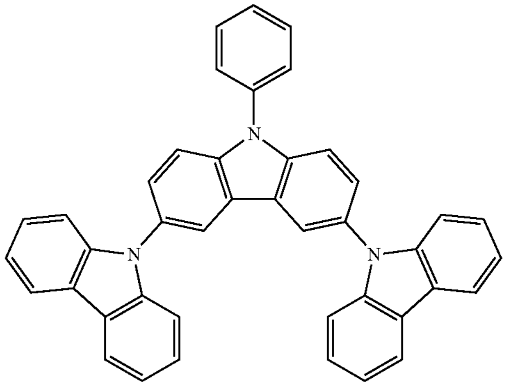
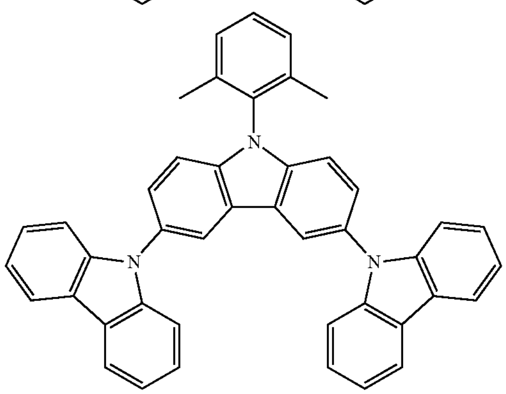
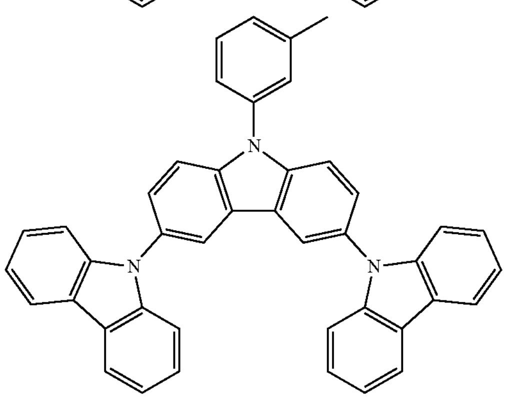
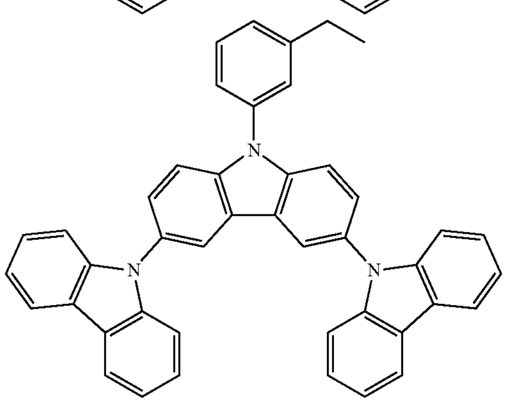
-continued
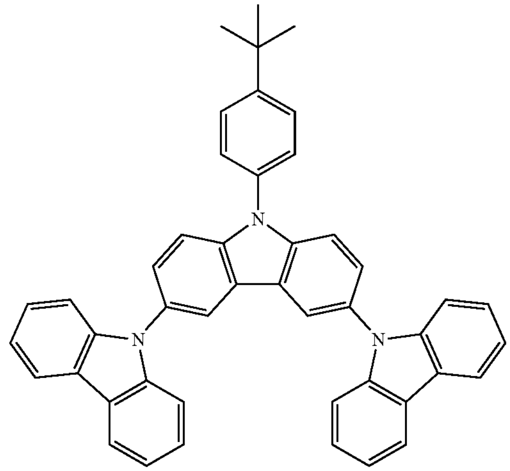
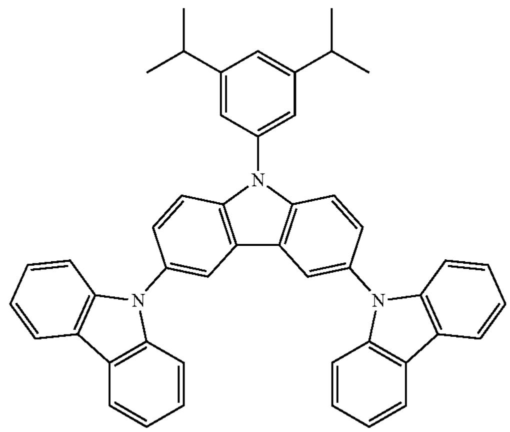
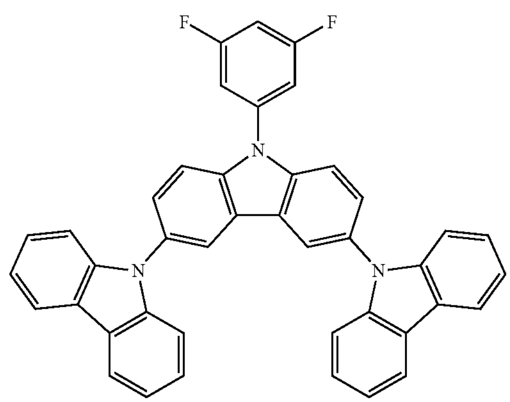
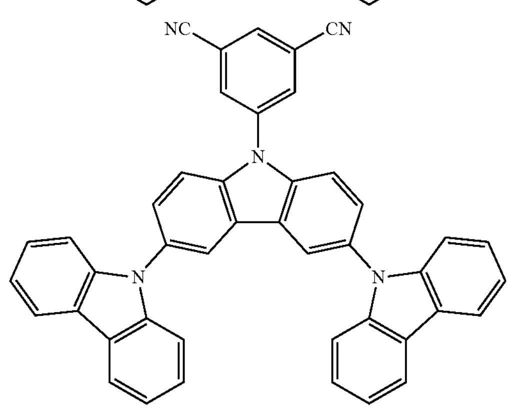

-continued
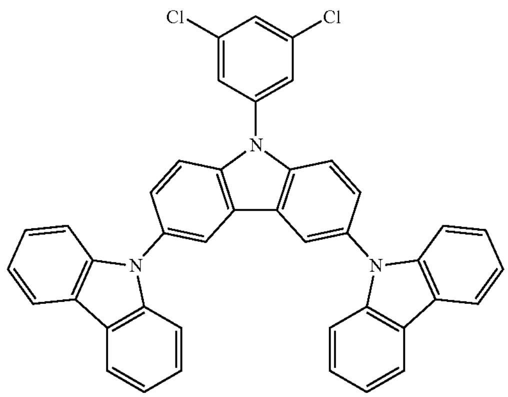
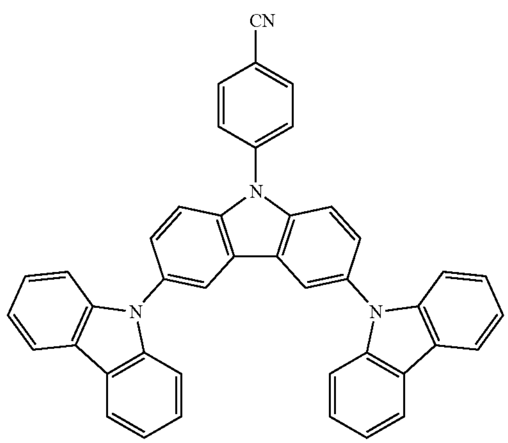
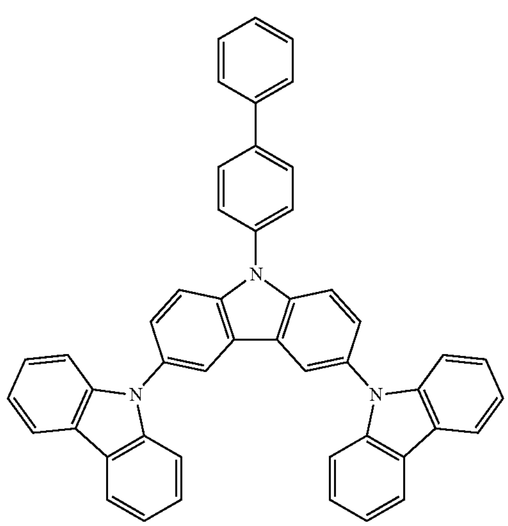
-continued
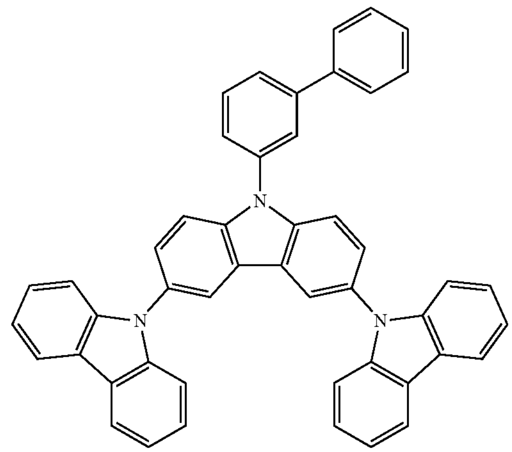
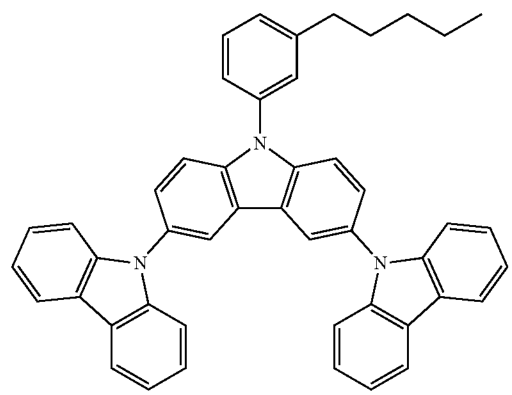
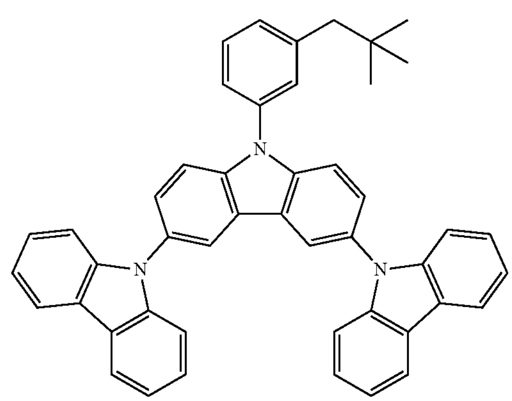

-continued
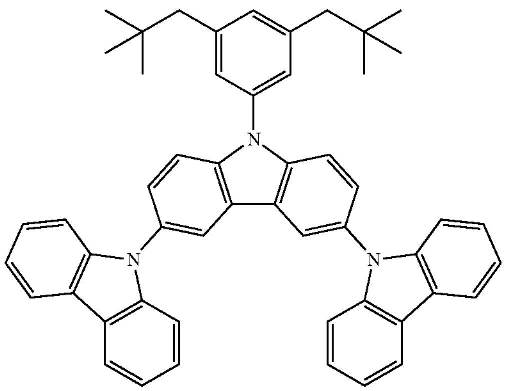
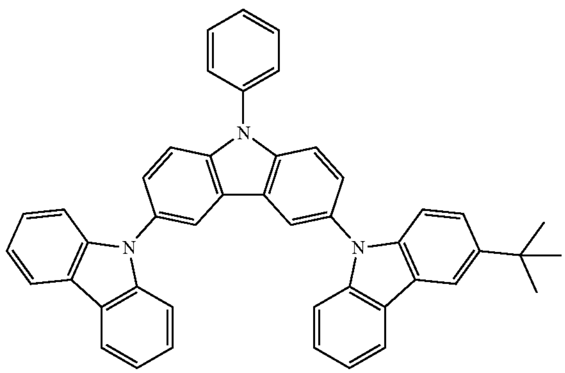
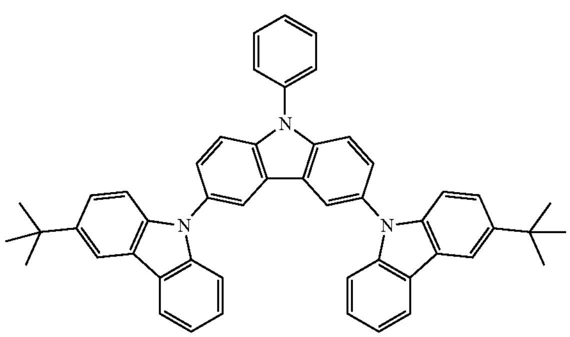
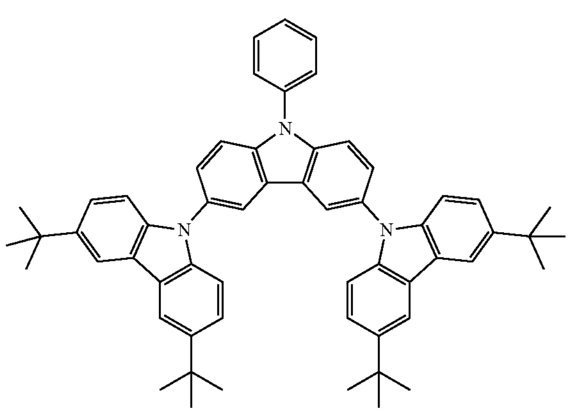
-continued
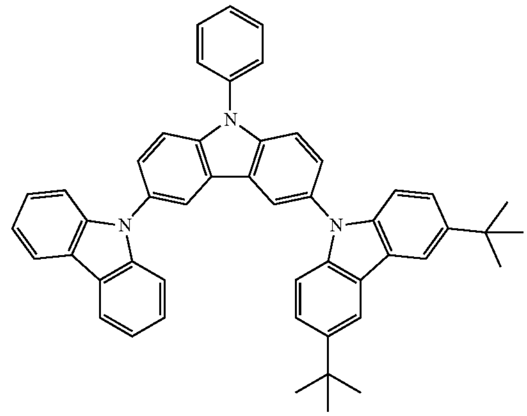
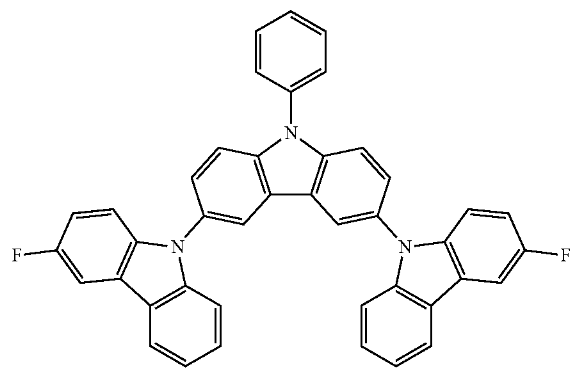
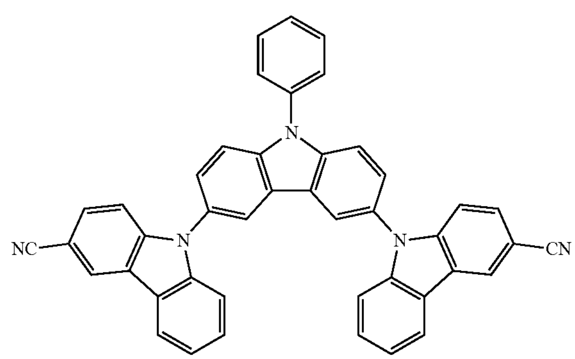
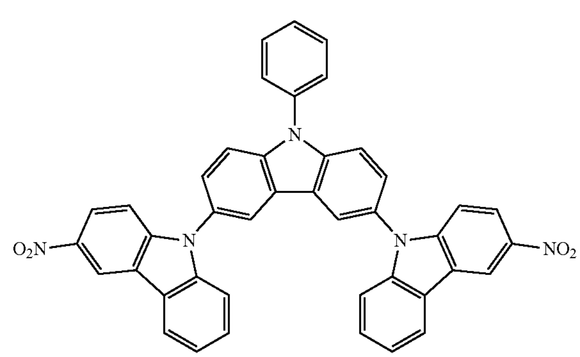

-continued
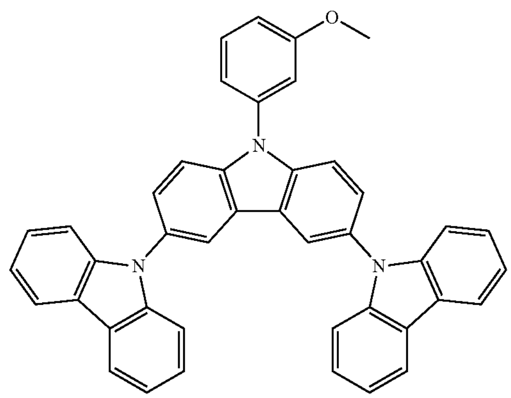
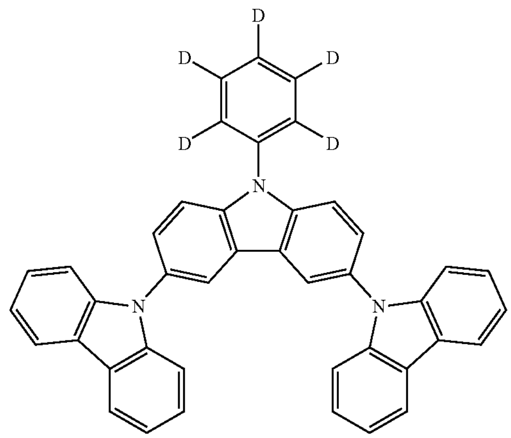
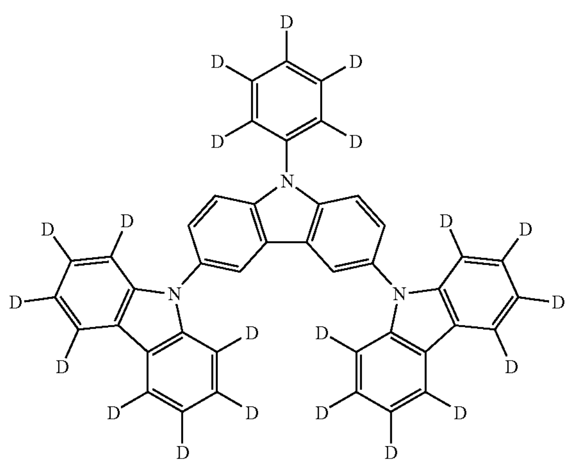
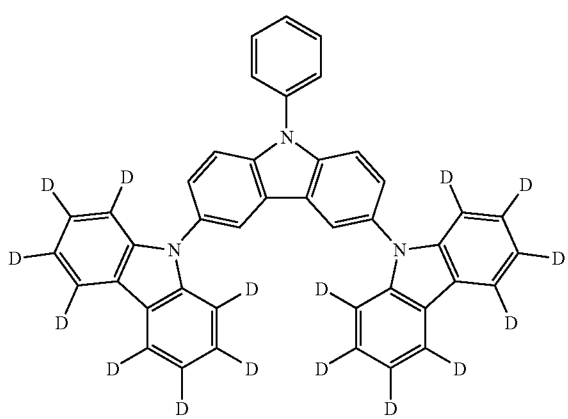
-continued
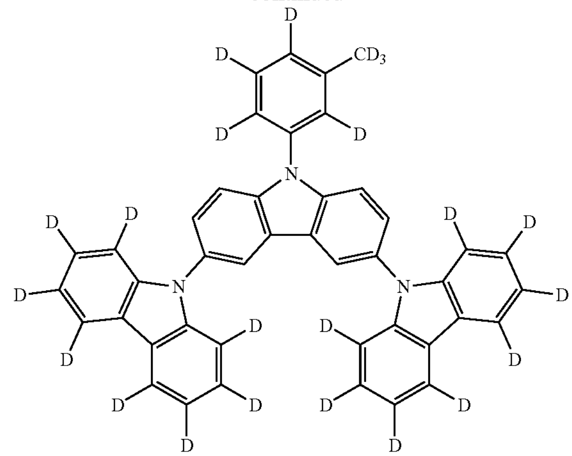
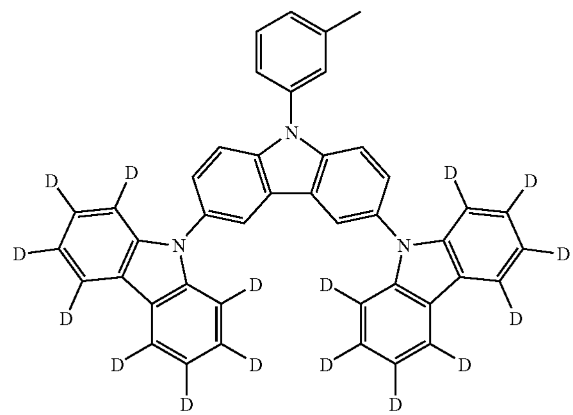
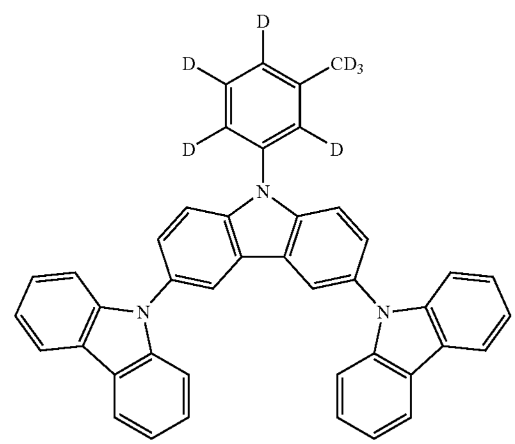
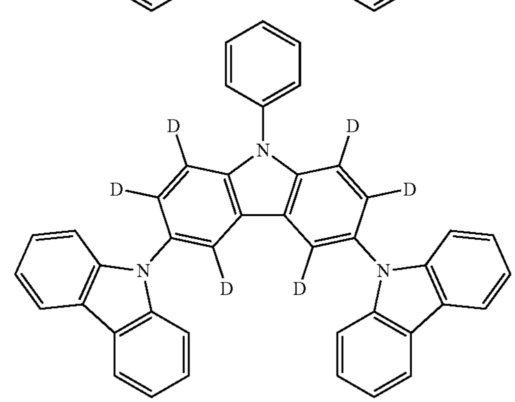

(Electron Injection Layer, Electron Transport Layer)

The electron injection layer or electron transport layer is a layer having a function of accepting electrons from the cathode or cathode side and transporting them to the anode side. Electron injection materials or electron transport materials to be used for these layers may be either a low molecular compound or a high molecular compound.

The electron injection layer, the hole transport layer, the electron injection layer, and the electron transport layer are described specifically, for example, in Japanese Patent Laid-Open Nos. 2008-270736 and 2007-266458. The techniques described in these publications can be applied to the invention.

—Hole Blocking Layer—

The hole blocking layer is a layer having a function of preventing holes, which have been transported from the anode side to the light emitting layer, from passing through to the cathode side. In the invention, the hole blocking layer can be provided as an organic layer adjacent to the light emitting layer on the cathode side.

Examples of an organic compound constituting the hole blocking layer include aluminum complexes such as aluminum(III) bis(2-methyl-8-quinolinato)-4-phenylphenolate (which will hereinafter be abbreviated as "BAlq"), triazole derivatives, and phenanthroline derivatives such as 2,9-dimethyl-4,7-diphenyl-1,10-phenanthroline (which will hereinafter be abbreviated as "BCP").

The thickness of the hole blocking layer is preferably from 1 nm to 500 nm, more preferably from 5 nm to 200 nm, still more preferably from 10 nm to 100 nm.

The hole blocking layer may have a single layer structure comprised of one or more of the above-described materials or a multilayer structure comprised of two or more layers having the same composition or different compositions.

—Electron Blocking Layer—

The electron blocking layer is a layer having a function of preventing electrons, which have been transported from the cathode side to the light emitting layer, from passing through to the anode side. In the invention, the electron blocking layer can be provided as an organic layer adjacent to the light emitting layer on the anode side.

Examples of an organic compound constituting the electron blocking layer include those exemplified above as the hole transport material.

The thickness of the electron blocking layer is preferably from 1 nm to 500 nm, more preferably from 5 nm to 200 nm, still more preferably from 10 nm to 100 nm.

The electron blocking layer may have a single layer structure comprised of one or more of the above-described materials or a multilayer structure comprised of two or more layers having the same composition or different compositions.

—Protective Layer—

In the invention, the entirety of the organic EL device may be protected with a protective layer.

Materials contained in the protective layer are not limited insofar as they have a function of preventing substances such as water and oxygen, which promote deterioration of the device, from entering the device.

The protective layer is described specifically, for example, in Japanese Patent Laid-Open Nos. 2008-270736 and 2007-266458. The techniques described in these publications can be applied to the invention.

(Sealing)

The whole device of the invention may be sealed with a sealing container. A moisture absorbent or an inert liquid may be sealed in a space between the sealing container and the light emitting device. Although the moisture absorbent is not particularly limited, examples include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieves, zeolite, and magnesium oxide. Although the inert liquid is not particularly limited, examples include paraffins, liquid paraffins, fluorine-based solvents such as perfluoroalkane, perfluoroamine, and perfluoroether, chlorine-based solvents, and silicone oils.

The device of the invention can emit light by applying thereto a direct current (alternating current components may be contained as needed) voltage (usually from 2 volts to 15 volts) or direct current between the anode and the cathode.

As the driving method of the device of the invention, driving methods described in Japanese Patent Laid-Open Nos. 148687/1990, 301355/1994, 29080/1993, 134558/1995, 234685/1996, and 241047/1996, Japanese Patent No. 2784615, U.S. Pat. Nos. 5,828,429 and 6,023,308 and the like can be employed.

The device of the invention is suited for use in display devices, displays, backlights, electron photographs, light emitting apparatuses, light sources for illumination, recording, exposure, or reading, signs, signboards, interiors, optical communications, and the like.

The light emitting apparatus of the invention will next be described referring to FIG. 2.

The light emitting apparatus of the invention comprises the organic electroluminescence device.

Figure 2:
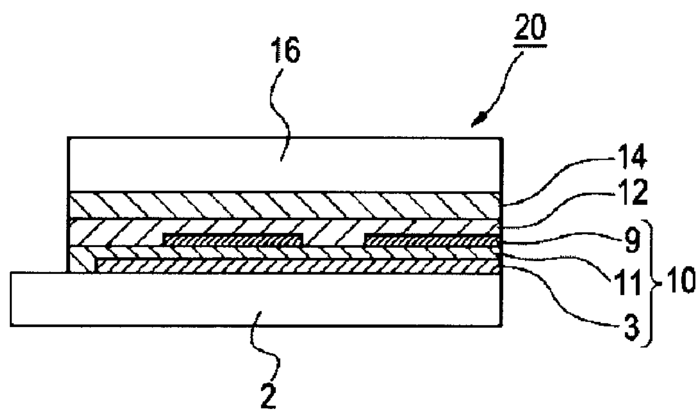
FIG. 2 is a schematic view illustrating an exemplary of a light emitting apparatus according to the invention.

FIG. 2 is a schematic cross-sectional view illustrating one example of the light emitting apparatus of the invention.

A light emitting apparatus 20 of FIG. 2 has a transparent substrate (support substrate) 2, an organic electroluminescent device 10, a sealing container 16, and the like.

The organic electroluminescence device 10 is formed by successively stacking, over the substrate 2, an anode (first electrode) 3, an organic layer 11, a cathode (second electrode) 9. Over the cathode 9, a protective layer 12 is stacked and the protective layer 12 has thereon the sealing container 16 via an adhesion layer 14. It is to be noted that a part of each of the electrode 3 and 9, a partition, insulating layer, and the like are omitted.

As the adhesion layer 14, a photosetting adhesive or thermosetting adhesive can be used. For example, a thermosetting adhesion sheet can also be used.

The intended use of the light emitting apparatus of the invention is not particularly limited and it can be used, for example, for illumination apparatuses and display apparatuses such as TV, personal computer, mobile phone, and electronic paper.

The illumination apparatus of the invention will next be described referring to FIG. 3.

Figure 3:
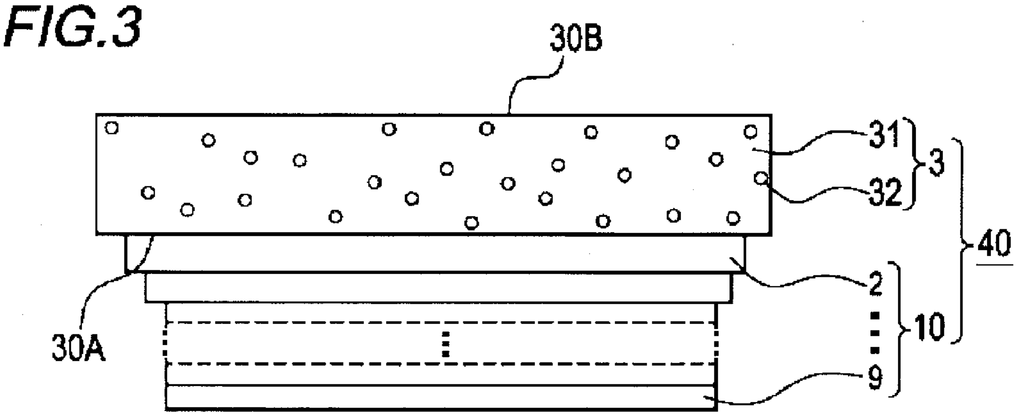
FIG. 3 is a schematic view illustrating an exemplary embodiment illustrating a lighting device according to the invention.

FIG. 3 is a schematic cross-sectional view illustrating one example of the illumination apparatus of the invention.

An illumination apparatus 40 is equipped with the above-described organic electroluminescence device 10 and a light scattering member 30. More specifically, in the illumination apparatus 40, the substrate 2 of the organic electroluminescence device 10 is brought into contact with the light scattering member 30.

The light scattering member 30 is not particularly limited insofar as it can scatter light. In FIG. 3, it is a member obtained by dispersing fine particles 32 in a transparent substrate 31. For example, a glass substrate can be used. As the fine particles 32, transparent resin fine particles are preferably employed. As each of the glass substrate and transparent resin fine particles, known ones can be used. In such an illumination apparatus 40, when light from the organic electroluminescence device 10 is incident on a light incidence plane 30A of the light scattering member 30, the light scattering member scatters the incident light and the scattered light is emitted as an illumination light from the light emission plane 30B.

EXAMPLES

The invention will hereinafter be described in further detail by Examples, but the invention is not limited thereto.

SYNTHESIS EXAMPLES

Synthesis Example 1

Synthesis of Exemplified Compound A-1

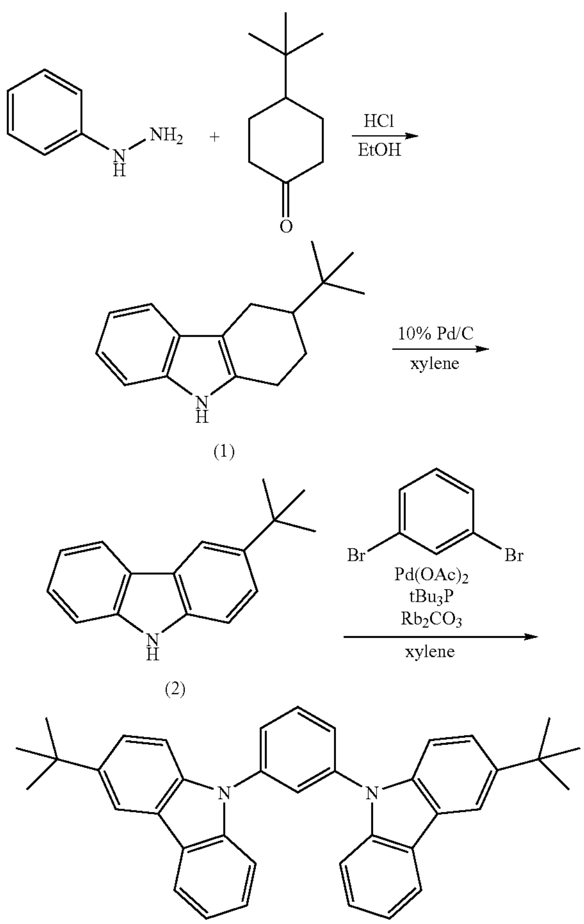

A-1

An egg-plant type flask was charged with 36.03 g of phenylhydrazine, 51.39 g of 4-tertiary-butylcyclohexanone, 600 ml of ethanol, and 200 ml of hydrochloric acid, followed by stirring for 4 hours under heating and refluxing. The reaction mixture was then cooled to room temperature. The crystals thus precipitated were filtered and dried to obtain 68.30 g (yield: 90.1%) of an intended compound (1). $^{1}$H-NMR (300 MHz, in $CDCl_3$): δ (ppm)=1.00 (s, 9H), 1.53 (m, 2H), 2.10 (m, 1H), 2.40 (m, 1H), 2.77 (m, 2H), 2.83 (m, 1H), 7.10 (m, 2H), 7.26 (dd, J=4.5, 1.8 Hz, 1H), 7.46 (dd, J=4.5, 1.8 Hz, 1H), 7.63 (b, 1H).

Under nitrogen, a three-necked flask was charged with 68.00 g of the compound (1), 17.7 g of palladium/carbon (10%) (water content: 50%), and 600 ml of xylene, followed by stirring for 3 days under heating and refluxing. The reaction mixture was filtered to remove the palladium/carbon. The filtrate was concentrated using an evaporator. To the residue thus obtained was added 500 ml of hexane and the resulting mixture was heated and refluxed. After cooling, the precipitate was collected by filtration to obtain 40.86 g (yield: 61.1%) of an intended compound (2). $^{1}$H-NMR (300 MHz, in $CDCl_3$): δ (ppm)=1.44 (s, 9H), 7.21 (m, 1H), 7.37-7.40 (m, 3H), 7.49 (dd, J=8.4, 1.8 Hz, 1H), 7.94 (b, 1H), 8.07 (s, 1H), 8.09 (d, J=4.5 Hz, 1H).

Under nitrogen, a three-necked flask was charged with 4.68 g of the compound (2), 2.36 g of m-dibromobenzene, 0.09 g of palladium acetate, 9.27 g of rubidium carbonate, and 100 ml of xylene. Then, 0.32 g of tri-tertiary-butylphosphine was added and the resulting mixture was stirred for 8 hours under heating and refluxing. Water was added to the reaction mixture, followed by extraction with ethyl acetate. The oil layer thus obtained was concentrated using an evaporator and the residue was purified using a silica gel column to obtain 4.39 g (yield: 84%) of an intended compound A-1. $^{1}$H-NMR (300 MHz, in $CDCl_3$): δ (ppm)=1.45 (s, 18H), 7.28 (t, J=6.9 Hz, 2H), 7.41 (t, J=7.2 Hz, 2H), 7.46-7.53 (m, 6H), 7.67 (dd, J=7.8, 1.8 Hz, 2H), 7.79-7.82 (m, 2H), 8.14 (s, 2H), 8.16 (d, J=4.8 Hz, 2H).

Synthesis Example 2

Synthesis of Exemplified Compound A-36

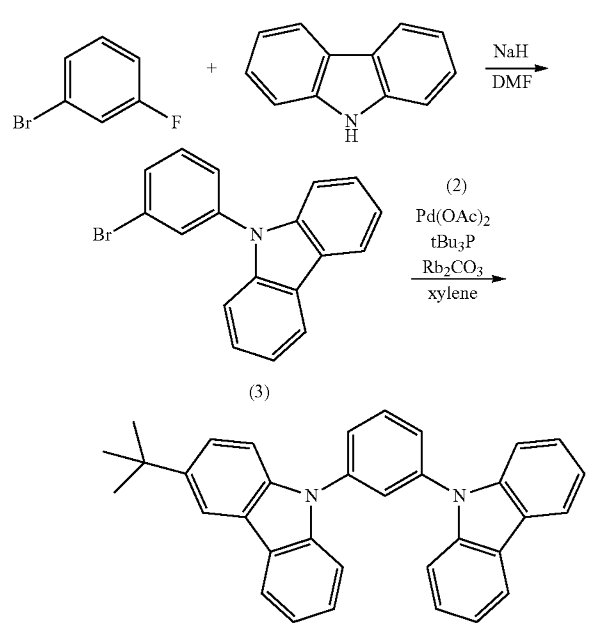

A-36

Under nitrogen, a three-necked flask was charged with 20 g of sodium hydride (60% in oil) and 100 ml of DMF. Then, 61.45 g of carbazole dissolved in 200 ml of DMF was added dropwise gradually. After completion of the dropwise addition, the reaction mixture was stirred for 30 minutes. Then, 61.25 g of 3-bromofluorobenzene was added dropwise and the resulting mixture was stirred for 6 hours at 110° C. Water was added to the reaction mixture, followed by extraction with ethyl acetate. The oil layer thus obtained was concentrated using an evaporator and the residue was purified using a silica gel column to obtain 57.5 g (yield: 50.8%) of an intended compound (3).

$^1$H-NMR (300 MHz, in $CDCl_3$): δ (ppm)=7.28-7.33 (m, 2H), 7.39-7.62 (m, 2H), 7.75 (s, 1H), 8.14 (d, J=3.9 Hz, 2H).

Under nitrogen, a three-necked flask was charged with 2.46 g of the compound (2), 3.22 g of the compound (3), 0.045 g of palladium acetate, 4.62 g of rubidium carbonate, and 100 ml of xylene. Then, 0.16 g of tri-tertiary-butylphosphine was added and the resulting mixture was stirred for 8 hours under heating and refluxing. Water was added to the reaction mixture, followed by extraction with ethyl acetate. The oil layer thus obtained was concentrated using an evaporator and the residue was purified using a silica gel column to obtain 2.18 g of (yield: 47%) of an intended compound A-36.

$^1$H-NMR (300 MHz, in $CDCl_3$): δ (ppm)=1.51 (s, 9H), 7.31 (t, J=6.9 Hz, 3H), 7.41 (t, J=7.2 Hz, 1H), 7.44 (t, J=7.2 Hz, 2H), 7.50-7.54 (m, 5H), 7.66-7.72 (m, 2H), 7.79-7.82 (m, 2H), 8.13-8.17 (m, 4H).

Synthesis Example 3

Synthesis of Exemplified Compound C-1

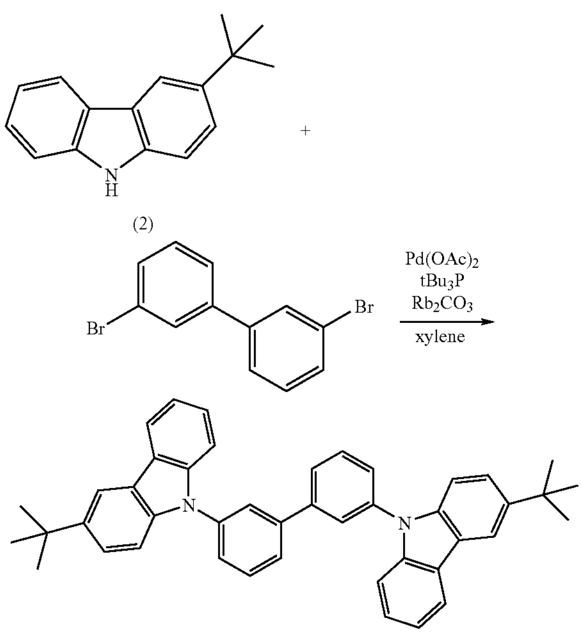

C-1

Under nitrogen, a three-necked flask was charged with 11.16 g of the compound (2), 6.24 g of 3,3'-dibromobiphenyl, 0.18 g of palladium acetate, 18.48 g of rubidium carbonate, and 200 ml of xylene. Then, 0.64 g of tri-tertiary-butylphosphine was added and the resulting mixture was stirred for 12 hours under heating and refluxing. Water was added to the reaction mixture, followed by extraction with ethyl acetate. The oil layer thus obtained was concentrated using an evaporator and the residue was purified using a silica gel column to obtain 8.93 g (yield: 74.8%) of an intended compound C-1.

$^1$H-NMR (300 MHz, in $CDCl_3$): δ (ppm)=1.45 (s, 18H), 7.27 (t, J=6.6 Hz, 2H), 7.36-7.51 (m, 8H), 7.57 (dt, J=3.4, 2.1 Hz, 2H), 7.64-7.72 (m, 4H), 7.85 (s, 2H), 8.15-8.17 (m, 4H).

Synthesis Example 4

Synthesis of Exemplified Compound C-9

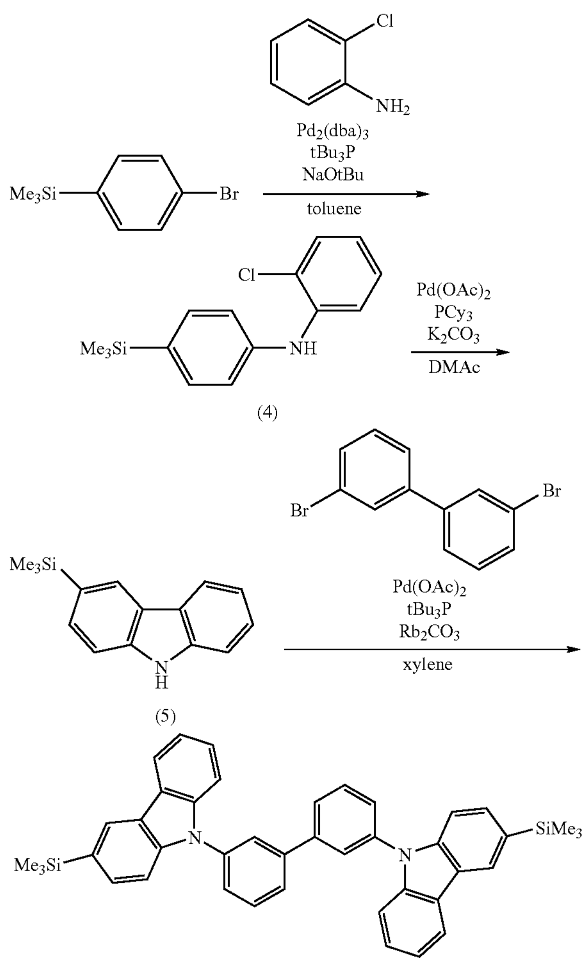

C-9

Under nitrogen, a three-necked flask was charged with 13.29 g of 1-bromo-4-(trimethylsilyl)benzene, 7.01 g of o-chloroaniline, 0.13 g of tris(dibenzylideneacetone)dipalladium(0), 6.34 g of tert-butoxy sodium, and 60 ml of toluene. Then, 1.12 g of tri-tertiary-butylphosphine was added and the resulting mixture was stirred for 10 hours under heating and refluxing. Water was added to the reaction mixture, followed by extraction with ethyl acetate. The oil layer thus obtained was concentrated using an evaporator. To the residue was added 50 ml of hexane. The resulting mixture was refluxed and the precipitate was collected by filtration to obtain 13.50 g (yield: 89%) of an intended compound (4).

$^1$H-NMR (300 MHz, in DMSO-$d_6$): δ (ppm)=0.20 (s, 9H), 6.98 (t, J=7.8 Hz, 1H), 7.07 (d, J=8.4 Hz, 2H), 7.24 (t, J=8.1 Hz, 1H), 7.32 (d, J=8.4 Hz, 2H), 7.37-7.42 (m, 2H), 7.96 (s, 1H).

Under nitrogen, a three-necked flask was charged with 12.41 g of the compound (4), 0.56 g of palladium acetate, 69.0 g of potassium carbonate, and 250 ml of N,N-dimethylacetamide. Then, 1.45 g of tricyclohexylphosphine was added and the resulting mixture was stirred for 12 hours under heating and refluxing. Water was added to the reaction mixture, followed by extraction with ethyl acetate. The oil layer thus obtained was concentrated using an evaporator and the residue was purified using a silica gel column to obtain 6.91 g (yield: 64.2%) of an intended compound (5).

$^1$H-NMR (300 MHz, in DMSO-$d_6$): δ (ppm)=0.20 (s, 9H), 7.14 (t, J=7.8 Hz, 1H), 7.38 (t, J=8.1 Hz, 1H), 7.41 (m, 2H), 7.51 (d, J=7.8 Hz, 1H), 7.99 (d, J=7.8 Hz, 1H), 8.23 (s, 1H), 11.45 (s, 1H).

Under nitrogen, a three-necked flask was charged with 5.74 g of the compound (5), 3.12 g of 3,3'-dibromobiphenyl, 0.09 g of palladium acetate, 9.24 g of rubidium carbonate, and 100 ml of xylene. Then, 0.32 g of tri-tertiary-butylphosphine was added and the resulting mixture was stirred for 12 hours under heating and refluxing. Water was added to the reaction mixture, followed by extraction with ethyl acetate. The oil layer thus obtained was concentrated using an evaporator and the residue was purified using a silica gel column to obtain 4.93 g (yield: 78.4%) of an intended compound C-9.

$^1$H-NMR (300 MHz, in DMSO-$d_6$): δ (ppm)=0.20 (s, 9H), 7.24 (t, J=7.8 Hz, 2H), 7.38 (t, J=8.1 Hz, 2H), 7.40-7.48 (m, 4H), 7.50-7.53 (m, 4H), 7.66 (d, J=7.8 Hz, 2H), 7.78 (d, J=7.5 Hz, 2H), 8.09 (s, 2H), 8.13 (d, J=7.8 Hz, 2H), 8.37 (s, 2H).

Synthesis Example 5

Synthesis of Exemplified Compound C-32

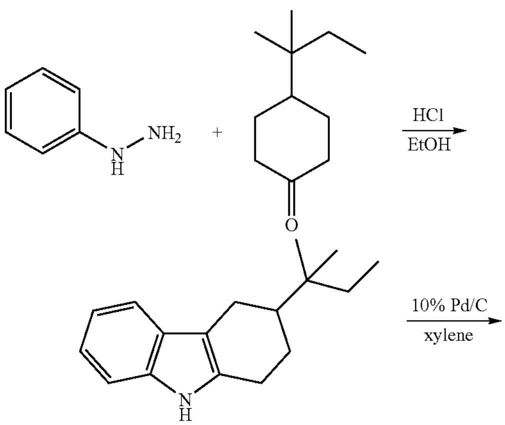

(7)

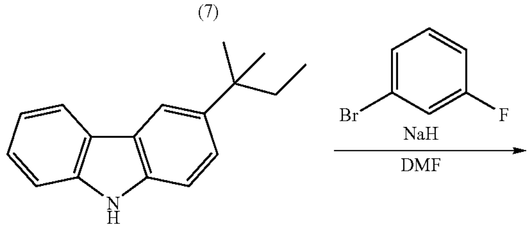

(8)

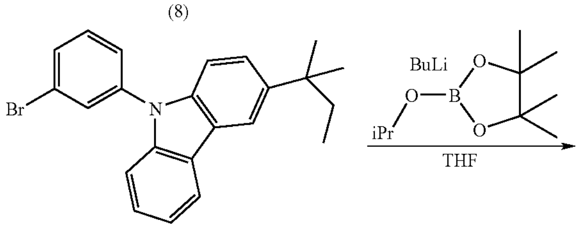

(9)

-continued

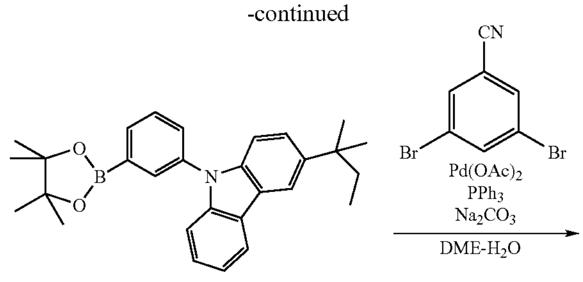

(10)

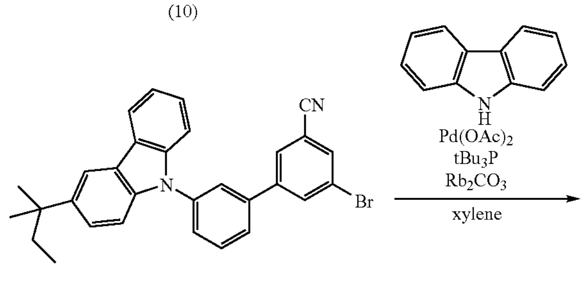

(11)

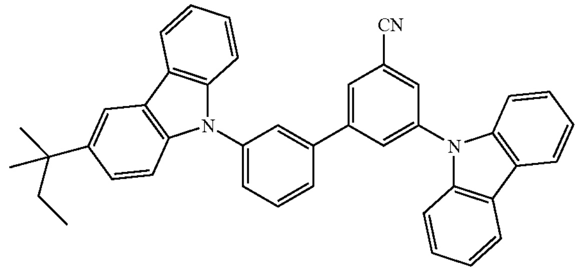

C-32

An egg-plant type flask was charged with 8.8 g of phenylhydrazine, 13.6 g of 4-tertiary-amylcyclohexanone, 300 ml of ethanol, and 100 ml of hydrochloric acid, followed by stirring for 4 hours under heating and refluxing. The reaction mixture was then cooled to room temperature. The crystals thus precipitated were collected by filtration and dried to obtain an intended compound (7). Under nitrogen, a three-necked flask was charged with the resulting compound (7), 4.4 g of palladium/carbon (10%) (water content: 50%), and 150 ml of xylene and the resulting mixture was stirred for 3 days under heating and refluxing. The reaction mixture was filtered to remove the palladium/carbon. The filtrate was concentrated using an evaporator. To the residue thus obtained was added 100 ml of hexane and the resulting mixture was heated and refluxed. After cooling, the precipitate was collected by filtration to obtain 10.4 g (yield: 54.3%) of an intended compound (8). $^1$H-NMR (300 MHz, in DMSO-$d_6$): δ (ppm)=0.64 (t, J=7.5 Hz, 3H), 1.35 (s, 6H), 1.71 (q, J=7.2 Hz, 2H), 7.12 (t, J=8.1 Hz, 1H), 7.34 (t, J=8.1 Hz, 1H), 7.39 (m, 2H), 7.44 (d, J=8.1 Hz, 1H), 8.03 (s, 1H), 8.11 (d, J=7.5 Hz, 1H), 11.08 (s, 1H).

Under nitrogen, a three-necked flask was charged with 1.1 g of sodium hydride (60% in oil) and 20 ml of DMF. Then, 5.33 g of the compound (8) dissolved in 30 ml of DMF was added dropwise gradually. After completion of the dropwise addition, the reaction mixture was stirred for 30 minutes. Then, 3.94 g of 3-bromofluorobenzene was added dropwise and the resulting mixture was stirred for 6 hours at 110° C. Water was added to the reaction mixture, followed by extraction with ethyl acetate. The oil layer thus obtained was concentrated using an evaporator and the residue was purified using a silica gel column to obtain 5.73 g (yield: 65%) of an intended compound (9).

$^1$H-NMR (300 MHz, in $CDCl_3$: 2H), 7.14-7.46 (m, 5H), 7.60-7.74 (m, 3H), 7.74 (s, 1H), 8.18 (s, 1H), 8.28 (d, J=7.8H, 1H).

Under nitrogen, a three-necked flask was charged with 5.17 g of the compound (9) and 100 ml of THF. The resulting mixture was cooled to −60° C. or less in a dry ice-acetone bath. After dropwise addition of 9.1 ml of a 1.6M n-butyllithium hexane solution, the resulting mixture was stirred for 30 minutes. Further, 3.69 g of 2-isopropoxy-4,4,5,5-tetramethyl-1,3,2-dioxaborolane was added and the temperature of the resulting mixture was returned to room temperature while stirring. Water was added to the reaction mixture, followed by extraction with ethyl acetate. The oil layer thus obtained was concentrated using an evaporator and the residue was purified using a silica gel column to obtain 3.07 g (yield: 53%) of an intended compound (10).

$^1$H-NMR (300 MHz, in $CDCl_3$): δ (ppm)=7.24-7.31 (m, 2H), 7.33 (s, 1H), 7.43 (t, J=8.1 Hz, 1H), 7.52 (d, J=7.8 Hz, 1H), 7.67-7.82 (m, 4H), 8.24 (s, 1H), 8.28 (d, J=7.2 Hz, 1H).

Under nitrogen, a three-necked flask was charged with 2.22 g of the compound (10), 2.60 g of 3,5-dibromobenzonitrile, 26 mg of palladium acetate, 0.13 g of triphenylphosphine, 2.65 g of sodium carbonate, 50 ml of dimethoxyethane, and 50 ml of water. The resulting mixture was stirred for 10 hours under heating and refluxing. Water was added to the reaction mixture, followed by extraction with ethyl acetate. The oil layer thus obtained was concentrated using an evaporator and the residue was purified using a silica gel column to obtain 1.48 g (yield: 60%) of an intended compound (11).

$^1$H-NMR (300 MHz, in DMSO-$d_6$): δ (ppm)=0.64 (t, J=7.5 Hz, 3H), 1.35 (s, 6H), 1.71 (q, J=7.2 Hz, 2H), 7.31 (t, J=8.1 Hz, 1H), 7.41-7.47 (m, 4H), 7.70 (d, J=7.8, 1H), 7.80 (t, J=7.8 Hz, 1H), 7.96 (d, J=7.5 Hz, 1H), 8.11 (s, 1H), 8.17 (s, 1H), 8.24-8.28 (m, 2H), 8.32-8.38 (m, 2H).

Under nitrogen, a three-necked flask was charged with 1.23 g of the compound (11), 0.47 g of carbazole, 14 mg of palladium acetate, 1.73 g of rubidium carbonate, and 20 ml of xylene. Then, 0.05 g of tri-tertiary-butylphosphine was added and the resulting mixture was stirred for 8 hours under heating and refluxing. Water was added to the reaction mixture, followed by extraction with ethyl acetate. The oil layer thus obtained was concentrated using an evaporator and the residue was purified using a silica gel column to obtain 1.16 g (yield: 80%) of an intended compound C-32.

$^1$H-NMR (300 MHz, in $CDCl_3$): δ (ppm)=0.68 (t, J=7.2 Hz, 3H), 1.24 (s, 6H), 1.64 (q, J=7.2 Hz, 2H), 7.28-7.36 (m, 3H), 7.40-7.46 (m, 8H), 7.66-7.78 (m, 3H), 7.85 (s, 1H), 7.70 (s, 1H), 7.99 (s, 1H), 8.11 (s, 1H), 8.13-8.17 (m, 4H).

Organic Electroluminescent Device

Example 1

Fabrication of Comparative Device C1-1

A glass substrate (product of Geomatec having a surface resistivity of 10 Ω/sq) 0.5 mm thick and 2.5 cm square and having an ITO film thereon was put in a cleaning container, ultrasonically cleaned in 2-propanol, and subjected to UV ozone treatment for 30 minutes. On the resulting transparent anode (ITO film), the following organic compound layers were deposited successively by vacuum deposition.

A deposition rate in Examples of the invention was 0.2 nm/sec unless otherwise particularly specified. The deposition rate was measured using a crystal oscillator. Film thicknesses described below were also measured using a crystal oscillator.

First layer: HI-3 and F4TCNQ (not described in tables): (weight ratio 99:1), film thickness: 120 nm Second layer: HT-1, film thickness: 7 nm Third layer: HT-8, film thickness: 3 nm Fourth layer (light emitting layer): Light emitting material A and Comparative compound 1 (weight ratio 15:85), film thickness: 30 nm Fifth layer: ET-3, film thickness: 29 nm Sixth layer: EI-1, film thickness: 1 nm Over these layers, 0.1 nm of lithium fluoride and 100 nm of metal aluminum were deposited in the order of mention to form a cathode.

Without bringing the resulting product into contact with the atmosphere, it was put in a glove box purged with a nitrogen gas and sealed with a UV-curing adhesive ("XNR5516HV", product of Nagase Ciba) in a sealing can made of glass to obtain a device C1-1.

[Fabrication of Comparative Device C1-2 and Invention Devices 1-1 to 1-36]

In a similar manner to that employed in Comparative device C1-1 except that the layer constitution was changed to that shown in Table 5, Comparative device C1-2 and Invention devices 1-1 to 1-36 were fabricated and evaluated. Phosphorescence derived from the light emitting material employed was obtained. The results are shown collectively in Table 5.

In Examples in the specification, when two kinds of host materials are used, they are described as "first host material/second host material" in Tables. The weight ratio of the host materials to the light emitting material is "light emitting material: first host material: second host material=15:65:20".

(Evaluation of Performances of Organic Electroluminescent Devices)

(a) Drive Durability

A DC voltage was applied to each device to give a luminance of 1000 cd/m$^2$ and time necessary for the luminance to decrease to 500 cd/m$^2$ was measured. This half period of luminance was designated as an indicator of evaluating drive durability.

(b) Drive Voltage

A DC voltage was applied to each device to give a luminance of 1000 cd/m$^2$ to cause it to emit light. The voltage at this time was designated as an indicator of evaluating a drive voltage. The results thus obtained are shown collectively as a relative value in Table 5.

TABLE 5

| | | | | Fourth layer | | | | | |
|---|---|---|---|---|---|---|---|---|---|
| Device | First layer | Second layer | Third layer | Light emitting material | Host material | Fifth layer | Sixth layer | Relative drive voltage | Relative durability |
| C1-1 | HI-3 | HT-1 | HT-8 | A | Comparative compound 1 | ET-3 | EI-1 | 1.00 | 1.00 |
| C1-2 | HI-3 | HT-1 | HT-8 | A | Comparative compound 4 | ET-3 | EI-1 | 1.08 | 0.38 |

TABLE 5-continued

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| 1-1 | HI-3 | HT-1 | HT-8 | A | A-1 | ET-3 | EI-1 | 0.70 | 3.06 |
| 1-2 | HI-3 | HT-1 | HT-8 | A | A-2 | ET-3 | EI-1 | 0.66 | 2.22 |
| 1-3 | HI-3 | HT-1 | HT-8 | A | A-4 | ET-3 | EI-1 | 0.71 | 2.50 |
| 1-4 | HI-3 | HT-1 | HT-8 | A | B-1 | ET-3 | EI-1 | 0.66 | 1.44 |
| 1-5 | HI-3 | HT-1 | HT-8 | A | B-2 | ET-3 | EI-1 | 0.67 | 1.25 |
| 1-6 | HI-3 | HT-1 | HT-8 | A | B-4 | ET-3 | EI-1 | 0.71 | 1.28 |
| 1-7 | HI-3 | HT-1 | HT-8 | A | A-1/H-1 | ET-3 | EI-1 | 0.68 | 3.36 |
| 1-8 | HI-3 | HT-1 | HT-8 | A | E-2 | ET-3 | EI-1 | 0.69 | 4.25 |
| 1-9 | HI-3 | HT-1 | HT-8 | A | A-13 | ET-3 | EI-1 | 0.72 | 3.10 |
| 1-10 | HI-3 | HT-1 | HT-8 | A | A-16 | ET-3 | EI-1 | 0.74 | 2.37 |
| 1-11 | HI-3 | HT-1 | HT-8 | A | A-25 | ET-3 | EI-1 | 0.63 | 2.95 |
| 1-12 | HI-3 | HT-1 | HT-8 | A | A-26 | ET-3 | EI-1 | 0.61 | 2.15 |
| 1-13 | HI-3 | HT-1 | HT-8 | A | A-36 | ET-3 | EI-1 | 0.62 | 3.03 |
| 1-14 | HI-3 | HT-1 | HT-8 | A | A-39 | ET-3 | EI-1 | 0.64 | 2.55 |
| 1-15 | HI-3 | HT-1 | HT-8 | A | A-50 | ET-3 | EI-1 | 0.61 | 2.91 |
| 1-16 | HI-3 | HT-1 | HT-8 | A | A-55 | ET-3 | EI-1 | 0.81 | 2.10 |
| 1-17 | HI-3 | HT-1 | HT-8 | A | A-86 | ET-3 | EI-1 | 0.70 | 2.84 |
| 1-18 | HI-3 | HT-1 | HT-8 | A | A-88 | ET-3 | EI-1 | 0.77 | 1.98 |
| 1-19 | HI-3 | HT-1 | HT-8 | A | A-95 | ET-3 | EI-1 | 0.73 | 2.67 |
| 1-20 | HI-3 | HT-1 | HT-8 | A | A-97 | ET-3 | EI-1 | 0.79 | 2.03 |
| 1-21 | HI-3 | HT-1 | HT-8 | A | B-13 | ET-3 | EI-1 | 0.69 | 1.56 |
| 1-22 | HI-3 | HT-1 | HT-8 | A | B-16 | ET-3 | EI-1 | 0.71 | 1.51 |
| 1-23 | HI-3 | HT-1 | HT-8 | A | B-25 | ET-3 | EI-1 | 0.65 | 1.37 |
| 1-24 | HI-3 | HT-1 | HT-8 | A | B-34 | ET-3 | EI-1 | 0.68 | 1.31 |
| 1-25 | HI-3 | HT-1 | HT-8 | A | B-36 | ET-3 | EI-1 | 0.63 | 1.51 |
| 1-26 | HI-3 | HT-1 | HT-8 | A | B-44 | ET-3 | EI-1 | 0.73 | 1.20 |
| 1-27 | HI-3 | HT-1 | HT-8 | A | B-53 | ET-3 | EI-1 | 0.72 | 1.41 |
| 1-28 | HI-3 | HT-1 | HT-8 | A | B-54 | ET-3 | EI-1 | 0.74 | 1.21 |
| 1-29 | HI-3 | HT-1 | HT-8 | A | B-49 | ET-3 | EI-1 | 0.72 | 1.32 |
| 1-30 | HI-3 | HT-1 | HT-8 | A | B-50 | ET-3 | EI-1 | 0.77 | 1.29 |
| 1-31 | HI-3 | HT-1 | HT-8 | A | B-80 | ET-3 | EI-1 | 0.75 | 1.23 |
| 1-32 | HI-3 | HT-1 | HT-8 | A | B-81 | ET-3 | EI-1 | 0.71 | 1.17 |
| 1-33 | HI-3 | HT-1 | HT-8 | A | B-107 | ET-3 | EI-1 | 0.79 | 1.15 |
| 1-34 | HI-3 | HT-1 | HT-8 | A | B-108 | ET-3 | EI-1 | 0.82 | 1.10 |
| 1-35 | HI-3 | HT-1 | HT-8 | A | A-36/H-1 | ET-3 | EI-1 | 0.64 | 3.48 |
| 1-36 | HI-3 | HT-1 | HT-8 | A | E-9 | ET-3 | EI-1 | 0.60 | 4.57 |

Example 2

Fabrication of Comparative Device C2-1 and Invention Devices 2-1 to 2-30

In a similar manner to that employed for Comparative device C1-1 except that the constitution of each layer was changed to that described in Table 6, Comparative Device C1-2 and Invention devices 2-1 to 2-30 were fabricated and evaluated. The devices thus obtained each emitted phosphorescence derived from the light emitting material used for the fabrication. The results are collectively shown in Table 6.

TABLE 6

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| C2-1 | HI-4 | HT-1 | HT-8 | A | Comparative compound 2 | ET-3 | EI-1 | 1.00 | 1.00 |
| 2-1 | HI-4 | HT-1 | HT-8 | A | C-1 | ET-3 | EI-1 | 0.72 | 5.88 |
| 2-2 | HI-4 | HT-1 | HT-8 | A | C-4 | ET-3 | EI-1 | 0.64 | 2.94 |

TABLE 6-continued

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| 2-3 | HI-4 | HT-1 | HT-8 | A | C-5 | ET-3 | EI-1 | 0.70 | 2.82 |
| 2-4 | HI-4 | HT-1 | HT-8 | A | C-8 | ET-3 | EI-1 | 0.74 | 6.18 |
| 2-5 | HI-4 | HT-1 | HT-8 | A | C-9 | ET-3 | EI-1 | 0.74 | 3.53 |
| 2-6 | HI-4 | HT-1 | HT-8 | A | C-1/H-2 | ET-3 | EI-1 | 0.69 | 6.59 |
| 2-7 | HI-4 | HT-1 | HT-8 | A | F-2 | ET-3 | EI-1 | 0.70 | 8.59 |
| 2-8 | HI-4 | HT-1 | HT-8 | A | C-18 | ET-3 | EI-1 | 0.74 | 6.14 |
| 2-9 | HI-4 | HT-1 | HT-8 | A | C-21 | ET-3 | EI-1 | 0.69 | 3.05 |
| 2-10 | HI-4 | HT-1 | HT-8 | A | C-26 | ET-3 | EI-1 | 0.69 | 6.31 |
| 2-11 | HI-4 | HT-1 | HT-8 | A | C-34 | ET-3 | EI-1 | 0.71 | 6.18 |
| 2-12 | HI-4 | HT-1 | HT-8 | A | C-35 | ET-3 | EI-1 | 0.63 | 6.48 |
| 2-13 | HI-4 | HT-1 | HT-8 | A | C-42 | ET-3 | EI-1 | 0.68 | 6.27 |
| 2-14 | HI-4 | HT-1 | HT-8 | A | C-44 | ET-3 | EI-1 | 0.76 | 5.84 |
| 2-15 | HI-4 | HT-1 | HT-8 | A | C-46 | ET-3 | EI-1 | 0.74 | 2.77 |
| 2-16 | HI-4 | HT-1 | HT-8 | A | C-101 | ET-3 | EI-1 | 0.77 | 5.13 |
| 2-17 | HI-4 | HT-1 | HT-8 | A | C-103 | ET-3 | EI-1 | 0.79 | 2.55 |
| 2-18 | HI-4 | HT-1 | HT-8 | A | C-104 | ET-3 | EI-1 | 0.74 | 5.73 |
| 2-19 | HI-4 | HT-1 | HT-8 | A | C-106 | ET-3 | EI-1 | 0.75 | 5.51 |
| 2-20 | HI-4 | HT-1 | HT-8 | A | C-137 | ET-3 | EI-1 | 0.81 | 5.64 |
| 2-21 | HI-4 | HT-1 | HT-8 | A | D-1 | ET-3 | EI-1 | 0.72 | 3.76 |
| 2-22 | HI-4 | HT-1 | HT-8 | A | D-4 | ET-3 | EI-1 | 0.69 | 1.81 |
| 2-23 | HI-4 | HT-1 | HT-8 | A | D-8 | ET-3 | EI-1 | 0.75 | 3.51 |
| 2-24 | HI-4 | HT-1 | HT-8 | A | D-9 | ET-3 | EI-1 | 0.67 | 3.87 |
| 2-25 | HI-4 | HT-1 | HT-8 | A | D-18 | ET-3 | EI-1 | 0.69 | 3.66 |
| 2-26 | HI-4 | HT-1 | HT-8 | A | D-40 | ET-3 | EI-1 | 0.76 | 3.38 |
| 2-27 | HI-4 | HT-1 | HT-8 | A | D-81 | ET-3 | EI-1 | 0.74 | 3.42 |
| 2-28 | HI-4 | HT-1 | HT-8 | A | D-35/H-2 | ET-3 | EI-1 | 0.59 | 7.62 |
| 2-29 | HI-4 | HT-1 | HT-8 | A | F-4 | ET-3 | EI-1 | 0.69 | 8.90 |
| 2-30 | HI-4 | HT-1 | HT-8 | A | F-8 | ET-3 | EI-1 | 0.60 | 9.23 |

Example 3

Fabrication of Comparative Devices C3-1 and C3-2, and Invention Devices 3-1 to 3-9

In a similar manner to that employed for Comparative device C1-1 except that the constitution of each layer was changed to that described in Table 7, Comparative devices C3-1 and C3-2, and Invention devices 3-1 to 3-9 were fabricated and evaluated. The devices thus obtained each emitted phosphorescence derived from the light emitting material used for the fabrication. The results are collectively shown in Table 7.

TABLE 7

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| C3-1 | HI-2 | HT-4 | HT-8 | A | Comparative compound 1 | ET-3 | EI-1 | 1.00 | 1.00 |
| C3-2 | HI-2 | HT-4 | HT-8 | A | Comparative compound 3 | ET-3 | EI-1 | 0.98 | 0.49 |
| 3-1 | HI-2 | HT-4 | HT-8 | A | A-6 | ET-3 | EI-1 | 0.68 | 2.28 |
| 3-2 | HI-2 | HT-4 | HT-8 | A | C-2 | ET-3 | EI-1 | 0.74 | 1.94 |
| 3-3 | HI-2 | HT-4 | HT-8 | A | C-3 | ET-3 | EI-1 | 0.73 | 2.00 |
| 3-4 | HI-2 | HT-4 | HT-8 | A | C-4 | ET-3 | EI-1 | 0.65 | 1.39 |
| 3-5 | HI-2 | HT-4 | HT-8 | A | A-18 | ET-3 | EI-1 | 0.68 | 2.43 |
| 3-6 | HI-2 | HT-4 | HT-8 | A | A-49 | ET-3 | EI-1 | 0.71 | 2.11 |
| 3-7 | HI-2 | HT-4 | HT-8 | A | B-18 | ET-3 | EI-1 | 0.74 | 1.52 |
| 3-8 | HI-2 | HT-4 | HT-8 | A | C-20 | ET-3 | EI-1 | 0.77 | 1.88 |
| 3-9 | HI-2 | HT-4 | HT-8 | A | C-63 | ET-3 | EI-1 | 0.79 | 1.72 |

Example 4

Fabrication of Comparative Devices C4-1 and C4-2, and Invention Devices 4-1 to 4-10

In a similar manner to that employed for Comparative device C1-1 except that the constitution of each layer was changed to that described in Table 8, Comparative devices C4-1 and C4-2, and Invention devices 4-1 to 4-10 were fabricated and evaluated. The devices thus obtained each emitted phosphorescence derived from the light emitting material used for the fabrication. The results are collectively shown in Table 8.

TABLE 8

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| C4-1 | H1-1 | HT-1 | HT-8 | A | Comparative compound 3 | ET-3 | EI-1 | 1.00 | 1.00 |
| C4-2 | H1-1 | HT-1 | HT-8 | A | Comparative compound 5 | ET-3 | EI-1 | 1.07 | 0.86 |
| 4-1 | H1-1 | HT-1 | HT-8 | A | A-5 | ET-3 | EI-1 | 0.69 | 4.86 |
| 4-2 | H1-1 | HT-1 | HT-8 | A | C-6 | ET-3 | EI-1 | 0.76 | 3.89 |
| 4-3 | H1-1 | HT-1 | HT-8 | A | C-7 | ET-3 | EI-1 | 0.73 | 3.86 |
| 4-4 | H1-1 | HT-1 | HT-8 | A | A-29 | ET-3 | EI-1 | 0.72 | 4.98 |
| 4-5 | H1-1 | HT-1 | HT-8 | A | A-40 | ET-3 | EI-1 | 0.66 | 5.11 |
| 4-6 | H1-1 | HT-1 | HT-8 | A | A-142 | ET-3 | EI-1 | 0.74 | 4.37 |
| 4-7 | H1-1 | HT-1 | HT-8 | A | B-29 | ET-3 | EI-1 | 0.68 | 2.36 |
| 4-8 | H1-1 | HT-1 | HT-8 | A | B-94 | ET-3 | EI-1 | 0.70 | 2.10 |
| 4-9 | H1-1 | HT-1 | HT-8 | A | C-27 | ET-3 | EI-1 | 0.69 | 4.22 |
| 4-10 | H1-1 | HT-1 | HT-8 | A | C-117 | ET-3 | EI-1 | 0.78 | 3.65 |

Example 5

Fabrication of Comparative Devices C5-1 and C5-2, and Invention Devices 5-1 to 5-9, 5-10, 5-21 to 5-29, and 5-31 to 5-32

In a similar manner to that employed for Comparative device C1-1 except that the constitution of each layer was changed to that described in Table 9, Comparative devices C5-1 and C5-2, and Invention devices 5-1 to 5-9, 5-10, 5-21 to 5-29, and 5-31 to 5-32 were fabricated and evaluated. The devices thus obtained each emitted phosphorescence derived from the light emitting material used for the fabrication. The results are collectively shown in Table 9.

Example 6

Fabrication of Comparative Devices C6-1 and C6-2, and Invention Devices 6-1 to 6-10 and 6-21 to 6-28

In a similar manner to that employed for Comparative device C1-1 except that the constitution of each layer was changed to that described in Table 10, Comparative devices C6-1 and C6-2, and Invention devices 6-1 to 6-10 and 6-21 to 6-28 were fabricated and evaluated. The devices thus obtained each emitted phosphorescence derived from the light emitting material used for the fabrication. The results are collectively shown in Table 10.

TABLE 9

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| C5-1 | HI-3 | HT-1 | HT-8 | B | Comparative compound 1 | ET-3 | EI-1 | 1.00 | 1.00 |
| C5-2 | HI-3 | HT-1 | HT-8 | B | Comparative compound 3 | ET-3 | EI-1 | 1.02 | 0.48 |
| 5-1 | HI-3 | HT-1 | HT-8 | B | A-1 | ET-3 | EI-1 | 0.80 | 2.40 |
| 5-2 | HI-3 | HT-1 | HT-8 | B | A-2 | ET-3 | EI-1 | 0.73 | 1.90 |
| 5-3 | HI-3 | HT-1 | HT-8 | B | A-4 | ET-3 | EI-1 | 0.77 | 2.06 |
| 5-4 | HI-3 | HT-1 | HT-8 | B | B-1 | ET-3 | EI-1 | 0.77 | 1.40 |
| 5-5 | HI-3 | HT-1 | HT-8 | B | B-2 | ET-3 | EI-1 | 0.71 | 1.14 |
| 5-6 | HI-3 | HT-1 | HT-8 | B | B-4 | ET-3 | EI-1 | 0.75 | 1.10 |
| 5-7 | HI-3 | HT-1 | HT-8 | B | A-13 | ET-3 | EI-1 | 0.82 | 2.52 |
| 5-8 | HI-3 | HT-1 | HT-8 | B | A-16 | ET-3 | EI-1 | 0.87 | 1.65 |
| 5-9 | HI-3 | HT-1 | HT-8 | B | A-25 | ET-3 | EI-1 | 0.76 | 2.02 |
| 5-10 | HI-3 | HT-1 | HT-8 | B | A-26 | ET-3 | EI-1 | 0.75 | 1.73 |
| 5-21 | HI-3 | HT-1 | HT-8 | B | A-36 | ET-3 | EI-1 | 0.77 | 2.78 |
| 5-22 | HI-3 | HT-1 | HT-8 | B | A-50 | ET-3 | EI-1 | 0.74 | 1.88 |
| 5-23 | HI-3 | HT-1 | HT-8 | B | A-86 | ET-3 | EI-1 | 0.81 | 1.71 |
| 5-24 | HI-3 | HT-1 | HT-8 | B | A-95 | ET-3 | EI-1 | 0.83 | 1.66 |
| 5-25 | HI-3 | HT-1 | HT-8 | B | B-13 | ET-3 | EI-1 | 0.80 | 1.28 |
| 5-26 | HI-3 | HT-1 | HT-8 | B | B-25 | ET-3 | EI-1 | 0.76 | 1.42 |
| 5-27 | HI-3 | HT-1 | HT-8 | B | B-36 | ET-3 | EI-1 | 0.75 | 1.31 |
| 5-28 | HI-3 | HT-1 | HT-8 | B | B-44 | ET-3 | EI-1 | 0.86 | 1.12 |
| 5-29 | HI-3 | HT-1 | HT-8 | B | B-53 | ET-3 | EI-1 | 0.84 | 1.25 |
| 5-31 | HI-3 | HT-1 | HT-8 | B | B-50 | ET-3 | EI-1 | 0.88 | 1.17 |
| 5-32 | HI-3 | HT-1 | HT-8 | B | B-80 | ET-3 | EI-1 | 0.90 | 1.12 |
| 5-33 | HI-3 | HT-1 | HT-8 | B | B-107 | ET-3 | EI-1 | 0.91 | 1.08 |

TABLE 10

| | | | | Fourth layer | | | | | |
|---|---|---|---|---|---|---|---|---|---|
| Device | First layer | Second layer | Third layer | Light emitting material | Host material | Fifth layer | Sixth layer | Relative drive voltage | Relative durability |
| C6-1 | HI-4 | HT-1 | HT-8 | B | Comparative compound 1 | ET-3 | EI-1 | 1.00 | 1.00 |
| C6-2 | HI-4 | HT-1 | HT-8 | B | Comparative compound 2 | ET-3 | EI-1 | 0.95 | 0.48 |
| 6-1 | HI-4 | HT-1 | HT-8 | B | C-1 | ET-3 | EI-1 | 0.72 | 2.50 |
| 6-2 | HI-4 | HT-1 | HT-8 | B | C-3 | ET-3 | EI-1 | 0.76 | 1.68 |
| 6-3 | HI-4 | HT-1 | HT-8 | B | C-4 | ET-3 | EI-1 | 0.65 | 1.34 |
| 6-4 | HI-4 | HT-1 | HT-8 | B | C-6 | ET-3 | EI-1 | 0.74 | 1.60 |
| 6-5 | HI-4 | HT-1 | HT-8 | B | C-18 | ET-3 | EI-1 | 0.78 | 2.62 |
| 6-6 | HI-4 | HT-1 | HT-8 | B | C-21 | ET-3 | EI-1 | 0.73 | 1.21 |
| 6-7 | HI-4 | HT-1 | HT-8 | B | C-26 | ET-3 | EI-1 | 0.72 | 2.86 |
| 6-8 | HI-4 | HT-1 | HT-8 | B | C-34 | ET-3 | EI-1 | 0.78 | 2.72 |
| 6-9 | HI-4 | HT-1 | HT-8 | B | C-35 | ET-3 | EI-1 | 0.70 | 2.79 |
| 6-10 | HI-4 | HT-1 | HT-8 | B | C-42 | ET-3 | EI-1 | 0.73 | 2.68 |
| 6-21 | HI-4 | HT-1 | HT-8 | B | C-44 | ET-3 | EI-1 | 0.80 | 2.44 |
| 6-22 | HI-4 | HT-1 | HT-8 | B | C-101 | ET-3 | EI-1 | 0.83 | 2.27 |
| 6-23 | HI-4 | HT-1 | HT-8 | B | C-104 | ET-3 | EI-1 | 0.80 | 2.36 |
| 6-24 | HI-4 | HT-1 | HT-8 | B | D-1 | ET-3 | EI-1 | 0.76 | 1.55 |
| 6-25 | HI-4 | HT-1 | HT-8 | B | D-4 | ET-3 | EI-1 | 0.72 | 1.05 |
| 6-26 | HI-4 | HT-1 | HT-8 | B | D-9 | ET-3 | EI-1 | 0.75 | 1.73 |
| 6-27 | HI-4 | HT-1 | HT-8 | B | D-18 | ET-3 | EI-1 | 0.78 | 1.54 |
| 6-28 | HI-4 | HT-1 | HT-8 | B | D-40 | ET-3 | EI-1 | 0.81 | 1.41 |

Example 7

Fabrication of Comparative Device C7-1 and Invention Devices 7-1 to 7-5

In a similar manner to that employed for Comparative device C1-1 except the constitution of each layer was changed to that described in Table 11 and the third layer was not formed, Comparative device C7-1 and Invention devices 7-1 to 7-5 were fabricated and evaluated. The devices thus obtained each emitted phosphorescence derived from the light emitting material used for the fabrication. The results are collectively shown in Table 11.

TABLE 11

| | | | Fourth layer | | | | | |
|---|---|---|---|---|---|---|---|---|
| Device | First layer | Second layer | Light emitting material | Host material | Fifth layer | Sixth layer | Relative drive voltage | Relative durability |
| C7-1 | HT-2 | HT-5 | B | Comparative compound 2 | ET-3 | EI-1 | 1.00 | 1.00 |
| 7-1 | HT-2 | HT-5 | B | C-2 | ET-3 | EI-1 | 0.78 | 3.75 |
| 7-2 | HT-2 | HT-5 | B | C-5 | ET-3 | EI-1 | 0.73 | 2.71 |
| 7-3 | HT-2 | HT-5 | B | C-7 | ET-3 | EI-1 | 0.82 | 3.21 |
| 7-4 | HT-2 | HT-5 | B | C-8 | ET-3 | EI-1 | 0.79 | 4.58 |
| 7-5 | HT-2 | HT-5 | B | C-9 | ET-3 | EI-1 | 0.78 | 2.50 |

Example 8

Fabrication of Comparative Devices C8-1 and C8-2, and Invention Devices 8-1 to 8-33

In a similar manner to that employed for Comparative device C1-1 except the constitution of each layer was changed to that described in Table 12, Comparative devices C8-1 and C8-2 and Invention devices 8-1 to 8-33 were fabricated and evaluated. The devices thus obtained each emitted phosphorescence derived from the light emitting material used for the fabrication. The results are collectively shown in Table 8.

TABLE 12

| | | | | Fourth layer | | | | | |
|---|---|---|---|---|---|---|---|---|---|
| Device | First layer | Second layer | Third layer | Light emitting material | Host material | Fifth layer | Sixth layer | Relative drive voltage | Relative durability |
| C8-1 | HI-2 | HT-4 | HT-8 | C | Comparative compound 1 | ET-3 | EI-1 | 1.00 | 1.00 |

TABLE 12-continued

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| C8-2 | HI-2 | HT-4 | HT-8 | C | Comparative compound 3 | ET-3 | EI-1 | 1.06 | 0.75 |
| 8-1 | HI-2 | HT-4 | HT-8 | C | A-1 | ET-3 | EI-1 | 0.72 | 3.40 |
| 8-2 | HI-2 | HT-4 | HT-8 | C | A-2 | ET-3 | EI-1 | 0.66 | 2.62 |
| 8-3 | HI-2 | HT-4 | HT-8 | C | A-4 | ET-3 | EI-1 | 0.68 | 3.38 |
| 8-4 | HI-2 | HT-4 | HT-8 | C | B-1 | ET-3 | EI-1 | 0.71 | 2.19 |
| 8-5 | HI-2 | HT-4 | HT-8 | C | B-2 | ET-3 | EI-1 | 0.65 | 1.58 |
| 8-6 | HI-2 | HT-4 | HT-8 | C | B-4 | ET-3 | EI-1 | 0.63 | 1.94 |
| 8-7 | HI-2 | HT-4 | HT-8 | C | A-1/H-1 | ET-3 | EI-1 | 0.71 | 3.90 |
| 8-8 | HI-2 | HT-4 | HT-8 | C | A-13 | ET-3 | EI-1 | 0.73 | 3.56 |
| 8-9 | HI-2 | HT-4 | HT-8 | C | A-16 | ET-3 | EI-1 | 0.76 | 3.43 |
| 8-10 | HI-2 | HT-4 | HT-8 | C | A-25 | ET-3 | EI-1 | 0.65 | 3.68 |
| 8-11 | HI-2 | HT-4 | HT-8 | C | A-26 | ET-3 | EI-1 | 0.62 | 2.26 |
| 8-12 | HI-2 | HT-4 | HT-8 | C | A-36 | ET-3 | EI-1 | 0.62 | 3.39 |
| 8-13 | HI-2 | HT-4 | HT-8 | C | A-39 | ET-3 | EI-1 | 0.67 | 3.53 |
| 8-14 | HI-2 | HT-4 | HT-8 | C | A-50 | ET-3 | EI-1 | 0.62 | 3.28 |
| 8-15 | HI-2 | HT-4 | HT-8 | C | A-55 | ET-3 | EI-1 | 0.85 | 2.22 |
| 8-16 | HI-2 | HT-4 | HT-8 | C | A-86 | ET-3 | EI-1 | 0.73 | 3.15 |
| 8-17 | HI-2 | HT-4 | HT-8 | C | A-88 | ET-3 | EI-1 | 0.75 | 2.10 |
| 8-18 | HI-2 | HT-4 | HT-8 | C | A-95 | ET-3 | EI-1 | 0.75 | 3.24 |
| 8-19 | HI-2 | HT-4 | HT-8 | C | A-97 | ET-3 | EI-1 | 0.82 | 2.19 |
| 8-20 | HI-2 | HT-4 | HT-8 | C | B-13 | ET-3 | EI-1 | 0.71 | 2.28 |
| 8-21 | HI-2 | HT-4 | HT-8 | C | B-16 | ET-3 | EI-1 | 0.75 | 2.34 |
| 8-22 | HI-2 | HT-4 | HT-8 | C | B-25 | ET-3 | EI-1 | 0.66 | 2.45 |
| 8-23 | HI-2 | HT-4 | HT-8 | C | B-34 | ET-3 | EI-1 | 0.70 | 2.04 |
| 8-24 | HI-2 | HT-4 | HT-8 | C | B-36 | ET-3 | EI-1 | 0.62 | 2.41 |
| 8-25 | HI-2 | HT-4 | HT-8 | C | B-44 | ET-3 | EI-1 | 0.69 | 1.51 |
| 8-26 | HI-2 | HT-4 | HT-8 | C | B-53 | ET-3 | EI-1 | 0.72 | 2.26 |
| 8-27 | HI-2 | HT-4 | HT-8 | C | B-54 | ET-3 | EI-1 | 0.76 | 1.84 |
| 8-28 | HI-2 | HT-4 | HT-8 | C | B-49 | ET-3 | EI-1 | 0.73 | 2.14 |
| 8-29 | HI-2 | HT-4 | HT-8 | C | B-50 | ET-3 | EI-1 | 0.74 | 2.31 |
| 8-30 | HI-2 | HT-4 | HT-8 | C | B-80 | ET-3 | EI-1 | 0.77 | 2.29 |
| 8-31 | HI-2 | HT-4 | HT-8 | C | B-81 | ET-3 | EI-1 | 0.69 | 1.78 |
| 8-32 | HI-2 | HT-4 | HT-8 | C | B-107 | ET-3 | EI-1 | 0.76 | 1.91 |
| 8-33 | HI-2 | HT-4 | HT-8 | C | B-108 | ET-3 | EI-1 | 0.77 | 2.18 |

Example 9

Fabrication of Comparative Device C9-1 and Invention Devices 9-1 to 9-26

In a similar manner to that employed for Comparative device C1-1 except the constitution of each layer was changed to that described in Table 13 and the third layer was not formed, Comparative device C9-1 and Invention devices 9-1 to 9-26 were fabricated and evaluated. The devices thus obtained each emitted phosphorescence derived from the light emitting material used for the fabrication. The results are collectively shown in Table 13.

TABLE 13

| Device | First layer | Second layer | Fourth layer: Light emitting material | Fourth layer: Host material | Fifth layer | Sixth layer | Relative drive voltage | Relative durability |
|---|---|---|---|---|---|---|---|---|
| C9-1 | HI-3 | HT-1 | C | Comparative compound 2 | ET-3 | EI-1 | 1.00 | 1.00 |
| 9-1 | HI-3 | HT-1 | C | C-1 | ET-3 | EI-1 | 0.70 | 4.53 |
| 9-2 | HI-3 | HT-1 | C | C-4 | ET-3 | EI-1 | 0.64 | 2.46 |
| 9-3 | HI-3 | HT-1 | C | C-5 | ET-3 | EI-1 | 0.67 | 2.28 |
| 9-4 | HI-3 | HT-1 | C | C-8 | ET-3 | EI-1 | 0.70 | 3.50 |
| 9-5 | HI-3 | HT-1 | C | C-9 | ET-3 | EI-1 | 0.70 | 2.17 |
| 9-6 | HI-3 | HT-1 | C | C-1/H-2 | ET-3 | EI-1 | 0.69 | 4.80 |
| 9-7 | HI-3 | HT-1 | C | C-18 | ET-3 | EI-1 | 0.72 | 5.01 |
| 9-8 | HI-3 | HT-1 | C | C-21 | ET-3 | EI-1 | 0.70 | 2.28 |
| 9-9 | HI-3 | HT-1 | C | C-26 | ET-3 | EI-1 | 0.70 | 5.21 |
| 9-10 | HI-3 | HT-1 | C | C-34 | ET-3 | EI-1 | 0.73 | 5.13 |
| 9-11 | HI-3 | HT-1 | C | C-35 | ET-3 | EI-1 | 0.68 | 4.86 |
| 9-12 | HI-3 | HT-1 | C | C-42 | ET-3 | EI-1 | 0.71 | 4.92 |
| 9-13 | HI-3 | HT-1 | C | C-44 | ET-3 | EI-1 | 0.76 | 4.72 |
| 9-14 | HI-3 | HT-1 | C | C-46 | ET-3 | EI-1 | 0.77 | 2.04 |
| 9-15 | HI-3 | HT-1 | C | C-101 | ET-3 | EI-1 | 0.81 | 4.68 |
| 9-16 | HI-3 | HT-1 | C | C-103 | ET-3 | EI-1 | 0.83 | 1.96 |
| 9-17 | HI-3 | HT-1 | C | C-104 | ET-3 | EI-1 | 0.75 | 4.73 |
| 9-18 | HI-3 | HT-1 | C | C-106 | ET-3 | EI-1 | 0.74 | 4.38 |
| 9-19 | HI-3 | HT-1 | C | C-137 | ET-3 | EI-1 | 0.79 | 4.58 |

TABLE 13-continued

| Device | First layer | Second layer | Fourth layer: Light emitting material | Fourth layer: Host material | Fifth layer | Sixth layer | Relative drive voltage | Relative durability |
|---|---|---|---|---|---|---|---|---|
| 9-20 | HI-3 | HT-1 | C | D-1 | ET-3 | EI-1 | 0.73 | 2.05 |
| 9-21 | HI-3 | HT-1 | C | D-4 | ET-3 | EI-1 | 0.74 | 1.38 |
| 9-22 | HI-3 | HT-1 | C | D-8 | ET-3 | EI-1 | 0.78 | 2.14 |
| 9-23 | HI-3 | HT-1 | C | D-9 | ET-3 | EI-1 | 0.71 | 2.19 |
| 9-24 | HI-3 | HT-1 | C | D-18 | ET-3 | EI-1 | 0.70 | 2.21 |
| 9-25 | HI-3 | HT-1 | C | D-40 | ET-3 | EI-1 | 0.78 | 1.96 |
| 9-26 | HI-3 | HT-1 | C | D-81 | ET-3 | EI-1 | 0.77 | 1.82 |

Example 10

Fabrication of Comparative Device C10-1 and Invention Devices 10-1 to 10-9

In a similar manner to that employed for Comparative device C1-1 except that the constitution of each layer was changed to that described in Table 14, Comparative device C10-1 and Invention devices 10-1 to 10-9 were fabricated and evaluated. The devices thus obtained each emitted phosphorescence derived from the light emitting material used for the fabrication. The results are collectively shown in Table 14.

TABLE 14

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| C10-1 | HI-3 | HT-1 | HT-8 | C | Comparative compound 3 | ET-3 | EI-1 | 1.00 | 1.00 |
| 10-1 | HI-3 | HT-1 | HT-8 | C | A-6 | ET-3 | EI-1 | 0.69 | 4.26 |
| 10-2 | HI-3 | HT-1 | HT-8 | C | C-2 | ET-3 | EI-1 | 0.66 | 4.04 |
| 10-3 | HI-3 | HT-1 | HT-8 | C | C-3 | ET-3 | EI-1 | 0.65 | 3.85 |
| 10-4 | HI-3 | HT-1 | HT-8 | C | C-4 | ET-3 | EI-1 | 0.61 | 2.89 |
| 10-5 | HI-3 | HT-1 | HT-8 | C | A-18 | ET-3 | EI-1 | 0.75 | 4.56 |
| 10-6 | HI-3 | HT-1 | HT-8 | C | A-49 | ET-3 | EI-1 | 0.78 | 4.22 |
| 10-7 | HI-3 | HT-1 | HT-8 | C | B-18 | ET-3 | EI-1 | 0.75 | 2.95 |
| 10-8 | HI-3 | HT-1 | HT-8 | C | C-20 | ET-3 | EI-1 | 0.75 | 3.90 |
| 10-9 | HI-3 | HT-1 | HT-8 | C | C-63 | ET-3 | EI-1 | 0.81 | 3.51 |

Example 11

Fabrication of Comparative Devices C11-1 and C11-2, and Invention Devices 11-1 to 11-11

In a similar manner to that employed for Comparative device C1-1 except that the constitution of each layer was changed to that described in Table 15, Comparative devices C11-1 and C11-2, and Invention devices 11-1 to 11-11 were fabricated and evaluated. The devices thus obtained each emitted phosphorescence derived from the light emitting material used for the fabrication. The results are collectively shown in Table 15.

TABLE 15

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| C11-1 | HI-4 | HT-1 | HT-8 | C | Comparative compound 3 | ET-1 | EI-1 | 1.00 | 1.00 |
| 11-1 | HI-4 | HT-1 | HT-8 | C | Comparative Compound 5 | ET-1 | EI-1 | 1.02 | 0.71 |
| 11-2 | HI-4 | HT-1 | HT-8 | C | A-5 | ET-1 | EI-1 | 0.69 | 4.15 |
| 11-3 | HI-4 | HT-1 | HT-8 | C | C-6 | ET-1 | EI-1 | 0.66 | 3.84 |
| 11-4 | HI-4 | HT-1 | HT-8 | C | C-7 | ET-1 | EI-1 | 0.69 | 3.76 |
| 11-5 | HI-4 | HT-1 | HT-8 | C | A-29 | ET-1 | EI-1 | 0.68 | 4.22 |
| 11-6 | HI-4 | HT-1 | HT-8 | C | A-40 | ET-1 | EI-1 | 0.68 | 4.34 |
| 11-7 | HI-4 | HT-1 | HT-8 | C | A-142 | ET-1 | EI-1 | 0.77 | 4.01 |
| 11-8 | HI-4 | HT-1 | HT-8 | C | B-29 | ET-1 | EI-1 | 0.70 | 2.22 |
| 11-9 | HI-4 | HT-1 | HT-8 | C | B-94 | ET-1 | EI-1 | 0.73 | 1.94 |

TABLE 15-continued

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| 11-10 | HI-4 | HT-1 | HT-8 | C | C-27 | ET-1 | EI-1 | 0.68 | 3.91 |
| 11-11 | HI-4 | HT-1 | HT-8 | C | C-117 | ET-1 | EI-1 | 0.71 | 3.58 |

Example 12

Fabrication of Comparative Devices C12-1 and C12-2, and Invention Devices 12-1 to 12-18

In a similar manner to that employed for Comparative device C1-1 except that the constitution of each layer was changed to that described in Table 16, Comparative devices C12-1 and C12-2 and Invention devices 12-1 to 12-18 were fabricated and evaluated. The devices thus obtained each emitted phosphorescence derived from the light emitting material used for the fabrication. The results are collectively shown in Table 16.

TABLE 16

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| C12-1 | HI-2 | HT-4 | HT-8 | D | Comparative compound 1 | ET-3 | EI-1 | 1.00 | 1.00 |
| C12-2 | HI-2 | HT-4 | HT-8 | D | Comparative Compound 3 | ET-3 | EI-1 | 1.01 | 0.58 |
| 12-1 | HI-2 | HT-4 | HT-8 | D | A-1 | ET-3 | EI-1 | 0.81 | 1.60 |
| 12-2 | HI-2 | HT-4 | HT-8 | D | A-2 | ET-3 | EI-1 | 0.73 | 1.30 |
| 12-3 | HI-2 | HT-4 | HT-8 | D | A-4 | ET-3 | EI-1 | 0.78 | 1.53 |
| 12-4 | HI-2 | HT-4 | HT-8 | D | B-1 | ET-3 | EI-1 | 0.77 | 1.09 |
| 12-5 | HI-2 | HT-4 | HT-8 | D | B-2 | ET-3 | EI-1 | 0.75 | 1.03 |
| 12-6 | HI-2 | HT-4 | HT-8 | D | B-4 | ET-3 | EI-1 | 0.76 | 1.04 |
| 12-7 | HI-2 | HT-4 | HT-8 | D | A-13 | ET-3 | EI-1 | 0.81 | 1.68 |
| 12-8 | HI-2 | HT-4 | HT-8 | D | A-16 | ET-3 | EI-1 | 0.85 | 1.55 |
| 12-9 | HI-2 | HT-4 | HT-8 | D | A-25 | ET-3 | EI-1 | 0.78 | 1.73 |
| 12-10 | HI-2 | HT-4 | HT-8 | D | A-26 | ET-3 | EI-1 | 0.74 | 1.32 |
| 12-11 | HI-2 | HT-4 | HT-8 | D | A-36 | ET-3 | EI-1 | 0.74 | 1.65 |
| 12-12 | HI-2 | HT-4 | HT-8 | D | A-50 | ET-3 | EI-1 | 0.76 | 1.40 |
| 12-13 | HI-2 | HT-4 | HT-8 | D | A-86 | ET-3 | EI-1 | 0.77 | 1.39 |
| 12-14 | HI-2 | HT-4 | HT-8 | D | A-95 | ET-3 | EI-1 | 0.79 | 1.43 |
| 12-15 | HI-2 | HT-4 | HT-8 | D | B-13 | ET-3 | EI-1 | 0.79 | 1.15 |
| 12-16 | HI-2 | HT-4 | HT-8 | D | B-25 | ET-3 | EI-1 | 0.77 | 1.24 |
| 12-17 | HI-2 | HT-4 | HT-8 | D | B-36 | ET-3 | EI-1 | 0.77 | 1.18 |
| 12-18 | HI-2 | HT-4 | HT-8 | D | B-44 | ET-3 | EI-1 | 0.79 | 1.05 |

Example 14

Fabrication of Comparative Devices C14-1 and C14-2, and Invention Devices 14-1 to 14-13

In a similar manner to that employed for Comparative device C1-1 except that the constitution of each layer was changed to that described in Table 17 and the third layer was not formed, Comparative devices C14-1 and C14-2, and Invention devices 14-1 to 14-13 were fabricated and evaluated. The devices thus obtained each emitted phosphorescence derived from the light emitting material used for the fabrication. The results are collectively shown in Table 17.

TABLE 17

| Device | First layer | Second layer | Fourth layer: Light emitting material | Fourth layer: Host material | Fifth layer | Sixth layer | Relative drive voltage | Relative durability |
|---|---|---|---|---|---|---|---|---|
| C14-1 | HT-4 | HT-3 | D | Comparative compound 1 | ET-2 | EI-1 | 1.00 | 1.00 |
| C14-2 | HT-4 | HT-3 | D | Comparative compound 2 | ET-2 | EI-1 | 0.96 | 0.96 |

TABLE 17-continued

| Device | First layer | Second layer | Fourth layer: Light emitting material | Fourth layer: Host material | Fifth layer | Sixth layer | Relative drive voltage | Relative durability |
|---|---|---|---|---|---|---|---|---|
| 14-1 | HT-4 | HT-3 | D | C-1 | ET-2 | EI-1 | 0.81 | 1.99 |
| 14-2 | HT-4 | HT-3 | D | C-3 | ET-2 | EI-1 | 0.84 | 1.29 |
| 14-3 | HT-4 | HT-3 | D | C-4 | ET-2 | EI-1 | 0.79 | 1.08 |
| 14-4 | HT-4 | HT-3 | D | C-6 | ET-2 | EI-1 | 0.81 | 1.17 |
| 14-5 | HT-4 | HT-3 | D | C-18 | ET-2 | EI-1 | 0.82 | 2.11 |
| 14-6 | HT-4 | HT-3 | D | C-21 | ET-2 | EI-1 | 0.79 | 1.11 |
| 14-7 | HT-4 | HT-3 | D | C-26 | ET-2 | EI-1 | 0.80 | 2.23 |
| 14-8 | HT-4 | HT-3 | D | C-34 | ET-2 | EI-1 | 0.84 | 2.14 |
| 14-9 | HT-4 | HT-3 | D | C-35 | ET-2 | EI-1 | 0.77 | 2.04 |
| 14-10 | HT-4 | HT-3 | D | C-42 | ET-2 | EI-1 | 0.81 | 2.01 |
| 14-11 | HT-4 | HT-3 | D | C-44 | ET-2 | EI-1 | 0.86 | 1.89 |
| 14-12 | HT-4 | HT-3 | D | C-101 | ET-2 | EI-1 | 0.83 | 1.84 |
| 14-13 | HT-4 | HT-3 | D | D1 | ET-2 | EI-1 | 0.81 | 1.32 |

Examples 15 and 16

In a similar manner to that employed for Comparative device C1-1 except that the constitution of each layer was changed to that described in Tables 18 and 19 and the third layer was not formed, devices described in Tables 18 and 19 were fabricated and evaluated. The devices thus obtained emitted phosphorescence derived from the light emitting materials used for the fabrication. The results are collectively shown in Tables 18 and 19.

Examples 17-25

In a similar manner to that employed for Comparative device C1-1 except that the constitution of each layer was changed to that described in Tables 20 to 28, the devices shown in Tables 20 to 28 were fabricated and evaluated. The devices thus obtained each emitted phosphorescence derived from the light emitting material used for the fabrication. The results are collectively shown in Tables 20 to 28.

TABLE 18

| Device | First layer | Second layer | Fourth layer: Light emitting material | Fourth layer: Host material | Fifth layer | Sixth layer | Relative drive voltage | Relative durability |
|---|---|---|---|---|---|---|---|---|
| C15-1 | HI-4 | HT-6 | D | Comparative compound 2 | EI-1 | EI-1 | 1.00 | 1.00 |
| 15-1 | HI-4 | HT-6 | D | C-2 | EI-1 | EI-1 | 0.87 | 1.41 |
| 15-2 | HI-4 | HT-6 | D | C-5 | EI-1 | EI-1 | 0.84 | 1.08 |
| 15-3 | HI-4 | HT-6 | D | C-7 | EI-1 | EI-1 | 0.88 | 1.27 |
| 15-4 | HI-4 | HT-6 | D | C-8 | EI-1 | EI-1 | 0.84 | 1.53 |
| 15-5 | HI-4 | HT-6 | D | C-9 | EI-1 | EI-1 | 0.81 | 1.13 |

TABLE 19

| Device | First layer | Second layer | Fourth layer: Light emitting material | Fourth layer: Host material | Fifth layer | Sixth layer | Relative drive voltage | Relative durability |
|---|---|---|---|---|---|---|---|---|
| C16-1 | HI-4 | HT-1 | E | Comparative compound 1 | EI-1 | EI-1 | 1.00 | 1.00 |
| 16-1 | HI-4 | HT-1 | E | A-1 | EI-1 | EI-1 | 0.84 | 2.32 |
| 16-2 | HI-4 | HT-1 | E | A-4 | EI-1 | EI-1 | 0.82 | 2.04 |
| 16-3 | HI-4 | HT-1 | E | A-13 | EI-1 | EI-1 | 0.83 | 2.41 |
| 16-4 | HI-4 | HT-1 | E | A-25 | EI-1 | EI-1 | 0.79 | 2.57 |
| 16-5 | HI-4 | HT-1 | E | B-1 | EI-1 | EI-1 | 0.73 | 1.40 |
| 16-6 | HI-4 | HT-1 | E | B-49 | EI-1 | EI-1 | 0.70 | 1.27 |
| 16-7 | HI-4 | HT-1 | E | C-1 | EI-1 | EI-1 | 0.75 | 2.59 |
| 16-8 | HI-4 | HT-1 | E | C-9 | EI-1 | EI-1 | 0.76 | 1.34 |
| 16-9 | HI-4 | HT-1 | E | C-18 | EI-1 | EI-1 | 0.73 | 2.61 |
| 16-10 | HI-4 | HT-1 | E | C-35 | EI-1 | EI-1 | 0.73 | 2.83 |

TABLE 20

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| C17-1 | HI-2 | HT-1 | C-1 | F | Comparative compound 7 | ET-3 | EI-1 | 1.00 | 1.00 |
| 17-1 | HI-2 | HT-1 | C-1 | F | C-1 | ET-3 | EI-1 | 0.67 | 1.32 |
| 17-2 | HI-2 | HT-1 | C-1 | F | C-26 | ET-3 | EI-1 | 0.65 | 6.74 |
| 17-3 | HI-2 | HT-1 | C-1 | F | C-44 | ET-3 | EI-1 | 0.71 | 5.38 |

TABLE 21

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| C18-1 | HI-3 | HT-1 | C-1 | H | Comparative compound 1 | ET-3 | EI-1 | 1.00 | 1.00 |
| 18-1 | HI-3 | HT-1 | C-1 | H | A-1 | ET-3 | EI-1 | 0.79 | 2.84 |
| 18-2 | HI-3 | HT-1 | C-1 | H | A-55 | ET-3 | EI-1 | 0.84 | 2.43 |
| 18-3 | HI-3 | HT-1 | C-1 | H | B-49 | ET-3 | EI-1 | 0.84 | 1.54 |

TABLE 22

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| C19-1 | HI-3 | HT-1 | HT-9 | I | Comparative compound 3 | ET-3 | EI-1 | 1.00 | 1.00 |
| 19-1 | HI-3 | HT-1 | HT-9 | I | A-6 | ET-3 | EI-1 | 0.72 | 3.78 |
| 19-2 | HI-3 | HT-1 | HT-9 | I | A-49 | ET-3 | EI-1 | 0.78 | 3.51 |
| 19-3 | HI-3 | HT-1 | HT-9 | I | B-94 | ET-3 | EI-1 | 0.76 | 1.88 |

TABLE 23

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| 20-1 | HI-1 | HT-1 | HT-8 | J | A-16 | ET-1 | EI-1 | 0.97 | 1.08 |
| 20-2 | HI-1 | HT-1 | HT-8 | J | A-25 | ET-1 | EI-1 | 0.91 | 1.10 |
| 20-3 | HI-1 | HT-1 | HT-8 | J | A-86 | ET-1 | EI-1 | 1.00 | 1.00 |

TABLE 24

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| 21-1 | HT-4 | HT-1 | HT-9 | K | C-21 | ET-1 | EI-1 | 1.00 | 1.00 |
| 21-2 | HT-4 | HT-1 | HT-9 | K | C-26 | ET-1 | EI-1 | 0.99 | 1.95 |
| 21-3 | HT-4 | HT-1 | HT-9 | K | C-34 | ET-1 | EI-1 | 1.02 | 1.86 |

TABLE 25

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| 22-1 | HT-4 | HT-1 | HT-9 | L | C-9 | ET-3 | EI-1 | 0.96 | 1.24 |
| 22-2 | HT-4 | HT-1 | HT-9 | L | D-1 | ET-3 | EI-1 | 0.97 | 1.21 |
| 22-3 | HT-4 | HT-1 | HT-9 | L | D-81 | ET-3 | EI-1 | 1.00 | 1.00 |

TABLE 26

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| 23-1 | HT-4 | HT-1 | HT-9 | M | C-35 | ET-1 | EI-1 | 0.98 | 1.11 |
| 23-2 | HT-4 | HT-1 | HT-9 | M | C-42 | ET-1 | EI-1 | 1.03 | 1.02 |
| 23-3 | HT-4 | HT-1 | HT-9 | M | C-44 | ET-1 | EI-1 | 1.00 | 1.00 |

TABLE 27

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| 24-1 | HI-3 | HT-2 | HT-8 | N | A-5 | ET-3 | EI-1 | 1.00 | 1.00 |
| 24-2 | HI-3 | HT-2 | HT-8 | N | A-29 | ET-3 | EI-1 | 0.95 | 1.12 |
| 24-3 | HI-3 | HT-2 | HT-8 | N | A-142 | ET-3 | EI-1 | 0.98 | 1.05 |

TABLE 28

| Device | First layer | Second layer | Third layer | Fourth layer: Light emitting material | Fourth layer: Host material | Fifth layer | Sixth layer | Relative drive voltage | Relative durability |
|---|---|---|---|---|---|---|---|---|---|
| 25-1 | HT-4 | HT-2 | C-1 | O | C-1 | ET-1 | EI-1 | 0.75 | 1.62 |
| 25-2 | HT-4 | HT-2 | C-1 | P | C-1 | ET-1 | EI-1 | 0.89 | 1.75 |
| 25-3 | HT-4 | HT-2 | C-1 | Q | C-1 | ET-1 | EI-1 | 1.00 | 1.00 |

As is apparent from the above results, the devices of the invention are excellent in drive voltage and particularly excellent in durability compared with comparative devices.

Examples 26 to 30

In a similar manner to that employed for Comparative device C1-1 except that the constitution of each layer was changed to that described in Tables 29 to 33, devices shown in Tables 29 to 33 were fabricated and evaluated. The devices thus obtained each emitted phosphorescence derived from the light emitting material used for the fabrication. The results are collectively shown in Tables 29 to 33. In Comparative device C30-1 and Invention devices 30-1 to 30-4, the third layer was not formed.

(Evaluation of Performances of Organic Electroluminescent Devices)

(c) Drive Durability

A DC voltage was applied to each device to give a luminance of 300 cd/$m^2$ and time necessary for the luminance to decrease to 150 cd/$m^2$ was measured. This half period of luminance was designated as an indicator of evaluating drive durability.

(d) Initial Durability

A DC voltage was applied to each device to give a luminance of 300 cd/$m^2$ and time necessary for the luminance to decrease to 270 cd/$m^2$ was measured. This 10% luminance reduction time was designated as an indicator of evaluating initial durability.

TABLE 29

| Device | First layer | Second layer | Third layer | Fourth layer: Light emitting material | Fourth layer: Host material | Fifth layer | Sixth layer | Relative durability | Relative initial durability |
|---|---|---|---|---|---|---|---|---|---|
| C26-1 | HI-3 | HT-1 | HT-9 | A | mCP | ET-3 | EI-1 | 1.00 | 1.00 |
| 26-1 | HI-3 | HT-1 | HT-9 | A | A-1 | ET-3 | EI-1 | 1.32 | 1.57 |
| 26-2 | HI-3 | HT-1 | HT-9 | A | A-13 | ET-3 | EI-1 | 1.45 | 1.85 |

TABLE 29-continued

| Device | First layer | Second layer | Third layer | Fourth layer: Light emitting material | Fourth layer: Host material | Fifth layer | Sixth layer | Relative durability | Relative initial durability |
|---|---|---|---|---|---|---|---|---|---|
| 26-3 | HI-3 | HT-1 | HT-9 | A | A-36 | ET-3 | EI-1 | 1.28 | 2.32 |
| 26-4 | HI-3 | HT-1 | HT-9 | A | A-86 | ET-3 | EI-1 | 1.20 | 1.42 |

TABLE 30

| Device | First layer | Second layer | Third layer | Fourth layer: Light emitting material | Fourth layer: Host material | Fifth layer | Sixth layer | Relative durability | Relative initial durability |
|---|---|---|---|---|---|---|---|---|---|
| C27-1 | HT-4 | HT-1 | HT-9 | A | mCBP | ET-3 | EI-1 | 1.00 | 1.00 |
| 27-1 | HT-4 | HT-1 | HT-9 | A | C-1 | ET-3 | EI-1 | 1.33 | 1.62 |
| 27-2 | HT-4 | HT-1 | HT-9 | A | C-18 | ET-3 | EI-1 | 1.30 | 1.70 |
| 27-3 | HT-4 | HT-1 | HT-9 | A | C-26 | ET-3 | EI-1 | 1.37 | 1.48 |
| 27-4 | HT-4 | HT-1 | HT-9 | A | C-35 | ET-3 | EI-1 | 1.44 | 1.55 |
| 27-5 | HT-4 | HT-1 | HT-9 | A | C-104 | ET-3 | EI-1 | 1.23 | 1.30 |

TABLE 31

| Device | First layer | Second layer | Third layer | Fourth layer: Light emitting material | Fourth layer: Host material | Fifth layer | Sixth layer | Relative durability | Relative initial durability |
|---|---|---|---|---|---|---|---|---|---|
| C28-1 | HI-2 | HT-1 | HT-9 | A | Comparative compound 6 | ET-3 | EI-1 | 1.00 | 1.00 |
| 28-1 | HI-2 | HT-1 | HT-9 | A | C-7 | ET-3 | EI-1 | 1.19 | 1.45 |
| 28-2 | HI-2 | HT-1 | HT-9 | A | C-117 | ET-3 | EI-1 | 1.12 | 1.29 |

TABLE 32

| Device | First layer | Second layer | Third layer | Fourth layer: Light emitting material | Fourth layer: Host material | Fifth layer | Sixth layer | Relative durability | Relative initial durability |
|---|---|---|---|---|---|---|---|---|---|
| C29-1 | HT-4 | HT-1 | HT-9 | G | mCBP | ET-3 | EI-1 | 1.00 | 1.00 |
| 29-1 | HT-4 | HT-1 | HT-9 | G | C-1 | ET-3 | EI-1 | 1.29 | 1.41 |
| 29-2 | HT-4 | HT-1 | HT-9 | G | C-18 | ET-3 | EI-1 | 1.21 | 1.38 |
| 29-3 | HT-4 | HT-1 | HT-9 | G | C-26 | ET-3 | EI-1 | 1.30 | 1.50 |
| 29-4 | HT-4 | HT-1 | HT-9 | G | C-35 | ET-3 | EI-1 | 1.33 | 1.51 |
| 29-5 | HT-4 | HT-1 | HT-9 | G | C-44 | ET-3 | EI-1 | 1.18 | 1.27 |

TABLE 33

| Device | First layer | Second layer | Fourth layer: Light emitting material | Fourth layer: Host material | Fifth layer | Sixth layer | Relative durability | Relative initial durability |
|---|---|---|---|---|---|---|---|---|
| C30-1 | HI-3 | HT-1 | E | mCBP | ET-1 | EI-1 | 1.00 | 1.00 |
| 30-1 | HI-3 | HT-1 | E | C-1 | ET-1 | EI-1 | 1.20 | 1.40 |
| 30-2 | HI-3 | HT-1 | E | C-18 | ET-1 | EI-1 | 1.18 | 1.35 |
| 30-3 | HI-3 | HT-1 | E | C-26 | ET-1 | EI-1 | 1.22 | 1.31 |
| 30-4 | HT-4 | HT-1 | E | C-35 | ET-1 | EI-1 | 1.25 | 1.38 |

As is apparent from the above results, the devices of the invention are excellent in durability and particularly excellent in initial durability compared with the comparative devices.

The structures of the compounds used in Examples will next be shown.

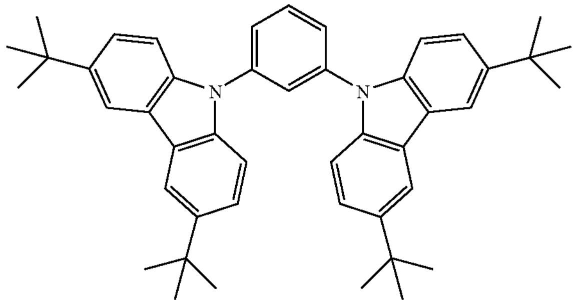

Comparative compound 1: Compound (1) described in Japanese Patent Laid-Open No. 2008-109103

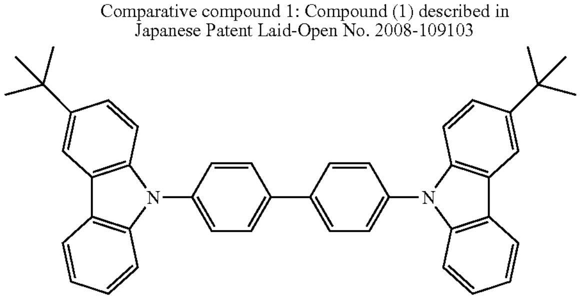

Comparative compound 2: Compound described in WO2004-101707

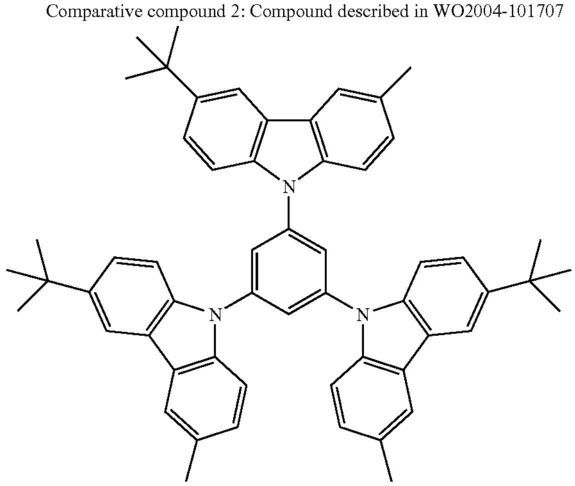

Comparative compound 3: Compound H-1 described in Japanese Patent Laid-Open No. 2003-335753

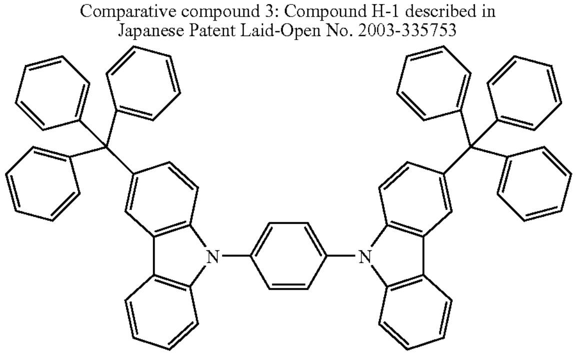

Comparative compound 4: Compound 31 described in Japanese Patent Laid-Open No. 2008-1621

-continued

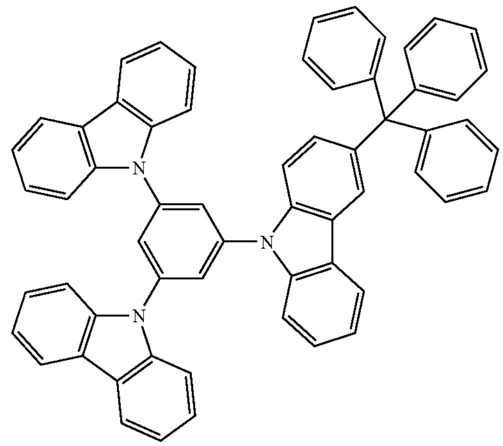

Comparative compound 5: Compound 29 described in Japanese Patent Laid-Open No. 2008-1621

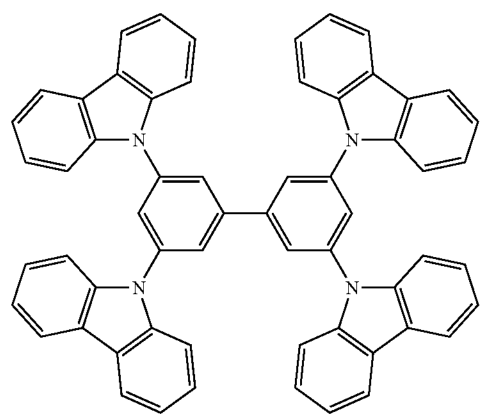

Comparative compound 6: Compound 1 described in Japanese Patent Laid-Open No. 2005-47811

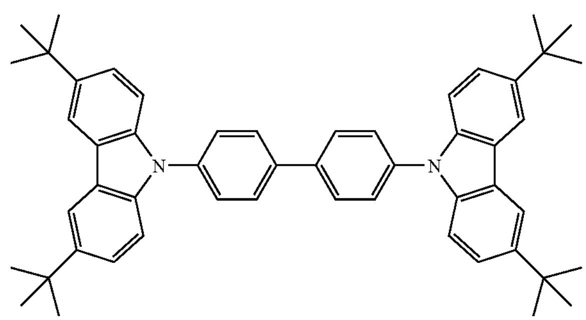

Comparative Example 7

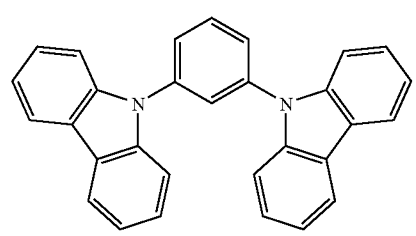

mCP

-continued
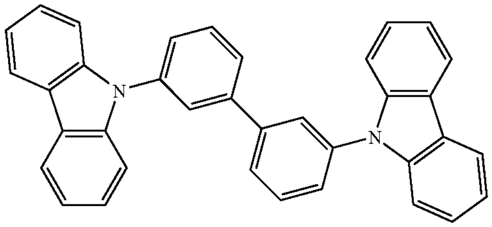
mCBP
Blue Phosphorescent Materials
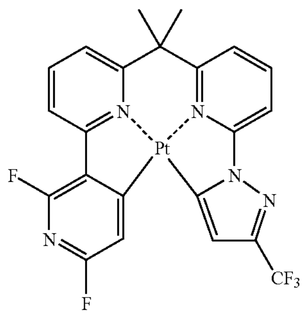
Light emitting material A
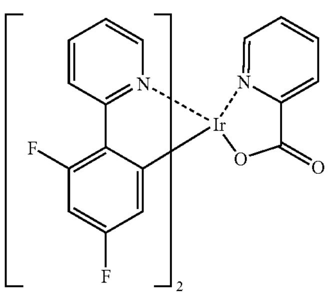
Lighting emitting material B
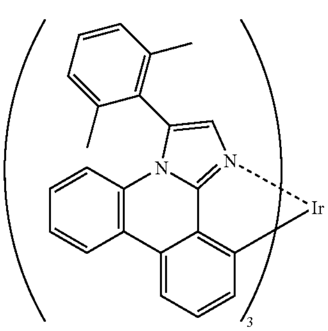
Lighting emitting material E
-continued
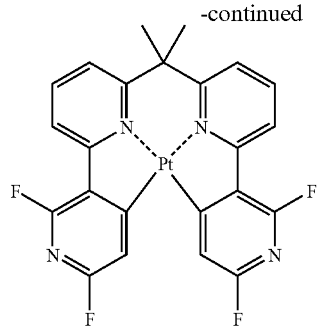
Light emitting material F
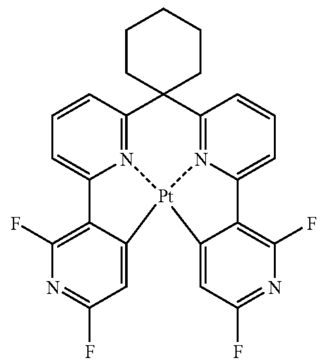
Light emitting material G
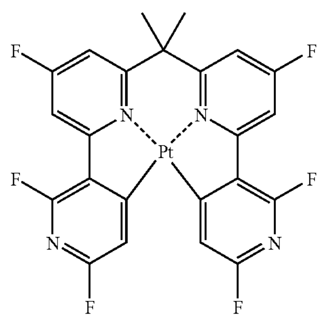
Light emitting material H
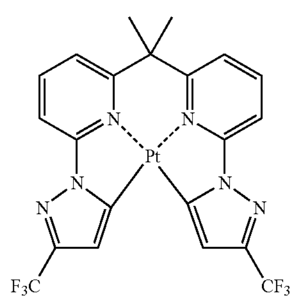
Light emitting material I Green Phosphorescent Materials
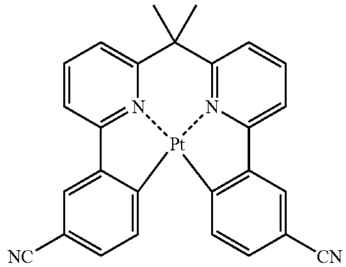
Light emitting material C
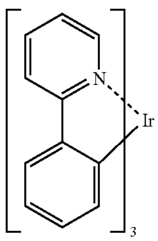
Light emitting material D
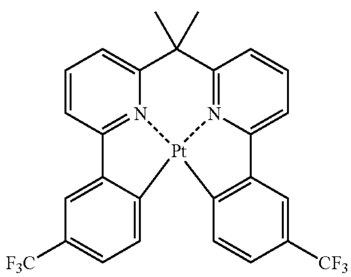
Light emitting material J
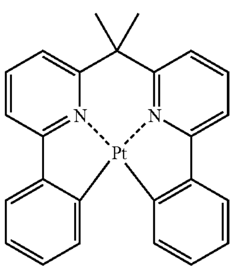
Light emitting material K
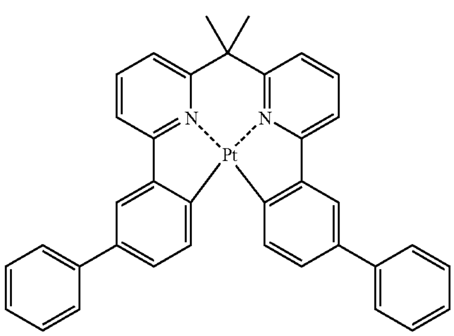
Light emitting material L
-continued
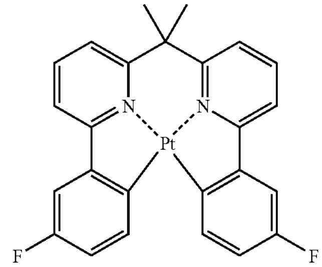
Light emitting material M
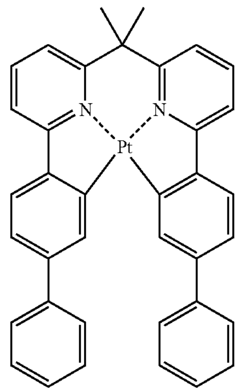
Light emitting material N
Red Phosphorescent Materials
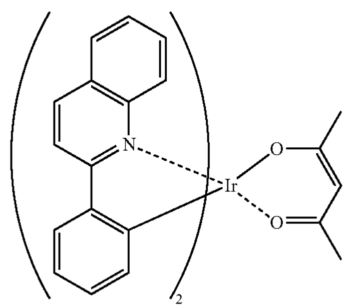
Lighting emitting material O
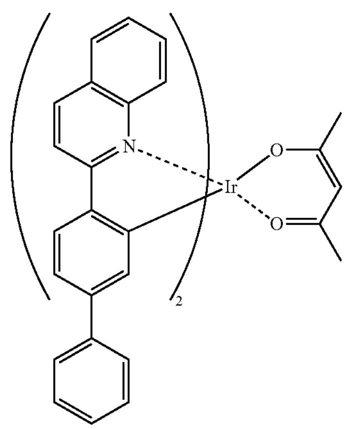
Lighting emitting material P -continued
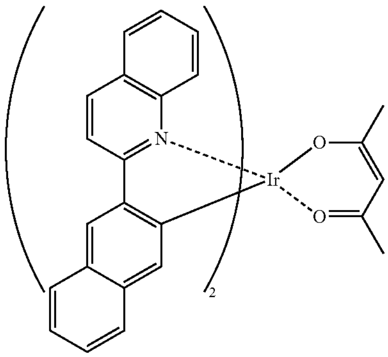
Lighting emitting material Q
Materials Used for Devices
HI-1
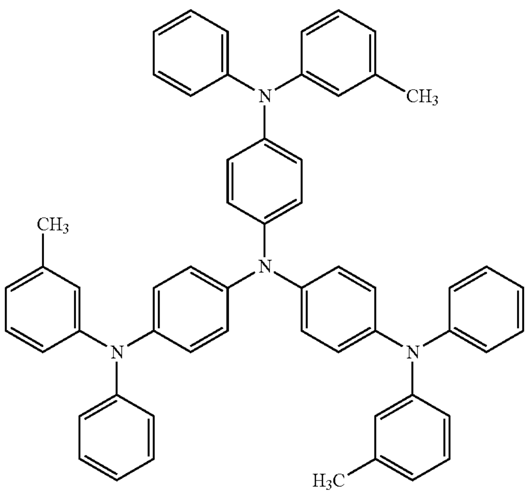
HI-2
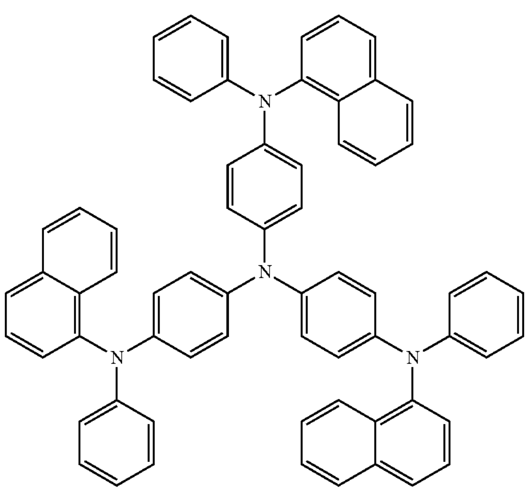
-continued
HI-3
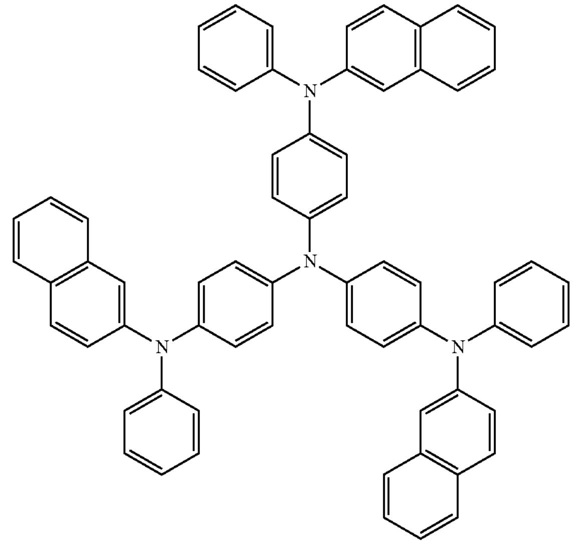
HI-4
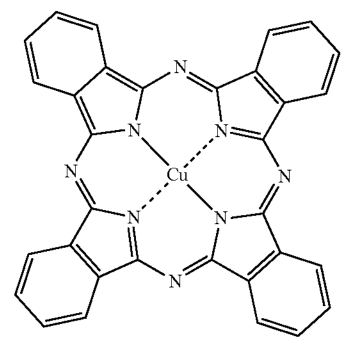
F4TCNQ
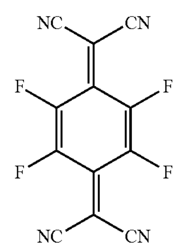
HT-1
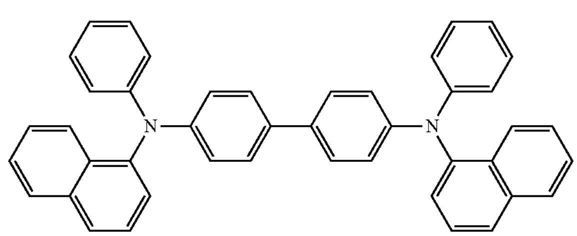

-continued
HT-2
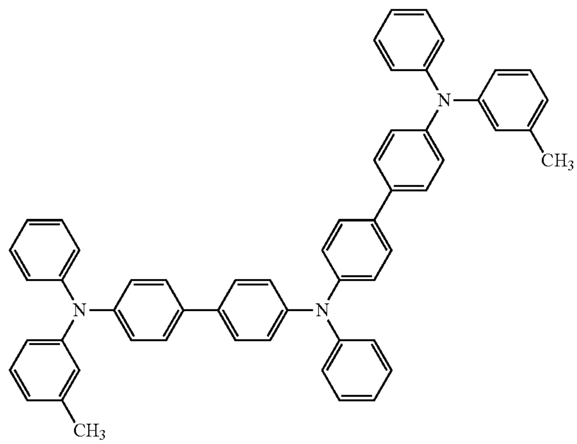
HT-3
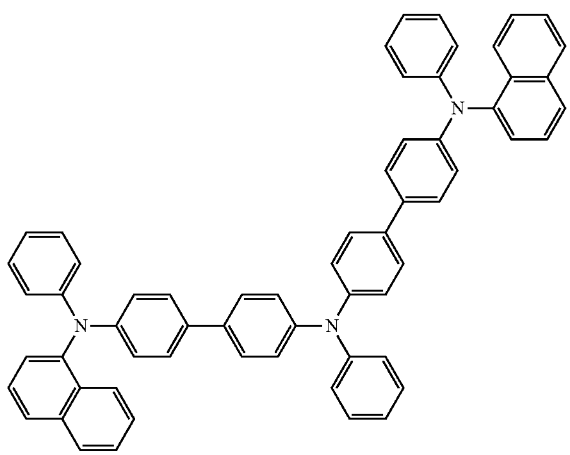
HT-4
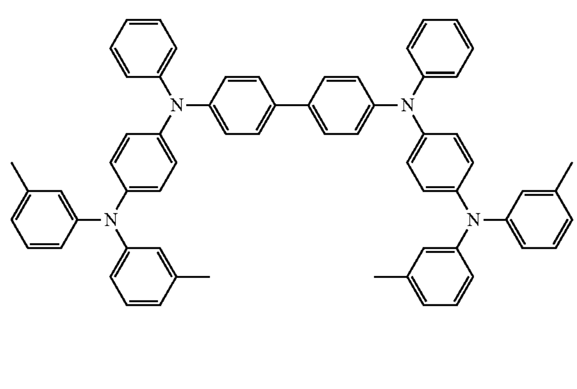
-continued
HT-5
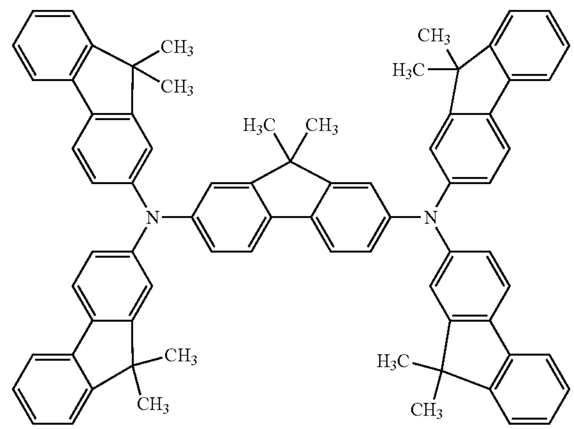
HT-6
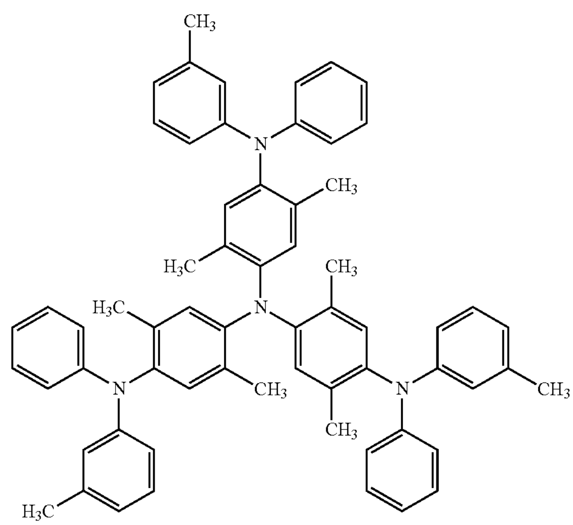
HT-7
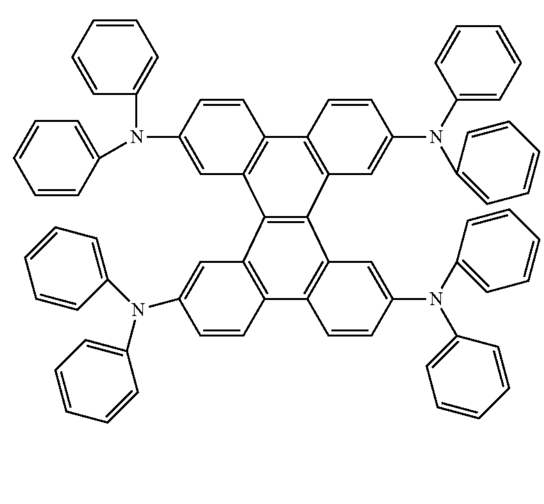

-continued
HT-8
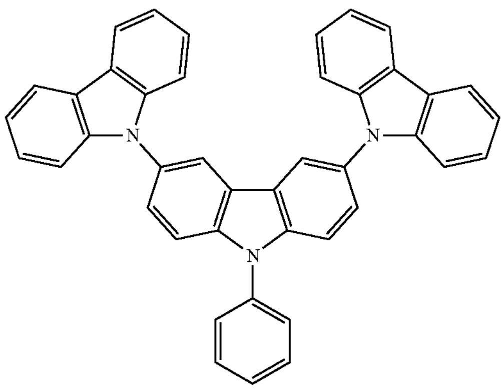
HT-9
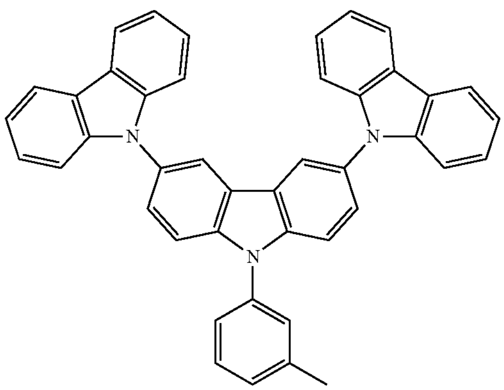
H-1
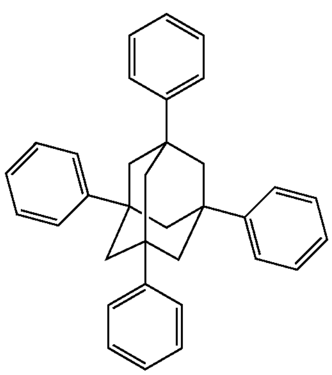
H-2
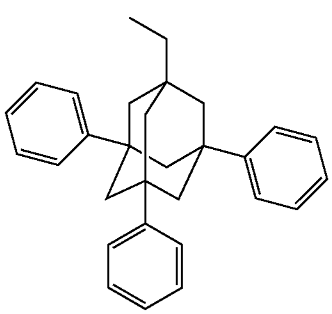
-continued
ET-1
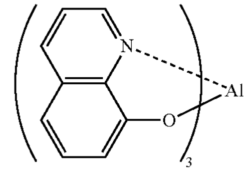
ET-2
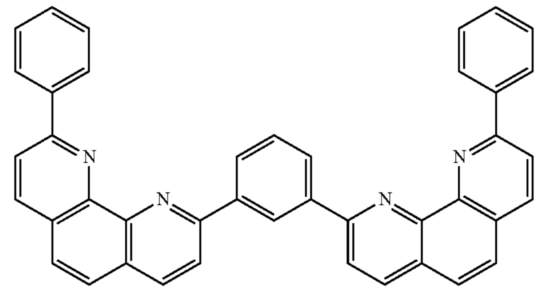
ET-3
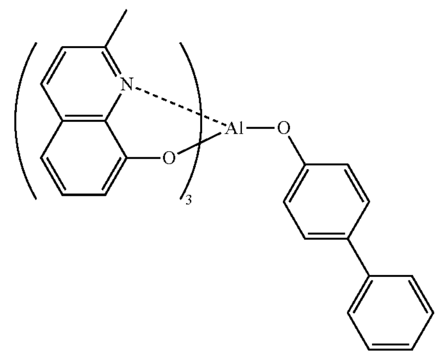
EI-1
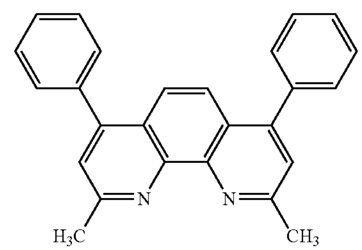
A-1
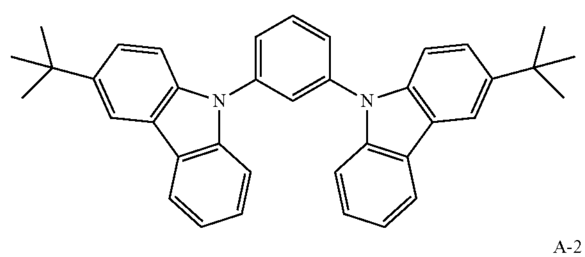
A-2
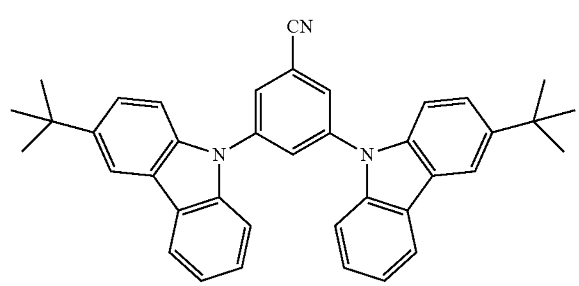

-continued
A-4
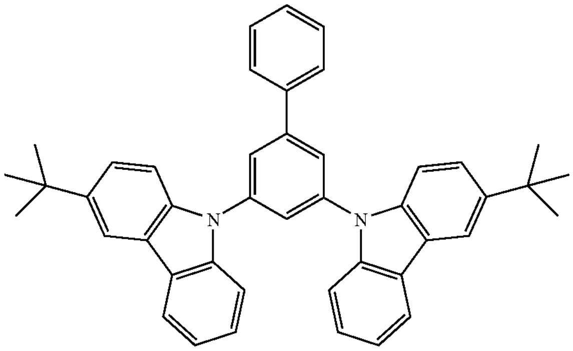
A-5
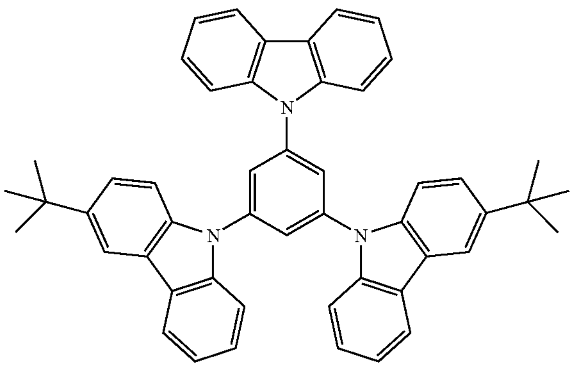
A-6
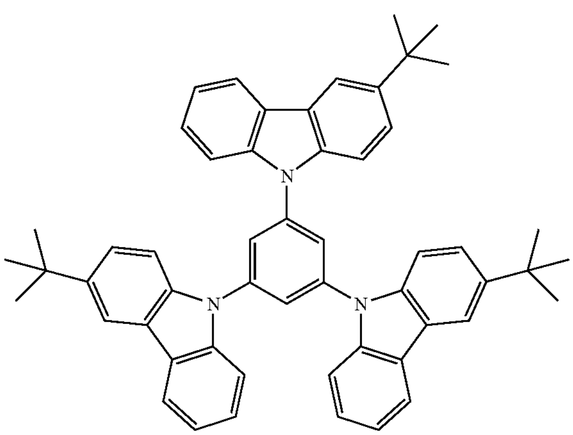
A-13
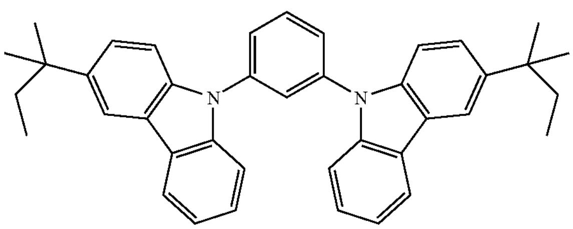
-continued
A-16
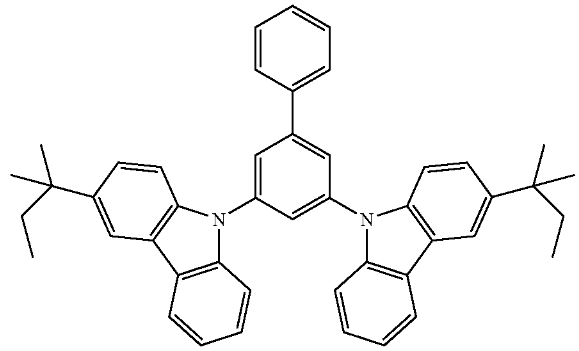
A-18
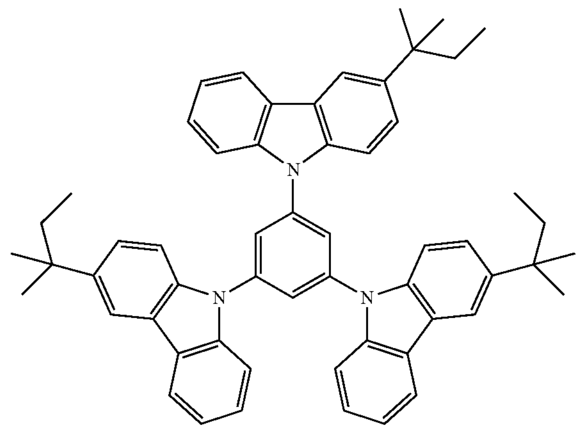
A-25
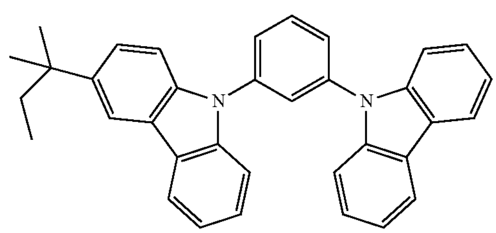
A-26
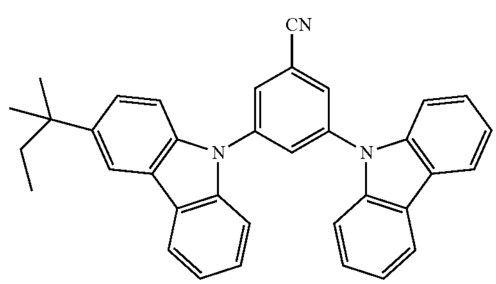

-continued
A-29
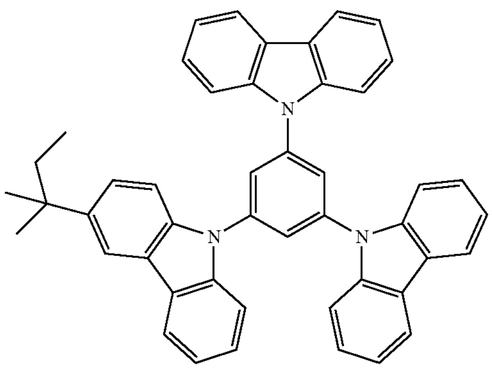
A-36
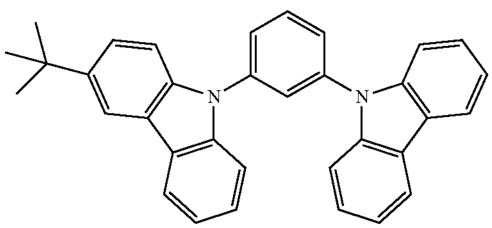
A-39
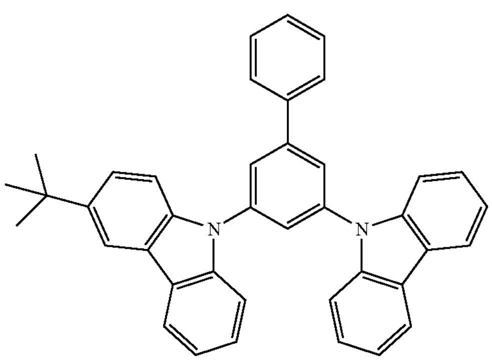
A-40
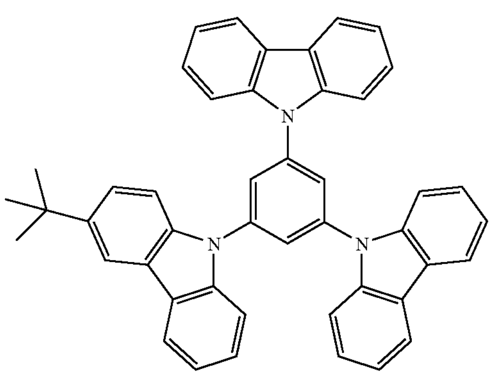
-continued
A-49
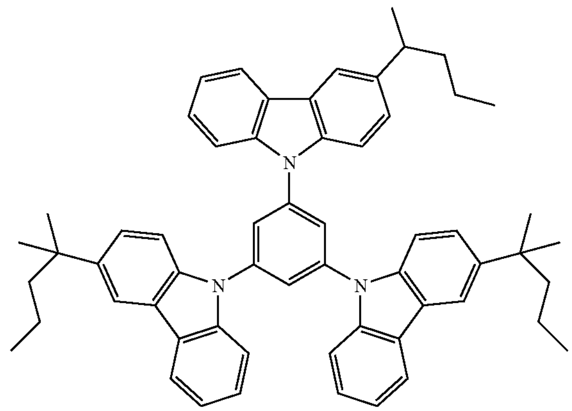
A-50
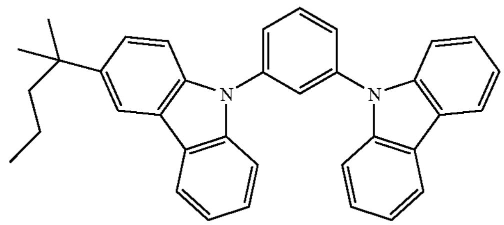
A-55
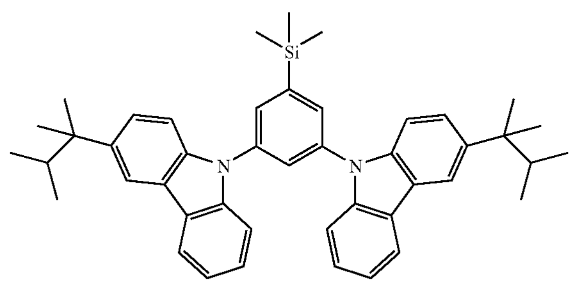
A-86
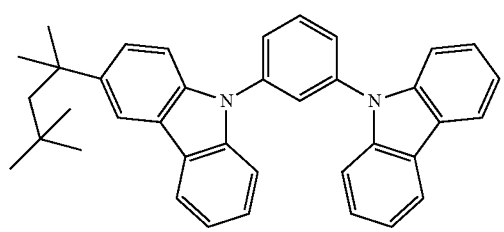
A-88
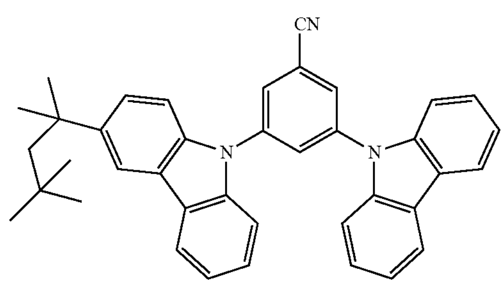

-continued
A-95
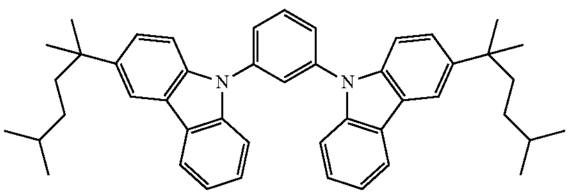
A-97
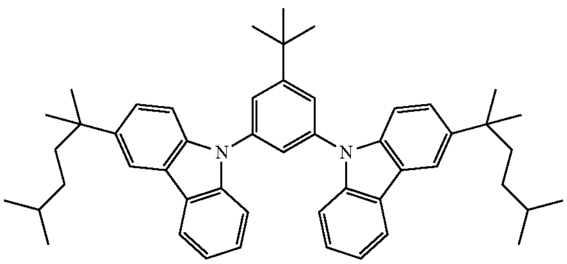
A-142
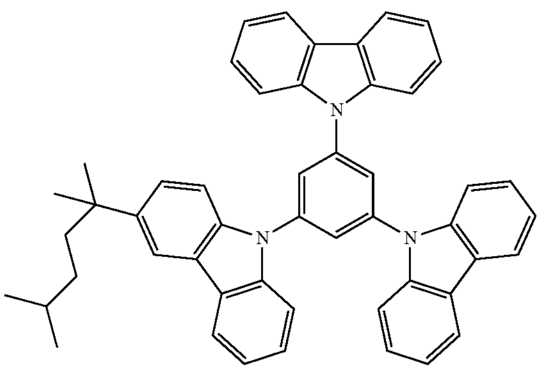
B-1
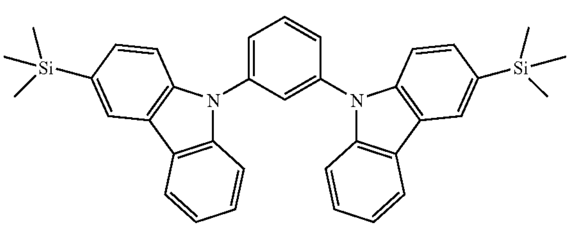
B-2
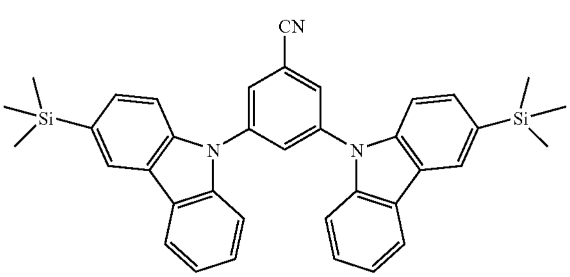
-continued
B-4
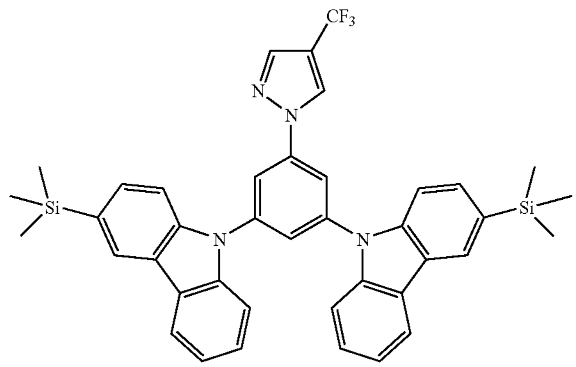
B-13
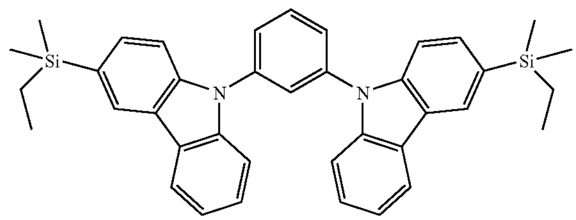
B-16
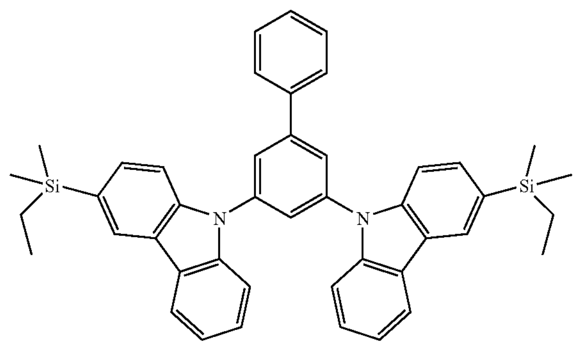
B-18
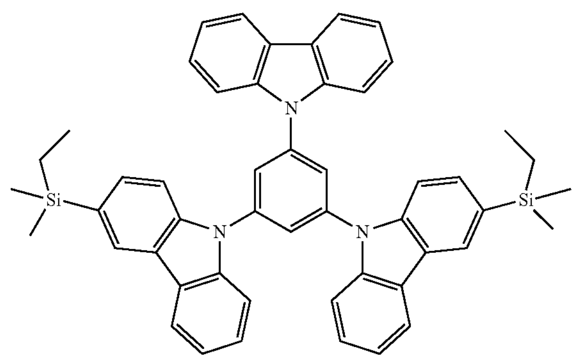
B-25
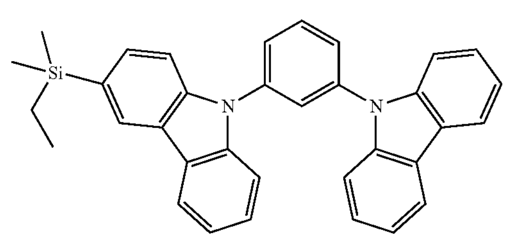

-continued
B-29
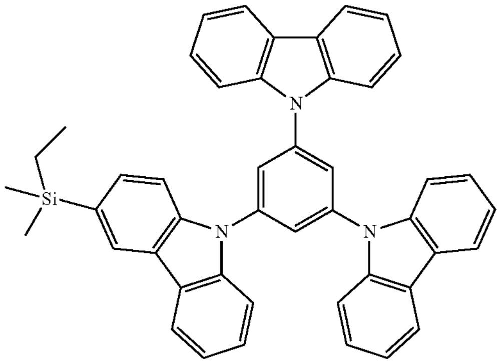
B-34
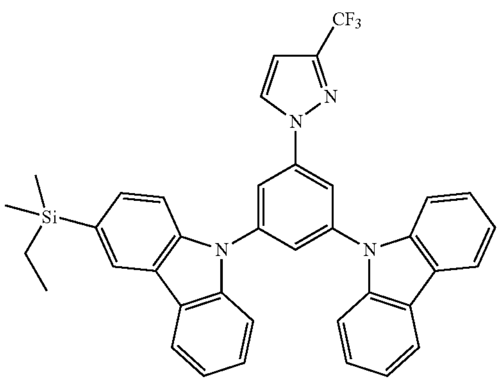
B-36
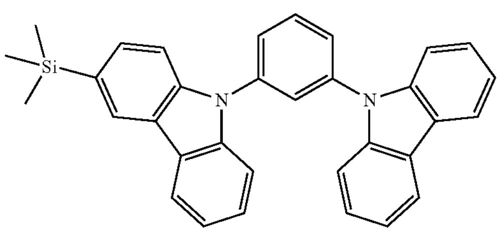
B-40
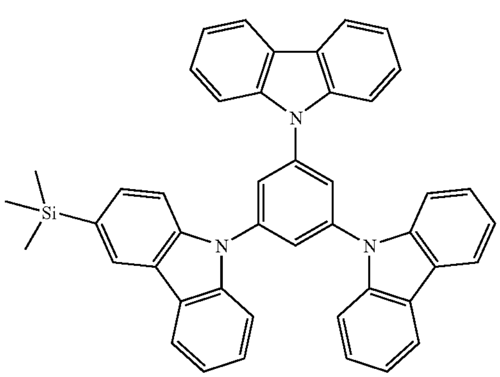
-continued
B-44
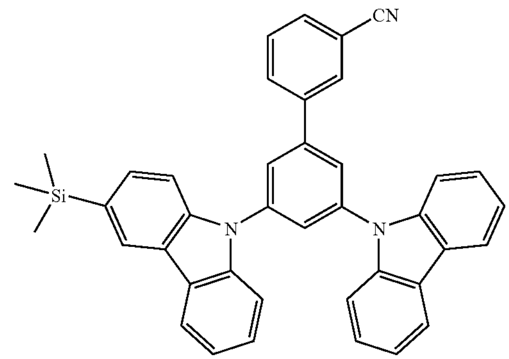
B-49
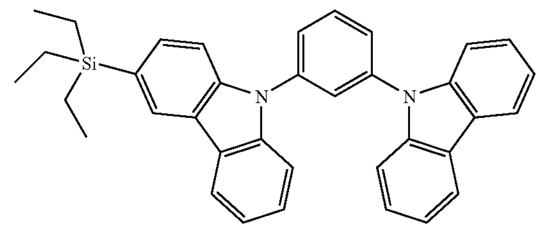
B-50
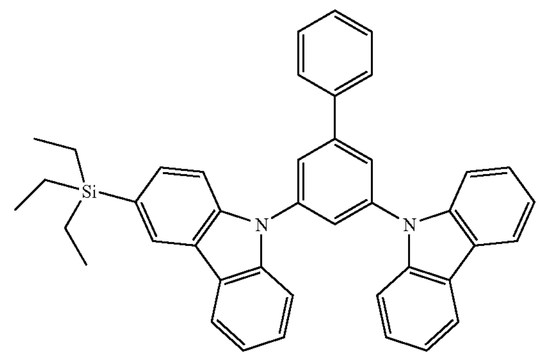
B-53
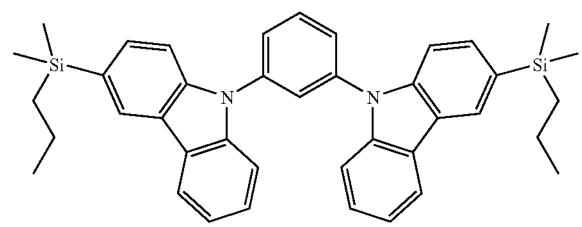
B-54
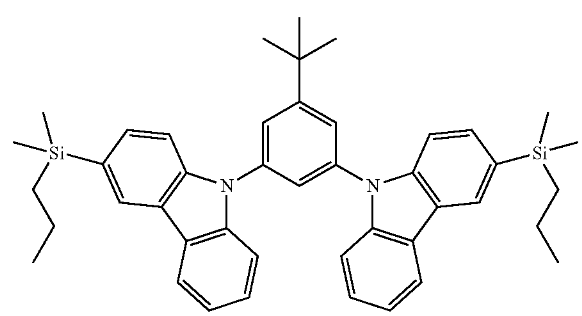

-continued
B-80
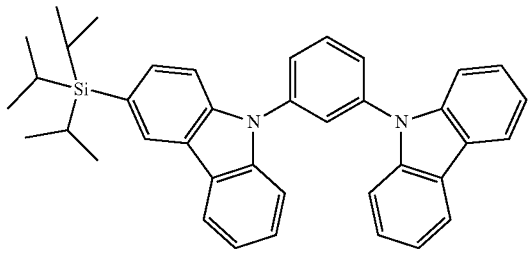
B-81
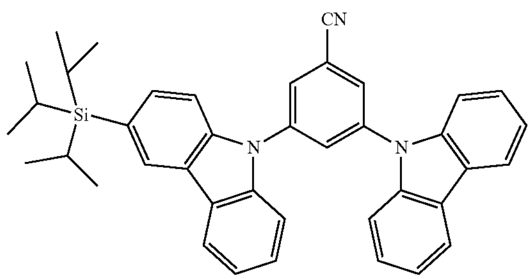
B-94
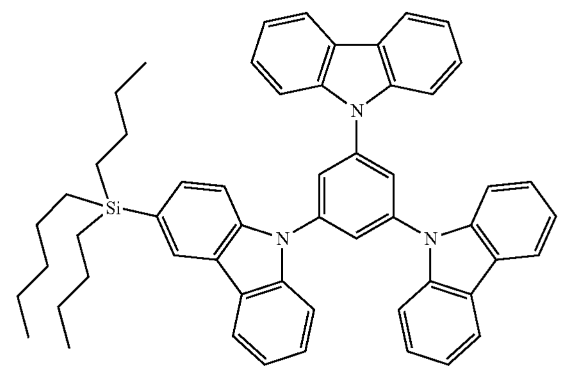
B-107
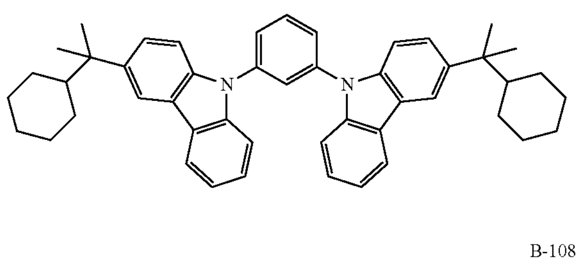
B-108
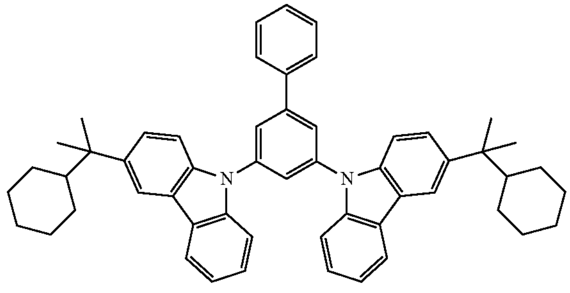
-continued
C-1
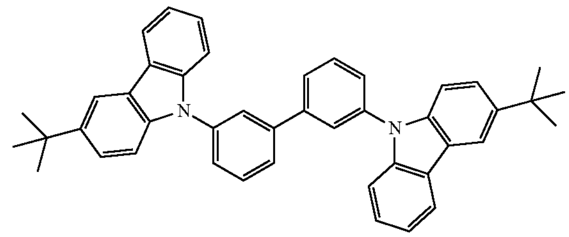
C-2
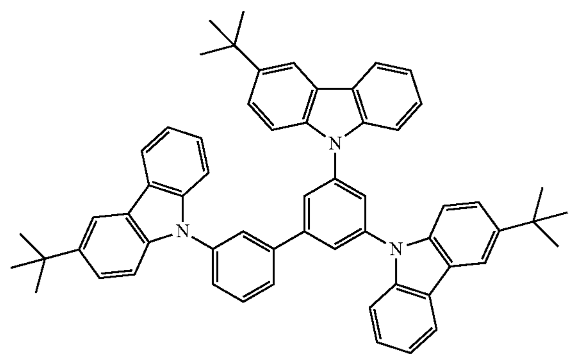
C-3
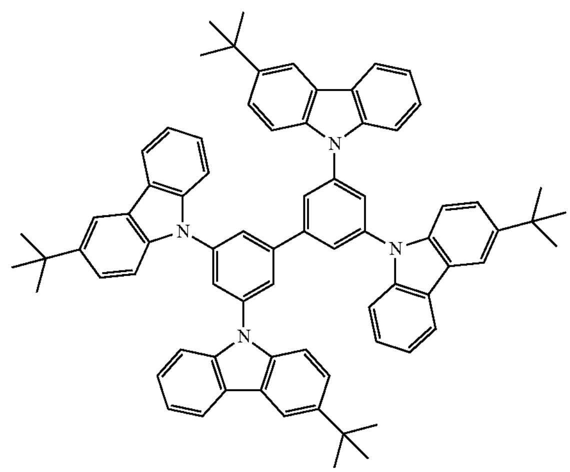
C-4
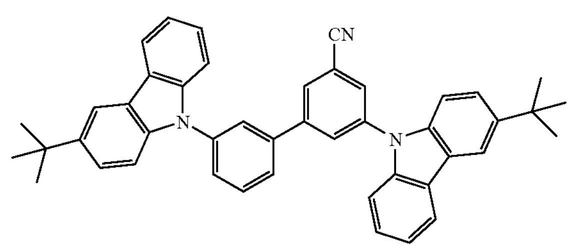
C-5
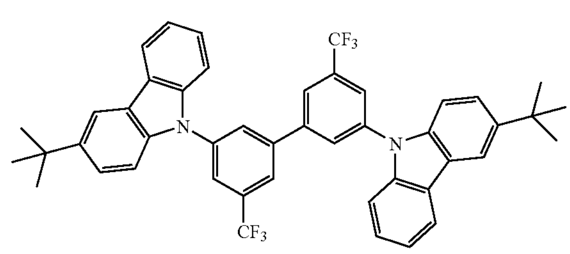

-continued
C-6
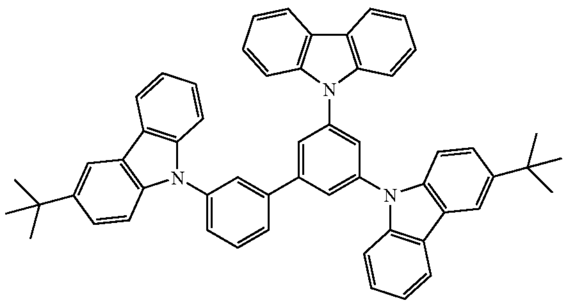
C-7
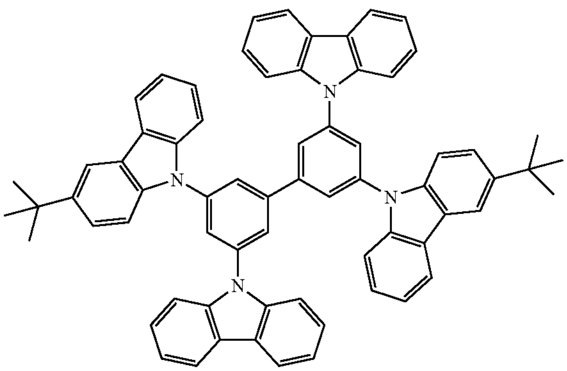
C-8
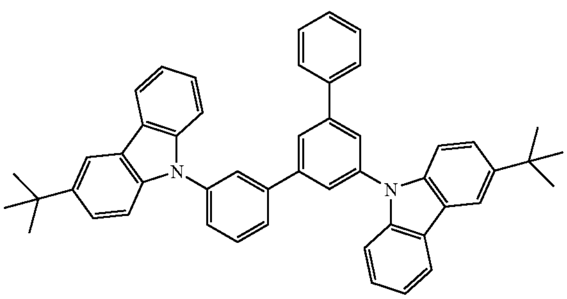
C-9
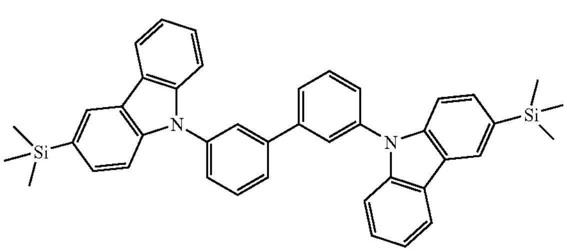
C-18
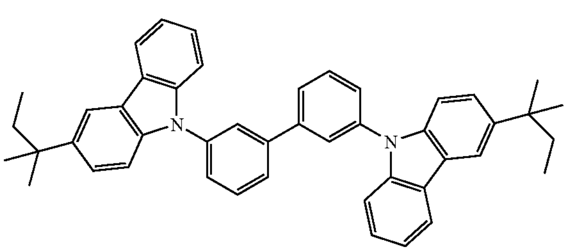
-continued
C-21
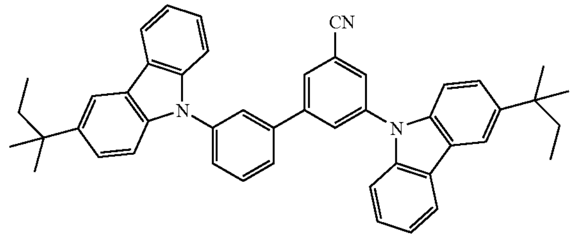
C-20
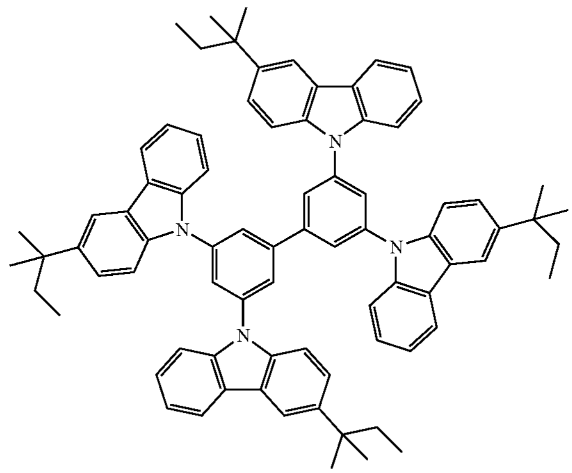
C-26
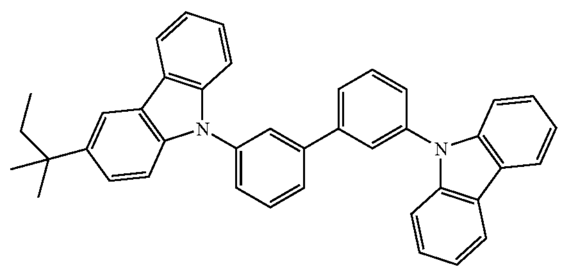
C-27
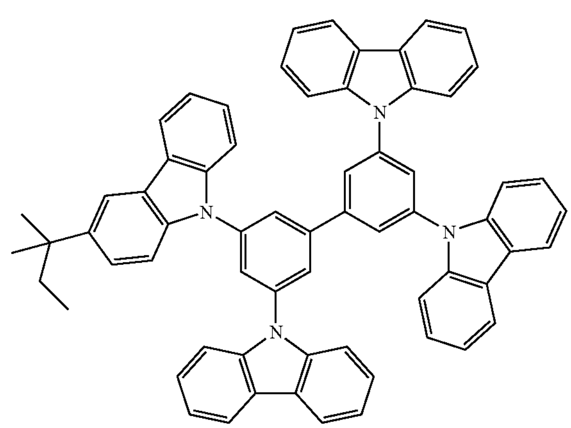

-continued
C-34
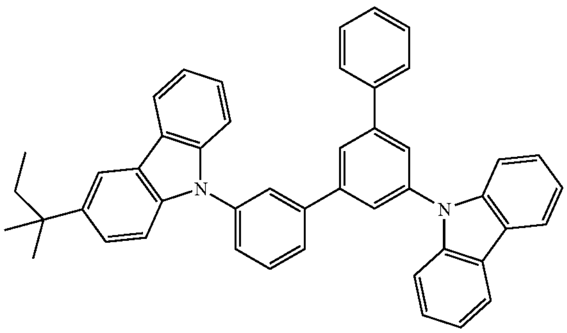
C-35
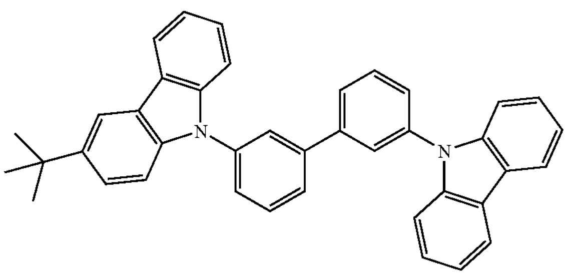
C-42
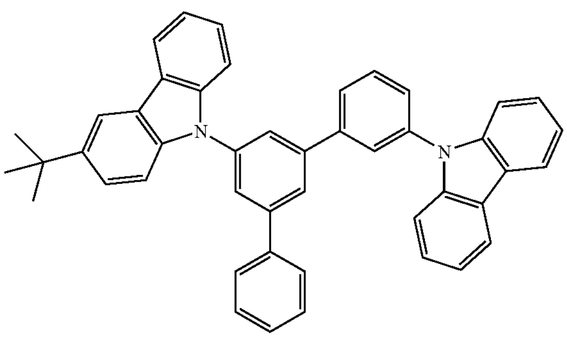
C-44
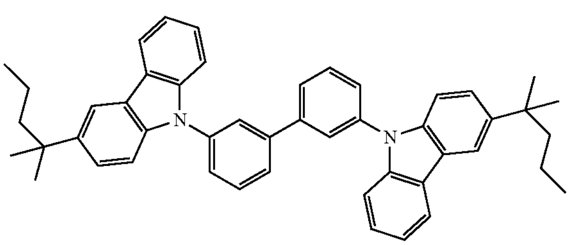
C-46
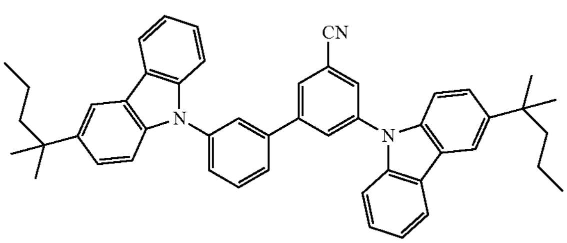
-continued
C-63
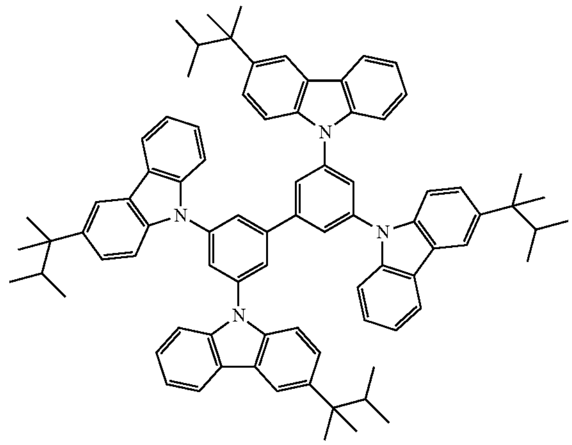
C-101
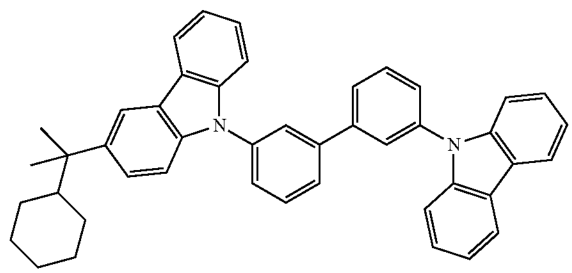
C-103
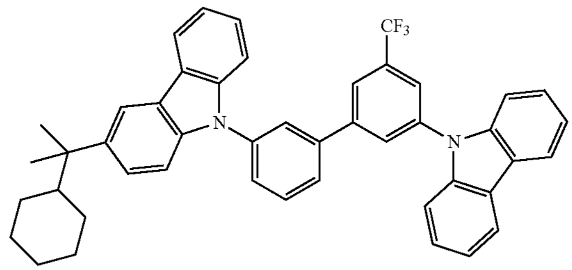
C-104
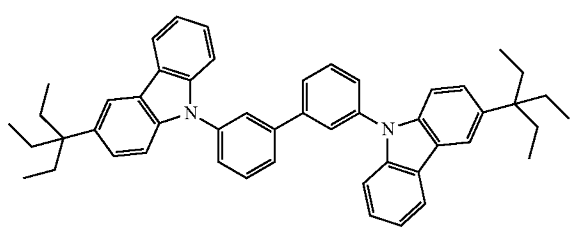
C-106
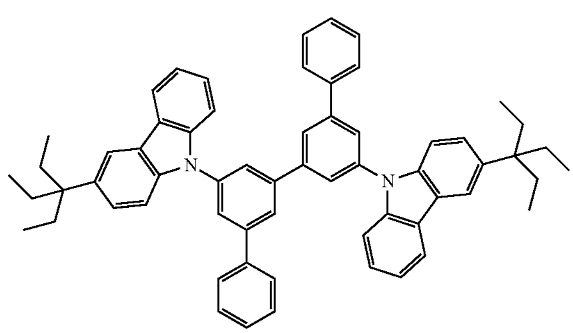

-continued
C-117
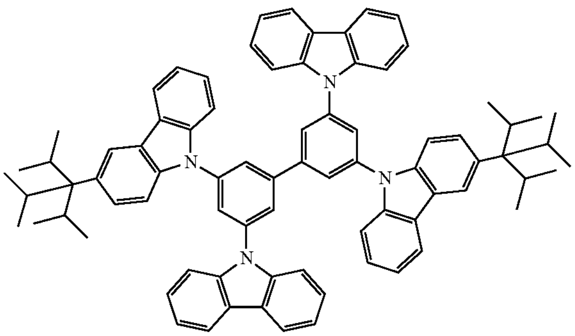
C-137
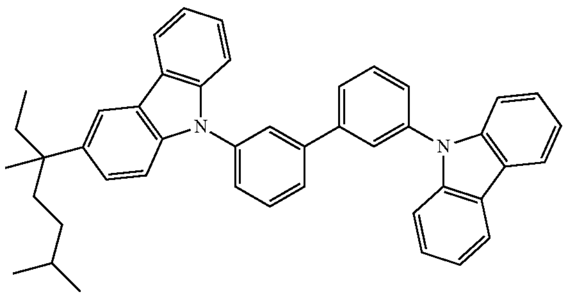
D-1
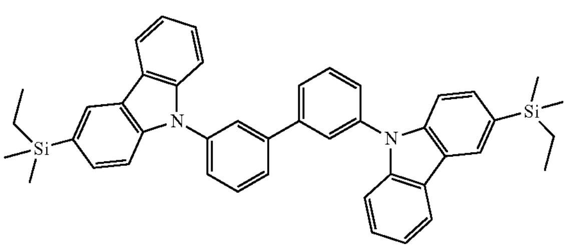
D-4
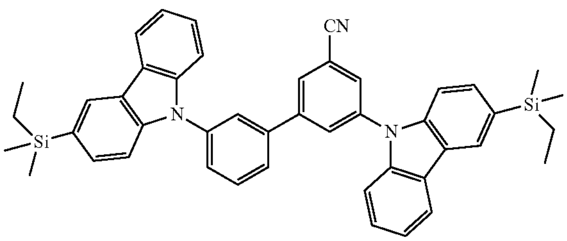
D-8
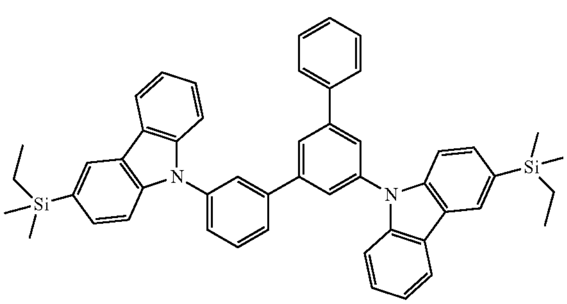
-continued
D-9
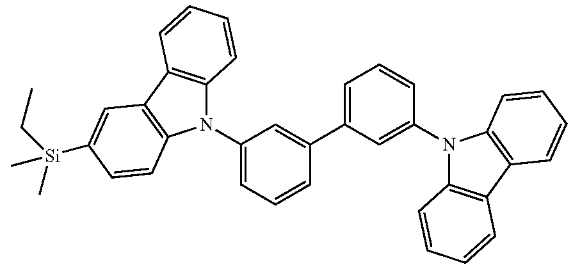
D-18
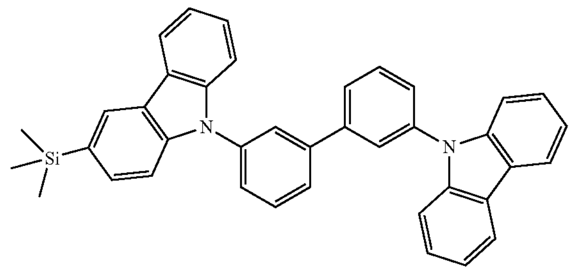
D-81
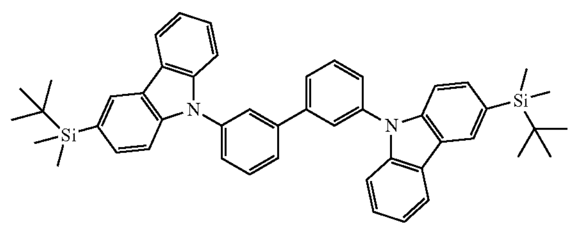
D-40
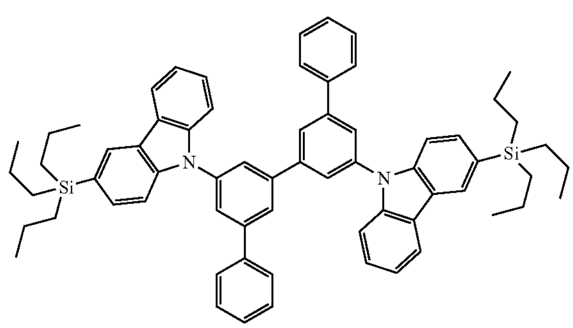
E-2
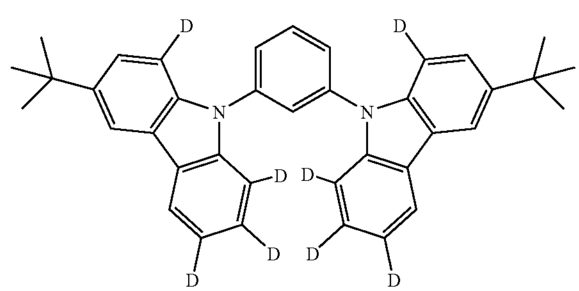

-continued

E-9

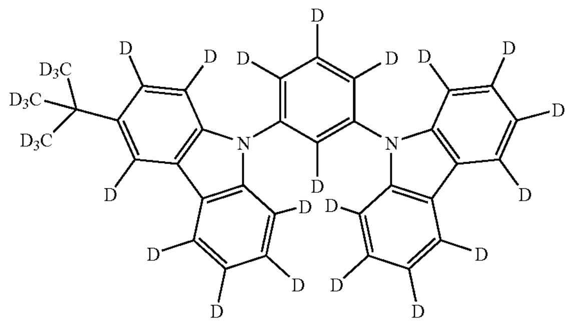

F-2

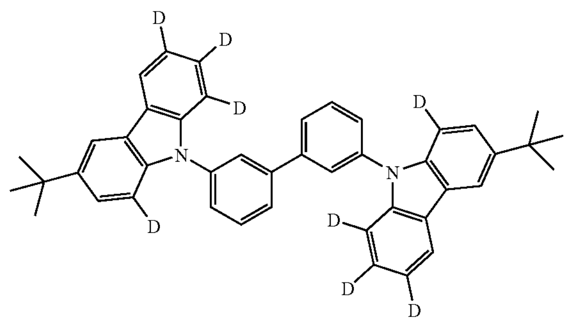

F-4

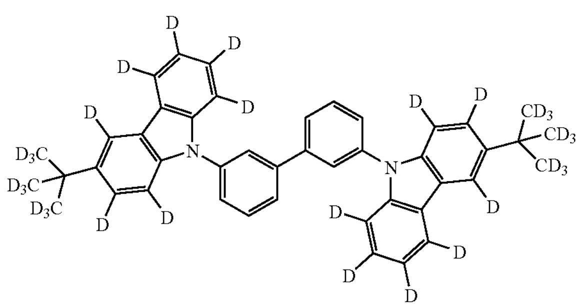

F-8

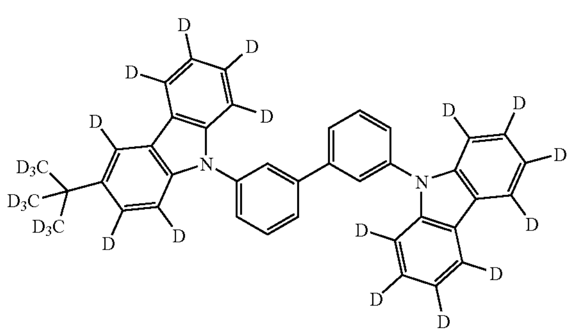

What is claimed is:

1. An organic electroluminescent device comprising:

a pair of electrodes;

an organic layer including a light emitting layer between the electrodes, wherein the organic layer contains a compound represented by formula (V):

(V)

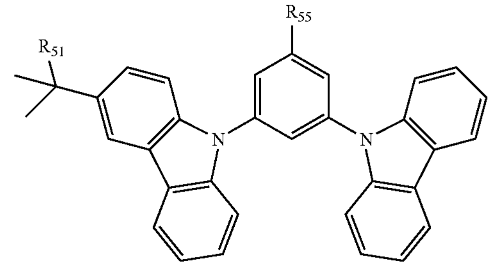

wherein $R_{51}$ represents a methyl or ethyl group and $R_{55}$ represents a hydrogen atom, a substituted or unsubstituted alkyl group, a cyano group, a substituted or unsubstituted aryl group, or a substituted or unsubstituted heteroaryl group.

2. The organic electroluminescent device according to claim 1, wherein $R_{55}$ is a hydrogen atom.

3. The organic electroluminescent device according to claim 1, wherein the compound represented by formula (V) has $T_1$ of 61 kcal/mol or greater.

4. The organic electroluminescent device according to claim 1, wherein the compound represented by formula (V) has a molecular weight of from 450 to 1200.

5. The organic electroluminescent device according to claim 1, wherein the light emitting layer further contains at least one phosphorescent metal complex containing a metal having an atomic weight of 40 or greater and a monoanionic bidentate ligand represented by one of formulae (A1) to (A4):

A1

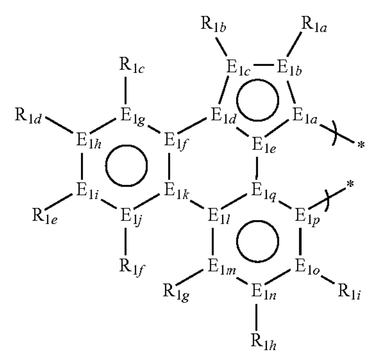

A2

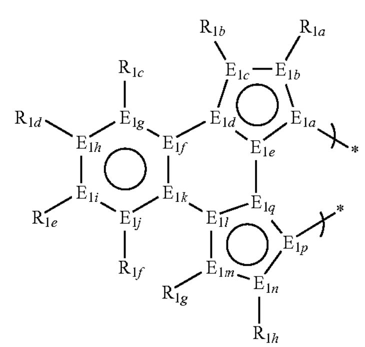

-continued

A3

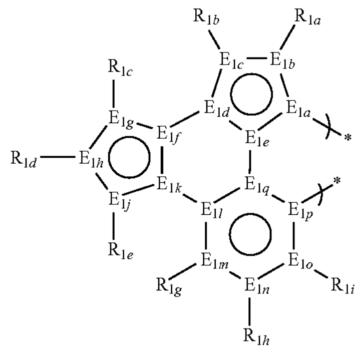

A4

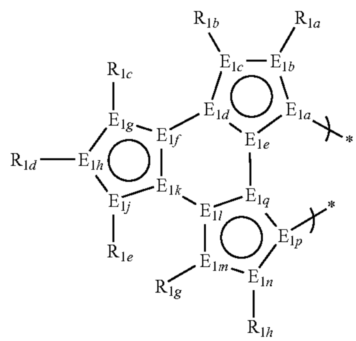

wherein $E_{1a}$ to $E_{1q}$ each independently represents a carbon atom or a hetero atom, $R_{1a}$ to $R_{1i}$ each independently represents a hydrogen atom or a substituent, and skeletons represented by the formulae (A1) to (A4) each has a 18π electronic structure in total.

6. The organic electroluminescent device according to claim 1, wherein the light emitting layer further contains at least one tetradentate platinum complex represented by formula (1):

(1)

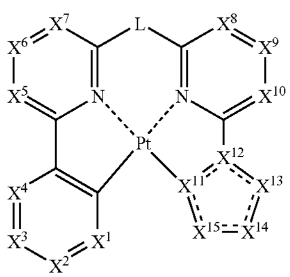

wherein $X^1$, $X^2$, $X^3$, and $X^4$ each independently represents a carbon atom or a nitrogen atom, with the proviso that at least one of $X^1$, $X^2$, $X^3$, and $X^4$ represents a nitrogen atom, $X^5$, $X^6$, $X^7$, $X^8$, $X^9$, and $X^{10}$ each independently represents a carbon atom or a nitrogen atom, $X^{11}$ and $X^{12}$ each independently represents a carbon atom or a nitrogen atom, $X^{13}$, $X^{14}$, and $X^{15}$ each independently represents a carbon atom, a nitrogen atom, an oxygen atom, or a sulfur atom, with the proviso that the number of nitrogen atoms contained in a 5-membered ring skeleton represented by $X^{11}$, $X^{12}$, $X^{13}$, $X^{14}$, and $X^{15}$ is 2 or less, and L represents a single bond or a divalent linking group.

7. An organic electroluminescent device comprising:

a pair of electrodes;

an organic layer including a light emitting layer between the electrodes, wherein the organic layer contains a compound represented by formula (X):

(X)

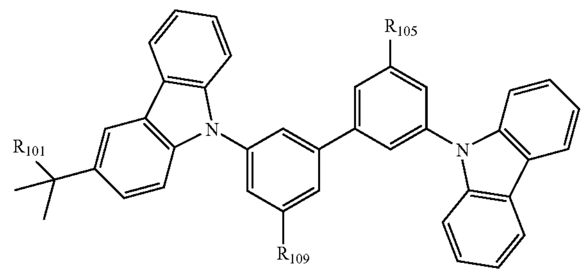

wherein $R_{101}$ represents a methyl or ethyl group, $R_{105}$ and $R_{109}$ each independently represents a hydrogen atom, a substituted or unsubstituted alkyl group, a cyano group, a substituted or unsubstituted aryl group, or a substituted or unsubstituted heteroaryl group.

8. The organic electroluminescent device according to claim 7, wherein each of $R_{105}$ and $R_{109}$ is a hydrogen atom.

9. The organic electroluminescent device according to claim 7, wherein the light emitting layer contains a compound represented by formula (a):

(a)

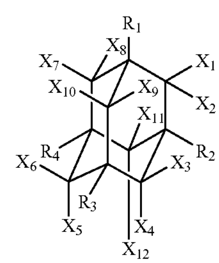

wherein $R_1$ to $R_4$ each independently represents a hydrogen atom, an alkyl group, an alkenyl group, an alkynyl group, an aryl group, a heteroaryl group, an alkoxy group, an acyl group, an acyloxy group, an amino group, a nitro group, a cyano group, an ester group, an amide group, a halogen group, a perfluoroalkyl group, or a silyl group, with the proviso that at least one of $R_1$ to $R_4$ is a group having a double bond or a triple bond, and $X_1$ to $X_{12}$ each independently represents a hydrogen atom, an alkyl group, an alkynyl group, an aryl group, a heteroaryl group, an alkoxy group, an acyl group, an acyloxy group, an amino group, a nitro group, a cyano group, an ester group, an amide group, a halogen group, a perfluoroalkyl group, or a silyl group.

10. The organic electroluminescent device according to claim 7, wherein the compound represented by formula (X) has $T_1$ of 61 kcal/mol or greater.

11. The organic electroluminescent device according to claim 7, wherein the compound represented by formula (X) has a molecular weight of from 450 to 1200.

12. The organic electroluminescent device according to claim 7, wherein the light emitting layer further contains at least one phosphorescent metal complex containing a metal having an atomic weight of 40 or greater and a monoanionic bidentate ligand represented by one of formulae (A1) to (A4):

A1

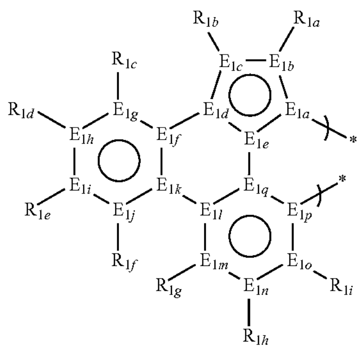

A2

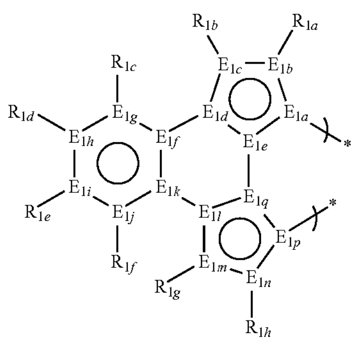

A3

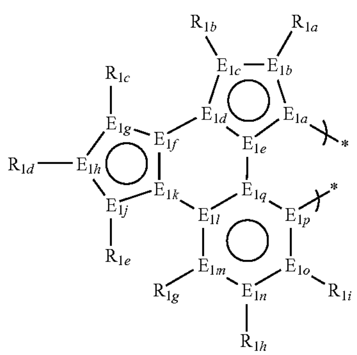

-continued

A4

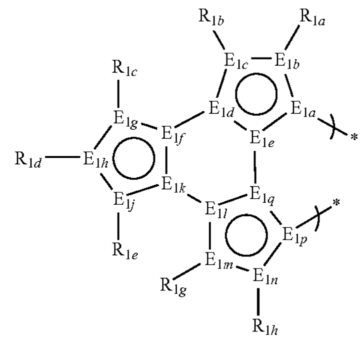

wherein $E_{1a}$ to $E_{1q}$ each independently represents a carbon atom or a hetero atom, $R_{1a}$ to $R_{1i}$ each independently represents a hydrogen atom or a substituent, and skeletons represented by the formulae (A1) to (A4) each has a 18π electronic structure in total.

13. The organic electroluminescent device according to claim 7, wherein the light emitting layer further contains at least one tetradentate platinum complex represented by formula (1):

(1)

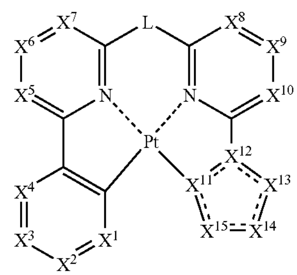

wherein $X^1$, $X^2$, $X^3$, and $X^4$ each independently represents a carbon atom or a nitrogen atom, with the proviso that at least one of $X^1$, $X^2$, $X^3$, and $X^4$ represents a nitrogen atom, $X^5$, $X^6$, $X^7$, $X^8$, $X^9$, and $X^{10}$ each independently represents a carbon atom or a nitrogen atom, $X^{11}$ and $X^{12}$ each independently represents a carbon atom or a nitrogen atom, $X^{13}$, $X^{14}$, and $X^{15}$ each independently represents a carbon atom, a nitrogen atom, an oxygen atom, or a sulfur atom, with the proviso that the number of nitrogen atoms contained in a 5-membered ring skeleton represented by $X^{11}$, $X^{12}$, $X^{13}$, $X^{14}$, and $X^{15}$ is 2 or less, and L represents a single bond or a divalent linking group.

* * * * *